US006875105B1

(12) United States Patent
Behm et al.

(10) Patent No.: US 6,875,105 B1
(45) Date of Patent: Apr. 5, 2005

(54) LOTTERY TICKET VALIDATION SYSTEM

(75) Inventors: William F. Behm, Roswell, GA (US); Mark Bofill, Roswell, GA (US); Steven J. Daigle, Plano, TX (US); Kenneth E. Irwin, Jr., Alpharetta, GA (US); Bret Levy, Dunwoody, GA (US); Dan Pallone, Dunwoody, GA (US); Gary R. Streeter, Andover, MA (US); Mark Tevis, Cumming, GA (US)

(73) Assignee: Scientific Games Inc., Alpharetta, GA (US)

( * ) Notice: Subject to any disclaimer, the term of this patent is extended or adjusted under 35 U.S.C. 154(b) by 439 days.

(21) Appl. No.: 09/723,772

(22) Filed: Nov. 28, 2000

Related U.S. Application Data

(63) Continuation-in-part of application No. 09/455,564, filed on Dec. 6, 1999, now Pat. No. 6,379,742, which is a continuation-in-part of application No. 08/794,120, filed on Feb. 3, 1997, now Pat. No. 5,997,044, which is a continuation-in-part of application No. 08/263,888, filed on Jun. 22, 1994, now Pat. No. 5,599,046.

(51) Int. Cl.[7] .............................................. A63F 13/00
(52) U.S. Cl. ....................... 463/17; 235/375; 235/451; 235/441; 235/492; 235/440; 340/825.31
(58) Field of Search ........................... 463/17; 235/375, 235/451, 441

(56) References Cited

U.S. PATENT DOCUMENTS 3,089,123 A    5/1963  Hennis et al.

(Continued)

FOREIGN PATENT DOCUMENTS

CH          598 964       12/1978

(Continued)

Primary Examiner—Jessica Harrison
Assistant Examiner—Corbett B. Coburn
(74) Attorney, Agent, or Firm—Michael B. McMurry

(57) ABSTRACT

A lottery ticket validation system validates a probability lottery ticket that has predetermined play rules and that includes a plurality of player removable material covering play spots that in turn cover play indicia located in predetermined locations on the ticket. In addition, validation data is printed on the ticket in the form of a bar code. The validation system includes a housing, a controller located in the housing, a document channel configured in the housing, a sensor, a data reader, a transport mechanism, a scanning circuit, a memory, a processor, and a stigmatization circuit. The sensor includes an optical detector located in the housing and operatively connected to the controller. The data reader is operatively connected to the controller and is adapted to read the bar code. The transport mechanism is located in the housing and is operatively connected to the controller. The transport mechanism includes at least one roller, a plurality of ticket sensors, and a motor. The roller is effective to transport the probability lottery ticket through the document channel such that at least a portion of the play spots is substantially aligned with the sensor and such that the bar code is substantially aligned with the data reader. The scanning circuit is operatively connected to the sensor and to the controller and scans at least a portion of the probability lottery ticket for the player removable material covering the play spots and generates a validation signal indicating which, if any, of the player removable material covering the play spots has been removed from the probability lottery ticket. The memory is operatively connected to the controller and contains data representing the probability lottery ticket, including at least a portion of the validation data obtained from the data reader, and removed play spot data obtained from the validation signal. The processor is operatively connected to the controller and the memory and relates the portion of the validation data to the removed play spot data to verify the probability lottery ticket and to cause the transport mechanism to exit the probability lottery ticket from the document channel. The stigmatization circuit is operatively connected to the processor and is adapted to change at least a portion of a color of the probability lottery ticket prior to the transport mechanism exiting the probability ticket from the document channel.

302 Claims, 46 Drawing Sheets

U.S. PATENT DOCUMENTS

| | | | |
|---|---|---|---|
| 3,245,697 A | 4/1966 | Nugent | |
| 3,736,368 A | 5/1973 | Vogelman et al. | |
| 3,868,057 A | 2/1975 | Chavez | |
| 3,876,865 A | 4/1975 | Bliss | |
| 3,918,174 A | 11/1975 | Miller et al. | |
| 3,922,529 A | 11/1975 | Orloff | |
| 3,934,120 A | 1/1976 | Maymarev | |
| 4,017,834 A | 4/1977 | Cutill et al. | |
| 4,105,156 A | 8/1978 | Dethloff | |
| 4,176,406 A | 11/1979 | Matkan | |
| 4,195,772 A | 4/1980 | Nishimura | |
| 4,243,216 A | 1/1981 | Mazumder | |
| 4,313,087 A | 1/1982 | Weitzen et al. | |
| 4,355,300 A | 10/1982 | Weber | |
| 4,455,039 A | 6/1984 | Weitzen et al. | |
| 4,544,184 A | 10/1985 | Freund et al. | |
| 4,579,371 A | 4/1986 | Long et al. | |
| 4,591,189 A | 5/1986 | Holmen et al. | |
| 4,669,729 A | 6/1987 | Solitt et al. | |
| 4,677,553 A * | 6/1987 | Roberts et al. | 463/17 |
| 4,736,109 A | 4/1988 | Dvorzsak | |
| 4,760,247 A | 7/1988 | Keane et al. | |
| 4,763,927 A | 8/1988 | Schneider | |
| 4,792,667 A | 12/1988 | Chen | |
| 4,832,341 A * | 5/1989 | Muller et al. | 463/17 |
| 4,835,624 A | 5/1989 | Black et al. | |
| 4,870,260 A | 9/1989 | Niepolomski et al. | |
| 4,880,964 A | 11/1989 | Donahue | |
| 4,964,642 A | 10/1990 | Kamille | |
| 5,032,708 A | 7/1991 | Comerford et al. | |
| 5,092,598 A | 3/1992 | Kamille | |
| 5,094,458 A | 3/1992 | Kamille | |
| 5,109,153 A | 4/1992 | Johnsen et al. | |
| 5,112,050 A | 5/1992 | Koza et al. | |
| 5,118,109 A | 6/1992 | Gumina | |
| 5,193,854 A | 3/1993 | Borowski, Jr. et al. | |
| 5,228,692 A | 7/1993 | Carrick et al. | |
| 5,234,798 A | 8/1993 | Heninger et al. | |
| 5,308,992 A | 5/1994 | Crane | |
| 5,317,135 A * | 5/1994 | Finocchio | 463/17 |
| 5,346,258 A | 9/1994 | Behm et al. | |
| 5,403,039 A | 4/1995 | Borowski, Jr. et al. | |
| 5,451,759 A | 9/1995 | Hoshino et al. | |
| 5,453,602 A | 9/1995 | Hanada | |
| 5,471,039 A | 11/1995 | Irwin, Jr. et al. | |
| 5,471,040 A | 11/1995 | May | |
| 5,475,205 A | 12/1995 | Behm et al. | |
| 5,528,154 A | 6/1996 | Leichner et al. | |
| 5,599,046 A | 2/1997 | Behm et al. | |
| 5,602,381 A | 2/1997 | Hoshino et al. | |
| 5,621,200 A | 4/1997 | Irwin, Jr. et al. | |
| 5,682,819 A | 11/1997 | Beaty | |
| 5,690,366 A | 11/1997 | Luciano | |
| 5,704,647 A | 1/1998 | Desbiens | |
| 5,756,220 A | 5/1998 | Hoshino et al. | |
| 5,791,990 A * | 8/1998 | Schroeder et al. | 463/17 |
| 5,803,504 A | 9/1998 | Deshiens et al. | |
| 5,818,019 A | 10/1998 | Irwin, Jr. et al. | |
| 5,835,576 A | 11/1998 | Katz | |
| 5,855,514 A * | 1/1999 | Kamille | 463/17 |
| 5,887,906 A | 3/1999 | Sultan | |
| 5,903,340 A | 5/1999 | Lawandy et al. | |
| 5,915,588 A | 6/1999 | Stoken et al. | |
| 5,935,000 A * | 8/1999 | Sanchez et al. | 463/17 |
| 5,996,997 A * | 12/1999 | Kamille | 273/139 |
| 5,997,044 A | 12/1999 | Behm et al. | |
| 6,053,405 A | 4/2000 | Irwin, Jr. et al. | |
| 6,107,913 A | 8/2000 | Gatto et al. | |
| 6,155,491 A | 12/2000 | Dueker et al. | |
| 6,273,817 B1 * | 8/2001 | Sultan | 463/17 |
| 6,308,991 B1 * | 10/2001 | Royer | 283/102 |

FOREIGN PATENT DOCUMENTS

| | | |
|---|---|---|
| EP | 0 097 570 A2 | 1/1984 |
| WO | PCT/US98/06718 | 10/1998 |
| WO | PCT/US99/11929 | 12/1999 |
| WO | PCT/US99/12640 | 12/1999 |

* cited by examiner

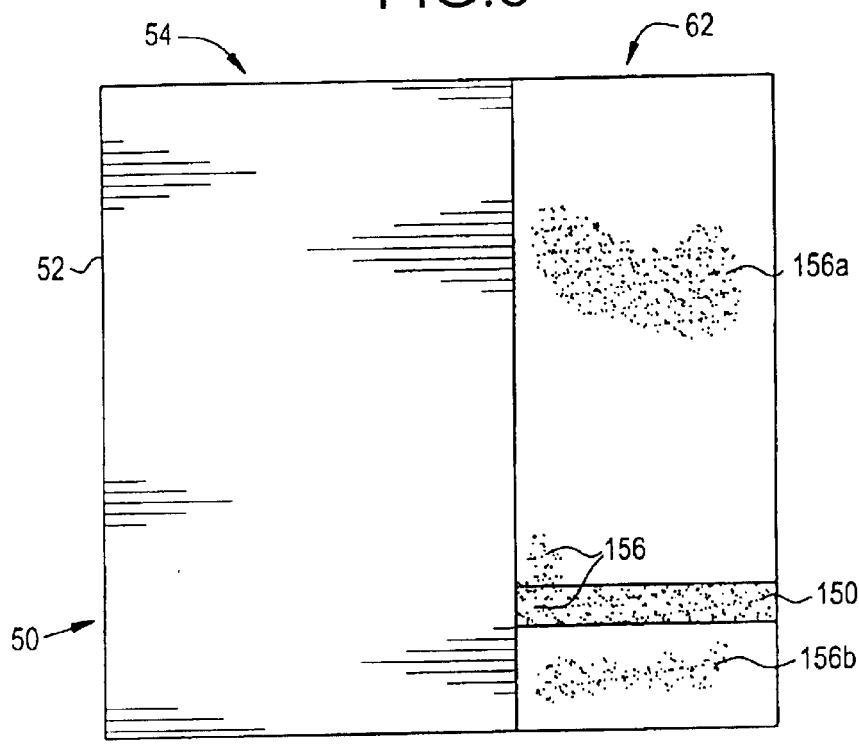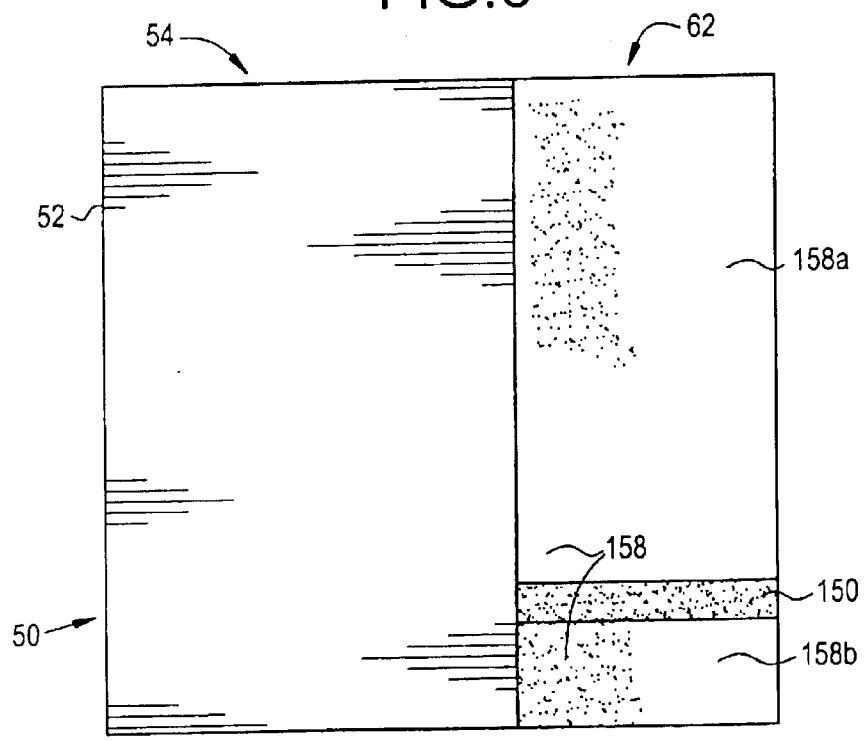

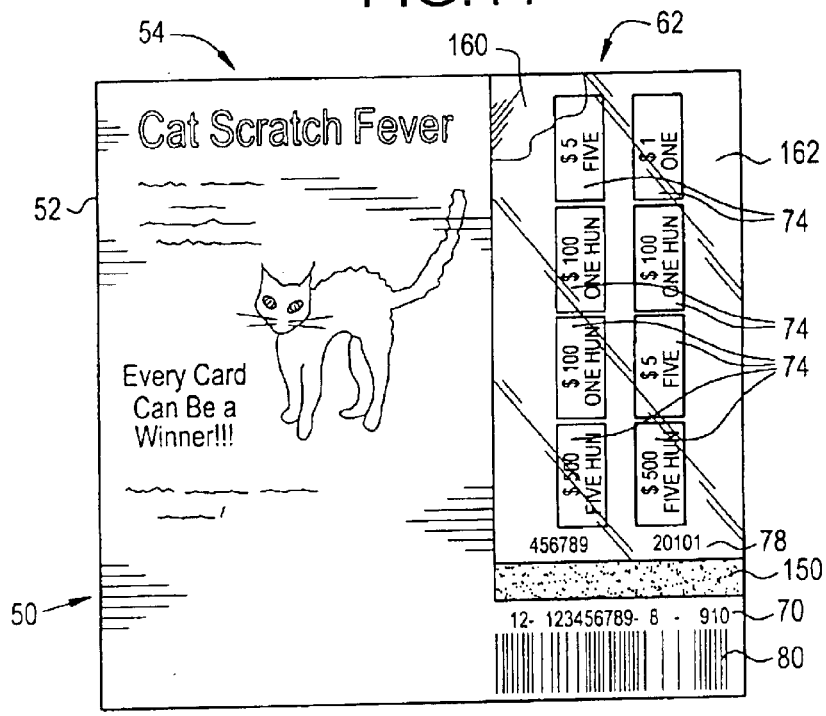
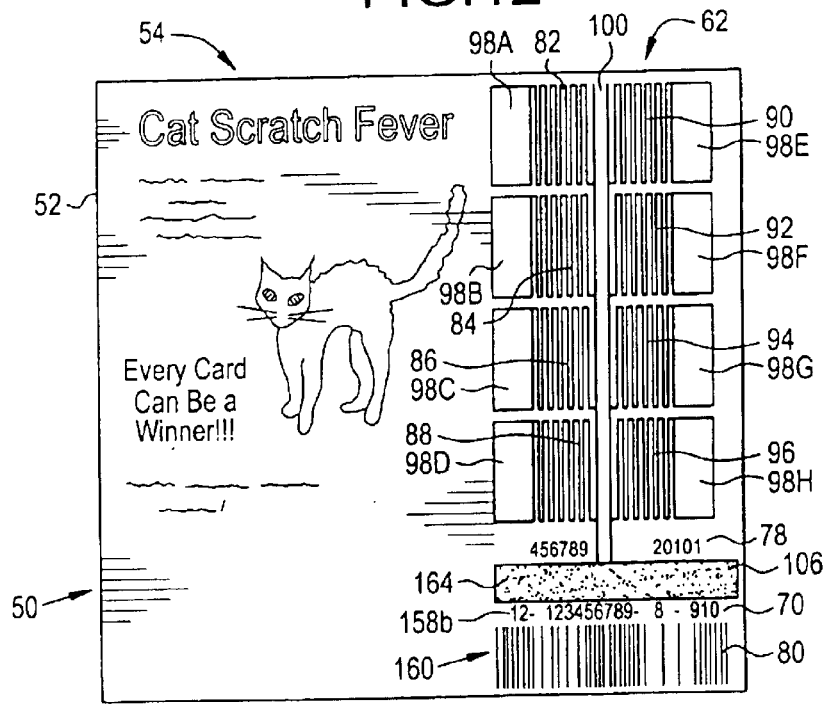

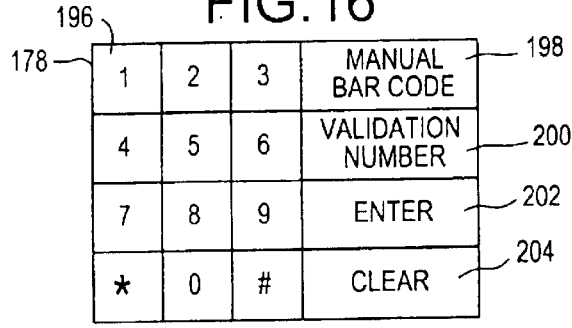
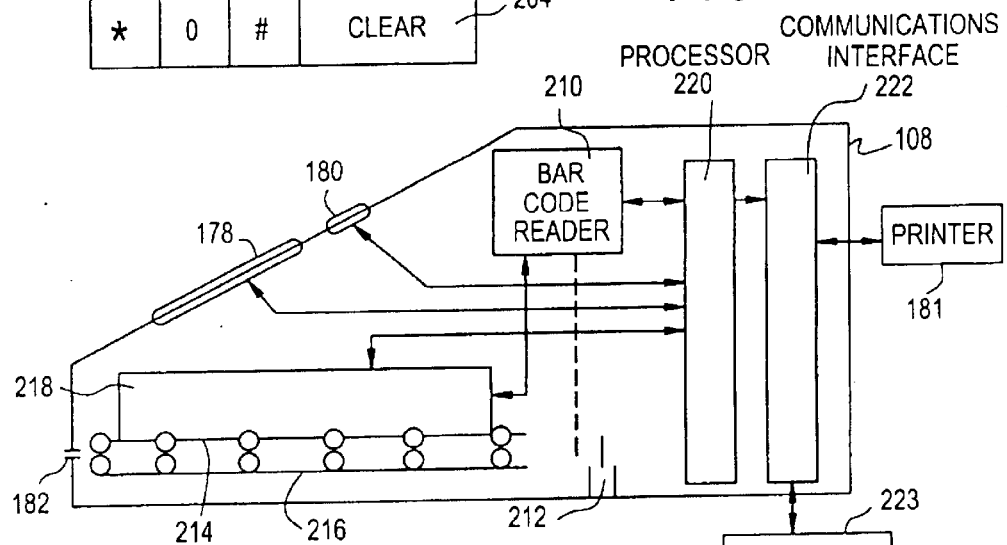
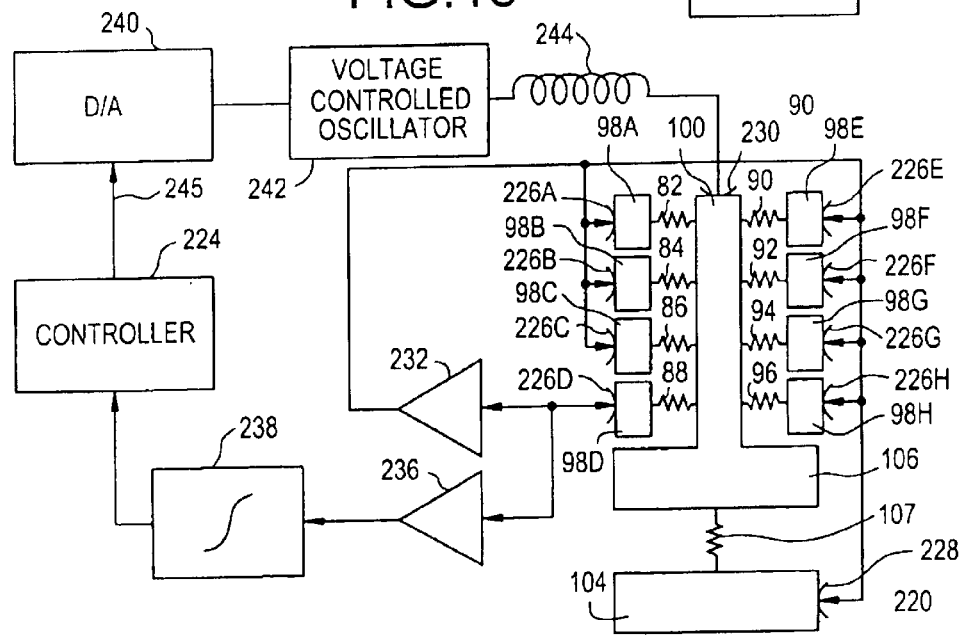

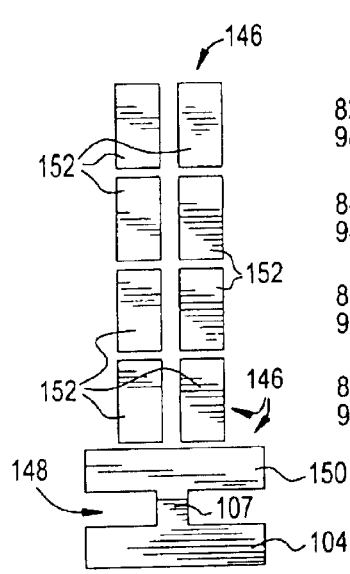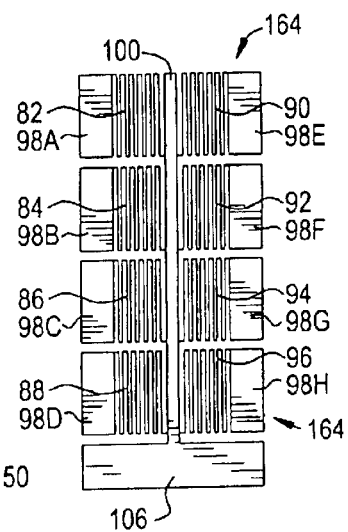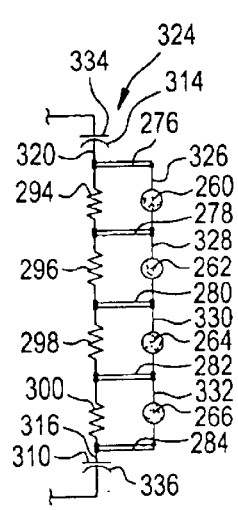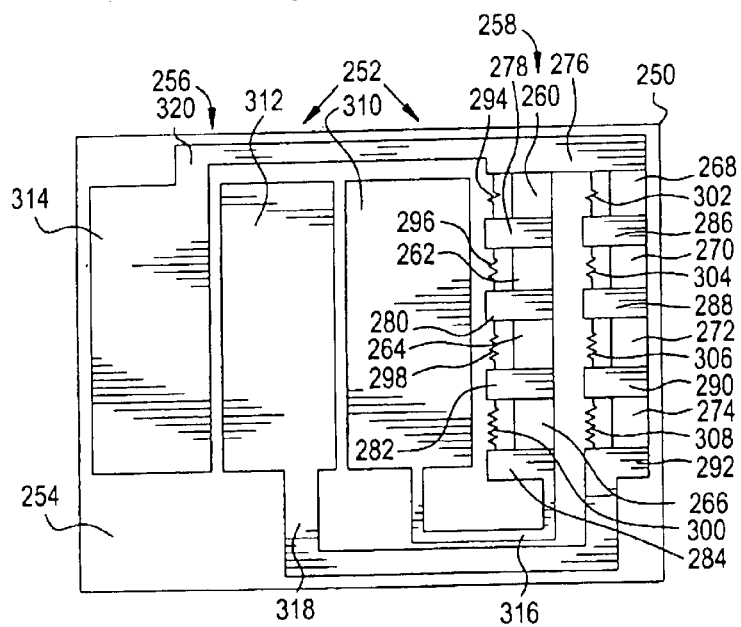

FIG.42
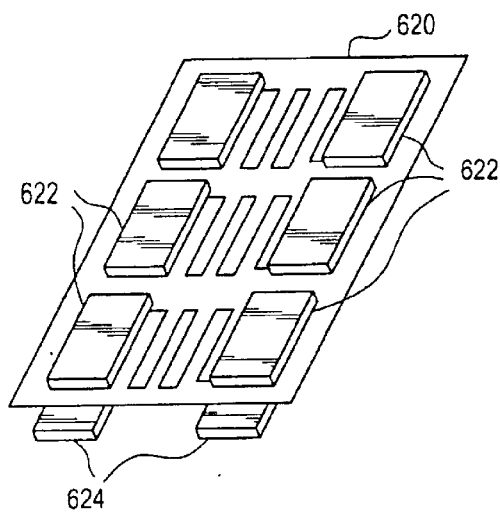
FIG.43
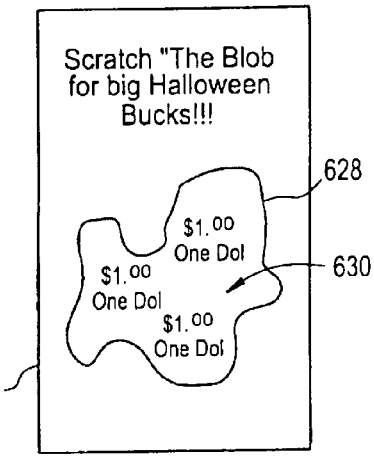
FIG.44
```
                    2⁰ 2¹ 2² 2³ 2⁴ 2⁵ 2⁶ 2⁷ 2⁸ 2⁹   632
       FF₁₆        1  0  0  0  0  0  0  0  0  0
         ↑         1  0  0  0  0  0  0  0  0  0
                   0  0  0  0  0  0  0  0  0  0
                   0  0  0  0  0  0  0  0  0  0
                   0  0  0  0  0  0  0  0  0  0
       MEMORY            •
      LOCATIONS           •
                         •
                   0  0  0  1  0  1  1  1  0  0
                   0  0  1  1  0  1  1  1  0  0
                   0  0  1  1  1  1  1  1  0  0
                   0  0  1  1  1  1  1  0  0  0
                   0  0  1  1  1  1  1  1  0  0
                   0  1  1  1  1  1  1  1  1  0
                   0  1  1  1  1  1  1  1  1  0
                   0  1  1  1  1  1  1  1  0  0
                   0  0  1  0  1  1  1  1  0  0
                   0  0  0  0  1  1  1  0  0  0
                   0  0  0  0  0  1  1  0  0  0
                   1  0  0  0  0  0  0  0  0  0
                   1  0  0  0  0  1  1  1  1  1
                   1  0  0  0  0  1  0  0  0  1
       00₁₆        1  0  0  0  0  1  1  1  1  1
```
FIG.45
```
                    2⁰ 2¹ 2² 2³ 2⁴ 2⁵ 2⁶ 2⁷ 2⁸ 2⁹   634
                   1  0  0  0  0  0  0  0  0  0
                   1  0  0  0  0  0  0  0  0  0
                   0  0  0  0  0  0  0  0  0  0
                   0  0  0  0  0  0  0  0  0  0
                   0  0  0  0  0  0  0  0  0  0
                         •
                         •
                         •
                   0  0  1  0  1  1  1  0  0
                   0  0  1  1  0  1  1  1  0  0
                   0  0  1  0  1  0  0  1  0  0
                   0  0  0  1  1  0  0  0  0  0
                   0  0  0  0  0  0  0  1  0  0
                   0  1  0  0  0  0  0  0  1  0
                   0  1  0  0  0  0  0  0  1  0
                   0  1  0  1  0  0  0  0  0  0
                   0  0  1  0  0  0  0  1  0  0
                   0  0  0  0  1  0  1  0  0  0
                   0  0  0  0  1  1  0  0  0  0
                   1  0  0  0  0  0  0  0  0  0
                   1  0  0  0  0  1  1  1  1  1
                   1  0  0  0  0  1  0  0  0  1
                   1  0  0  0  0  1  1  1  1  1
```

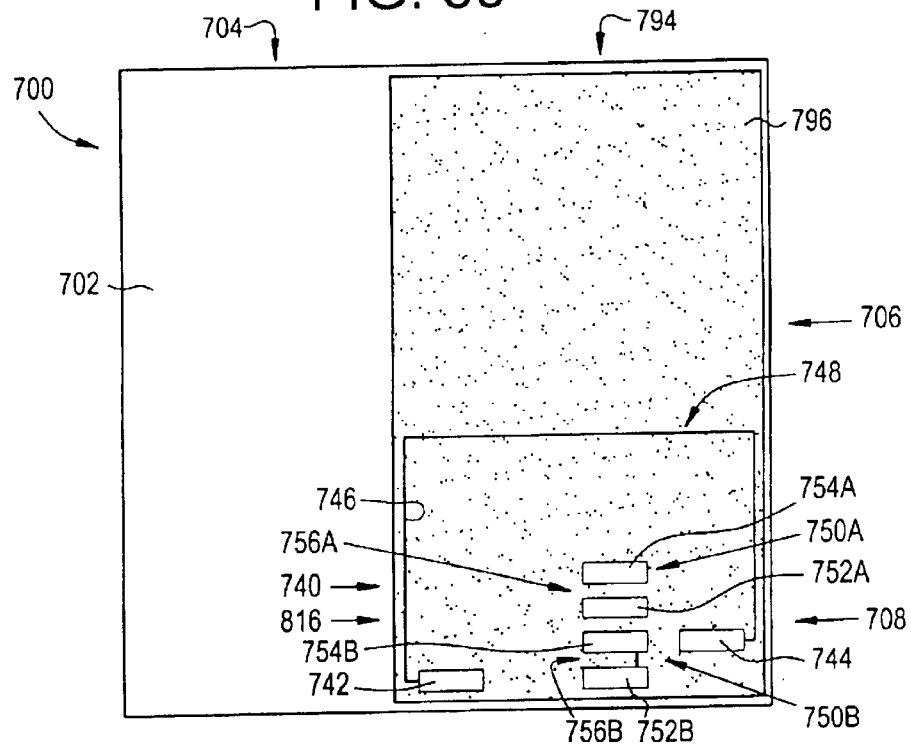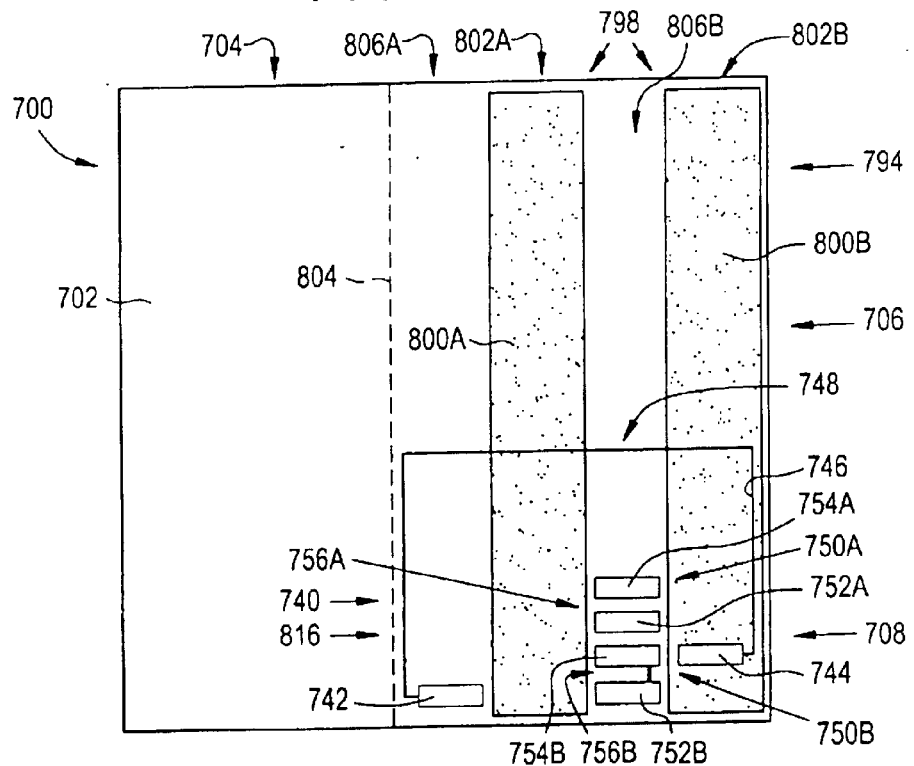

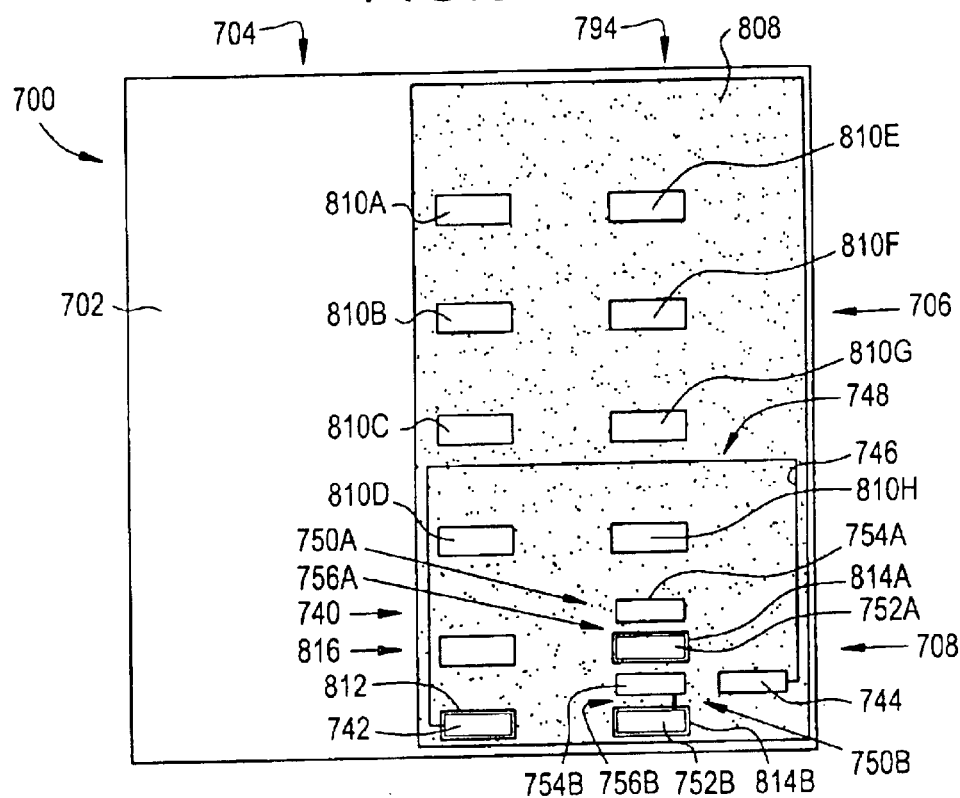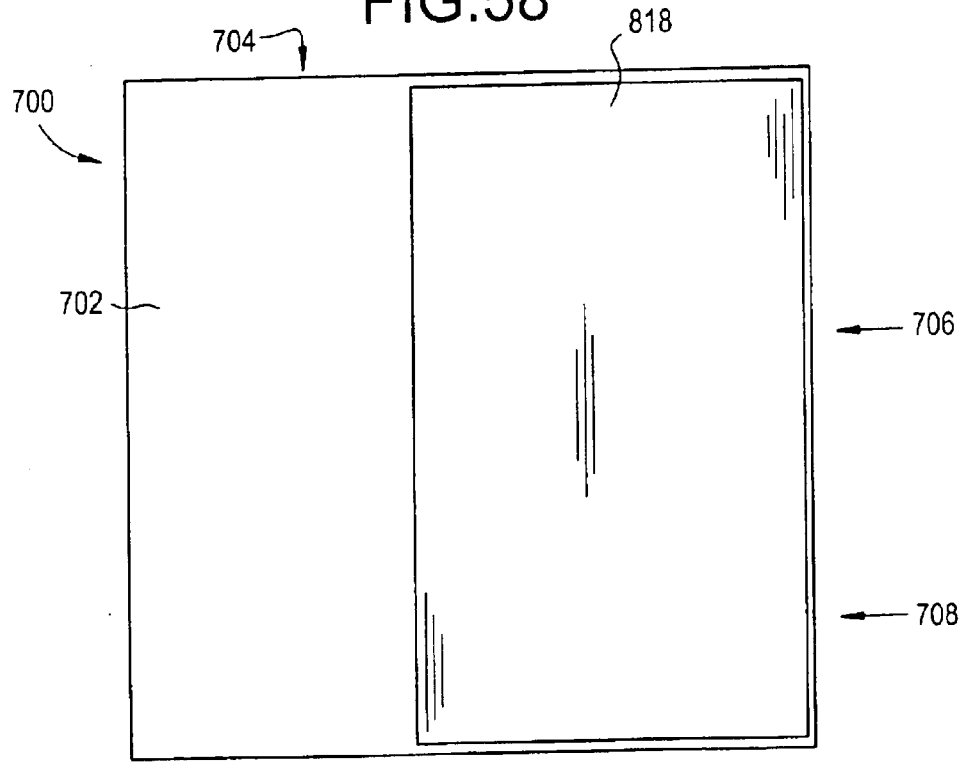

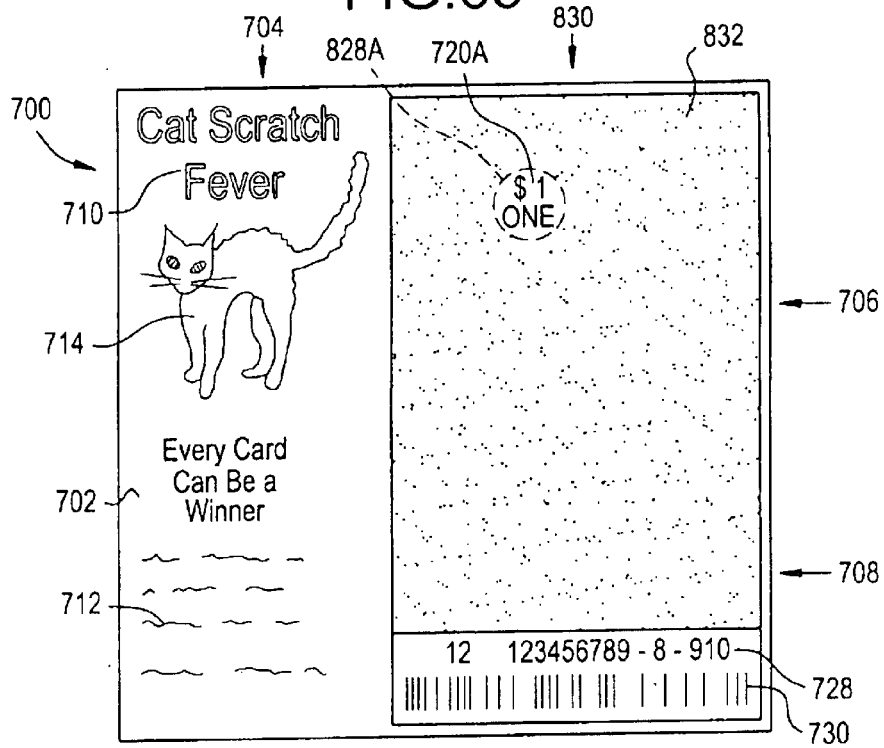
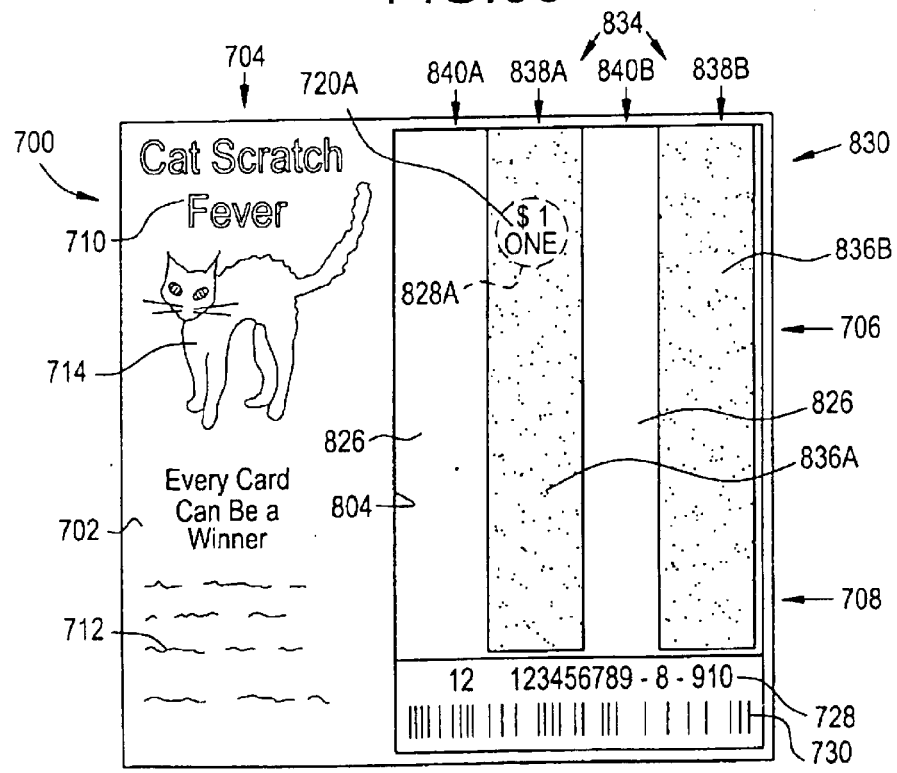

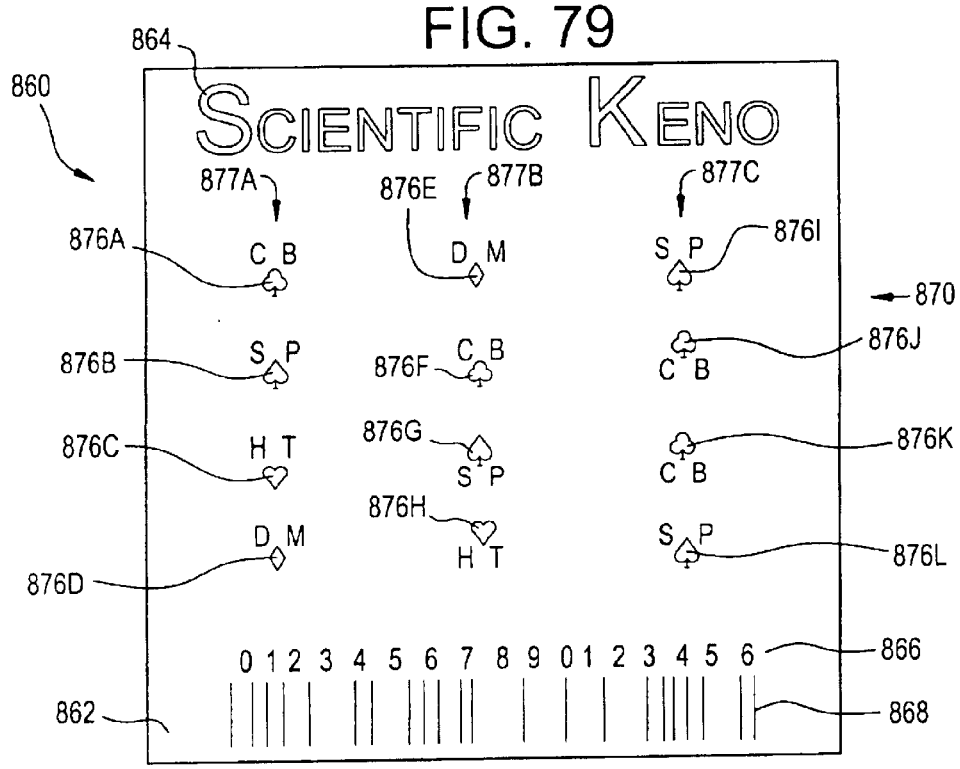
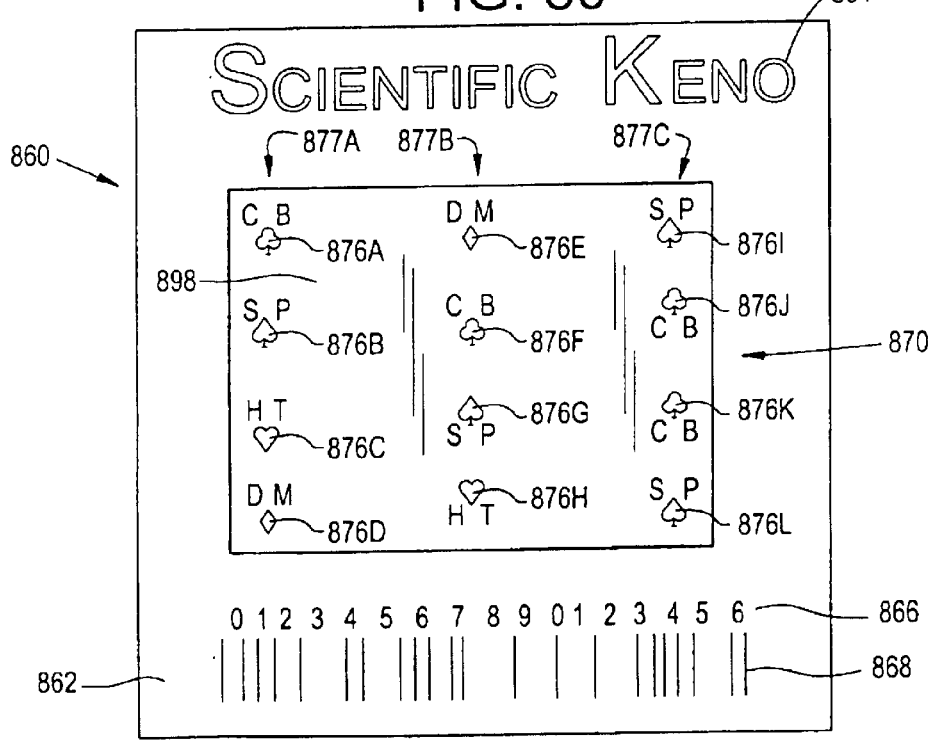

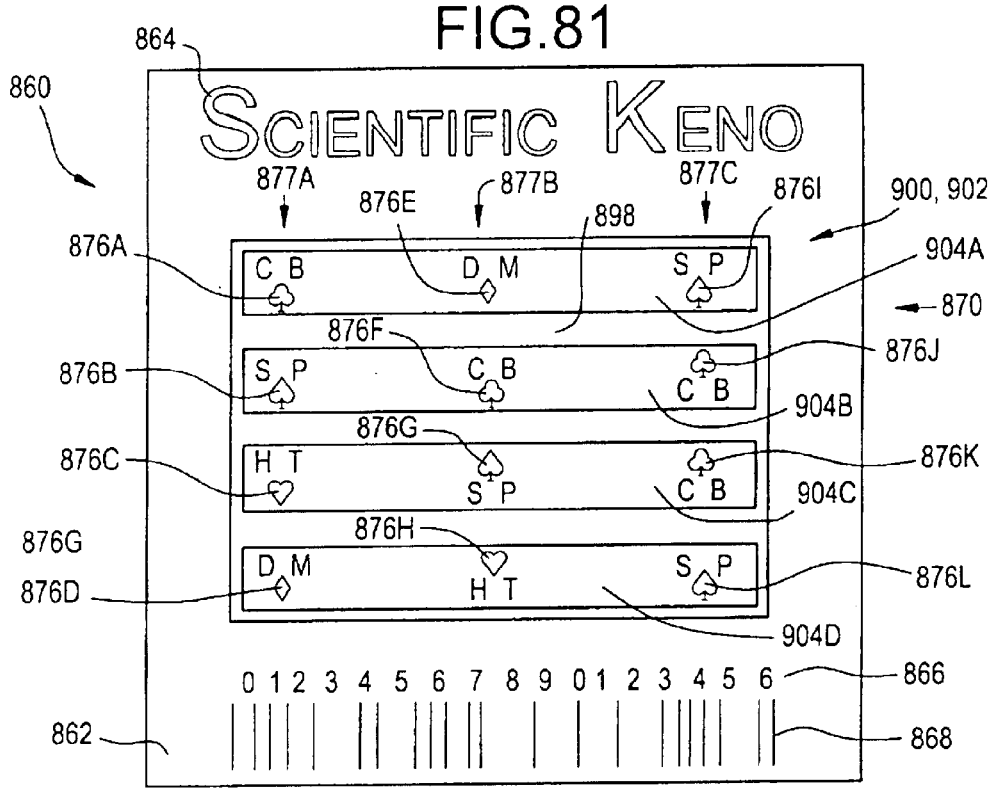
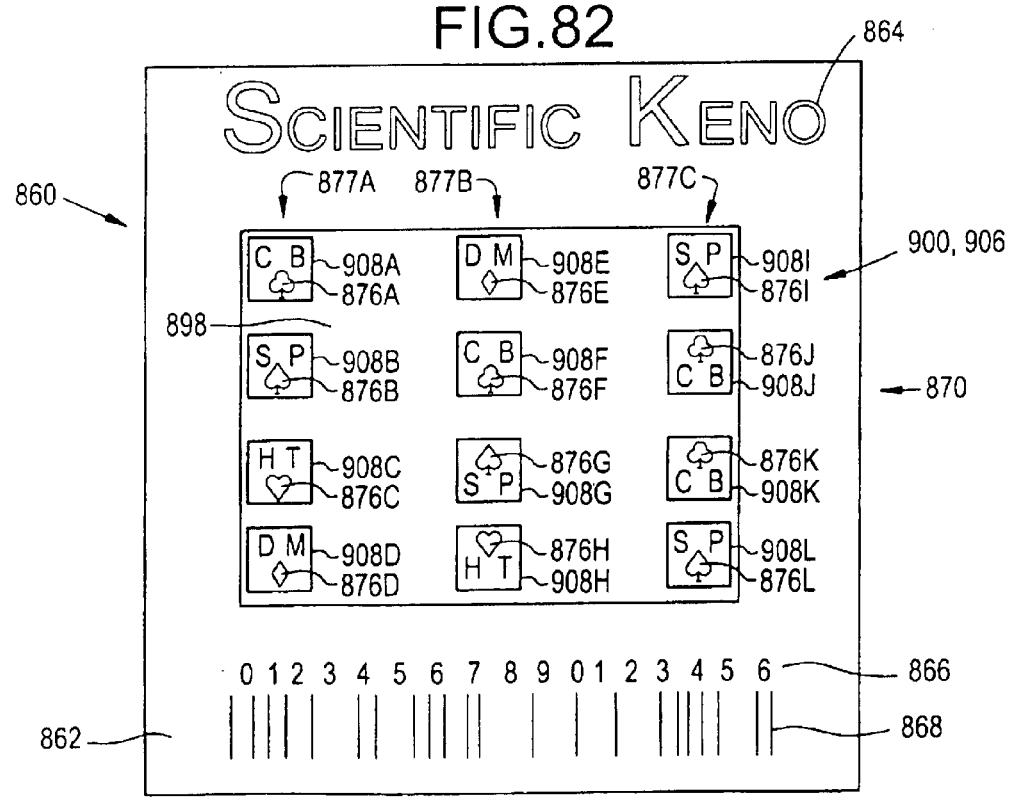

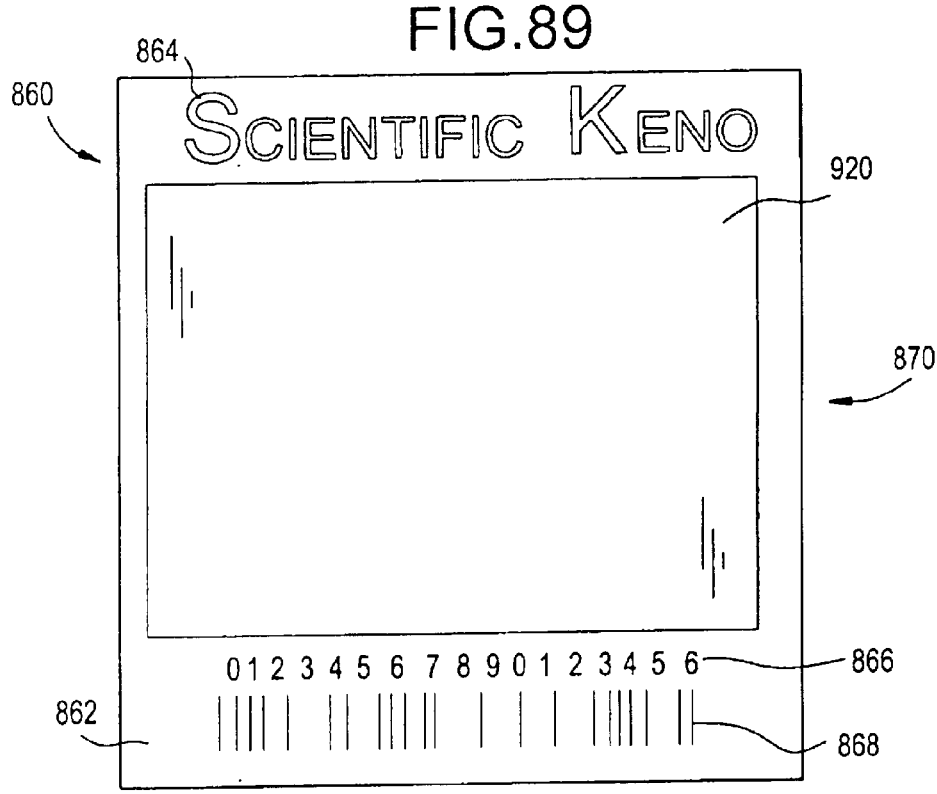
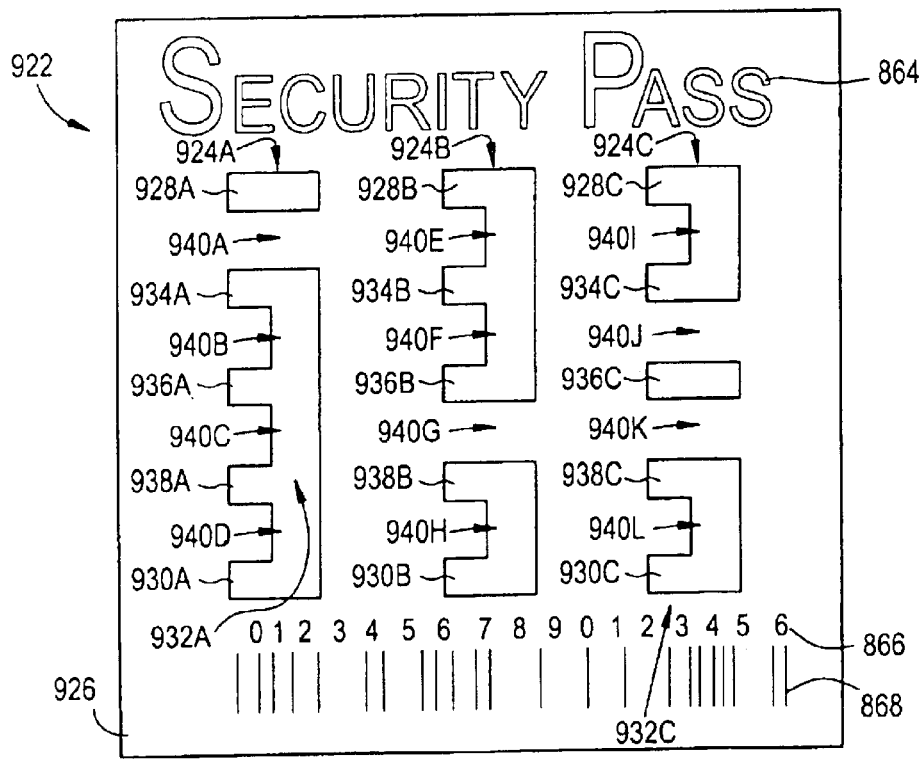

LOTTERY TICKET VALIDATION SYSTEM

CROSS-REFERENCE TO RELATED APPLICATIONS

This application is a continuation-in-part of U.S. Ser. No. 09/455,564, filed Dec. 6, 1999 now U.S. Pat. No. 6,379,742, which was a continuation-in-part of U.S. Ser. No. 08/794,120; now U.S. Pat. No. 5,997,044, filed February 3, 1997 and issued Dec. 7, 1999, which was a continuation-in-part of application Ser. No. 08/263,888, now U.S. Pat. No. 5,599,046, filed Jun. 22, 1994 and issued Feb. 4, 1997.

FIELD OF THE INVENTION

This invention relates to the field of lottery ticket validation systems, and more particularly to validation systems for instant lottery tickets and probability lottery tickets.

BACKGROUND OF THE INVENTION

Instant lottery tickets generally include play indicia which initially are covered and not readily visible. The player removes the covering which obscures the play indicia to determine if any of the revealed indicia win a prize. Instant lottery tickets are quite popular because the player knows immediately whether or not he/she has won a prize.

Probability lottery tickets are a special form of instant lottery tickets and have been shown to be quite popular. Probability lottery tickets differ from conventional instant lottery tickets in that each probability lottery ticket includes winning play indicia. There are at least two general types of probability lottery tickets. In the first type, the probability lottery ticket has only one winning play indicia and several non-winning play indicia, all of which are covered initially by a player removable material. The probability lottery ticket also has pre-determined play rules which must be followed for the ticket to qualify as a winning ticket. Whether or not a player has a winning ticket depends not only on revealing the winning indicia but also on playing the probability lottery ticket according to a pre-determined set of play rules. For example, the play rules for a probability lottery ticket may specify that the player can reveal only three of the covered play indicia to qualify for a winning ticket. In this case, if the player were to reveal four of the covered play indicia, the ticket would not be a winning ticket even if one of the revealed play indicia was a winning play indicia.

In the second general type, the probability ticket includes more than one winning play indicia, as well as several non-winning play indicia, all of which are covered initially with a player removable material. As before, the probability lottery ticket has pre-determined rules which must be followed for the ticket to be a winning ticket even if the player uncovers winning play indicia. The main difference is that in this second general type of probability lottery ticket the redemption value of the ticket is not known until the player reveals the winning play indicia according to the pre-determined play rules. For example, a probability lottery ticket may have three winning play indicia in addition to other non-winning play indicia, for example, winning play indicia that have a value of $1.00, $2.00, and $3.00. The redemption value of this ticket depends on which of the three winning play indicia the player uncovers. For example, if the player uncovered only the winning play indicia that has a value of $1.00. The redemption value of the ticket would only be $1.00. However, if the player uncovered two winning play indicia which having values of $1.00 and $3.00, respectively, the ticket would have a redemption value of $4.00, provided that the player reveals the winning play indicia according to the pre-determined play rules.

For both instant lottery tickets and probability lottery tickets, a ostensibly winning ticket must be validated before a prize is awarded to the player. Validation includes determining the size of the prize to be awarded the winner. In other words, the redemption value of the ticket must be determined before the prize is awarded. Although a seemingly simple task, validating both instant lottery tickets and probability lottery tickets can be quite problematic because both types of lottery tickets are subject to tampering and fraud. For example, it is known that attempts have been made to redeem non-winning instant lottery tickets by altering the revealed play indicia so that the ticket appears to include winning play indicia. Attempts to guard against this type of tampering have included encoding information in the bar codes of the lottery tickets. However, the bar codes themselves can be subject to tampering and fraud. Consequently, using bar codes alone to prevent this type of lottery ticket tampering has not been completely successful. Another type of tampering occurs even before instant lottery tickets are played. In the past, unscrupulous individuals have tried to identify which tickets, if any, in a pack of instant lottery tickets includes winning play indicia. This has been done by various techniques, for example, candling the ticket, lifting and replacing the player-removable material, or pin-pricking the player removable material. This type of tampering most often occurs before the tickets are sold to the public at large and often involves persons having access to full ticket packages, such as ticket sales persons. As a result, identifying this type of fraud/tampering by using only information encoded in the ticket bar codes has not been very successful.

Because each ticket includes at least one winning play indicia, probability lottery tickets are especially vulnerable to tampering or fraud. Because every ticket can win if the right play indicia are selected, some players look for ways to determine the play indicia contained in every play area in order to identify the location of a winning combination. If the player can conceal the fact that he has seen the play indicia, the player subsequently can remove the latex covering from the play areas containing the winning combination and claim a prize. One technique used to accomplish this result involves lifting the player removable material to look at the play indicia before placing the player removable material back into place. The player then removes the player removable material over the number of play indicia specified in the pre-determined play rules, including the player removable material covering the winning play indicia. The ticket therefore appears to have been played according to the pre-determined rules and hence qualifies as a winning ticket. Typically, probability game lottery tickets are validated by the visual observation of a human lottery agent. Consequently, it can be difficult to visually detect this sort of tampering. Conventional bar code systems are also inadequate to protect against this tampering and fraud because the information stored in the bar code cannot itself identify which of the player removable materials have been lifted.

Another problem associated with both instant lottery tickets and probability lottery tickets is multiple redemption of winning tickets. If a person can present a winning ticket more than once to obtain the indicated prize, such multiple redemption is also fraudulent. In some cases, the sales person to whom the ticket is presented is instructed to mark or stigmatize the ticket after the prize has been awarded. However, if a winning ticket is not stigmatized this type of fraud is difficult to overcome.

Hence, it is desirable to provide a lottery ticket validation system which not only determines the redemption value of the ticket but also discourages tampering, alteration, and fraud.

SUMMARY OF THE INVENTION

It is therefore an object of the invention to provide a validation system for lottery tickets that prevents altered, tampered, or fraudulent tickets from being redeemed as winning tickets.

Another object of the invention is to provide a lottery ticket validation system which does not rely on visual inspection to prevent altered, tampered, or fraudulent tickets from being redeemed as winning tickets.

Another object of the invention is to provide a lottery ticket validation system which determines the redemption value of a ticket that has more than one possible redemption value.

Another object of the invention is to provide a lottery ticket validation system that prevents winning tickets from being redeemed more than one time.

These and other objectives and goals are met by the current invention which is a system for validating lottery tickets. In one embodiment, the validation system validates a lottery ticket which has player removable play spots covering play indicia. The validation system includes ticket data located on the lottery ticket and an electronic validation machine that has a detector and a microprocessor operatively connected to the detector. The microprocessor computes which of the play spots have been removed from the lottery ticket. The microprocessor further computes a ticket redemption value from the play spots which have been removed from the ticket and from the ticket data printed on the ticket.

In a second embodiment of the invention, the system validates a lottery ticket which includes player removable material located in predetermined locations on the ticket. The validation system includes a memory and a processor operatively coupled to the memory. The memory contains a data bit map that represents at least a portion of the player removable material that has been removed from the ticket. The memory further contains data representing validation data. The processor compares the data bit map to the data that represents validation data according to a predetermined criteria to validate the lottery ticket.

In a third embodiment, the system validates a lottery ticket having player removable play spots covering play indicia. The validation system includes a source of electromagnetic energy, a detector circuit, and a validation circuit. The detector circuit includes an array of photo-detectors that is responsive to the electromagnetic energy. The detector circuit generates a verification signal indicating which of the player removable spots have been removed from the lottery ticket. The validation circuit determines from the verification signal a ticket redemption value related to the play spots that have been removed from the lottery ticket.

In a fourth embodiment of the invention, the validation system includes a lottery ticket, ticket data located on the lottery ticket, a detector, and a validation mechanism which is operatively connected to the detector and includes a processor. The lottery ticket has a plurality of player removable play spots covering play indicia. The ticket data located on the lottery ticket contains information relating to the ticket. The detector, which includes sensors, determines which of the play spots have been removed. The validation mechanism generates a play redemption value represented by the play spots which have been removed.

In a fifth embodiment of the invention, the validation system includes a lottery ticket, ticket data located on the lottery ticket, a detector, and a validation mechanism which is operatively connected to the detector and which includes a reader configured to read at least a portion of the lottery ticket. The lottery ticket has a plurality of play indicia and a plurality of player removable play spots, each of the player removable play spots covering at least one of the play indicia. The ticket data located on the ticket includes redemption information. The detector includes electromagnetic sensors which are adapted to generate a removed spot signal that identifies which of the play spots have been removed from the lottery ticket. The validation mechanism determines a ticket redemption value related to the play spots that have been removed from the ticket. The ticket redemption value is determined from the redemption information included in the ticket data on the ticket and the removed spot signal generated by the electromagnetic sensors.

In a sixth embodiment of the invention, the system includes a probability lottery ticket that has predetermined play rules, a plurality of player removable play spots covering play indicia, and validation data printed on the ticket. In addition, an electromagnetic responsive material is printed in registry with the play spots on the lottery ticket. The system also includes an electronic validation machine and a processor. The electronic validation machine has a controller, a data reader, an electromagnetic sensor, a ticket interface, and a transport mechanism. The data reader is operatively connected to the controller and reads the validation data printed on the ticket. The electromagnetic sensor is operatively connected to the controller and is configured to detect the electromagnetic material printed on the ticket. The ticket interface and transport mechanism are operatively connected to the controller and are adapted to receive the lottery ticket and to position the validation data and play spots with respect to the data reader and the electromagnetic sensor respectively. The controller is effective to generate from the data reader a data signal representing the validation data. In addition, the controller is effective to generate from the electromagnetic sensor a validation signal indicating which of the play spots have been removed from the lottery ticket. The processor relates the data signal to the validation signal to verify that the lottery ticket has been played according to the predetermined play rules.

In a seventh embodiment of the invention, the system validates a lottery ticket which includes a player removable material located in predetermined locations on the lottery ticket. The validation system includes a controller, a document channel, a sensor array, a transport mechanism, a memory, and a scanning circuit. ticket. The sensor array and the transport mechanism are operatively connected to the controller. The transport mechanism is effective to transport the lottery ticket through the document channel such that at least a portion of the player removable material is aligned with the sensor array. The scanning circuit, which is operatively connected to the controller and to the sensor array, generates in the memory a scanned bit map of at least a portion of the player removable material.

In an eighth embodiment of the invention, the validation system includes a probability lottery ticket which has predetermined play rules and which includes a plurality of player removable play spots covering play indicia located in predetermined locations on the probability lottery ticket and validation data printed on the probability lottery ticket. The system also includes a housing, a controller, a document channel, a transport mechanism, a memory, and a processor.

The controller is located in the housing and the document channel is configured in the housing. The transport mechanism is operatively connected to the controller, located in the housing, and effective to transport the probability lottery ticket through the document channel. The memory is operatively connected to the controller and contains data representing the probability lottery ticket, including at least a portion of the validation data and removed play spot data. The processor is operatively connected to the controller and relates the removed play spot data to the portion of the validation data contained in the memory to verify that the probability lottery ticket has been played according to the predetermined play rules and to cause the transport mechanism to exit the probability lottery ticket from the document channel.

In a ninth embodiment of the invention, the validation system includes a probability lottery ticket, a housing, a controller, a document channel, a transport mechanism, a memory and a processor. The probability lottery ticket has predetermined play rules and includes validation data printed on the ticket and a plurality of player removable play spots covering play indicia located in predetermined locations on the ticket. The controller is located in the housing and the document channel is configured in the housing. The transport mechanism is operatively connected to the controller, located in the housing, and effective to transport the probability lottery ticket through the document channel. The memory is operatively connected to the controller and contains data representing the probability lottery ticket including removed play spot data and at least a portion of the validation data. The processor is operatively connected to the controller and relates the portion of the validation data to the removed play spot data to generate a played ticket redemption value and to cause the transport mechanism to exit the probability lottery ticket from the document channel.

In a tenth embodiment of the invention, the system validates a probability lottery ticket that has predetermined play rules and that includes a plurality of player removable play spots covering play indicia located in predetermined locations on the ticket and validation data printed on the ticket. The validation system includes a controller, a document channel, a photo-detector array, a transport mechanism, a scanning circuit, a data reader, and a processor. The photo-detector array is operatively connected to the controller. The transport mechanism is operatively connected to the controller effective to transport the probability lottery ticket through the document channel such that at least a portion of the play spots is substantially aligned with the photo-detector array. The scanning circuit is operatively connected to the photo-detector array and generates a validation signal indicating which of the play spots have been removed from the probability lottery ticket. The data reader is operatively connected to the controller and reads reading the validation data. The controller is effective to generate from the data reader a data signal representing the validation data printed on the ticket. The processor is operatively connected to the controller and relates the data signal to the validation signal to verify that the probability lottery ticket has been played.

In an eleventh embodiment of the invention, the system validates a probability lottery ticket that has predetermined play rules and that includes a plurality of player removable play spots covering play indicia located in predetermined locations on the ticket and validation data printed on the ticket. The validation system includes a controller, a document channel, a sensor array, a transport mechanism, a scanning circuit, a data reader, and a processor. The sensor array is connected to said controller. The transport mechanism is operatively connected to the controller and is effective to transport the probability lottery ticket through the document channel such that at least a portion of the play spots is substantially aligned with the sensor array. The scanning circuit is operatively connected to the sensor array and generates a validation signal indicating which of the play spots have been removed from the probability lottery ticket. The data reader is operatively connected to the controller and reads the validation data printed on the probability lottery ticket. The controller is effective to generate from the data reader a data signal representing the validation data. The processor is operatively connected to the controller and relates the data signal to the validation signal to verify that the probability lottery ticket has been played according to the predetermined play rules.

In a twelfth embodiment of the invention, the system validates a probability lottery ticket that has predetermined play rules and that includes a plurality of player removable play spots covering play indicia located in predetermined locations on the probability ticket and validation data printed on the probability ticket. The validation system includes a housing, a controller located in the housing, a document channel configured in the housing, a sensor array, a transport mechanism, a scanning circuit, a data reader, and a processor. The sensor array is located in the housing and is operatively connected to the controller. The transport mechanism is located in the housing and includes at least one roller, a plurality of ticket sensors, and a motor operatively connected to the controller and the roller. The transport mechanism is effective to transport the probability lottery ticket through the document channel such that at least a portion of the play spots is substantially aligned with the sensor array. The scanning circuit is operatively connected to the sensor array and generates a validation signal indicating which of the play spots have been removed from the probability lottery ticket. The data reader is operatively connected to the controller and is adapted to read the validation data printed on the probability lottery ticket. The controller is effective to generate from the data reader a data signal representing the validation data. The processor is operatively connected to the controller and relates the data signal to the validation signal to verify the that probability lottery ticket has been played according to the predetermined play rules.

In a thirteenth embodiment of the invention, the system validates a probability lottery ticket that has predetermined play rules and that includes a plurality of player removable material covering play spots that in turn cover play indicia located in predetermined locations on the ticket. In addition, validation data is printed on the ticket in the form of a bar code. The validation system includes a housing, a controller located in the housing, a document channel configured in the housing, a sensor, a data reader, a transport mechanism, a scanning circuit, a memory, a processor, and a stigmatization circuit. The sensor includes an optical detector located in the housing and operatively connected to the controller. The data reader is operatively connected to the controller and is adapted to read the bar code. The transport mechanism is located in the housing and is operatively connected to the controller. The transport mechanism includes at least one roller, a plurality of ticket sensors, and a motor. The roller is effective to transport the probability lottery ticket through the document channel such that at least a portion of the play spots is substantially aligned with the sensor and such that the bar code is substantially aligned with the data reader. The scanning circuit is operatively connected to the sensor and to the controller and scans at least a portion of the probability lottery ticket for the player removable material covering the play spots and generates a validation signal indicating which, if any, of the player removable material covering the play spots has been removed from the probability lottery ticket. The memory is operatively connected to the controller and contains data representing the probability lottery ticket, including at least a portion of the validation data obtained from the data reader, and removed play spot data obtained from the validation signal. The processor is operatively connected to the controller and the memory and relates the portion of the validation data to the removed play spot data to verify the probability lottery ticket and to cause the transport mechanism to exit the probability lottery ticket from the document channel. The stigmatization circuit is operatively connected to the processor and is adapted to change at least a portion of a color of the probability lottery ticket prior to the transport mechanism exiting the probability ticket from the document channel.

BRIEF DESCRIPTION OF THE DRAWINGS

FIG. 5 is a plan drawing of the second layer printed on the ticket in FIG. 1;

FIG. 6 is a plan drawing of the third layer printed on the ticket in FIG. 1;

FIG. 11 is a plan drawing of the fifth and sixth layers printed on the ticket in FIG. 1;

FIG. 12 is a plan drawing of the seventh layer printed on the lottery ticket on FIG. 1;

FIG. 16 is a plan drawing of the user interface of the electronic verification machine in FIG. 14;

FIG. 17 is a block diagram of the major internal components of the electronic verification machine in FIG. 14;

FIG. 18 is a block diagram of the circuitry of the electronic verification machine in FIG. 14;

FIG. 19 is a plan drawing of the partial printed circuit used to determine the authenticity and integrity of the bar code of the ticket in FIG. 1;

FIG. 20 is a plan drawing of the partial printed circuit used to determine the authenticity and integrity of the play spot areas of the ticket in FIG. 1;

FIG. 21 is a plan drawing of another printed partial circuit which can be used to determine the authenticity and integrity of a probability lottery ticket;

FIG. 22 is a schematic circuit diagram of the completed circuit which is formed when the partial circuit in FIG. 20 is coupled to an electronic verification machine;

FIG. 42 is a perspective view of an alternative position sensor array that can be used with the electronic verification machine of FIG. 38;

FIG. 43 is a plan view of a first lottery ticket suitable for use with the electronic verification machine of FIG. 38;

FIG. 44 is a game signature map representing the location of a scratch-off coating having conductive material on the lottery ticket of FIG. 43;

FIG. 45 is a data map representing the data out put of the electronic verification machine of FIG. 38 for the lottery ticket of FIG. 43;

FIG. 47 is an illustrative top view of the pull-tab lottery ticket of

FIG. 46 in conjunction with a signature map;

FIG. 55 is a plan drawing of one of the circuit elements in FIG. 49 as printed on the first blocking layer in FIG. 52;

FIG. 56 is a plan drawing of one of the circuit elements in FIG. 49 as printed on the first blocking layer in FIG. 53;

FIG. 57 is a plan drawing of one of the circuit elements in FIG. 49 as printed on the first blocking layer in FIG. 54;

FIG. 58 is a plan drawing of a masking layer that is apart of the ticket shown in FIG. 49;

FIG. 65 is a plan drawing of an upper blocking layer that is part of the ticket shown in FIG. 49;

FIG. 66 is a plan drawing of an alternative embodiment of the upper blocking layer in FIG. 65;

FIG. 79 is a plan drawing is a plan drawing of the play indicia which are part of the marker card in FIG. 77;

FIG. 80 is a plan drawing of a seal coat which is part of the marker card in FIG. 77;

FIG. 81 is a plan drawing of a release coat that is part of the marker card in FIG. 77;

FIG. 82 is a plan drawing of an alternative embodiment of the release coat shown in FIG. 81;

FIG. 89 is a plan drawing of a scratch-off layer that is part of the ticket shown in FIG. 77;

FIG. 90 is a plan drawing of a data card according to the invention;

DETAILED DESCRIPTION OF THE INVENTION

I. General Overview

Figure 1:
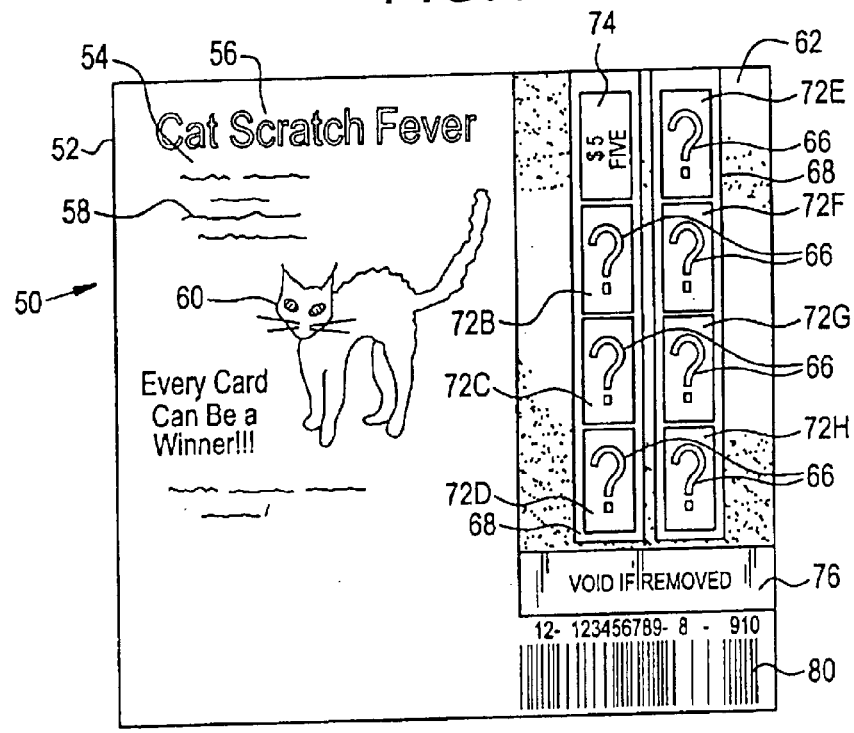
FIG. 1 is a plan drawing of a probability lottery ticket having an electrical signature according to the invention.

The present invention is directed to a system and to an interrelated group of devices for determining the authenticity and integrity documents. In particular, the present invention is directed to a system for validating lottery tickets, including instant lottery tickets and probability lottery tickets. "Document", as that term is used herein, is not limited to conventional printed papers but includes any type of flexible substrate as well as rigid substrates such as printed circuit boards. A document is authentic if it is not the product of counterfeiting. The integrity of a document relates to its current physical state as compared to its initial physical state and is affected by unauthorized modifications or attempted modifications of the document by, for example, subjecting the document to chemicals, heat, light, or pressure. The electrical characteristics of the printed circuit or the location of the conductive material provide the basis for determining both the authenticity and the integrity of the document. These characteristics can also be used to obtain data from the document.

A first method is to choose a predetermined, measurable electrical property, for example, a known resistance or capacitance, that will serve as the electrical signature of the document. Next, at least a portion of an electrical circuit is printed on the document using conductive or semi-conductive inks. The electrical circuit is designed so that when the circuit is completed, the circuit will generate an electrical signature that is substantially equal to a chosen predetermined electrical signature. Last, the circuit on the document is coupled to an electronic verification machine for determining the authenticity and integrity of the document by comparing the signal characteristics of the circuit on the document to the predetermined signature.

The electronic verification machine provides at least three functions. First, the electronic verification machine completes the circuit and provides a power source for exciting the circuit. Second, the electronic verification machine measures the resulting electrical signature of the document. And third, the electronic verification machine determines whether the measured electrical signature is substantially the same as the predetermined electrical signature. There are a number of ways in which the electronic verification machine can determine the authenticity and integrity of the document. The electronic verification machine can directly determine the authenticity and integrity of the document by using data directly available to the electronic verification machine. Alternatively, the electronic verification machine can indirectly determine the authenticity and integrity of a document by communicating the measured electrical signature to a remote computer which contains data related to the predetermined electrical signature for the document. Determining the authenticity and integrity of the document is, in its simplest form, a logical progression. Generally, if an electrical signature can not be measured, the document is not authentic, is not in its original integral state, or both. On the other hand, if an electrical signature can be measured and the measured electrical signature is substantially the same as the predetermined electrical signature, the document can be assumed to be authentic and in its original integral state. If an electrical signature can be measured but is substantially different than the predetermined electrical signature, at the very least the document is not in its original integral state. This method will be explained in terms of a representative document which in this case is a probability game lottery ticket.

A second method is similar to the first method but involves the determination of the location of conductive materials on the document. This method will be explained in conjunction with the second embodiment of the electronic verification machine.

II. Probability Game Lottery Ticket Configuration.

The preferred embodiment of the invention is system that can be used to validate lottery tickets, including instant lottery tickets and probability game lottery ticket. An instant lottery ticket typically includes a group of play areas or play spots, each containing play indicia covered by an opaque player removable material. In general, not every instant lottery ticket includes winning play indicia. Thus, only those lottery tickets which include winning play indicia are winning tickets for which a prize is awarded. Similar to an instant lottery ticket, a probability game lottery ticket typically includes a group of play areas or play spots, each containing play indicia covered by an opaque material, usually a latex material. However, in a probability lottery game each probability lottery ticket includes at least one winning play indicia. Consequently, probability lottery tickets also have pre-determined play rules which must be followed for a ticket to be qualified as a winning ticket. Generally the player is instructed to rub off only a specified number of play spots. If a player rubs off more than the number of spots specified in the pre-determined play rules, the ticket is void and player automatically loses even if a winning play indicia is revealed. For example, a particular probability lottery game may require a player to rub off three play spots. In this case, if the player rubs off only three play spots and in so doing reveals a winning play indicia, the ticket is a winning ticket and has a redemption value equal to the value or value code of the winning play indicia. On the other hand if the removed play spots do not reveal any winning play indicia the redemption value of the ticket will be zero.

FIG. 1 illustrates the final printed format of a probability game ticket 50 according to one embodiment of the invention. The ticket 50 includes a card substrate 52 which is generally divided into two portions. A first portion 54, the display portion, contains various types of printed information such as the name 56 of the probability game, information 58 related to the rules for playing the ticket, and customized art work 60. A second portion, the playing field portion 62, includes overprint areas 66, 68 and 76. The square overprint areas 66 define a group of play spot areas 72A–H of the ticket 50. As shown in FIG. 1, the overprint area of one play spot area 72A has been rubbed off the reveal the underlying play indicia 74. The play indicia 74 can take any on a variety of forms including, as shown here, a dollar value. The play indicia 74 can also be formed from letters or words alone, numbers alone, or symbols alone, or any combination of letters, numbers, or symbols. Although not illustrated, it is to be understood that play indicia similar to play indicia 74 underlie each of the play spot areas 72B–H.

The overprint area 76 defines the void-if-removed area of the ticket 50. A validation number 78, shown in FIG. 8, underlies the void-if-removed area defined by the overprint area 76. The validation number 78 contains various types of security information including a portion that is usually algorithmically related to the pack number and ticket number for a particular ticket, such as the ticket 50. The pack number identifies the pack from which the ticket 50 originates. The ticket number relates to the position of the ticket 50 within the pack. In addition as will be explained below, the validation number 78 can also include information related to the electrical signature(s) of the ticket 50. The validation number 78 is useful for determining the authenticity and integrity of the ticket 50, as explained in greater detail below, in Section V.

A bar code 80 is also printed within the playing field portion 62 of the ticket 50. The bar code 80 can include information related to the validation number, the pack and ticket numbers for the ticket 50 and to the redemption values of various combinations of the play indicia 74 in each of the play spot areas 72A–H. The bar code 80 can also be used to store information about the value of the play indicia 74 on the ticket 50, as is explained in greater detail below, in Section V.

Figure 2:
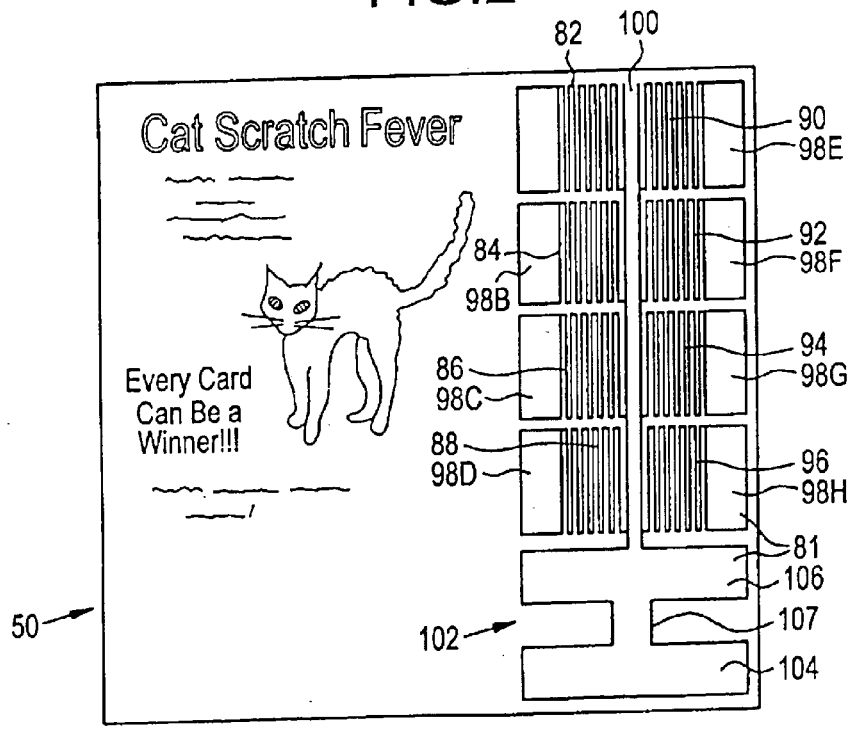
FIG. 2 is a plan drawing of the partial electrical circuit that provides the card in FIG. 1 its electrical signature.

FIG. 2. illustrates a partial electrical circuit 81 which is interposed between the overprint areas 64–68 and the play indicia 74 of the ticket 50 shown in FIG. 1. In the preferred embodiment, the circuit 81 includes eight resistor tracks 82–96 which are divided into two columns of four resistor tracks each. Each resistor track 82–96 underlies the overprint areas 68 shown in FIG. 1 which define each of the play spot areas 72A–H in FIG. 1. In addition, each resistor track 82–96 overlies a play indicia such as 74. Eight conductive or capacitive pick-up areas 98A–H are located around the periphery of the resistor tracks 82–96 and a central conductive track 100 is located between the two columns of resistor tracks 82–96. The central conductive track 100 is connected to a conductive I-track shown at 102 which includes a terminal conductive bar 104 and a second conductive bar 106 parallel to and spaced apart from the terminal conductive bar 104. A resistive track 107 connects the terminal conductive bar 104 to the second conductive bar 106. In the final printed format, such as that shown in FIG. 1, the terminal conductive bar 104 underlies the bar code 80.

Each resistor track 82–96 is electrically connected to the central conductive track 100 and to one of the conductive areas 98A–H, for example, resistor track 82 is electrically connected to central conductive track 100 and to conductive area 98A. The conductive areas 98A–H and the central conductive track 100 are used to capacitively couple the ticket 50 to an electronic verification machine 108, such as that illustrated in FIG. 14. In the preferred embodiment, each conductive area 98A–H acts as a capacitor plate, the other capacitor plate being provided by the electronic verification machine 108. In addition, the central conductive track 100 also acts as a capacitor plate, the second capacitor plate being provided by the electronic verification machine 108. The capacitive coupling of the conductive areas 98A–H and the central conductive track 100 to the electronic verification machine 108 completes the printed circuit 81 and permits the electronic verification machine 108 to excite the circuit and to measure the electrical signature or signatures of ticket 50. Since the capacitive coupling of the conductive areas 98A–H and the central conductive track 100 to the electronic verification machine 108 permits the electronic verification machine 108 to measure the electrical signature(s) of ticket 50, areas 98A–H and track 100 are also known as capacitive pick-up areas because through these areas the electronic verification machine 108 "picks-up" the electrical signature of ticket 50.

Because each of the resistor tracks 82–96 is electrically connected to both the central conductive bar 100 and to one of the conductive areas 98A–H, each of the resistor tracks 82–96 forms a complete circuit when the ticket 50 is coupled to the electronic verification device 108. Thus each of the resistor tracks 82–96 has its own electrical signature equal to the printed resistance of the resistor track. As shown in FIG. 2, each of the four resistor tracks in the two columns has the same resistance. Since each of the resistor tracks 82–96 is electrically connected to its associated conductive area 98A–H, the integrity of the eight circuits containing the eight resistor tracks 82–96 can be determined by reference to the specific conductive area 98A–H used to measure the electrical signature. Alternatively, each resistive track may have a unique resistance. For example, the resistor track 82 can have a resistance of 100 KΩ, the resistor track 84 can have a resistance of 300 KΩ, the resistor track 86 can have a resistance of 500 KΩ, and the resistor track 88 can have a resistance of 2700 KΩ. Similarly, the resistor tracks 90–96 can have resistances of 100 KΩ, 300 KΩ, 500 KΩ, and 700 KΩ respectively. As is explained in greater detail in Sections III and IV.C.1., the magnitude of the resistance for a specific resistor track is a function of the type of ink used to print the resistor track, the length of the resistor track and the cross-sectional area, including the thickness, of the resistor track. Differences in the four resistances 82–88 or 90–96 in a given column of resistor tracks facilitate the determination of the authenticity and the integrity of the ticket 50 and more particularly can be used to determine which of the overprint areas 68 have been rubbed off.

Circuit 81, as shown in FIG. 2, is actually a composite of several layers used to print ticket 50. The following section describes in detail the sequence and relationship of the various layers used to print ticket 50.

III. Printing the Electrical Signature

In the preferred embodiment, the circuit 81 is printed onto the ticket 50 preferable via a gravure printing process. The gravure printing process allows for the widest range of ink and coating formulations. The gravure printing process, however, is not the only printing process that can be used to print the circuits. Gravure is only one type of intaglio printing process. Other types of intaglio printing processes can be used as well. In addition, the circuit 81 can be printed via screen printing, relief printing, planographic printing, letterpress and flexographic printing. In the preferred embodiment, the ticket 50 is printed on a paper substrate. Paper substrates are preferred because they offer good insulation and absorbency. Alternatively, the ticket 50 could be printed on a plastic or a metal, such as an aluminum foil, substrate. If a foil substrate is used, portions of the foil can serve as the main conductor for the ticket 50, while other portions of the ticket 50 are covered with an insulating layer.

Figure 3:
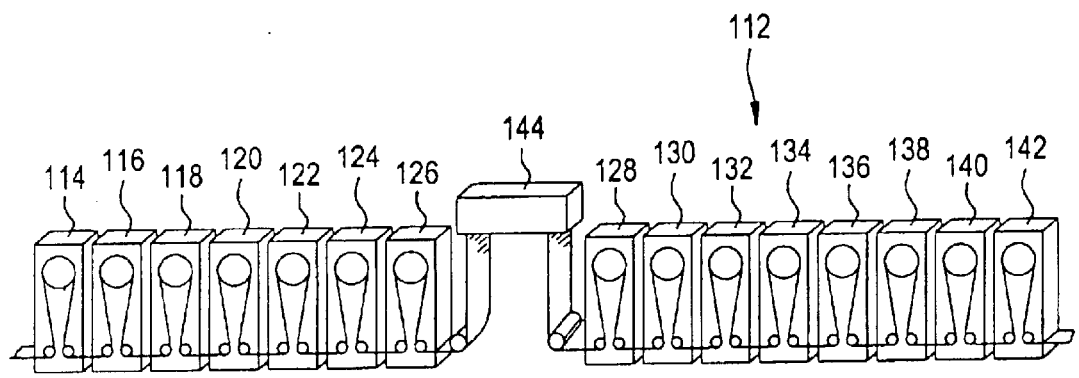
FIG. 3 is a schematic representation of a gravure printing press used to print the ticket in FIG. 1.

FIG. 3 is a schematic diagram representing a gravure printing press 112 suitable for printing ticket 50. The press 112 has fifteen gravure printing stations 114–142 and one ink jet station 144. As is explained in more detail below, each of the press stations 114–142 prints one layer on the ticket 50 while the ink jet printer 144 prints the play indicia 74 and the bar code 80.

Figure 4:
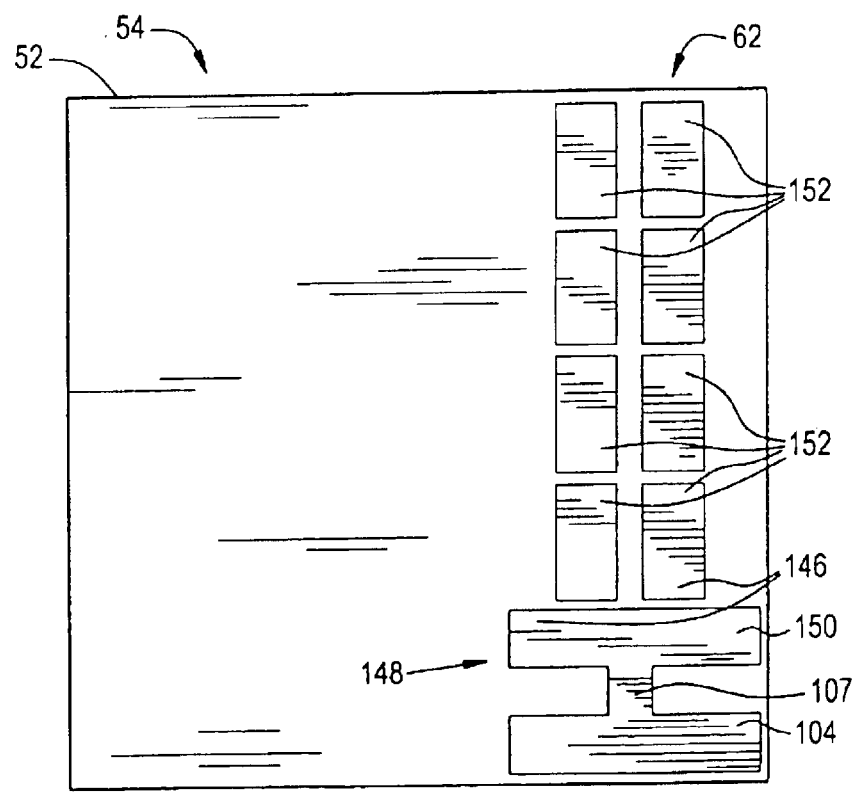
FIG. 4 is a plan drawing of the first layer printed on the ticket in FIG. 1.

Station 114 prints a first layer or surface 146 which is shown in FIG. 4. The first layer 146 is printed with a conductive-carbon based ink and forms a part of the circuit 81 shown in FIG. 2. The first layer 146 includes two portions the first of which is an I-track 148. The I-track 148 includes the terminal conductive bar 104 and the resistive track 107 which form part of the I-track 102 illustrated in FIG. 2. A second conductive bar 150 of the I-track 148 underlies the second conductive bar 106 of the I-track 102 of FIG. 2. The second portion of the first layer 146 consists of a pair of rows of blocking cells 152. Each of the blocking cells 152 is positioned to underlie one of the play indicia 74 which are subsequently printed on the ticket 50.

The ink used to print the layer 146 should have a sheet resistivity below 2,700 $\Omega/\square$ preferably in the range of 1,000 $\Omega/\square$ to 1,300 $\Omega/\square$. In the ticket 50 shown in FIGS. 1–13, the ink used to print the lower conductive layer 146 would most desirably have a sheet resistivity of 1,200 $\Omega/\square$. "Sheet resistivity" ($\rho s$), as that term is used herein, is the bulk resistivity of the ink ($\rho$) divided by the thickness of the film of ink (t) printed on the ticket 50.

$$\rho s = \rho/t.$$

Sheet resistivity ($\rho s$) will typically be expressed in terms of ohms/square ($\Omega/\square$). In practice, the sheet resistivity of an ink is determined by printing and measuring the resistance of a unit length and width.

The resistance (R) of a specific resistor in turn is a function of the bulk resistivity of the material and the dimensions of the resistor:

$$R = \rho(l/tw)$$

where $\rho$ is the bulk resistivity of the material used to make the resistor, l is the length of the resistor, t is the thickness of the resistor and w is the width of the resistor. Substituting the previous equation for sheet resistivity into the equation for resistance yields the following:

$$R = \rho s(l/w)$$

Thus, the resistance of a resistor printed with a conducting or semi-conducting ink is a function of the sheet resistivity of the ink, the length of the printed resistor, and the width of the printed resistor. For example, the resistance of a printed resistor with an ink having $\rho s = 100$ $\Omega/\square$ which is 0.120 inches (0.3048 cm) long and 0.040 inches (0.1016 cm) wide would be:

$$R = \rho s(l/w) = 100 \ \Omega/\square (0.0120/0.040) = 300 \ \Omega.$$

The ink used to print the first layer 146 should also have very good adhesive properties so that the layer 146 adheres well to the ticket 50 and should have good abrasion resistance properties so that the layer 146 is not easily rubbed off the ticket 50. A preferred formulation for the ink used to print the first layer 146 is given in Table 1.

TABLE 1

| Preferred Ink Formulation For Layer 1 | |
|---|---|
| material | wt % |
| Acrylic Resin | 12–18% |
| Pentaerythritol ester of modified rosin | 2–6% |
| Conductive carbon | 14–20% |
| Polyamine amide/acidic ester dispersant | 0.3–1.0% |
| 2-ethyhexyl diphenyl phosphate plasticizer | 2–5% |
| Anhydrous ethyl alcohol | 20–30% |
| Normal Propyl acetate | 23–33% |
| 50/50 mixed solvent, normal propyl acetate and ethyl alcohol | 5% |
| 950 varnish | 5% |

The 950 varnish comprises 36.24% normal propyl acetate, 24.92% DM55 acrylic, 12.92% pentalyn 830, 17.92% nitro varnish, and 3% santicizer 141. The preferred formulation provides a film former, solvent based ink. Film formers are polymers capable of being plasticized to form a continuous and totally flexible ink. In the preferred formulation, the solvent evaporates from the printed surface during drying leaving a continuous, conductive dry ink film. Preferably, the conductive carbon will be about 2–20 $\mu$ in size in this formulation.

The first layer 146 serves at least two purposes. First, the solid black nature of the blocking cells 152 of the first layer 146 serves to prevent unauthorized detection of the play indicia 74, for example, by shining a bright light through the ticket 50. Second, the I-track 148 can be used to protect the bar code 80 against unauthorized modifications, by providing an electrical signature for the bar code 80 which can be measured by the electronic verification machine 108. It should be noted that in some cases, especially where the ticket 50 does not include the blocking cells 152, it may be desirable to print an opaque blocking layer between the substrate 52 and the play indicia 74.

Station 116 prints the second layer 156 which is shown in FIG. 5. The second layer 156 has two portions: an upper portion 156*a* and a lower portion 156*b*. The upper portion 156*a* overlies all of the blocking cells 152 of the first layer 146 shown in FIG. 4. The lower portion 156*b* overlies the terminal conductive bar 104 and the resistive track 107 of the I-track 148 of the first layer 146. The gap between the upper portion 156*a* and the lower portion 156*b* exposes the second conductive bar 150 of the I-track 148 of the first layer 146. The second layer 156 acts as a blocking layer to prevent the first layer 146 from obscuring observation of the play indicia 74 when the ticket 50 is played. A suitable formulation for the second blocking layer 156 is disclosed in U.S. patent application Ser. No. 08/004,157 the entire disclosure of which is hereby incorporated by reference.

A third layer 158 is then printed by the printing station 118. The placement of the third layer 158 is essentially coincident with the second layer 156, as shown in FIG. 6. The third layer 158 also includes a upper portion 158*a* and a lower portion 158*b* separated by a gap which exposes the second conductive bar 150 of the I-track 148. The third layer 158 is a primer layer which provides a suitable surface for printing the play indicia 74. A suitable formulation for the third primer layer is disclosed in Walton, U.S. Pat. No. 4,726,608.

Figure 7:
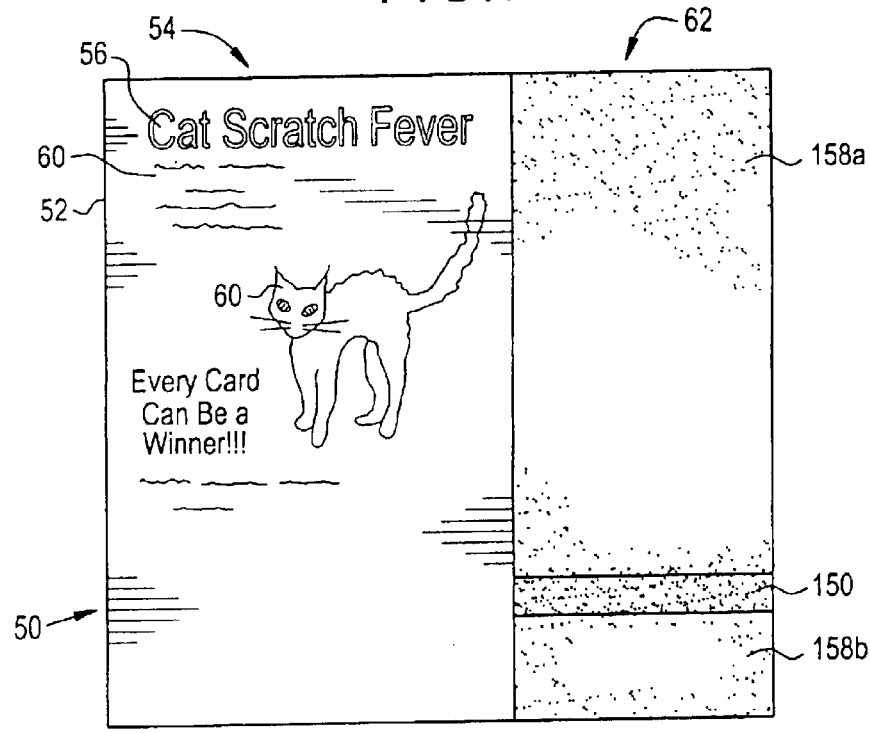
FIG. 7 is a plan drawing of customized graphics printed on the first portion of the ticket in FIG. 1.

Printing stations 120–126 provide the features printed on the display portion 54 of the ticket 50, as shown in FIG. 7. These printed features include the name 56 of the probability lottery game, information 58 related to the rules for playing the game, and customized art work 60. Because 4 different printing stations 120–126 are used to print these features, as many as four different colors of ink can be used to print process colors.

Figure 8:
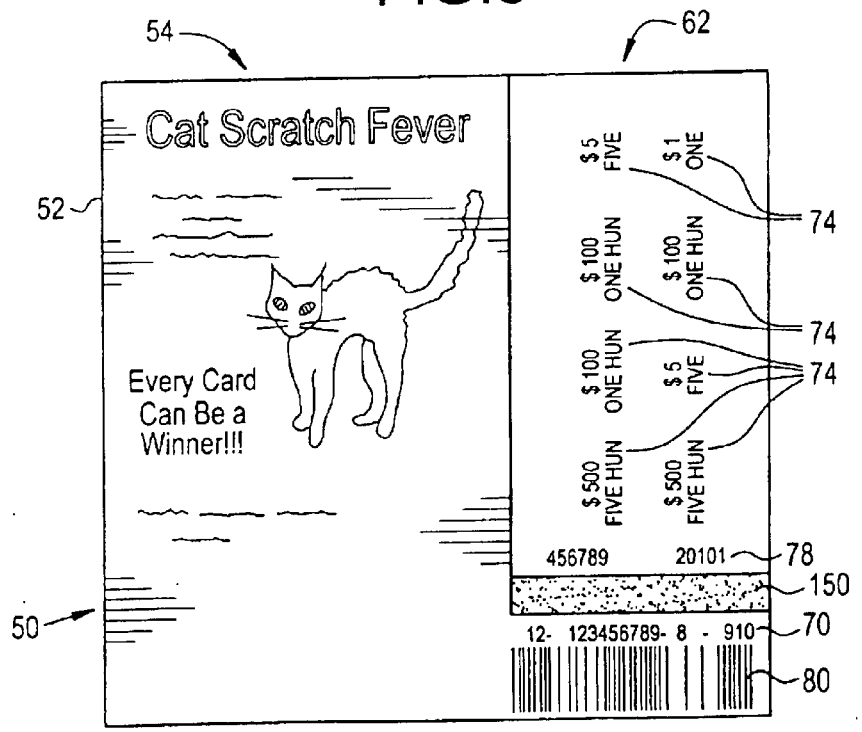
FIG. 8 is a plan drawing showing the placement of the play indicia, validation number, inventory control number, and bar code which are printed on the ticket in FIG. 1.

The ink jet printer 144 prints the play indicia 74 on a portion of the third layer 158, as shown in FIG. 8. In the preferred embodiment, there are two columns of play indicia 74, each of which contains four separate play indicia 74. The two rows of play indicia 74 are positioned so that each separate play indicia 74 overlies one of the blocking cells 152 of the first layer 146 shown in FIG. 4. The ink jet printer 144 also prints the inventory control number 70, the validation number 78, and the bar code 80 on the ticket 50. In the preferred embodiment, the inventory control number 70, the play indicia 74, the validation number 78, and the bar code 80 are printed with a water-based dye.

Figure 9:
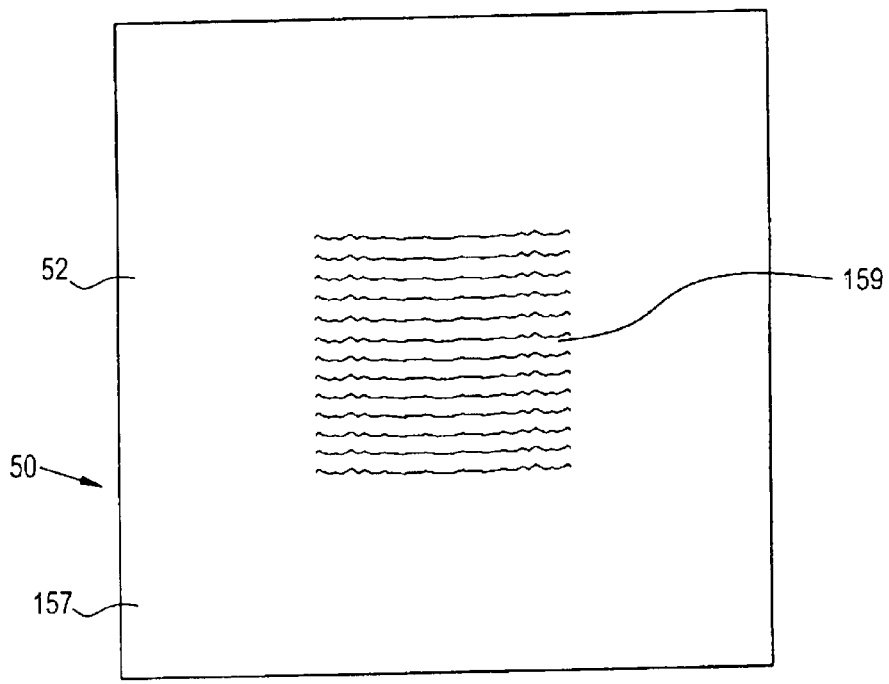
FIG. 9 is a plan drawing of the back of the ticket in FIG. 1.
Figure 10:
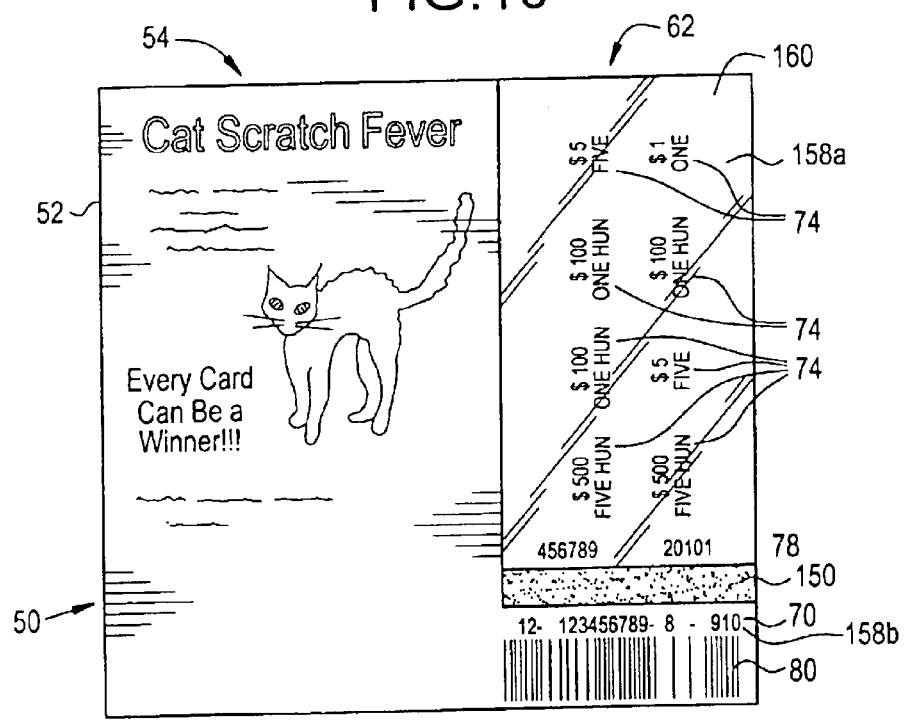
FIG. 10 is a plan drawing of the fourth layer printed on the ticket in FIG. 1.

Printing station 128 prints the back 157 of the ticket 50 as shown in FIG. 9. The back 157 may include additional information 159 related to the rules for playing the ticket 50.

The print station 130 prints a fourth layer 160 on the ticket 50. The fourth layer 160 is indicated by the shaded portions in FIG. 10. The fourth layer covers the upper and lower portions 158a, 158b of the third layer 158 shown in FIG. 7, and also covers the play indicia 74, the inventory control number 70, the validation number 78, and the bar code 80. In the same manner as the second and third layers 156 and 158, the fourth layer does not cover the second conductive bar 150 of the I-track 148. The fourth layer 160 is a seal coat which protects the inventory control number 70, play indicia 74, the validation number 78, and the bar code 80 from abrasion and from liquids in which the play indicia 74, the validation number 78, and the bar code 80 are soluble. Suitable materials for this purpose include various polymer materials such as acrylics, polyester urethane, epoxy acrylate, and vinyl polymer. A suitable formulation for the third primer layer 158 of FIG. 6 is disclosed in Walton, U.S. Pat. No. 4,726,608.

The print stations 132 and 134 print a fifth and a sixth layer 162 on the ticket 50. As shown in FIG. 11, the fifth and sixth layers 162 are printed as discrete sections which overlie the play indicia 74 and the validation number 78. The fifth and sixth layers 162 are indicated by the shaded areas overlying the play indicia 74 and the validation number 78. The fifth and sixth layers 162 are both substantially transparent release coats which allow the play indica 74 to be viewed by the player and at the same time permit an easy removal of subsequent layers by, for example, rubbing the ticket 50 with a fingernail. The same release coat formula on may be used to print both the fifth and sixth layers 162. A suitable formulation for the third layer is disclosed in Walton, U.S. Pat. No. 4,726,608. Also, in some cases it may be desirable to use an ultraviolet curable seal-release coat in place of the release coats 162. Such seal-release coats are well known in the art.

The print station 136 prints a seventh layer 164 which comprises the remainder of the electrical circuit 81 shown in FIG. 2 which is printed on the ticket 50. As illustrated in FIG. 12, the seventh layer 164 is a patterned layer which includes the resistor tracks 82–96 and the conductive areas 98A–H. The seventh layer 164 also includes the conductive bar 106 of the I-track 102 shown in FIG. 2. As explained earlier, the resistor tracks 82–96 are connected to the conductive areas 98A–H. The resistor tracks 82–96, as printed thus have electrical continuity with the conductive areas 98A–H and conductive track 100.

The relationship between the first layer 146 and the seventh layer 164 is better understood with reference to FIGS. 19 and 20 which are respectively plan drawings of the first layer 146 and of the seventh layer 164 alone. As noted earlier, the first layer 146, shown by itself in FIG. 19, consists of the blocking cells 152 and the I-track 148. The I-track 148 includes the terminal conductive bar 104 and the resistive bar 107. The seventh layer 164, shown by itself in FIG. 20, consists of the resistive tracks 82–96, the conductive areas 98A–H, the central conductive track 100 and the conductive bar 106. The seventh layer 164 is positioned on the ticket 50 so that the conductive bar 106 of the seventh layer overlies the conductive bar 150 of the first layer 146 to form the partial circuit 81 as illustrated in FIG. 2. The overlying relationship of conductive bars 106 and 150 ensures electrical continuity between the first layer 146 and the seventh layer 164.

It is desirable that the ink used to print the seventh layer 164 have a sheet resistivity at least in the range of 300 Ω/□ to 600 Ω/□ and preferably, the sheet resistivity should be below 300 Ω/□. Several parameters can be varied to reduce the sheet resistivity of an ink. For example, the shape and size of the conductive particles affects the sheet resistivity of the ink. In addition, metal pigments tend to reduce the sheet resistivity as does a high pigment to binder ratio. However, both metal pigment and a high pigment to binder ratio tend to reduce the graphic adhesiveness of the ink. Unlike the ink used to print the first layer 146, the ink used to print the seventh layer 164 need not have exceptional adhesive properties because the seventh layer 164 or portions thereof are designed to be removed to reveal the play indicia 74 when the ticket 50 is played. Consequently, the ink used to print the seventh layer 164 on the ticket 50, or circuits on other types of documents where the adhesive qualities of the ink are not a major consideration, can include metal particles and can have a relatively high pigment to binder ratio. The use of metal particles in place of or in addition to carbon particles can substantiality increase the conductivity of the ink.

A preferred ink formulation for the seventh layer 164 is given in

TABLE 2

Preferred Conductive Ink Formulation For Layer 7

| material | wt % |
| --- | --- |
| Acrylic resin | 10–15% |
| Pentaerythritol ester of modified rosin | 1–5% |
| conductive carbon | 5–15% |
| silver plated copper particles (5–10μ) | 10–25% |
| polyamine amide/acid ester dispersant | 0.25–0.75% |
| anhydrous ethyl alcohol | 25–35% |
| normal propyl acetate | 28–38% |

Although the preferred metal particles are sliver plated copper particles, other conductive metal particles such as aluminum, brass, nickel, iron and iron oxide particles can be used as well. However, it should be noted that nickel may not be suitable for use in certain types of documents since it can be toxic if ingested. Also, in addition to sliver, the metal particles can be plated with gold or tin.

Figure 13:
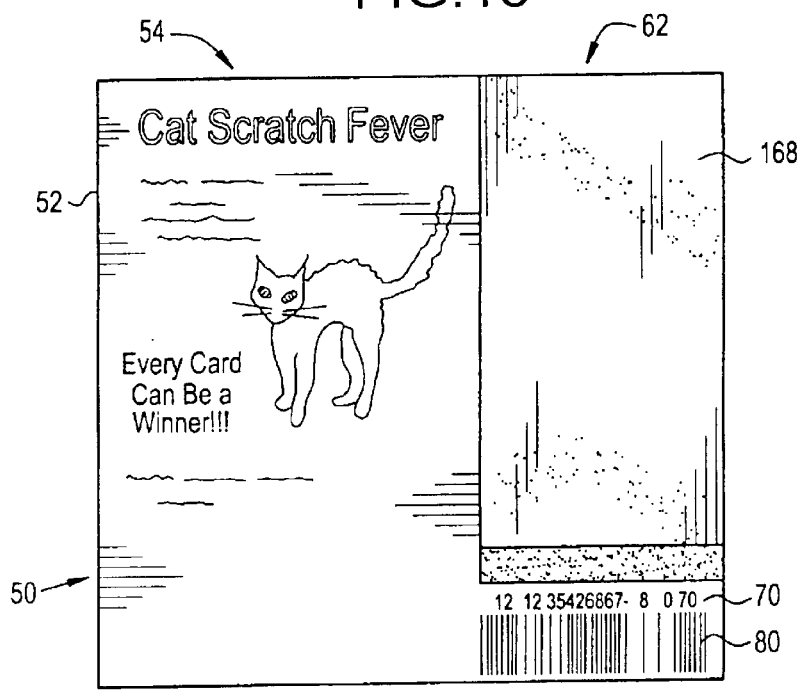
FIG. 13 is a plan drawing of the eighth layer printed on the lottery ticket in FIG. 1.

An eighth layer 168, preferably a scratch-off latex material, is applied at printing station 138. As shown in FIG. 13, the eighth layer 168 covers most of the playing field portion 62 of the ticket 50. The eighth layer 168 does not cover the inventory control number 70 or the bar code 80. The eight layer 168 does, however, overlie the conductive bar 102 of the seventh layer 164. The final printing stations 138, 140, and 142 apply overprint graphics such as overprint areas 66, 68, and 76 illustrated in FIG. 1. The square overprint areas 68 serve to visually identify the individual play spot areas 72A–H and the overprint area 76, which overlies the validation number 78, is printed with the instruction "void if removed."

IV. Measuring the Printed Electrical Signature

A. An Electronic verification Machine

Figure 14:
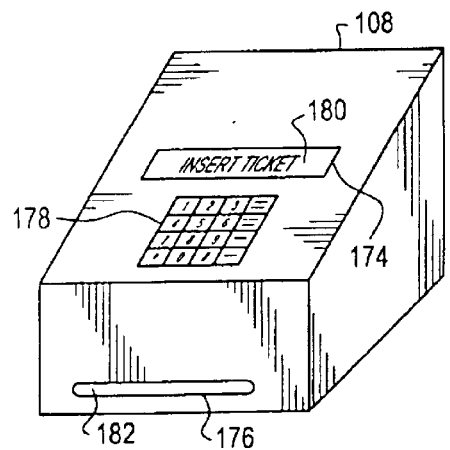
FIG. 14 is a perspective view of an electronic verification machine according to the invention.

As stated earlier, the circuit 81 on the ticket 50 is completed when the ticket 50 is capacitively coupled to the electronic validation or verification machine 108 which then can measure the electrical signature of the circuit elements such as resistors 82–96 on the ticket 50. FIG. 14 is a stylized perspective view of an exterior of the electronic verification machine 108. Although the exact configuration of the exterior of the electronic verification machine 108 can vary, the exterior of the electronic verification machine 108 has three features: a results indicator 174, a ticket interface 176, and a user interface 178. As shown in FIG. 14, the results indicator 174 of the electronic verification machine 108 is a display panel 180. The display panel 180 can display the results of a ticket validation operation and can also display the results of verification testing, including tests of the authenticity and integrity of the ticket 50. The display panel 180 can also display instructions, such as "Insert Ticket", concerning the use of the electronic verification machine 108. In place of or in combination with the display panel 180, the electronic verification machine 108 can communicate with a printer 181 shown in FIG. 17 which can display the results of the ticket validation operation and verification testing as well. The user interface 178 can be a keyboard which the player or an agent can use to manually enter data from the ticket into the electronic verification machine.

A ticket interface 176 of the electronic verification machine 108 includes a ticket slot 182 into which the ticket 50 can be inserted. When the ticket 50 is properly inserted into the ticket slot 182, the conductive areas 98A–H, 100, and 106 are aligned with an array of capacitor plates 226A–H, 228 and 230, as shown in FIG. 18, located within the electronic verification machine 108, to complete the partial circuit 81 printed on the ticket 50. In addition, the bar code 80 is aligned with a bar code reader 210 (not shown) located within the electronic verification machine 108.

Figure 15:
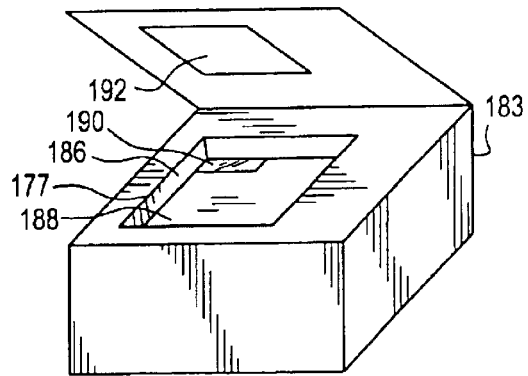
FIG. 15 is a perspective view of an alternative embodiment of an electronic verification machine according to the invention.

FIG. 15 is a stylized plan drawing of an alternative embodiment of an electronic verification machine 183 having a different type of ticket interface 177. In this embodiment the electronic verification machine 183 has a hinged lid 184 which can be raised to expose the ticket interface 177 which includes a ticket recess 186. Within the ticket recess 186 is a sensor area 188 containing an array of capacitor plates (not shown) which align with the capacitor areas 98A–H, 100, and 106 on the ticket 50. The ticket recess 186 also includes a bar code reader area 190. The ticket 50 is placed within the ticket recess 186 such that the bar code 80 can be read through reader area 190 by a bar code reader 210 located within the electronic verification machine 183 as illustrated in FIG. 17. The electronic verification machine 183 can also have a second sensor area 192 also containing capacitor plates (not shown) which align with the conductive areas 98A–H, 100, and 106 on ticket 50.

FIG. 16 is a plan view of the preferred embodiment of the user interface keyboard 178. The user interface 178 includes a numeric key pad 196 and a set of operation keys 198–204. The operation key 200 is used to input the validation number 78 of the ticket 50 into the electronic verification machine 108 and the operation key 198 is used to manually input the bar code 80 of the ticket 50 into the electronic verification machine 108. Keying in of the bar code 80 may be necessary if the bar code reader 210 is not able to read the bar code because, for example, the bar code 80 is damaged or perhaps has been tampered with.

FIG. 17 is a sectioned side view which includes a block diagram of the major internal components of the electronic verification machine 108. The electronic verification machine includes the bar code reader 210, and a ticket sensor 212. The ticket sensor 212 senses when the ticket 50 has been properly inserted so that the bar code 80 can be read by the bar code reader 210. When the ticket is properly inserted the conductive areas 98A–H, 100, and 106 of the ticket 50 are aligned with a pair of sensor plates, indicated at 214 and 216, which include an array of copper capacitor plates 226A–H, 228 and 230, shown in FIG. 18, positioned in a configuration which mirrors that of the conductive or capacitor areas 98A–H, 100, and 106 of the ticket 50. The sensor plates 214, 216 are part of a sensor head 218 which contains a set of excitation and detection circuitry for the electronic verification machine 108. The electronic verification machine 108 also includes a processor board 220, including a microprocessor and memory, and a communications interface 222.

The excitation and detection circuitry of the sensor head 218 includes a microcontroller 224 with associated memory as shown in FIG. 18. The microcontroller 224 provides the necessary logic to control the electronic verification machine 108 and performs various tasks including controlling the communications interface 222, the user interface 178, and the bar code reader 210. The microcontroller 224 also processes the measured electrical signature of the circuit elements 82–96 on the ticket 50 that can be used to determine the authenticity and integrity of the ticket 50. Because the microcontroller 224 requires relatively little processing power, a single, self-contained IC can be used to provide inexpensive processing. Examples of acceptable chips include the Motorola 68HC711E9 and the Intel MCS®-51 Series microcontrollers. Each of these chips includes a Random Access Memory ("RAM") and a Programmable Read Only Memory ("PROM") and an Analog to Digital converter ("A/D ").

As is explained in greater detail below, in Section V., the bar code 80 can include information regarding the value of the play indicia 74 of the ticket 50. The bar code reader 210 communicates directly with the microcontroller 224 via an ANSI standard interface, for example, UART. In the preferred embodiment, the bar code reader 210 is a laser scanner.

The communications interface 222 generally is a serial digital interface which may be a driver IC or a modem chip set. As is explained in more detail in Section V. below, the serial digital interface 222 allows the electronic verification machine 108 to communicate with a central host computer 223 when necessary to determine the authenticity or integrity of the ticket 50. In the preferred embodiment, a non-standard interface or a low-level encryption is included in the design of the serial digital interface 222 in order to enhance the security of communications between the electronic verification machine 108 and the central computer 223.

In operation, the excitation and detection circuitry of the sensor head 218 is capacitively coupled with the partial circuit 81 printed on the ticket 50 to complete the circuit 81. Thus, a complete circuit 225 including the partial circuit 81 on the ticket 50, as shown in FIG. 21, is completed 81 when the ticket 50 is placed within the ticket slot 182 in the sensor head 218. It should be noted that the excitation and detection circuitry can also be coupled to the ticket 50 by various other methods including: direct coupling, inductive coupling, radio frequency coupling and optical coupling, as described below in Section IV.E.

In the preferred embodiment of the electronic verification machine 108, the sensor head 218 of the electronic verification machine 108 is capacitively coupled to the circuit 81 on the ticket 50 to complete the circuit 81. A block circuit diagram of the completed circuit 225 is shown in FIG. 21. As noted earlier, the conductive areas 98A–H, the central conductive track 100, and the conductive bar 106 function as capacitor plates. The sensor head 218 includes an array of the capacitive coupler plates 226A–H, 228 and 230, arranged in the same configuration as the conductive areas 98A–H, 100 and 106. When the ticket 50 is placed in the ticket slot 182, the capacitor plates 226A–H are aligned with the conductive areas 98A–H, the central conductive track 100, and the conductive bar 106 to form capacitors having an air gap dielectric. Alternatively, the capacitive couplers 226A–H, 228 and 230 could be arranged within the electronic verification machine 108 so that the capacitor plates 226A–H, 228 and 230 are positioned on the side of the ticket 50 opposite the conductive areas 98A–H, 100 and 106. In this configuration, the capacitors formed by coupling the capacitive couplers 226A–H, 228 and 230 to the conductive areas 98A–H, 100 and 106 would have a dielectric contributed both by the air gap and by the ticket substrate and printed layers located between the conductive areas 98A–H, 100, and 106 and the capacitor plates 226A–H, 228 and 230.

As noted earlier, each of the resistor tracks 82–96 is capacitively coupled in series to one of the capacitor plates 226A–H in the sensor head 218 via one of the conductive areas 98A–H. Similarly, a capacitor is formed by the capacitor plate 230 and the central conductive track 100. In addition, the bar code resistor track 107 is connected in series with the capacitor formed by the capacitor plate 228 in the sensor head 218 and the conductive bars 106 and 150 and to the capacitor formed by the conductive track 104 and the capacitor plate 228.

The capacitor plates 226A–H and 228 are connected to a pair of buffer amplifiers 232 and 236. The main buffer amplifier 236 supplies a signal to an integrator 238 in the electronic verification machine 108 which in turn supplies a signal to the microcontroller 224. The secondary buffer amplifier 232 provides a feed back loop to the capacitor plates 226A–H and 228 and hence the conductive areas 98A–H. The resistor tracks which are not currently being tested by the electronic verification machine 108 can produce stray capacitance which would interfere with the measured detection signal. To overcome this effect, the secondary buffer amplifier 232 applies the buffered detection signal to the resistor tracks which are not being tested, such as tracks 82–86, 90–96, and 107, to cancel out the effect of the stray capacitances.

The microcontroller 224 is also connected to a digital to analog ("D/A") converter 240 which supplies a signal to a voltage controlled oscillator ("VCO") 242. Because of the size constraints of a typical probability game ticket, such as ticket 50, the capacitance formed by coupling the individual resistor tracks, such as resistor track 88, to the excitation and detection circuitry is small. For example, a capacitor including a conductive track printed with the ink formulation described in Table 2 and having an area of 0.201869 inches$^2$ would have a capacitance of approximately 9 pF. Consequently, the excitation and detection circuitry includes an inductor 244 to oppose the effect of the capacitive impedance resulting from the small capacitance provided by coupling the capacitive pick-up areas 98A–98H and 104 to the electronic verification machine 108. The output from the VCO 242 is routed through the inductor 224 and applied to the central conductive track 100 via the excitation coupler 230.

When the ticket 50 is inserted into the electronic verification machine 108 and the microcontroller 224 is activated, the electronic verification machine 108 begins a discreet verification process for each resistor track 82–96 and 107. The microcontroller 224 steps an 8-bit output bus 245, which controls the D/A converter 240, from a value of 255 to zero. The DC output voltage from the D/A 240 is then applied to the VCO 242 for conversion to frequency. Thus, the microcontroller 224 produces a stepped series of decreasing excitation frequencies. These stepped excitation frequencies are routed though the inductor 244 and applied to the central conductive track 100 of the ticket 50 via the excitation coupler 230. The excitation signal from the VCO 242 is ultimately applied to each of the eight resistor tracks 82–96 and the bar code resistor track 107. The microcontroller 224 selects an individual resistor track, such as resistor track 88, through solid state switches (not shown) and routes the capacitively coupled detection signal to the dual buffer amplifiers 232 and 236. The main buffer amplifier 236 supplies a buffered voltage to the integrator 238 which converts the AC detection signal to a DC detection signal and applies this DC detection signal to the analog to digital input of the microcontroller 224 for processing.

In this embodiment, the electronic verification machine 108 uses a iterative resonance seeking algorithm to determine the measured electrical signature for each of the resistor tracks 82–96 and 107. Two registers (not shown), the resonance register and the temporary register, in the microcontroller 224 are used to store successive values of the detection signal. The detection signal is the signal produced when any of the resistor tracks, such as resistor track 88, is coupled to the electronic verification machine 108 and receives the excitation signal via the central conductive bar 100. The contents of both the resonance and temporary registers are initially set to zero.

The amplitude of the detection signal is ultimately converted to an eight-bit binary value via the integrator 238 and the A/D input of the microcontroller 224. The binary converted detection signal is then stored in the temporary register of the microcontroller 240. and the microcontroller 240 then compares the contents of the two registers. If the contents of the temporary register is less than the contents of the resonance register, the resonance register contains the binary converted equivalent of the amplitude corresponding to the resonance frequency of the resistor track being tested, such as track 88. Consequently, the frequency of the excitation signal and the contents of the resonance register are output to the processor 220 and in certain cases to the communication interface 222 which includes a UART serial digital port. The output of the communication interface 222 which represents the electrical signature of the resistor track being tested can be transmitted to the central computer 223 or to a lottery terminal (not shown).

If the resonance frequency of the resistor track, such as track 88, is not detected, the above excitation and detection process is repeated. First, the contents of the temporary register are stored in the resonance register. Thereafter, the 8-bit output bus, which controls the DIA converter 240, is decremented to produce an excitation signal from the VCO 242 having a lower frequency than the previously applied excitation signal. The new excitation signal is applied to the ticket via the conductive track 100 and the new detection signal is compared, as previously described, with the contents of the resonance register. This excitation and detection process is repeated for each resistor track 82–96 and 107 until the detection signal corresponding to that associated with the resonance frequency of the resistor track being tested is determined.

B. Candidate Circuits for Providing the Electrical Signature

1. The T-square Circuit.

Several different types of circuit configurations can be printed on the ticket 50 to provide a measurable electrical signature. In the preferred embodiment, the printed circuit configuration 81, termed a T-square circuit, is illustrated in FIG. 2. As noted earlier, each of the resistor tracks 82–96 is electrically connected to one of the conductive areas 98A–H and to the central conductive track 100. FIG. 20 is a plan drawing of the partial printed circuit used to determine the authenticity and integrity of the play spot areas 72A–H and illustrates the resistor tracks 82–96 connected to the conductive areas 98A–H and the central conductive track 100. In addition, the bar code resistor track 107 is electrically connected to the conductive bars 104 and 106. FIG. 19 is a plan drawing of the partial printed circuit used to determine the authenticity and integrity of the bar code 80 and illustrates the bar code resistive track 107 connected to the conductive areas 104 and 150. As noted earlier, the first layer 146 printed on the ticket 50 includes the bar code resistor track 107 and the conductive areas 150 and 104. Successive layers, up to and including the sixth layer 162, do not overlie the conductive area 150 thus leaving the conductive area 150 exposed. The seventh layer 166 consists of the partial printed circuit used to determine the authenticity and integrity of the play spot areas 72A–H, as shown in FIG. 20. The conductive bar 106 of the seventh layer 164 immediately overlies the conductive bar 150 of the first layer 146. Consequently, the partial circuit including circuit elements 82–96 and 98A–98H for the play spot areas 72A–H, shown in FIG. 20, and the partial circuit for the bar code 80, shown in FIG. 19, are electrically connected via the conductive bars 106 and 150. Thus, when the ticket 50 is coupled to the electronic verification machine 108, the excitation signal applied to the ticket 50 via the central conductive track 100 is also transmitted to the bar code resistive track 107 via the conductive bars 106 and 150. Therefore, the completed circuit 225 which is formed when the ticket 50 is capacitively coupled to the sensor head 218 via the conductive areas 98A–H, 100, 104, and 106 is actually nine different, separate circuits, one for each of the resistor tracks 82–96 and one for the bar code resistor track 107.

As is explained in Section V. below, the electronic verification device 108 tests the integrity of a specific resistor track, such as resistor track 88, by comparing the measured resistance to the resistance which should result from the undisturbed configuration of the resistor track as originally printed, that is, the predetermined electrical signature of the resistor track. If the play spot area overlying the resistor track, such as track 88, has not been altered, for example, rubbed off or lifted to reveal the underlying play indicia, the resistance measured by the electronic verification machine 108 will be substantially the same as the resistance which should result from the configuration of the resistor track 88 as originally printed. If, however, the play spot has been removed or lifted, the measured resistance will be substantially different than the predetermined electrical signature of the track 88.

The T-square circuit 200 can determine the authenticity and integrity of the ticket 50 as a whole, of the individual play spot areas 72A–H, and of the bar code 80. If no resistance can be measured for any of the resistor tracks 82–96, it can be assumed that either the ticket 50 is a counterfeit or that all of the play spot areas 72A–H have been rubbed off thereby rendering the ticket 50 void. Moreover, because the T-square circuit 200 provides a different individual circuit for each of the resistor tracks 82–96, the T-square circuit 200 can individually test the integrity of the individual play spot areas 72A–H.

For example, a particular probability game may require revealing three matching game indicia to win. In addition, the game rules may require that no more than three play spot areas be rubbed off to reveal the underlying indicia. Consider the hypothetical situation in which an individual presents the ticket 50 to a lottery agent for redemption because the individual has ostensibly rubbed off only three play spot areas and the indicia in the three play spot areas match. By pure visual inspection, the ticket 50 might appear to be a valid and winning ticket. However, when the ticket 50 is inserted into the ticket slot 182 of the electronic verification machine 108 to measure the resistance of the play spot areas 72A–H, the electronic verification machine 108 would determine that not only the measured resistances of the three rubbed-off play spot areas differ from the predetermined resistances for these play spot areas, but also that the measured resistance of other "non-rubbed-off" play spot areas differ from the predetermined resistances for these areas. This situation could arise, for example, when the individual removes the overprint areas 68 of these additional play spot areas to reveal the hidden indicia 74 and then attempts to replace the overprint areas 68 so that these play spot areas appear to not have been played. Thus, although visually the ticket 50 appears to be a valid winning ticket, the measure of the resistances 82–96 would indicate that more than three play spot areas have been removed and that therefore the ticket 50 is void. In addition, if the measured resistance of the bar code resistor track 107 is substantially different from the predetermined electrical signature for the bar code 80. it can be assumed that the bar code 80 has been tampered with as well.

2. The Binary Coupled Circuit.

An alternative embodiment of a ticket 250 having a partial printed circuit 252, termed a binary coupled circuit, is shown in FIG. 21. The partial circuit 252 is analogous to the seventh layer 164 printed on the ticket 50. As with ticket 50, the partial circuit 252 is ultimately printed on a ticket substrate 254 preferably using a conductive ink of the type described in Table 2. Although not shown, it is to be understood that additional layers such as a lower conductive layer analogous to the first layer 146 of ticket 50, a blocking layer and a primer layer analogous to the second layer 156 and third layer 158 of the ticket 50, play indicia analogous to the play indicia 74 of ticket 50, a seal coat and release coats analogous to the fourth layer 160 and the fifth and sixth layers 162 of the ticket 50 are also printed on the ticket 250 between the substrate 254 and the partial circuit 252 in a manner similar to that used for ticket 50.

The ticket 250 includes a display portion 256 and a playing field portion 258. The display portion 256 is ultimately covered by a coating (not shown) suitable for receiving customized graphics (not shown) and information (not shown) related to the rules for playing the ticket 250. The playing field portion includes two columns of four, separately removable play spot areas 260–274. Within the playing field portion 258, the partial circuit includes several conductive areas 276–292 and eight resistor tracks 294–308. Each of the play spot areas 260–274 is positioned between two conductive areas, for example, play spot area 260 is positioned between conductive areas 276 and 278 and play spot area 262 is positioned between conductive areas 278 and 280. Each of the resistor tracks 294–308 is also positioned between and electrically connected to two of the conductive areas 276–292. For example, resistor track 294, associated with play spot area 260, is positioned between and connected to conductive areas 276 and 278. Underlying each of the play spot areas 260–274 is a conductive line (not shown). Each conductive line is connected to the two conductive areas associated with its respective play spot area and resistor track. For example, the conductive line underlying play spot area 260 is connected to conductive areas 276 and 278.

The three additional conductive areas 310–314 are printed in the display portion 256 of the ticket 250. The first conductive area 310 is connected to the first column of four play spots 269–266 via a conductive track 316 connected to the conductive area 284. The second conductive area 312 is connected to the second column of four play spots 268–274 via a second conductive track 318 connected to the conductive area 292. All eight play spot areas 260–274 are connected to the third conductive area 314 via a third conductive track 320 connected to the conductive area 276. The conductive areas 310–314 serve as capacitor plates when the ticket 250 is coupled to an electronic verification machine.

Each column of four play spot areas 260–266 and 268–274 forms one complete circuit when the ticket 250 is coupled to the electronic verification machine 108. The excitation signal from the electronic verification machine 108 is routed through each group of four play spot areas 260–266 via the common conductive area 314 in the display portion 256 of the ticket 250. Each group of four play spot areas 260–266 and 268–274 provides its own detection signal. The detection signal for the play spot areas 260–266 is coupled to the electronic verification machine 108 via the conductive track 316 and the conductive area 310. The detection signal for play spot areas 268–274 is coupled to the electronic verification machine 108 via the conductive track 318 and the conductive area 312.

Within a group of four play spot areas, for example play spot areas 260–266, the magnitude of the detection signal varies with the integrity of each of the play spot areas 260–266. If the play spot areas 260–266 are intact, the excitation signal is substantially unaltered and is routed through the conductive lines underlying each of the play spot areas 260–266. However, if a play spot area has been rubbed off or lifted to reveal the underlying play indicia, the signal is routed through the resistor track associated with that play spot area. For example, if play spot area 260 is intact, the signal proceeds through the underlying conductive bar to the conductive area 278. However, if the play spot area 260 has been at least partially removed to reveal the underlying play indicia, the circuit through the conductive line is broken thus routing the signal through the associated resistor track 294 thus changing the characteristics of the detection signal.

In the preferred embodiment of this ticket 250, each of the resistor tracks associated with a group of four play spot areas, such as the resistor tracks 294–300 associated with play spot areas 260–266 has a unique predetermined resistance that is related, in a binomial progression, to the other resistor tracks in the column. For example, resistor track 294 can have a predetermined electrical signature equal to a resistance of 100 KΩ, resistor track 296 can have a predetermined electrical signature equal to a resistance of 200 KΩ, resistor track 298 can have a predetermined electrical signature equal to a resistance of 400 KΩ, and resistor track 300 can have a predetermined electrical signature equal to a resistance of 800 KΩ. The resistor tracks, such as resistor tracks 294–300, are printed in parallel to the conductive lines underlying the play spot areas, such as play spot areas 260–266. As explained below, the binomial relationship of the printed resistances for each resistor track within a group of four resistors tracks permits determination of the integrity of each play spot even though only one detection signal is produced for all four resistor tracks.

FIG. 22 is a partial schematic circuit diagram 324 illustrating the coupling of one column of four resistor tracks 260–266 to the excitation and detection circuitry of the electronic verification machine 108. The parts of the circuit which are contributed by the ticket 250 include the four resistor tracks 294–300, the conductive areas 276–284, the conductive lines 316 and 320, and the conductive areas 314 and 310. In addition, the ticket partial circuit includes four conductive lines 326–332 which underlie the play spot areas 260–266. The play spot areas 260–266 do not actually form a part of the circuit but are included in FIG. 22 for ease of understanding.

The remainder of the excitation and detection circuit is provided by the electronic verification machine 108, including a pair of capacitor plates 334 and 336. The capacitor plates 334 and 336 can consist of, for example, copper plates positioned within the electronic verification machine 108 to mirror the configuration of the conductive areas, such as conductive areas 310 and 314, on the ticket 250. When the ticket 250 is coupled to the electronic verification machine, the excitation and detection circuit is completed by the capacitive coupling of the capacitor plates 334 and 336 in the electronic verification machine with the conductive areas 314 and 318 printed on the ticket 250. The excitation signal is applied to the ticket 250 via one of the capacitors formed by one of the capacitor plates, for example the capacitor 334, with the conductive area 314 printed on the ticket 250. The detection signal is routed to the rest of the excitation and detection circuit via the capacitor formed by the other capacitor plate in the electronic verification machine, for example plate 338, with the conductive area 310 printed on the ticket 250.

When the play spots 260–266 have not been removed or tampered with, as illustrated in FIG. 22, the excitation signal flows through the each of the four conductive lines 326–332. However, removing or partially removing one of the play spots 260–266 effectively breaks the circuit through the: associated conductive line rerouting the signal through the associated resistor track. For example, if play spot 260 is removed, the signal pathway would go through resistor track 294. Because each resistor track 294–300 has its own unique resistance, each resistor track 294–300 produces its own unique detection signal thereby permitting the electronic verification machine 108 to identify which, if any of the play spot areas 260–266 have been lifted or removed. Moreover, since the resistance values of the resistor tracks 294–300 are related to each other as a binomial progression, the electronic verification machine 108 can also identify which of the play spots 260–266 have been removed when two or more of the play spots 260–266 have been removed. For example, if both play spots 260 and 262 are removed the combination of resistor tracks 294 and 296 adds 300 KΩ to the excitation and detection circuit. However, if play spots 260 and 264 are removed, the combination of resistor tracks 294 and 298 adds 500 kΩ to the excitation and detection circuit. Thus, because the resistor tracks 294–300 have resistance values that are related as a binomial progression, each possible combination of resistor tracks 294–300 results in a unique total resistance which can be used to identify the play spots 260–266 that have been removed. Table 3 lists all the possible combinations of resistor tracks 294–300 and the resulting resistance values for the previously identified resistance values for the resistor tracks 294–300.

TABLE 3

Resistor Combinations

| Resistors In The Circuit | Effective Resistance |
| --- | --- |
| R1 | 100 |
| R2 | 200 |
| R3 | 400 |
| R4 | 800 |
| R1 + R2 | 300 |
| R1 + R3 | 500 |
| R2 + R3 | 600 |
| R1 + R2 + R3 | 700 |
| R1 + R4 | 900 |
| R2 + R4 | 1000 |
| R1 + R2 + R4 | 1100 |
| R3 + R4 | 1200 |
| R1 + R3 + R4 | 1300 |
| R2 + R3 + R4 | 1400 |
| R1 + R2 + R3 + R4 | 1500 |

Additional resistance values and combinations of resistance values are possible. For example, the resistance values in Table 3 could be increased or decreased by an order of magnitude. The principle of this circuit design is that the individual resistance of each resistor track within a group of resistor tracks, such as resistor tracks 294–300, should be algorithmically related to the resistances of the other resistor tracks within the group so that every combination of resistor tracks provides a unique total resistance. Preferably, the individual resistances should vary as a binomial progression.

3. The Infinite Resistance Circuit.

Figure 23:
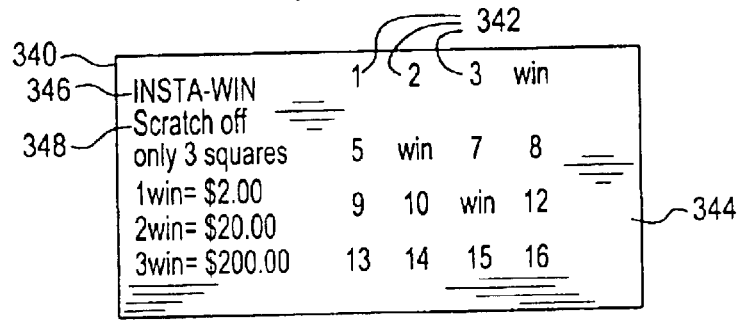
FIG. 23 is a plan drawing of a probability lottery ticket before the ticket is printed with yet another partial circuit which be used to determine the authenticity and integrity of the ticket.
Figure 24:
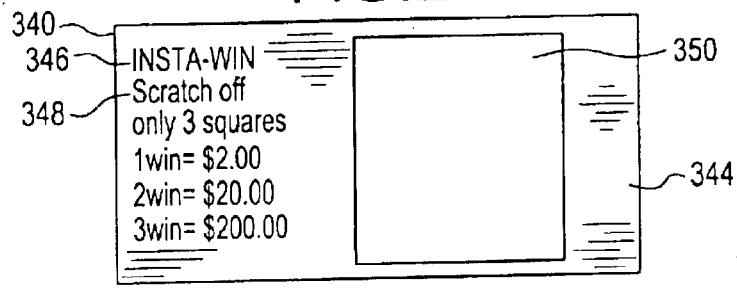
FIG. 24 is a plan drawing of the release coat printed on the ticket in FIG. 23.
Figure 25:
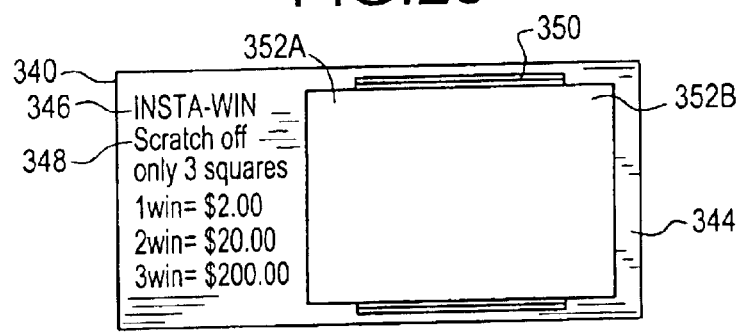
FIG. 25 is a plan drawing of the partial circuit used to determine the authenticity and integrity of the ticket in FIG. 23.
Figure 26:
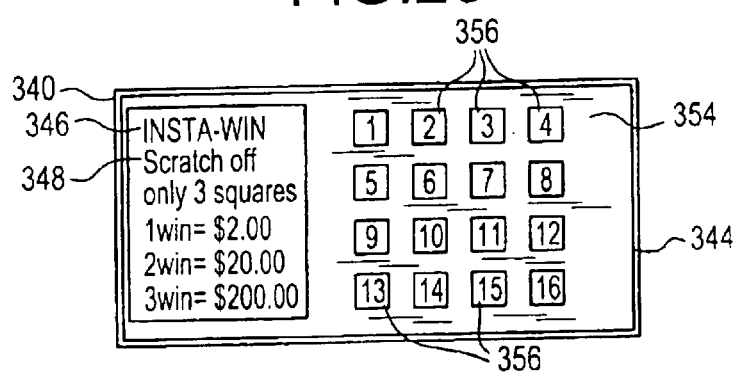
FIG. 26 is a plan drawing of the ticket in FIG. 23 in its final printed format.

FIGS. 23, 24, 25 and 26 illustrate another partial printed circuit which can be used to validate and determine the authenticity and integrity of a document which in this example is a lottery ticket 340. As shown in FIG. 23, the lottery ticket includes play indicia 342 which are printed over the ticket substrate 344. Additional information, such as the name of the lottery game 346 and rules 348 for playing the ticket are also printed on the ticket substrate 344. FIG. 24 is a plan drawing of the scratch-off coating 350 which is printed over and conceals the play indicia 342. The scratch-off coating 350 is a removable layer of a material such as latex which can be relatively easily removed to reveal the play indicia 342. A single block of scratch-off coating 350 is used to cover all of the play indicia 342. A release coat (not shown) coincident with the scratch-off coating 350 is also printed on the ticket 340 between the play indicia 342 and the scratch-off coating 350. FIG. 25 is a plan drawing of the partial printed circuit which is used to determine the integrity and authenticity of the ticket 340. The circuit consists of a single conductive area indicated at 352A and 352B which overlies the scratch-off coating 350. The two portions 352A, 352B of the conductive area extend beyond the edges of the scratch-off coating 350. FIG. 26 is a plan drawing of the ticket 340 in its final printed state which includes overprint areas 354 that conceal the scratch-off coating 350 and the conductive area 352, as well as overprint areas 356 that define the individual play spot areas.

When the ticket 340 is coupled to the electronic verification machine 108 the portions 352A and 352B serve as capacitor plates to couple the partial circuit printed on the ticket 340 with the excitation and detection circuitry in the electronic verification machine 108. The portion of the conductive track 352A–B which immediately overlies the scratch-off coating 350 but does not extend beyond the scratch-off coating 350 serves as a resistor track when the ticket 340 is coupled to an electronic verification machine 108. If the ticket is in its original integral state, the portion of the conductive area 352A–B immediately overlying the scratch-off layer 350 is electrically connected to the portions 352A and 352B which serve as capacitor plates. However, if an individual has attempted to surreptitiously inspect the play indicia 342 by, for example, lifting and then replacing the scratch-off layer 350, the electrical connection between the middle portion of the conductive layer and the end portion 352A and 352B would be broken resulting in an open circuit.

4. The Increased Resistance Circuit.

Figure 27:
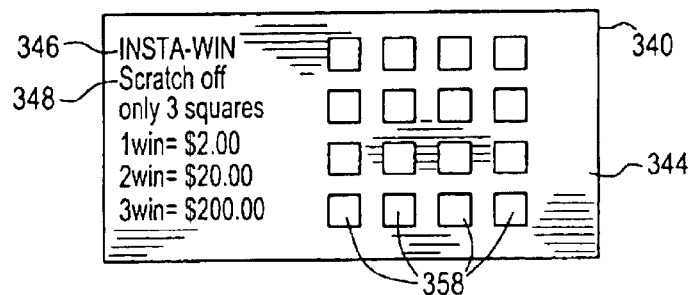
FIG. 27 is a plan drawing of a second embodiment of the release coat printed on the ticket in FIG. 23.
Figure 28:
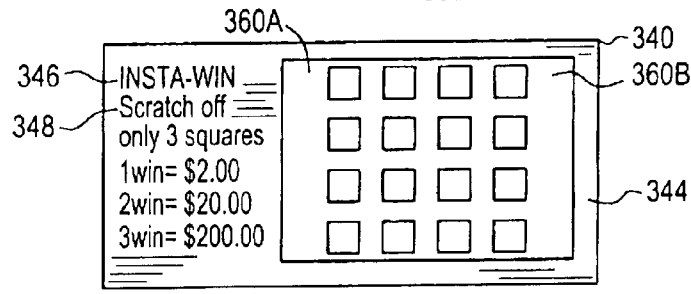
FIG. 28 is a plan drawing of the circuit used to determine the authenticity and integrity of the ticket in FIG. 23.

FIG. 27 illustrates an alternative embodiment of a scratch-off layer 358 for the ticket 340. Unlike the previously described scratch-off layer 350, the scratch-off layer 358 consists of discreet, individual areas which overlie each play indicia 342 (not shown). A release coat (not shown) underlies each of the discreet portions of the scratch-off coating 358. The partial printed circuit which overlies the scratch off layer 358 consists of a single conductive area indicated at 360A and 360B which overlies all of the scratch off layer 358. Two portions 360A, 360B of the conductive area 360 extend beyond the area of the ticket 340 containing the scratch-off coating 358. The final printed format of the ticket 240 is shown in FIG. 26 and includes overprint areas 354 that conceal the scratch-off coating 358 and the conductive area 360A–B, as well as overprint areas 356 that define the individual play spot areas.

When the ticket 340 is coupled to an electronic verification machine 108, the portions 360A and 360B of the conductive area 360 which extend beyond area of the ticket 340 containing the scratch-off layer 358 serve as capacitor plates to couple the partial circuit printed on the ticket 340 with the excitation and detection circuitry in the electronic verification machine 108. The portion of the conductive area 360A–B which immediately overlies the scratch-off coating 358 but does not extend beyond the scratch-off coating 358 serves as a resistor track when the ticket 340 is coupled to the electronic verification machine 108. If all of the play spots are intact, the electrical signature of the ticket 340 will be equal to the printed resistance associated with the portion of the conductive track 360 which overlies all of the play indicia 342. However, if an individual has attempted to surreptitiously inspect the play indicia 342 by, for example, lifting and then replacing one portion of the scratch-off layer 358, the small portion of the conductive area 360A–B immediately overlying the removed area of the scratch-off layer 258, will be electrically disconnected from the remainder of the conductive area 360A–B, leading to an increase in the resistance associated with the conductive area 360A–B.

5. The Waffle Circuit.

Figure 29:
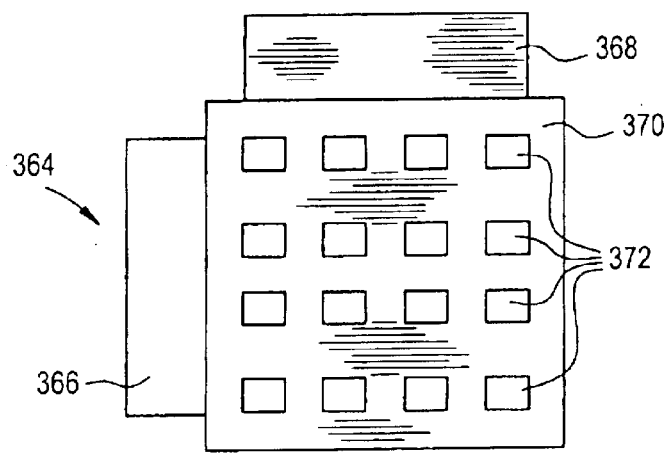
FIG. 29 is a plan drawing of another circuit which can be used to determine the authenticity and integrity of a probability game ticket.

FIG. 29 is a plan drawing of another partial circuit 364 which can be printed on a lottery ticket to determine the authenticity and integrity of the play spot areas. The partial circuit, termed a waffle circuit, includes two conductive bars 366 and 368 which are electrically connected to a conductive area 370 overlying the play indicia (not shown). Removable scratch-off areas 372 overlie the portions of the conductive area 370 which immediately overlie the individual play indicia. A seal coat and release coats analogous to the forth layer 160 and the fifth and sixth layers 162 of the ticket 50 in FIG. 11 are printed in an appropriate configuration between the play indicia and the conductive area 370. Thus, removal of any of the scratch-off areas 372 also removes a portion of the conductive area 370. When the ticket which includes the partial circuit 364 is coupled to the electronic verification machine 108, each of the play spot areas defined by the scratch-off areas 372 serves as a capacitor plate. In addition, the conductive bars 366 and 368 also serve as capacitor plates to couple the partial circuit 364 to the excitation and detection circuitry of the electronic verification machine 108. The excitation and detection circuitry of the electronic verification machine 108 in turn includes an array of capacitive couplers which are positioned to mirror the configuration of the conductive bars 366 and 368 and the scratch-off areas 372. Thus, in contrast to the previously described partial circuits in FIGS. 20, 21, and 23–28, the electrical signature of the play spot areas associated with the partial circuit 364 is a conductive track, rather than a resistive track.

The electronic verification machine 108 can check the authenticity and integrity of the play spot areas defined by the scratch—off areas 372 by applying an AC excitation signal to one of the conductive bars 366 or 368. If the individual play spot area being tested is intact, the excitation signal will be routed through the portion of the conductive area 370 underlying the scratch-off area 372 associated with the tested play spot area. Consequently, an AC detection signal will be routed to the capacitor plate in the electronic verification machine 108 which mirrors the particular play spot area 372. However, if the scratch-off area 372 being tested has been at least partially removed, the associated removal of a portion of the conductive area 370 creates an open circuit under that particular scratch-off area 372. Hence, no AC detection signal is routed to the associated capacitor plate in the electronic verification machine 108, indicating that the integrity of the play spot area 372 has been changed.

6. The Recursive Circuit.

Figure 30:
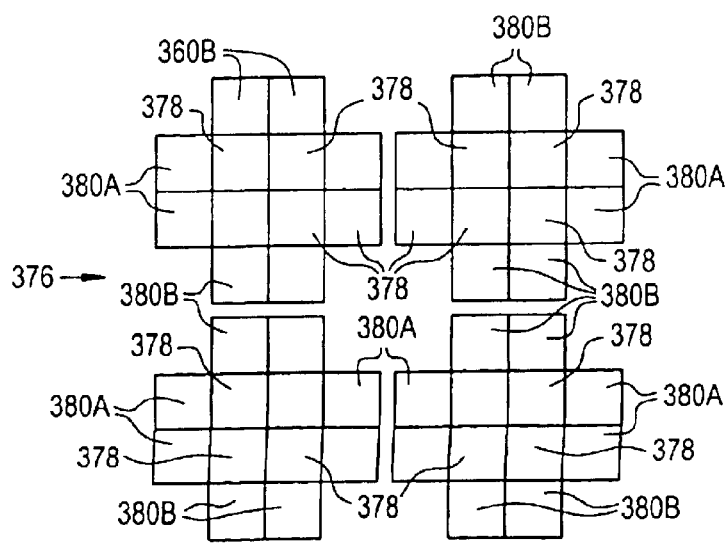
FIG. 30 is a plan drawing of another circuit which can be used to determine the authenticity and integrity of a probability game ticket.

FIG. 30 is another plan drawing of a partial printed circuit 376 which can be used to determine the authenticity and integrity of the play spot areas of a lottery ticket. The partial circuit 376 includes resistor tracks (not shown) which underlie each of the removable scratch-off areas 378. Each resistor track is electrically connected to a pair of conductive bars 380A and 380B. In the partial circuit shown in FIG. 30, there are a total of twenty-four conductive bars 380A, 380B, two for every resistor track associated with one of the scratch-off areas 378. When the ticket which includes the partial circuit 376 is coupled to an electronic verification machine 108, each resistor track associated with each scratch-off area 378 is capacitively coupled to the excitation and detection circuity of the electronic verification machine 108 by its associated conductive bars 380A and 380B. One conductive bar, for example, bar 380A, is used to apply the excitation signal to the resistor track. The second conductive bar, for example bar 380B, routes the detection signal to the rest of the excitation and detection circuitry in the electronic verification machine 108. If the scratch-off area 372 being tested is intact, the electrical signature of the associated resistor track will be substantially equal to the printed resistance of the resistor track underlying the scratch-off area 372. If, however, the scratch-off area 372 being tested has been at least partially removed or lifted, the measured resistance of the resistor track and hence the resonant frequency of the completed circuit associated with the scratch-off area 372 will be substantially different than the printed resistance of the resistor track.

C. Variation in Printed Resistances

1. Variations in the Printed Resistances.

A number of the foregoing circuits, such as the T-square circuit shown in FIG. 20., and the binary-weighted circuit shown in FIG. 21, use the resistance of a printed resistor track to impart an electrical signature to a document. As noted earlier, the resistance of such printed resistor tracks can be defined as follows:

$R=\rho(L/A)$ where

R=resistance;

$\rho$=bulk resistivity (resistance per unit volume);

L=length of resistor; and

A=cross sectional area of the resistor.

The cross-sectional area of the resistor in turn equals the product of the print thickness (t) and the width (W) of the resistor. Substituting these parameters yields the following formula for the resistance of a printed resistor track:

$R=\rho(L/tW)$

Figure 31:
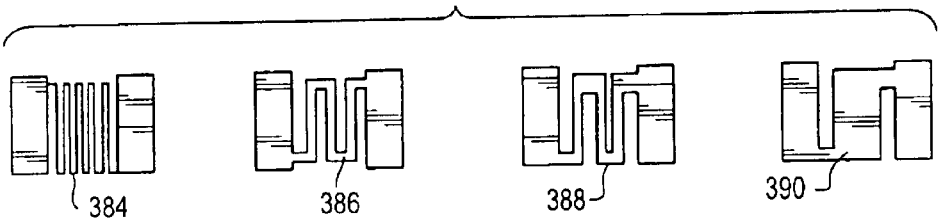
FIG. 31 is a plan drawing of four printed resistors having different resistances.

Thus the resistance of a printed resistor track such as those used in the previously described circuits is a function of the bulk resistivity of the ink used to print the resistor, the length of the resistor track, the thickness of the printed track and the width of the printed track. Resistor tracks having different resistances can thus be formulated by varying any of these parameters. In practice, changing the resistivity of the inks used in order to create different resistor tracks having different resistances may be impractical because, at least in a gravure printing process, changing inks requires using a different printing station. The other parameters, however, can be easily and effectively varied to provide different resistor tracks within one circuit which have different resistances. FIG. 31 is a plan drawing of four different resistor tracks 384–390. Because the length and widths of the resistor tracks 384–390 differ, the resistances of the resistor tracks 384–390 will be different even if the resistor tracks 384–390 are printed with exactly the same conductive ink. Thus, for example, the resistor tracks 386 and 388 would have different resistances even though the lengths of the resistor tracks 386 and 388 are approximately equal because the widths of the resistor tracks 386 and 388 are not the same. Thus, the resistance of the resistor tracks printed on a document, such as the ticket 50, can be varied by varying the dimensions of the printed resistor tracks.

2. Variations in the Measured Resistances.

Variations in ink resistivity can also occur over the course of a large print run. These variations in resistivity are due to a number of factors including printing process temperature and viscosity variations. Consequently, these variations are only detectable over a large number of tickets that were printed over a long period of time. The resistivity of the ink on a single ticket does not fluctuate in this manner. However, the resistance of a resistor track printed at the beginning of a print run can be measurably different than the resistance of an identical resistor track printed with the same conductive ink at the end of a print run due to these time-dependent variations in the resistivity of the conductive ink. Consequently, it is desirable that these time dependent variations in the electrical signature be compensated for when the electronic verification machine 108 tests the authenticity and integrity of the document.

The electronic verification machine, such as electronic verification machine 108, compensates for such time-dependent variations in the measured electrical signature in one or both of two ways: (1) by establishing that the measured values are accurate within a specified range of an expected value; or (2) by using a separate circuit element to establish the precision of the measured electrical signature.

In the preferred embodiment, the electronic verification machine compensates for time dependent variations in the electrical signature by determining that the measured values are accurate within a range of, for example, 10 percent, of the expected electrical signature. Thus, for example, a measured resistance that is expected to be 500 Ω would be acceptable as long as the resistance was in the range between 450 Ω and 550 Ω. In other words, if the measured resistance was within this range, the corresponding play spot is treated by the electronic verification machine 108 as not having been rubbed off and therefore as being in its original integral state as well as presumably authentic.

Figure 32:
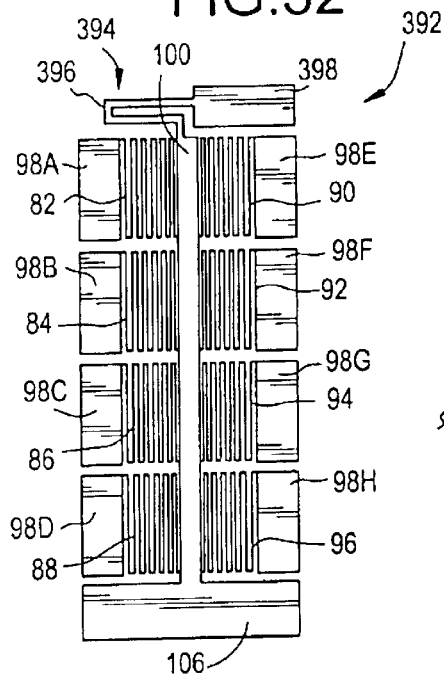
FIG. 32 is a plan drawing of a partial printed circuit which includes a calibration line.

If the time dependent variations in the electrical signature are corrected by using a precision system, the partial circuit printed on the ticket must contain an additional element, a calibration line, which is used to determine if a measured resistance is precise. FIG. 32 is a plan drawing of an alternative embodiment of a T-square circuit 392 which includes a calibration line shown generally at 394. The calibration line 394, termed a John Galt line, includes a resistor track 396 connected to a conductive area 398. The remaining elements of the partial printed circuit 392 are analogous to and function in the same manner as the T-square circuit shown in FIG. 20. Hence, the remaining elements of the circuit 392 in FIG. 32 correspond to the circuit elements shown in FIG. 20. The calibration line 394 is connected to the rest of the circuit 392 via the central conductive area 100. The resistor track 396 is printed on a portion of the ticket which does not include play spot areas. Consequently, the resistor track 396 should remain in its original integral state after the ticket has been played. When a ticket containing the calibration line 394 is coupled to the electronic verification machine 108 the resistor track 396 is coupled to the excitation and detection circuitry of the electronic verification machine 108 by the capacitors formed by coupling the conductive areas 100 and 398 to capacitor plates in the electronic verification machine 108.

In the partial circuit 392 shown in FIG. 32, the calibration line 394 is used to determine how far the measured resistances of a particular ticket should deviate from the expected value for these resistances. For example, if the calibration line 394 is printed with an expected resistance of 500 Ω, but measured resistance of the calibration line 394 on a particular ticket actually has a calibration value resistance of 525%, the five percent increase over the expected value should be seen in other resistances on the card as well. Therefore, even if a measured resistance of a play spot area is within the acceptable value of 10 percent above or below the expected value, it should be approximately five percent higher than the expected value in order to be precise for this ticket. Thus, if a given resistance corresponding to one of the play spots is eight percent below the expected value and therefore within plus or minus ten percent of the expected resistance, the spot would be deemed to have been played because the resistance, although accurate, is not within the calibrated precision for this ticket.

D. Protection of the Bar Code

A circuit printed on a lottery ticket, such as the circuit 81 printed on the ticket 50 shown in FIG. 2, can include a partial printed circuit which provides an electrical signature to protect the bar code 80. As noted with reference to FIG. 19, the bar code partial circuit includes a resistor track 107 connected to two conductive areas 150 and 104. In addition, the conductive area 150 immediately underlies the conductive area 106 of the partial printed circuit 164 used to determine the authenticity and integrity of the play spot areas, as shown in FIGS. 2 and 22. Hence the partial printed circuit for the bar code 80 and the partial printed circuit 164 for the play spot areas are electrically connected via the overlying relationship of the conductive areas 106 and 150. Consequently, when the electronic verification machine 108 transmits the excitation signal to the ticket 50 via the central conductive track 100, the excitation signal can be routed to the bar code partial circuit via the conductive areas 106 and 150. The detection signal from the bar code 80 is routed to the remaining excitation and detection circuitry via the capacitor formed by the conductive area 104 and a capacitor plate in the electronic verification machine 108.

The bar code 80 is in turn printed on the ticket 50 to at least partially overlie the bar code partial circuit. In the preferred embodiment shown in FIGS. 1 and 2, the bar code 80 is printed on the ticket 50 so that it overlies the conductive area 104. Alternatively, the bar code 80 could be printed to overlie the resistor track 107. In either embodiment, attempts to alter the bar code 80, for example by substituting the bar code 80 of the ticket with the bar code of a different ticket, would result in changes in the measured electrical signature of the bar code 80 by changing either the resistance or the capacitance of the bar code partial circuit.

E. Alternative Circuit Designs

In addition to resistors, other types of electrical circuit elements can be used in a printed circuit to produce electrical circuits. For example, the elements used to couple a document, such as the ticket 50, to an electronic verification machine 108 are not limited to capacitor plates or areas but can also include inductive, radio frequency, and optical frequency circuit elements. In addition, the form of the electrical signature can be varied so that a properties other than resistance can be used to validate or determine the authenticity and integrity of a document. Examples of alternative electrical signatures include gain, amplitude, frequency, oscillation, and thermal effects.

1. Coupling

There are a number of methods by which a circuit printed on a document, such as the circuit 81 on the ticket 50, can be coupled to the electronic verification machine 108 including direct, capacitive, inductive, radio frequency and optical coupling methods. In direct coupling, the ticket is coupled to the electronic verification machine via direct physical contact of one or more conductive areas on the ticket with an electrical element, such as a contact plate, within the electronic verification machine 108. Although it is relatively straightforward to implement, direct coupling has the potential disadvantage of signal distortions which can arise from surface imperfections or impurities on the conductive areas of the ticket.

In capacitive coupling one or more conductive areas such as the areas 98A–H of the ticket 50 shown in FIG. 2 form one plate of a capacitor. The other plate of the capacitor is provided by a metal plate connected to the circuitry of the electronic verification machine 108. As described previously, the resulting capacitor can be used to form part of a verification circuit 225 as shown in the block diagram of FIG. 18. Here the conductive areas 98A–C of the ticket 50 form capacitors with the plates 200–204 of the electronic verification machine 108.

Figure 33:
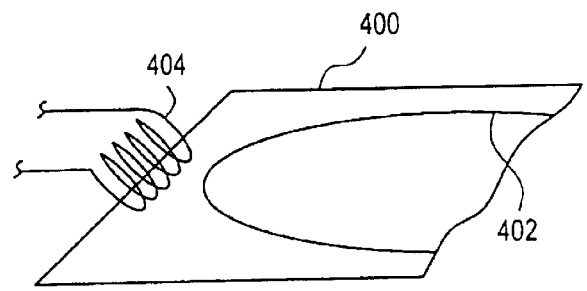
FIG. 33 is a partial plan drawing illustrating a ticket inductively coupled to an electronic verification machine.

Inductive coupling is similar in that a ticket 400 is printed with a circular conductive area 402 as illustrated in the example of FIG. 33. The electronic verification machine 108 would then include a coil 404 that is inductively coupled with the circular conductive area 402 when the ticket 400 is inserted in the electronic verification machine 108. There are a variety of configurations that can be used including a number of inductors printed on the ticket 400 that would be inductively coupled with a corresponding number of coils in the electronic verification machine 108.

Figure 34:
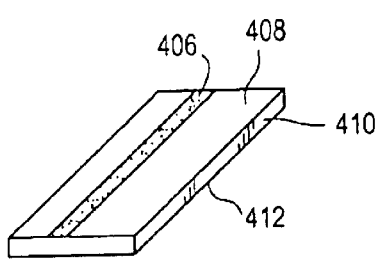
FIG. 34 is a partial plan drawing of a conductor which can be printed on a ticket to provide an RF antenna.

Radio frequency can also be used for verification as shown in FIG. 34. In this case a planar transmission line 406 is printed on a ticket 408 which is separated by the ticket substrate 410 from a ground plane 412 printed on the other side of the substrate 410. With this structure radio frequency energy is transmitted and received in a transverse electromagnetic mode. Using this approach verification signals can be transmitted to the circuits printed on the ticket 408 from suitable antennas located in the electronic verification machine 108.

In addition, optical frequency can be used for verification where for 20 example a photo emitter conductor or semiconductor is printed on the ticket 50 and is electrically stimulated to emit light at an infrared frequency. Photodetectors on the electronic verification machine 108 can be used to detect and classify the frequency of the light emitted by the ticket 50 in contrast to the nominal reflective background of the ticket 50.

2. Signature Verification

There are a number of methods for verifying the authenticity or integrity as well as to determine the redemption value of a lottery ticket, such as the ticket 50, using the electronic verification machine 108. One method is to merely check for an open circuit in the circuit printed on the ticket 50. Here a signal is applied to the ticket circuit by one of the techniques described above and if no current flow is detected then it can be assumed that a play spot 72A–H has been removed or that the ticket has been tampered with.

Gain can also be used where the electronic verification machine 108 includes an operational amplifier and the circuit element printed on the ticket 50 serves in its feedback loop. The gain of the operational amplifier will reflect any changes in the ticket circuit and thus can be used to detect tampering or to determine which play spots 72A–H have been scratched off by the player.

The amplitude of the voltage, current or power of the AC signal flowing through circuit printed on the ticket 50 can additionally be measured by the electronic verification machine 108 to indicated changes in the circuit that would reflect alterations in the ticket 50.

The phase of a signal flowing thought the circuit printed on the ticket 50 can also be checked by the electronic verification machine 108 against an expected or predetermined value to determine changes in the circuit.

Frequency of the electrical signal induced in the circuit printed on the ticket can be measured by the electronic verification machine to detect changes in the ticket. This is an especially useful approach where the circuit on the ticket 50 includes elements such as capacitors or inductors which can affect frequency.

A measure of oscillation frequency can also be used where the circuit printed on the ticket combined with the circuit in the electronic verification machine forms 108 an oscillator or where a complete oscillator circuit is printed on the ticket 50. Here an expected oscillation frequency can be used to detect changes in the ticket 50.

It should be noted that other methods can be used to determine which of the play spots 72A–H of the probability ticket 50 have been scratched off. For example, an optical card reader system of the type described in U.S. Pat. Nos. 4,736,109 and 4,760,247 or a laser system of U.S. Pat. No. 5,903,340 can be used to read a security code imprinted on the overprint areas 66 of ticket 50 to determine which of the play spots have been rubbed off in the manner generally described in U.S. Pat. No. 5,887,906. These systems can then perform the function of the sensor arrays 502 and 1036 and the related circuits of FIGS. 38 and 99 respectively, as described in connection with those figures below, to determine if the play spots 72 A–H have been rubbed off.

Figure 35:
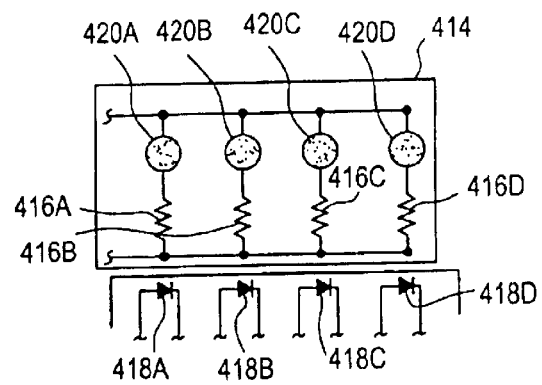
FIG. 35 is a partial schematic circuit diagram of circuit which measures thermal variations to determine the authenticity and integrity of a ticket.

Thermal effects are another phenomena that can be used by the system described above to detect tampering or determine which play spots have been removed from a ticket 414 of the type shown in FIG. 35. In this case heat generated by current flowing though a set of resistors 416A–D is detected by a group of infrared photodetectors 418A–D located in the electronic verification machine 108. When one or more of a set of play spots 420A–D is removed current will no longer flow though its associated resistor and the resulting lack of infrared radiation would indicate that the spot(s) had been removed.

Capacitance and inductance changes in the circuits printed on the ticket 50 can likewise be detected by the electronic verification machine 108 indirectly from the frequency characteristics of the circuits in order to determine whether changes have occurred on the ticket 50.

V. Validation of Lottery Tickets

Validation of the lottery ticket 50 as well as the determination the authenticity and integrity of a document, such as ticket 50, can involve the interaction of several steps. As an example, a description of a preferred method for validating the lottery ticket 50 of FIG. 1 using the electronic verification machine 108 of FIG. 14 is provided below. When an individual presents the ticket 50 to a lottery agent for redemption, the lottery agent insert the ticket 50 into the electronic verification machine 108. The electronic verification machine will read the bar code 80, which contains the inventory control number and encrypted validation number data, and it will sense which of the play spots 72A–G have been removed. The lottery agent then enters the validation number 78 of the ticket 50 into the electronic verification machine 108 via the user interface 178. As noted earlier, the validation number 78 contains information related to the identity of a specific ticket, such as the pack and ticket number. In addition, in the preferred embodiment the validation number 78 also contains information related to the electrical signatures of the circuit elements printed on the ticket 50. For example, the ticket 50 has two electrical signatures. One signature is the expected resistance of the bar code resistor track 107. The second is the expected resistance of the play spot resistor tracks 82–96 which all have the same value. If the play spot resistor tracks had different expected values, such as the resistor tracks 294–308 in the partial circuit 292 shown in FIG. 21, information related to each electrical signature could be stored in the validation number 78 of the ticket 50. Alternatively, the information related to the electrical signature(s) of the circuit elements printed on the ticket 50 could be stored in a look-up table in the microprocessor on the processor board 220 in the electronic verification machine 108 or the central computer 223. In this case, the validation number 78 or the encrypted validation number printed in the bar code 80 is used primarily to correlate the particular ticket being tested with the electrical signature information stored in the computer. Alternatively, data related to the expected signal can be contained in the validation number 78. In either case, the validation number provides the primary method for accessing the information related to the expected electrical signature(s) of the ticket.

After the ticket 50 is coupled to the electronic verification machine 108 via the ticket interface 176, the electronic verification machine 108 completes the discreet verification process for each of the play spot resistor tracks 82–96, as explained above in Section IV.A. The electronic verification machine determines the measured electrical signature for each of the play spot resistor tracks 82–96 and compares these values to the value or values stored either in the validation number 78 of the ticket 50 or in a look-up table in the central computer 223 or the processor board 220. If the measured resistance of a specific play spot resistor track 82–96 is substantially the same as the stored value of the resistance, the associated play spot area 72A–G is in its original integral state and has not been at least partially removed. If, on the other hand, the measured resistance is substantially different than the stored value for the resistance, the associated play spot area 72A–G is treated by the electronic verification machine 108 as having been removed. This occurs, for example, when the associated play spot area has been at least partially removed by a player playing the ticket or when the ticket has been tamped with.

In this particular example, the ticket 50 is considered valid only if the number of play spot areas 72A–G specified in the rules 58 have been removed to reveal the underlying play indicia 74. For example, the rules 58 for a particular game may require rubbing off only three play spot areas 72A–G. If an individual rubs off more than three play spot areas 72A–G, the ticket 50 is void even if three of the revealed play indicia 74 match. If the electronic verification machine 108 determines that the ticket 50 is valid, that is the ticket 50 has been played according to the rules 58, the electronic verification machine 108 then proceeds to determine the redemption value of the ticket 50.

The electronic verification machine 108 can validate or determine the redemption value of the ticket, such as ticket 50, in either of two ways: (1) by accessing the play indicia value data stored in the bar code 80 on the ticket 50; or (2) by accessing a ticket redemption file contained in the central computer 223 or the processor 220. Storing the play indicia value data in the bar code 80 has the advantage of permitting local determination of the redemption value of the ticket 50. Consequently, any lottery terminal can determine the redemption value of a ticket without contacting a central lottery or host computer thus reducing the cost and time required in the redemption process. On the other hand, it is not inconceivable that the play spot value code in the bar code 80 could be broken even though there are a very large number of potential play spot value combinations that can be printed on the ticket 50. As a result there is some possibility that an individual could predict the winning combinations present on ticket 50 based upon the bar code 80. Maintaining a separate ticket redemption value file in the central computer 223 or the processor 220 will normally result in increased ticket security because the play indicia value data are not stored in a bar code 80 on the ticket 50. Such a system, however, requires communication with the central computer 223 or the processor 220 in the electronic verification machine 108 before the ticket 50 can be redeemed. As a result, this type of redemption process, especially where a remote central computer 223 is used, can be slower and more costly than storing the play indicia value data in the bar code.

In the preferred embodiment of the invention, therefore, the method of storing play indicia or redemption value data in the bar code 80 typically would be used only for low level prizes. The larger cash prizes would be computed by the lottery central computer 223 in order to increase the security of the system with respect to high tier prizes or redemption values. In this embodiment, the bar code 80 would store information concerning all the play indicia 74 on the ticket 50. The bar code 80 can consist of, for example, 22 digits which represent a game number (2 digits), a pack number (6 digits), a check digit (1 digit), a ticket number (3 digits) and a play spot code (10 digits). The game number is unique to each particular lottery game. The pack number identifies the pack from which a particular ticket originates. The check digit is used to help ensure that a proper bar code read has been made. The ticket number relates the relative position of a specific ticket within a pack. In this example, the game number, the pack number and the ticket number represent ticket identification or accounting data and normally in themselves do not contain redemption value information.

Figure 36:
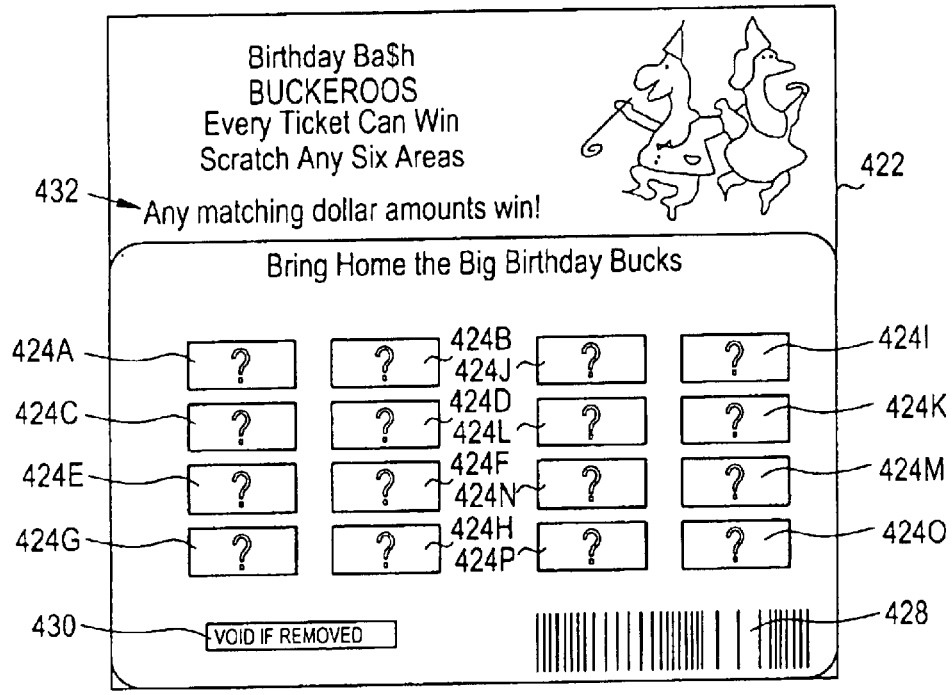
FIG. 36 is a plan drawing of a lottery ticket having sixteen play spot areas.
Figure 37:
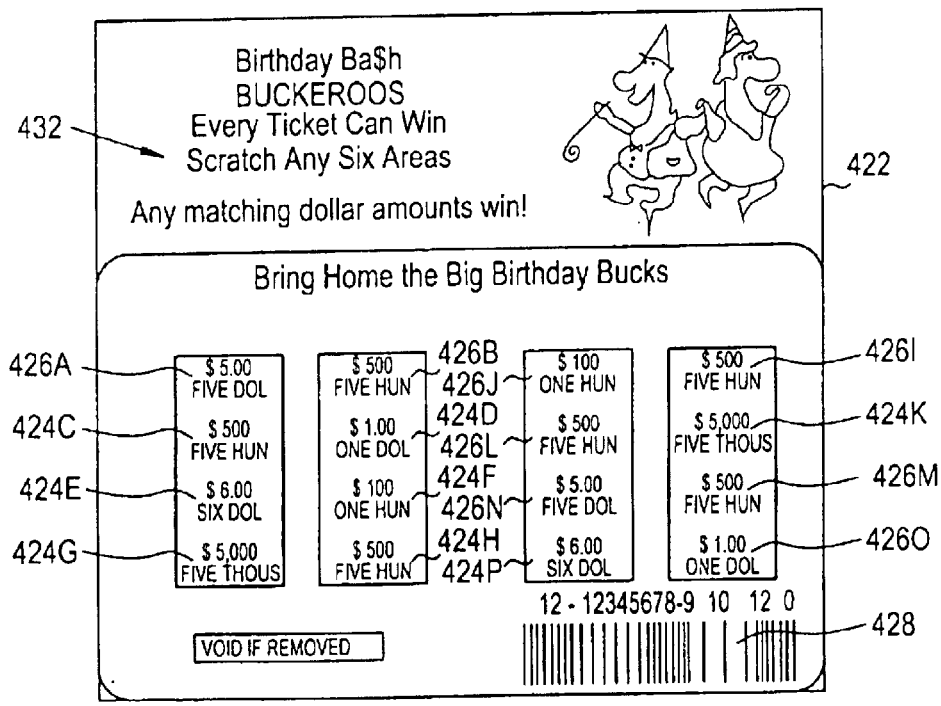
FIG. 37 is a plan drawing of the ticket in FIG. 36 having the play spot areas removed to reveal the underlying play indicia.

The 10-digit play spot code includes a value portion containing information about the value of each of the play indicia of each of the play spots areas. An illustration of how such a 10-digit play spot code can be used in a probability lottery ticket 422 is provided in FIGS. 36 and 37. Referring to FIG. 36, the ticket 422 has sixteen play spots areas 424A–P each of which covers a play indicia 426A–P which are shown in FIG. 37. The ticket 422 also includes a bar code 428 and a void-if-removed area 430 which conceals a validation number (not shown) as well as a set of printed information 432 concerning the rules for playing the ticket 432. In the example illustrated in FIGS. 36 and 37, the rules 432 state that only six play spot areas 424A–P may be removed. The ticket 422 can be redeemed for a prize if any two of the revealed play indicia 426A–P match. FIG. 37 illustrates the ticket 422 after all of the play spot areas 424A–P have been removed to reveal the underlying play indicia 426A–P.

For a ticket with 16 play spots areas, such as the ticket 422, two bits of the value portion in the play spot code are used to store information concerning the value of the play indicia 426A–P for each play spot area 424A–P. In this example, the values of these bit pairs are as follows: "00" signifies that the value of the play spot area cannot be checked locally by the electronic verification machine 108; "01" signifies that the value of the play indicia equals $1.00; "10" indicates that the value of the play indicia equals $2.00; and "11" indicates that the value of the play indicia equals $5.00. The play spot codes can also be considered redemption codes. In other words, all play indicia that contain the $1 symbol are represented by the bit pattern "01", play indicia that contain a $2 symbol are represented by the bit pattern "10", and play indicia that contain the $5 symbol are represented by the "11" bit pattern. Any play indicia having a value other than $1, $2 or $5 has a corresponding bit pattern of "00". Thus, for example, all play spots having $10, $20, $50 or $100 symbols would have corresponding bit patterns of "00". The bit pattern "00" indicates that the play indicia value for the corresponding play spot area 424A–P cannot be determined locally and must be determined by accessing the redemption file in the central computer 223. The bit patterns for all of the play indicia 426A–P are strung together to form a 32-bit binary number. For example, the 32-bit binary number corresponding to the play indicia 426A–P would be as follows:

11 00 00 00 00 11 00 00 00 00 11 00 00 00 00 01

Since the location of the indicia 424A–P are known, this number can be used to reconstruct the ticket 422. This binary number then is converted to base 10 in which the 32-bit number is represented by 10 digits, in this case 3,224,374, 273. These 10 digits are encrypted to form the play spot code which forms a part of the bar code 428. It should be noted that the 32-bit binary number can also be converted to numbers having other bases such as hexadecimal. For example, the hexadecimal value of the above 32-bit binary number would be C0300C01.

The bar code reader 210 in the electronic verification machine 108 reads the bar code 428 including the play spot code. The computer on the processor board 220 in the electronic verification machine 108 decrypts the 10 digit, base 10 play spot code and then converts it to a binary number thereby creating a 32-bit number with a 2-bit code corresponding to each of the 16 play indicia 426A–P thus in effect reconstructing the ticket. The computer in the electronic verification machine 108 then compares the two-bit pattern stored in the play spot code for each play spot area 424A–P which has been previously determined by the detection circuitry of the electronic verification machine 108 as having been played. If two or more of the rubbed-off play spot areas have a value of "00" (i.e., "can't check locally"), the electronic verification machine 108 can not determine locally whether the ticket 422 is a winner of a high tier prize and if so, the redemption value of the ticket 422. Thus, in the exemplary ticket 422 illustrated in FIGS. 36 and 37, if the bit pattern for any of the revealed play indicia 426A–P matches the bit pattern for a second revealed play indicia 426A–P, the redemption value of the ticket 422 equals the value of the matching play indicia 426A–P. For example, if two of the revealed play indicia 426A–P have a bit pattern equal to "11", the redemption value of the ticket 422 is five dollars. The electronic verification machine 108 then informs the lottery agent of the redemption value of the ticket 422 via the display 180 or the printer 181 so that the ticket 50 can be paid.

If two of the entries in the table corresponding to the rubbed-off spots are "00", however, the electronic verification machine 108 will not be able to locally determine the redemption value of the ticket 422. Here the "00" bit pattern indicates that the rubbed-off play spots represent a high redemption value or that there may be more than one possible redemption value, for example, the value of all play indicia greater than five dollars. In this case, the electronic verification machine 108 accesses the ticket redemption file in the central computer 223 to determine the redemption value of the ticket 422. In one arrangement the redemption file in the central computer 223 contains a record or a list for each ticket 422 in which the play indica value data are stored in association with a ticket identity number which is essentially a reconstruction of the ticket. The ticket identity number, for example accounting data contained in the bar code 428 or contained in a conventional validation number 78, which uniquely identifies a ticket within a game is transmitted to the central computer 223 and can be used as an address to locate the record in the redemption file containing the indica or redemption values for that ticket. Thus, for example, the ticket redemption file for the ticket 422 includes play indicia value data which enables the central host computer 223 to determine whether or not any two of the rubbed-off spots has the same symbol (e.g., all $10, all $20, etc.). The central host computer 223 then transmits a signal to the electronic verification machine 108 indicating whether or not the ticket 422 is a winner, and if so, the redemption value of the ticket 422. It should be noted that the functions of the central computer 223 and its associated redemption file as described above can be preformed by the computer in the processor board 220 of the electronic verification machine 108. As an alternative more than 2 bits can be used to represent each play spot. This will permit more or even all of the play spot areas to be validated by the electronic verification machine 108. This embodiment reduces or eliminates calls to the central host computer 223. However, this embodiment requires a longer play spot code and, hence, a longer bar code 428 if all the other fields in the bar code are kept at the same size as in the previous embodiment. As indicated above, the size of the bar code 80 can be reduced if a play spot code having a base larger than 10 is used.

A second approach to ticket validation involves using a validation file in the central computer 223 rather than encoding play indicia value data in the bar code 428 on the lottery ticket 422. In this embodiment, the validation number only contains information related to the identity of the ticket, for example, the game number, pack number and ticket number. The validation number is read by the electronic verification machine 108 when, for example, the lottery agent inputs the validation number via the keyboard 178 of the electronic verification machine 108. Alternatively, the validation number and game number can be stored on the ticket in a machine-readable format, for example, as part of the bar code 428 or even as a magnetic stripe. After the electronic verification machine 108 determines which play spot areas have been removed, the electronic verification machine 108 transmits the data as to which play spot areas have been removed along with the validation number to the central computer 223. The central computer 223 contains the redemption or validation file which includes information corresponding to the ticket identification information for each ticket as well as a record with play indicia value data corresponding to each of the play spot areas 424A–P on each ticket 422. The central computer 223 then uses the ticket identification information to read the record corresponding to the ticket 422 and obtains the play indicia value data corresponding to the play spot areas 424A–P that have been removed. If the number of the rubbed-off play spot areas 424-P specified in the rules 432, contain the same symbol, the ticket is a winner. The central computer 223 then determines the redemption value corresponding to the matching play indicia value data and sends authorization to the electronic verification machine 108 so that the redemption value can be paid. An additional advantage of this approach is that after a ticket has been presented for redemption, the records within the validation file which correspond to the ticket can be updated to reflect that the ticket has been verified by the electronic verification machine 108 and the central computer 223. Consequently, the ticket 422 can be presented for redemption only one time and thereafter the validation file contains information indicating that the ticket has been previously paid.

VI. Stigmatization

There are cases where it is desirable to provide a positive indication that a document such as the lottery ticket 50 has been verified or validated by the electronic verification machine 108. This process is termed stigmatization. One approach as described above in Section V. is to register each ticket 50 or document in a central computer that is connected to the electronic verification machine. Another approach is to stigmatize the ticket 50 or document itself.

Providing a hole puncher in the electronic verification machine 108 is one way to accomplish this object. In this case a hole is punched though a critical portion of the partial printed circuit after the verification process has taken place.

Printing a cancellation or void indication on the document by means of a printer such as a dot matrix printer (not shown) located in the electronic verifications machine 108 after verification is another approach that can be used.

Fuses located in the circuits printed on the document can be used to stigmatize or void the document. Here sufficient power is applied to the document such as the lottery ticket 50 by the electronic verification machine 108 to break for example one or more of the resistors 82–94 or blow selected fuses printed on the document. It should be noted that fuses of this nature can also be used to store specified information in the document. For example, if an array of fuses is printed on the document, information can be stored on the document by having the electronic verification machine 108 selectively burn certain fuses much as a PROM is programmed. This technique has applications other than lottery tickets such as an alternative to magnetic stripes on credit cards. Information burned in by blowing fuses can be far more difficult to alter than information contained in a magnetic stripe.

Coloration can also be used to stigmatize the document. In this case the document such as the lottery ticket 50 would also be printed with temperature sensitive ink. Power applied to the document by the electronic verification machine 108 would generate sufficient heat in the circuits printed on the document to change the color of at least a portion of the document.

VII. A Second Electronic verification Machine and Verification Methods

Figure 38:
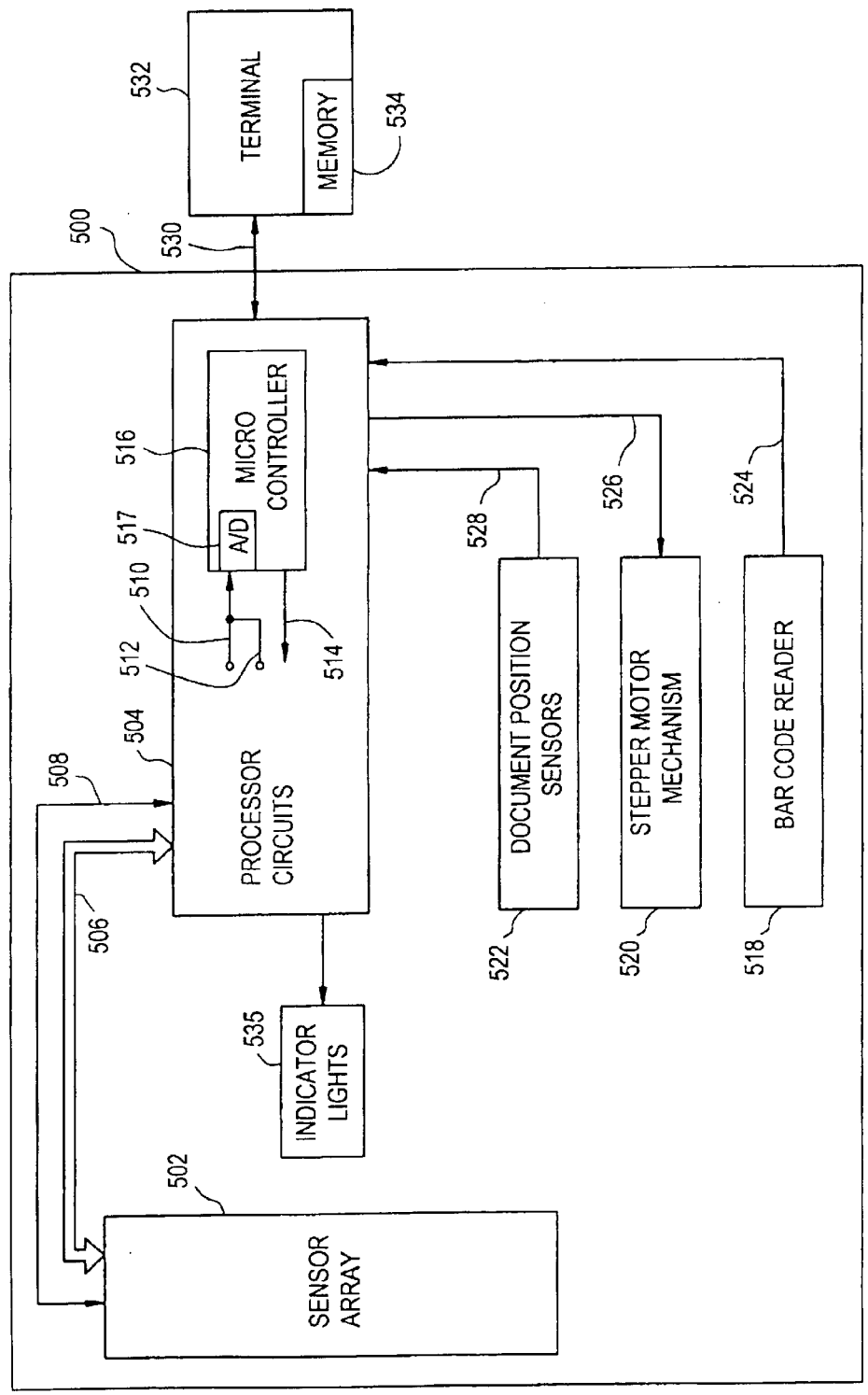
FIG. 38 is a block diagram of a second embodiment of an electronic verification machine.
Figure 39:
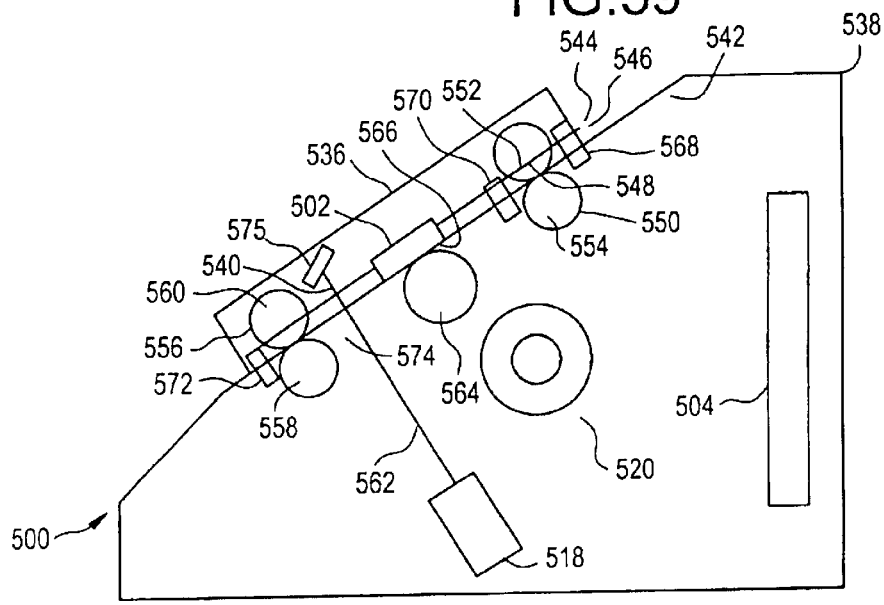
FIG. 39 is a partial sectioned side view of the electronic verification machine of FIG. 38 illustrating a document transport mechanism.

FIGS. 38 and 39 illustrate a second embodiment of an electronic verification machine 500. The basic components of the electronic verification machine 500 are shown in block diagram form in FIG. 40. Included in the electronic verification machine 500 is a sensor array 502 which is connected to a digital processor board 504 by a set of sensor plate lines 506 and an excitation line 508. A set of lines 510–514 provides signal inputs and outputs to a microcontroller 516 which forms part of the digital processor board 504. A suitable microcontroller 516 is the Motorola MC68HC711E9CFN2 that includes a multiplexed 8 bit analog to digital converter ("A/D") 517. The electronic verification machine 500 also includes a bar code reader 518, a stepper motor mechanism 520 and a set of three document position sensors 522 which are connected to the digital processor board 504 by a set of lines 524–528. In the embodiment of the invention shown in FIG. 38, the digital processor board 504 is connected by a RS-232C serial digital interface 530 to a commercially available, microprocessor based, lottery retail terminal 532 that includes a random access memory 534. A set of indicator lights 535 that in this embodiment include "power on," "ready" and "jammed ticket" also form a part of the electronic verification machine 500.

FIG. 39 is a sectioned side view of the electronic verification machine 500 which is primarily provided to illustrate a document interface and transport mechanism, indicated generally by 536. Secured to a housing 538 is an upper document guide plate 540 and a lower document guide plate 542 that combine to form a channel 544 through which a document, such as a lottery ticket, can pass. The document (not shown) is placed in the upper opening 546 of the channel and drops down in response to gravity until it makes contact with a first set of pinch rollers 548 and 550 that extend through an aperture 552 and an aperture 554 in guide plates 540 and 542 respectively. Also included in the electronic verification machine 500 is a second set of pinch rollers 556 and 558 that extend through an aperture 560 and an aperture 562 in guide plates 540 and 542 respectively; a pressure roller 564 which extends through an aperture 566 in the lower guide plate 542; a set of three document edge detectors 568, 570 and 572 that are represented in FIG. 38 as the document position sensors 522; and the bar code reader 518 which is mounted in an aperture 574 of the lower guide plate 542. A mirror 575 is mounted over the aperture 574 which makes it possible for the bar code reader 518 to read bar codes on either or both sides of the document as indicated by a dashed line 577. In addition, the sensor array 502 is mounted on the upper guide plate 540 opposite the pressure roller aperture 566. The pinch rollers 550 and 558 along with the pressure roller 564 are connected to the stepper motor 520 by a toothed belt (not shown) so that the rollers 550, 558 and 564 will all rotate at the same rate.

In operation, the document (not shown) is placed in the upper opening 546 of the channel and drops down in response to gravity until it makes contact with the first set of pinch rollers 548 and 550 which are normally not rotating. Meanwhile, the first edge detector 568 will provide an indication to the microcontroller 516 that a document is present in the channel formed by the guide plates 540 and 542 causing the stepper motor 520, in response to a first pulse rate applied to the stepper motor 520 by the microcontroller 516, to rotate at a first rate. When the document has been detected by the second edge detector 570 as emerging from the pinch rollers 550 and 548, the microcontroller 516 will increase the rate of rotation of the stepper motor 520 resulting in the document being transported by the rollers 550, 564 and 558 at a rate of approximately 8 inches per second past the sensor array 502. The second edge detector 570 also provides the mircrocontroller 516 with the precise location of the document so that the microcontroller 516 can initiate scanning of the document. The pinch rollers 548, 550, 556 and 558 are composed of a conventional elastomeric material and the pressure roller 564 is preferably composed of a closed cell polyurethane material in order to prevent this roller from absorbing or retaining any moisture that might be on the document. The purpose of the pressure roller 564 is to insure contact between the document and the sensor array 502. After passing the sensor array 502, the document will pass the bar code reader 518, which will transmit the bar code information on the document to the microcontroller 516, and the edge detector 572 will provide an indication to the microcontroller 516 that the document has exited the electronic verification machine 500.

It should be noted that the configuration of the electronic verification machine 500 shown in FIG. 39 has a number of significant advantages including: a straight document path that minimizes the possibility of paper jams; positive control of the document by the stepper motor 520 in conjunction with the pinch rollers 550 and 558; the use of the pressure roller 564 to maintain contact of the document with the sensor array 502; and the use of the edge detectors 568–572 to provide the microcontroller 516 with information as to the location of the document in the electronic verification machine transport mechanism 536. In addition, a self cleaning effect occurs because the document is in moving contact with the sensor array 502 and further more, the electronic verification machine 500 can readily accept documents of varying thickness.

Figure 40:
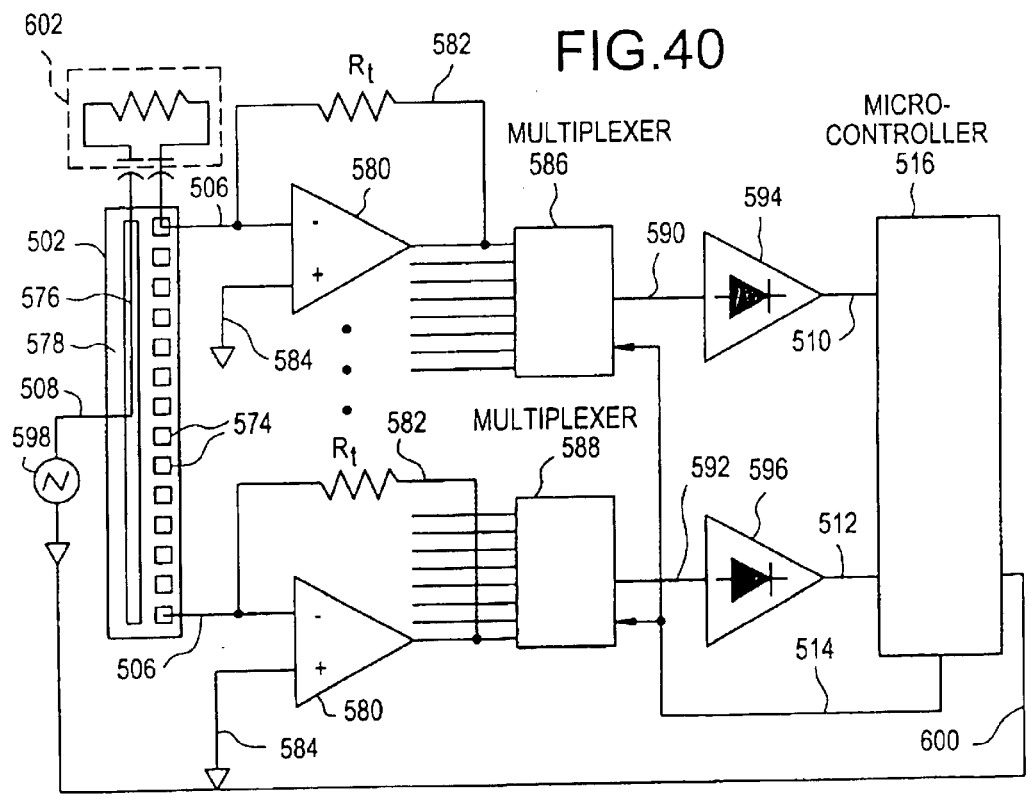
FIG. 40 is a block diagram of a portion of the circuitry of the electronic verification machine of FIG. 38.

FIG. 40 is a block diagram illustrating in more detail portions of the preferred embodiment of the sensor array 502, the digital processor board 504 and the microcontroller 516 of FIG. 38. In this embodiment of the invention, the sensor array includes 14 sensor plates, designated by reference numeral 574, and a rectangular excitation plate 576 mounted on a printed circuit board 578. A set of 14 operational amplifiers, designated by reference numeral 580, have their inverting inputs connected by the lines 506 to each one of the sensor plates 574. Also connected to the inverting inputs and the outputs of the operational amplifiers 580 is a feedback line, indicated by reference numeral 582, that includes a feedback resistor $R_f$. The noninverting inputs of the operational amplifiers 580 are connected to ground as shown by lines 584. The outputs of each of the operational amplifiers 580 are connected to one of two multiplexers 586 or 588 that in turn are connected by a pair of lines 590 and 592 to a pair of precision rectifiers 594 and 596. The rectifiers 594 and 596 are connected to the analog to the digital input 517 of the microcontroller 516 via the lines 510 and 512. Control is provided to the multiplexers 586 and 588 from the microcontroller 516 by the line 514. In addition, the circuit of FIG. 40 includes a triangle wave voltage generator 598 that applies an AC excitation voltage over the line 508 to the excitation plate 576. The voltage generator 598 can be controlled, in this case switched on or off, by the microcontroller 516 over a line 600. For illustrative purposes, FIG. 40 also includes within a dashed line 602 an equivalent circuit of a document under test where $C_{t1}$ represents the capacitance between the excitation plate 576 and the document; $R_t$ represents the resistance in the document between the excitation plate 576 and the first sensor plate 574; and $C_{t2}$ represents the capacitance between the document and the first sensor plate 574.

One of the objects of the circuit shown in FIG. 40 is to scan the document under test 602, such as a lottery ticket, for conductive material. Because the frequency and amplitude of the voltage generated by the triangular waveform voltage generator 598 are constant, the current I on the sensor plate 574 will be a square wave due to the relation $I=C_{total}\,dv/dt$ where $C_{total}$ is the combined capacitances of $C_{t1}$ and $C_{t2}$. As a result the voltage drop across the feedback resistor $R_f$ will be a square wave having its amplitude proportional to the capacitance $C_{total}$. The preferred frequency of the voltage generator is between 20 KHz and 150 KHz. Thus, the voltage output on lines 582 of the operational amplifiers 580 can be used to determine both the value of the coupling capacitance $C_{total}$ and if there is conductive material between each of the sensor plates 574 and the excitation plate 576. By using two multiplexers 586 and 588 and the rectifiers 510 and 512, the microcontroller 516 can, in effect, sample the current on each of the sensor plates 574, which would result from conductive material on the document 602, thereby providing an indication of the presence or absence of conductive material across the document 602. The stepper motor 520 of the electronic verification machine 500 advances the document 602 in discrete steps of approximately between 0.02 inches and 0.03 inches past the sensor array 502 and the microcontroller 516 applies the excitation signal to the excitation plate 576 for each step. In this manner the microcontroller 516 can be programmed to scan a predetermined portion or even the whole document 602 for conductive material as well as the values of the coupling capacitance $C_{total}$.

Another very important capability of the circuit shown in FIG. 40, in addition to the determination of the presence of conductive material on the document under test, is that it can be used to determine an electrical signature of the document. For example, the electrical signature representing an electrical characteristic such as resistance can be measured as is discussed in more detail in connection with the circuits of FIGS. 18 and 41. Also, a measure of the total coupling capacitance $C_{total}$ can be used as an electrical signature. As indicated above, if the voltage generator 598 generates a constant frequency triangular wave form, the current I on the sensor plate 574 will be linearly related to the capacitance $C_{total}$ and therefore the coupling capacitance $C_{total}$ itself can be measured. The total capacitance $C_{total}$ depends on the characteristics of the document under test, such as the dielectric constant K of a dielectric material covering the conductive material or the thickness t of the dielectric material, while other factors including the size of the excitation plate 576 and the sensor plates 574 remain essentially constant. As a result, the value of the current I or changes in the current I can be used to measure a capacitive electrical signature of the document. For example, it would be possible in some cases to use a capacitive electrical signature to determine if a scratch-off coating covering conductive material on a lottery ticket has been removed.

In the embodiment of the sensor array shown in FIG. 40, the 14 sensor plates 574 are square with each side 0.10 inches in length and the excitation plate is 0.10 inches in width. The excitation plate. 576 extends parallel to the linear array of sensor plates 574 and is located about 0.050 inches from the sensor plates 574. Improved control of capacitance coupling is provided for by utilizing the pressure roller 564 of FIG. 39 to maintain the document 602 in direct physical contact with the sensor array 502. Also, to insure adequate values of capacitance between the document 602 and the plates 574 and 576, as represented by the capacitors $C_{t1}$ and $C_{t2}$ the metal sensor and excitation plates 574 and 576 are coated with a material having a dielectric constant greater than 5. A suitable material for this coating is Kapton. In the event that a document interface is used where the document is not in contact with the sensor or excitation plates, is preferable that an air gap of less than 0.004 inches be maintained between the document and the plates. Also, in order to assure adequate values of sensed capacitance, it is preferable to have the rectangular excitation plate 576 several times larger in area than the sensor plates 574.

It should be noted that one of the advantages of the verification or validation method described above, is that the ticket or document can be printed on a flexible substrate such as paper and because the conductive material can be in direct contact with the sensor array 502, it is not necessary to apply a dielectric material over the document.

Figure 41:
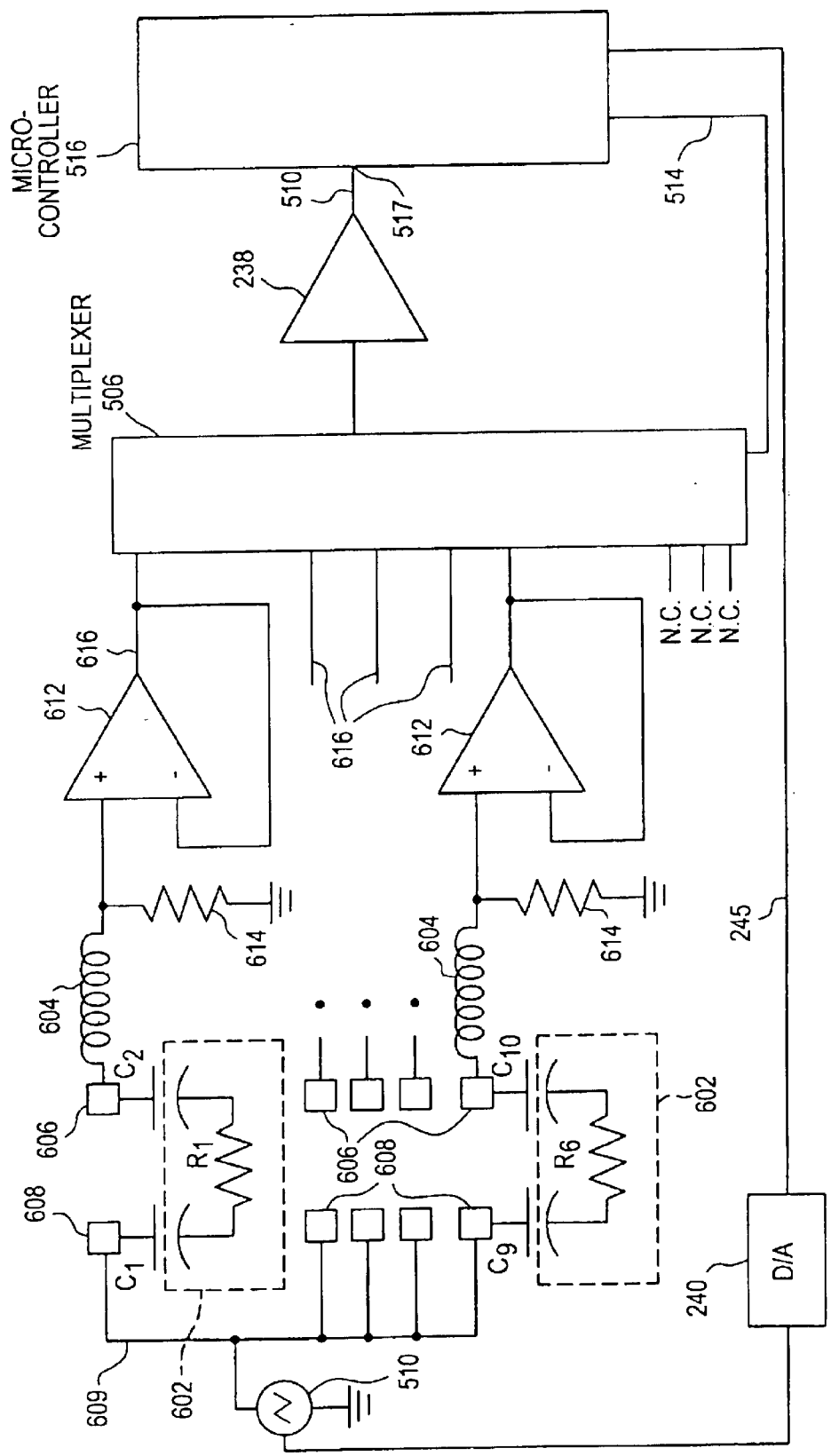
FIG. 41 is a schematic diagram of a position sensor array and buffer circuit that can be used with the circuit of FIG. 39.

Illustrated in FIG. 41 is an alternate embodiment of a sensor circuit of the type shown in FIG. 18 that can be used to make measurements of the electrical signatures, such as resistance, of conductive material on documents. The circuit of FIG. 41 is suitable for use with the mechanical arrangement of the electronic verification machine 500 shown in FIG. 39 and is generally equivalent in function to the sensor array 502 and the processor circuits 504 shown in FIGS. 38 and 40. For purposes of explanation, the circuit diagram of FIG. 41 includes the document under test equivalent circuit 602 which has been described in connection with FIG. 40 and the equivalent elements from FIGS. 18, 38 and 40 carry the same reference numbers. As with the circuit of FIG. 18, an inductor 604, for example having an inductance of 100 mH, is connected to each of a set of 5 sensor plates 606 in order to compensate, in phase, for the reactance resulting from the capacitance between the document 602 and the sensor plates 606 and a corresponding set of excitation plates 608. The microcontroller 516 can be programmed to perform the same frequency sweeping functions as the mircrocontroller 224 described in connection with FIG. 18 and the processor circuits 504 can contain functional elements equivalent to the integrator (peak detector) 238, the D/A converter 240 and the VCO 242. Included in this circuit is a set of 5 excitation plates 608. Although not shown in the schematic diagram of FIG. 41, the excitation plates 608 can be located between and aligned in a linear array with the sensor plates 606. Although a single excitation plate 576 of the type shown in FIG. 40 can be used instead of the separate excitation plates 608, the use of separate excitation plates 608 in this embodiment of the invention has the advantage of reducing distributed capacitances. Connected to each of the excitation plates 608 by a line 609 is a triangular wave voltage controlled oscillator (VCO) 610 in order to apply a triangularly shaped, AC excitation voltage or signal to the document under test. However, it should be noted that optimal performance of a resonant circuit can be achieved with a sinusoidal wave form instead of the triangular wave voltage generated by the generally less expensive VCO 610. Also included in this circuit is a set of 5 operational amplifiers 612 connected in a voltage follower arrangement with the sensor plates 606. Specifically, the noninverting inputs of each of the operational amplifiers 612 are connected, in this case, through the inductors 604 to the sensor plates 606 and to a resistor 614 that in turn is connected to ground. As a result, the output of each of the operational amplifiers 612, on a set of lines 616 which are also connected to the inverting input of the operational amplifiers 612, will be a voltage that represents the current flow through the resistor or resistance $R_t$ of the document 602 resulting from the excitation signal on line 609.

As indicated above, the circuit of FIG. 41 can use a control circuit 618, which can include a microcontroller such as the microcontroller 516, to perform an iterative resonance seeking algorithm to vary the frequency of the VCO 610 until the resonance of the LC circuit including the inductor 604 and the capacitance between plates 606 and 608 is found. The resulting voltage on lines 616, which can be multiplexed, peak-detected and applied to the analog to digital input 517 of the microcontroller 516 in a manner similar to that shown in FIG. 40, represents the value of the resistance of a conductive material on a document. In this way it is possible to determine the electrical signature, for example the value of resistance, of conductive material located in a predetermined position on a document. Since it is possible to make accurate measurements of electrical signatures using the circuit of FIG. 41, this approach can be particularly useful for those documents, such as a lottery probability ticket of the type shown at 50 in FIG. 1, where particular accuracy may be important. Also, once the control circuit 618 has determined the resonance frequency, it can use a standard resonance frequency equation, such as C=25,330/f $^2$L, to determine the coupling capacitance to the document since the inductance of the inductor 604 is known.

Another embodiment of a sensor array is illustrated in FIG. 42 where a document 620, such as a lottery ticket, is inserted between an upper array of sensor plates 622 and a lower array of excitation plates 624. This arrangement has the advantage of reducing the sensitivity of the system to displacement of the document 620 in a direction perpendicular to the plane of the document 620.

As illustrated in FIGS. 43–45, one of the advantages of the systems shown in FIGS. 38–40 is that it is possible to determine the location as well as the shape of conductive material on a document. As an example of how shapes on a document can be determined, a conventional instant lottery ticket 626 having a scratch-off coating 628, shown partially broken away, covering a set of play indicia 630 is illustrated in FIG. 43. In this case the scratch-off coating includes a conductive material and one object of the system in this example is to determine what portion of the scratch-off coating has been removed as part of a ticket validating process. Contained in the terminal memory 534, shown in FIG. 38, is a game signature map 632 in which a bit map or digital representation of the shape of the scratch-off coating 628 of the ticket 626 is stored. As previously described in connection with FIGS. 38–40, the electronic verification machine 500 scans the ticket 626 for conductive material and the microcontroller 616 then transmits a digital representation of the location of the conductive material detected on the ticket 626 to a scanned data map contained in the memory 534. At this point a microprocessor (not shown) in the lottery terminal 532 can compare the contents of the scanned data map 634 to the game signature map and if the data in the scanned data map meets certain predetermined criteria such as location, shape or percentage of expected removal of the scratch-off coating 628, then a comparison signal is generated indicating that the ticket 626 has passed a verification or validation test. One method for representing verification criteria is by a vector. In the case of the ticket 626, such a vector might have several bytes representing the starting address and the ending address of the game signature map 632 corresponding to where the scratch-off coating 628 can be expected along with another byte having a value that represents the minimum percentage of the scratch-off coating that constitutes an acceptably played ticket. As a practical matter, players often only scratch off a portion of the lottery ticket's scratch-off coating, so that, for example, an acceptable percentage for a particular type of played ticket might be 30%. Use of vectors of this type makes it especially easy to reprogram the terminal 532 for different types of lottery tickets or documents.

Another method of verifying a document such as a lottery ticket of the scratch-off type 626 is to utilize the capacitive signature of the ticket 626 as measured by the electronic verification machine 500. Taking, for example, the ticket 626 which can include a uniform conductive material (not shown) applied beneath the scratch-off coating 628 and that is removable with the coating 628 of the type as described in U.S. Pat. No. 5,346,258, a measure of the signal to noise ratio between areas of the ticket 626 having the scratch-off coating 628 and the areas that do not, can provide a strong indication of validity. This method starts by determining a value for the coupling capacitance $C_{total}$ for each location on the ticket 626 by measuring the current I on the sensor plates 574 using the circuit of FIG. 40. Then by taking the mean average $T_s$ of the value of the coupling capacitance of the areas of the ticket 626 having the scratch-off coating 628 along with the mean average $T_p$ of the other areas and dividing $T_s$ by $T_p$, a signal to noise ratio can be obtained. Here, $T_s$ represents the signal and $T_p$ represents the noise. Preferably, the value of $T_s$ is calculated from only those coupling capacitance values that exceed a predetermined value such as 11 out of a maximum sensed value of 36. Computing this signal to noise ratio for an entire document such as the ticket 626 can provide an excellent indication of the validity of the document. It has been found, for instance, that lottery tickets of the type 626 will consistently produce signal to noise ratios of between 3.6 and 4.9.

One of the reasons that the above described signal to noise ratios can provide such an excellent indication of validity is that it measures an inherent electrical signature of a document that can be very difficult to forge. In the example above, the measured coupling capacitance $C_{total}$ of the scratch-off areas 628 of the ticket 626 are a function of two independent factors: the thickness t and the dielectric constant K of the scratch-off coating 628. Because $C_{total}$ is equal to $K\epsilon_0 A/t$ where $\epsilon_0$ is the permittivity of free space and A is the area of the capacitor plate 574, a forger would have to almost exactly match both the thickness t and the dielectric constant K of the scratch-off coating.

In addition to lottery tickets, the scanning method as described above can be useful in the verification of a wide variety of documents. For instance, currency bills can be printed with conductive fibers or conductive inks located in predetermined locations. The electronic verification machine 500 can then be used to verify the authenticity of the bills by determining electrical signatures as well as the location or the amount of conductive material in the bills. Since the electronic verification machine 500 of FIGS. 38–40 can operate at relatively high speed, 8 to 10 inches per second, the verification of documents can be accomplished quickly and inexpensively.

Figure 46:
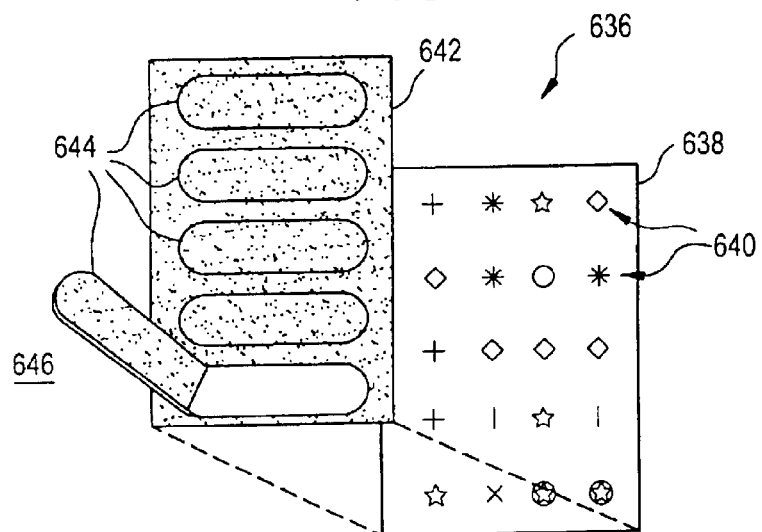
FIG. 46 is an exploded perspective view of a pull-tab lottery ticket.

Another application for the electronic verification machine 500 is in the validation of a pull-tab type lottery ticket 636 as shown in FIG. 46. The pull-tab ticket 636 is made up of a substrate 638 upon which play indicia, indicated by 640, are printed. Laminated over the substrate 638 is a pull-tab stock member 642 having a number of perforated pull-tabs 644 located such that they cover the play indicia 640. The underside or laminate surface of the pull-tab member 642 is printed with a layer of conductive ink, as indicated by reference numeral 646, which forms a conductive plane and is not obvious to a player. In this type of ticket 636, the conductive plane formed by the conductive ink layer 646 will be interrupted when a player removes one or more of the pull-tabs 644.

Figure 47:
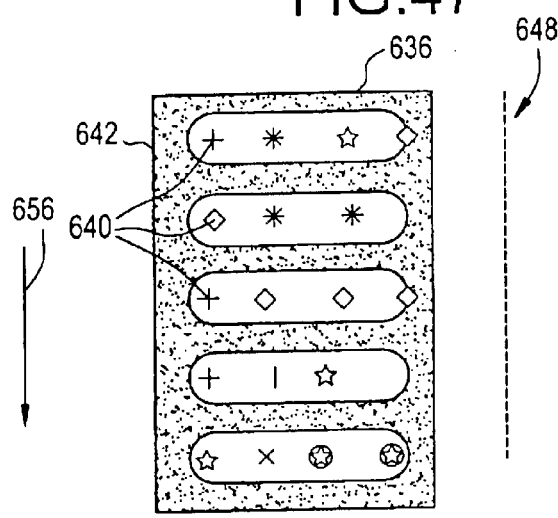

Referring to FIG. 47, a pull-tab signature map 648 is graphically represented along side the pull-tab ticket 636, with pull-tabs 644 shown as removed. As shown in this figure, the "0" bits in the signature map 648 correspond to positions of the pull-tab 644 on the ticket 638. The remaining bits in the signature map 648 are set to "1." As a result, the signature map 648 provides a digital representation of the location of the pull-tabs 644 along the center line of the pull-tab ticket 636. The signature map 644 can be stored in the memory 534 of the lottery terminal 532 or in the case where a simplified version of the type of electronic verification machine 500 of FIG. 38 is to be used, the signature map 644 can be stored in the microcontroller memory 516 or its equivalent.

Figure 48:
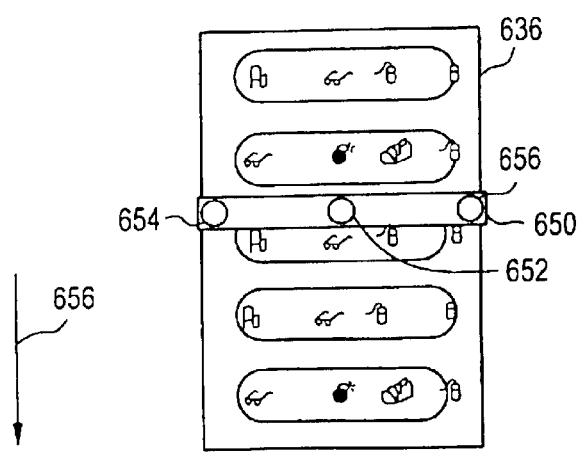
FIG. 48 is an illustrative top view of the pull-tab lottery ticket of FIG. 46 positioned below an electronic verification machine sensor array.

A simplified sensor array 650, which can be used in the electronic verification machine 500 to validate the pull-tab ticket 636, is shown in FIG. 48 as positioned over the pull-tab ticket 636. The sensor array 650 includes a sensor plate 652 located between a pair of excitation plates 654 and 656 such that the sensor plate 652 is aligned with the center line of the pull-tab ticket 636. The circuits (not shown) connected to the sensor and excitation plates 652 and 654 are substantially the same and operate in the same manner as the circuits in FIG. 40. In validating the pull-tab ticket 636, the ticket 636 is scanned along its center line, in the direction indicated by an arrow 656, by the sensor plate 652 and its associated circuity in the electronic verification machine 500. If, for example, the output of sensor plate 652 is equivalent all "0"s, then the ticket 636 does not contain conductive ink and, as such, can be considered a forgery, perhaps a photocopy. Then by comparing the sensor plate 652 output to the signature map 644 it is possible to determine how many, if any, of the pull-tabs 644 have been opened.

VIII. A Second Probability Game Ticket Configuration.

Figure 49:
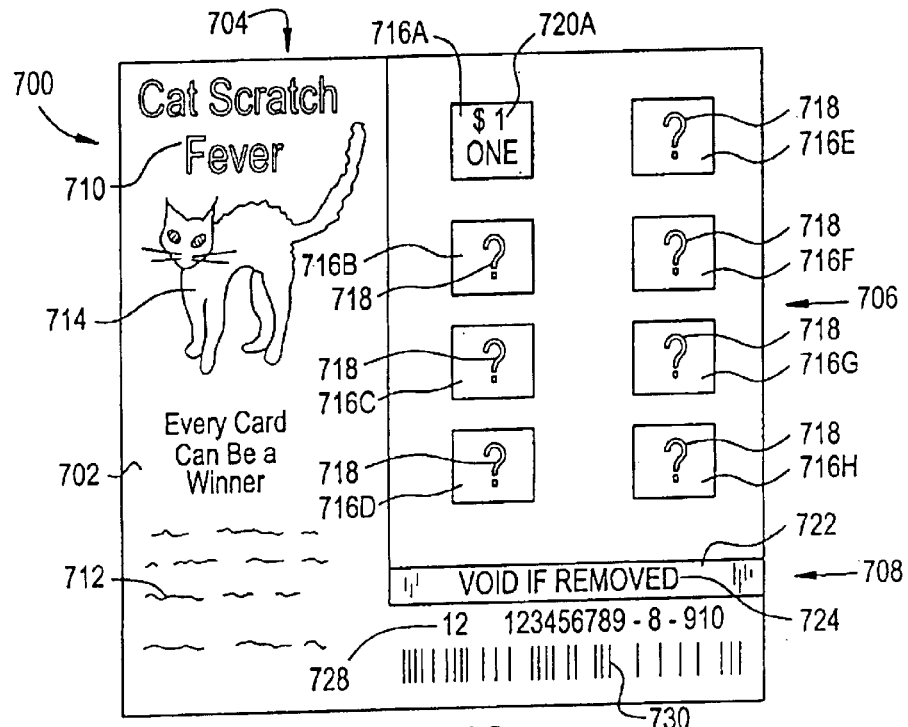
FIG. 49 is a plan drawing of a second embodiment of a probability ticket according to the invention.

FIGS. 49–50 and 52–72 show a second embodiment of a probability game ticket 700, which is the preferred embodiment to be used in conjunction with the sensor array 502 of the electronic verification machine 500, shown in FIGS. 38–40. FIG. 49 presents the finished appearance of the ticket 700. The ticket 700 is printed on a substrate 702, such as card stock or paper, and has three portions: a display graphics portion, shown generally at 704, a play field portion, shown generally at 706, and a ticket identification portion, shown generally at 708. As with the previous ticket 50, the display graphics portion 704 includes a variety of printed information such as the name 710 of the game, rules 712 for playing the game, and customized art work 714. The play field portion 706 includes a group of play spot areas 716A–H which are printed as overprint layers. The play field portion 706 can also include play spot graphics 718 which help to further visually delineate each play spot area 716A–H. Each play spot area 716A–H conceals a play indicia 720A–H (shown in FIG. 61). For example, play spot area 716A has been removed to reveal the underlying play indicia 720A. The ticket identification portion 708 includes a void-if-removed area 722 which is printed as an overprint layer. The void-if-removed area 722 can include overprint graphics 724. The void-if-removed area 722 conceals a validation number 726 (shown in FIG. 61) which contains information that can be used in validating the ticket 700. The ticket identification portion 708 also includes an inventory control number 728 and a machine-readable bar code 730. Similar to the bar code 80 of the first ticket 50, the bar code 730 can include information related to the validation number 726 (shown in FIG. 61), to the pack and ticket numbers for the ticket 700 and to the redemption values of the play indicia 720A–H. The bar code 730 thus serves as a ticket identification indicia for the ticket 700.

Figure 50:
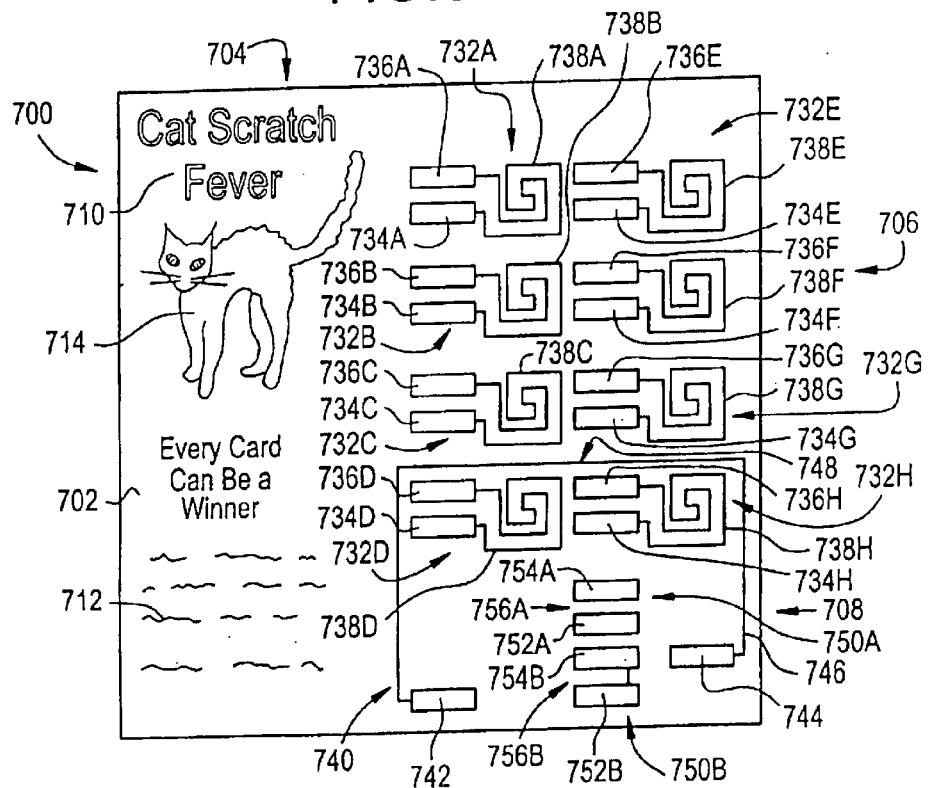
FIG. 50 is a plan drawing of the circuit elements that form parts of the ticket shown in FIG. 49.

FIG. 50 is a plan view of various circuit elements which are used in determining the authenticity and integrity of the ticket 700. The ticket 700 includes two general types of circuit elements which are used in association with the play indicia 720A–H and with the bar code 730. The first type of circuit element consists of individual indicia circuit elements 732A–H which are used to determine the presence of the play indicia 720A–H as well as the integrity of each of the underlying play indicia 720A–H. Each of the indicia circuits 732A–H includes a first capacitive pick-up area, generally denoted as 734, a second capacitive pick-up area, generally denoted as 736, and a resistive element, generally denoted as 738, that is connected to and extends between the first and second capacitive pick-up areas 734 and 736. Thus, for example, the indicia circuit element 732A includes the first capacitive pick-up area 734A, the second capacitive pick-up area 736A and the resistive element 738A. Similarly, the indicia circuit element 732B includes the first capacitive pick-up area 734B, the second capacitive pick-up area 736B, and the resistive element 738B. The resistive elements 738A–H are printed in a serpentine pattern so as to cover most of the play indicia 720A–H. As explained in more detail with reference to FIGS. 69–70, each of the indicia circuit elements 732A–H is associated with one of the underlying play indicia 720A–H. Thus, for example, the indicia circuit element 732A is associated with the play indicia 720A, shown in FIG. 49. The individual indicia circuit elements 732A–H are printed on the ticket 700 so that at least a portion of each indicia circuit 732A–H overlies one of the individual play indicia 720A–H. In the preferred embodiment, the resistive element 738 of the indicia circuit elements 732 are printed on the ticket 700 to overlie one of the play indicia 720. Moreover, in the preferred embodiment, the capacitive pick-up areas 734 and 736 of the indicia circuit elements 732 are printed on the ticket 700 so that the capacitive pick-up areas 734 and 736 do not overlie any of the play indicia 720. Thus, for example, the resistive element 738A of the indicia circuit element 732A is printed in the ticket 700 to overlie the play indicia 720A and while the capacitive pick-up areas 734A and 736A of the indicia circuit element 732A are printed on the ticket 700 so that the capacitive pick-up areas 734A and 736A are spaced-apart from the play indicia 720A and do not overlie the play indicia 720A or any of the other play indicia 720B–H.

The individual indicia circuit elements 732A–H capacitively couple with the sensor array 502 of the electronic verification machine 500 when the ticket 700 is placed in the opening 546 of the electronic verification machine 500 and is moved through the electronic verification machine by the stepper motor 520, the pinch rollers 548, 550, 556, 558, and the pressure roller 564, as described with reference to FIGS. 38–40. Specifically, the first capacitive pick-up areas 734A–H capacitively couple with the sensor plates 574 of the sensor array 502 and therefore serve as sensor capacitive pick-up areas for the indicia circuit elements 732A–H. In addition, and the second capacitive pick-up areas 736A–H capacitively couple with the excitation plate 576 of the sensor array 502 and therefore serve as excitation capacitive pick-up areas for the indicia circuit elements 732A–H. Consequently, the dimensions and positions of the capacitive pick-up areas 734A–H and 736A–H are determined by the dimensions and positions of the excitation plate 576 and the sensor plates 574 of the sensor array 502. In the preferred embodiment, the width of both the first and second capacitive pick-up areas 734A–H and 736A–H is on the order of 0.26 inches, the height of the first capacitive pick-up areas 734A–H is about 0.05 inches, and the height of the second capacitive pick-up areas 736A–H is on the order of 0.10 inches. In addition, the first capacitive pick-up areas 734A–H are longitudinally spaced-apart from the second capacitive pick-up areas 736A–H by a predetermined distance which, in the preferred embodiment is about 0.07 inches. Moreover, each of the individual indicia circuit elements, for example, indicia circuit element 734B, is longitudinally spaced apart from adjacent indicia circuit elements, for example, indicia circuit elements 732A and 732C, by a predetermined distance. The configuration of the indicia circuit elements 732A–H offer several advantages. First, the individual indicia circuit elements 732A–H provide discreet electrical signatures for each of the play spot areas 716A–H and associated underlying play indicia 720A–H. Consequently, the indicia circuit elements 732A–H can be used to determine the presence as well as the integrity of the individual play spot areas 716A–H and the associated underlying play indicia 720A–H. In addition, each of the indicia circuit elements 732A–H is spatially isolated from other circuit elements. Consequently, stray electrical noise is minimized or eliminated.

As explained in more detail below, portions of the indicia circuit elements 732A–H are removed when the play spot areas 716A–H are removed to reveal the play indicia 720A–H. Consequently, the ink used to print the indicia circuit elements 732A–H should have a reduced adhesiveness so that the portions of the indicia circuit elements 732A–H are readily removed from the ticket 700. In addition, the ink used to print the indicia circuit elements 732A–H should also be fairly conductive. In the presently preferred embodiment of the invention, the sheet resistivity of the ink used to print the indicia circuit elements 732A–732H is on the order of 2 K$\Omega$/□. Table 4 describes the presently preferred formulation for the ink used print the indicia circuit elements 732A–732H.

TABLE 4

Ink Formulation For The Indicia Circuit Elements 732A–732H

| material | wt % |
| --- | --- |
| Polyamide resin | 1.75 |
| Dimethylethanol amine | 0.25 |
| Ammonium Hydroxide | 0.25 |
| Conductive Carbon Black | 13.00 |
| Polyethylene/PTFE wax | 1.50 |
| Silicone paste | 1.25 |

TABLE 4-continued

Ink Formulation For The Indicia Circuit Elements 732A–732H

| material | wt % |
| --- | --- |
| Acrylic synthetic pigment | 4.00 |
| Colloidal acrylic | 9.00 |
| Ethyl Alcohol | 2.00 |
| Styrenated acrylic emulsion (high $T_g$) | 8.25 |
| Styrenated acrylic emulsion (low $T_g$) | 16.45 |
| Silicone-based surfactant | 0.50 |
| Water | 41.80 |

An alternative ink formulation for the ink used to print the indicia circuit elements 732A–732H is given in Table 5. This ink has a lower sheet resistivity than that of the ink described in Table 4, on the order of about 1 K$\Omega$/58.

TABLE 5

Alternative Ink Formulation For The Indicia Circuit Elements 732A–H

| material | wt % |
| --- | --- |
| water | 41.8 |
| Dispersant (W-22) | 4.8 |
| Dimethylethanolamine | 0.25 |
| Defoamer (RS-576) | 0.4 |
| Carbon Black | 1.5 |
| wetting agent (BYK 348) | 0.5 |
| EVCL Emulsion Vancryl 600 | 3 |
| Ammonium Hydroxide | 0.25 |
| DC-24 Silicone Emulsion | 2 |
| Styrenated Acrylic Varnish (J678) | 5 |
| Plasticizer 141 | 2 |
| Styrenated Acrylic Emulsion 7830 | 20 |
| Ethanol | 5 |

The second general type of circuit element is an integrity circuit element 740 that is used to determine the authenticity and integrity of the ticket identification indicia, such as the bar code 730. The integrity circuit element 740 includes a first capacitive pick-up area 742 that is shaped and sized to capacitively couple with one of the sensor plates 574 of the sensor array 502. The integrity circuit element 740 also includes a second capacitive pick-up area 744 that is shaped and positioned to capacitively couple with the excitation plate 576 of the sensor array 502. Both the first and second capacitive pick-up areas 742 and 744 are printed entirely within the ticket identification portion 708 of the ticket 700 and, as explained in more detail below, underlie at least a portion of the ticket identification indicia, such as the bar code 730. The ticket integrity circuit 740 also includes a resistive element 746 that is connected to and extends between the first and second capacitive pick-up areas 742 and 744. The resistive element 746 is printed on the ticket 700 so that a portion 748 of the resistive element 746 is located within the play field portion 706 of the ticket 700 and is shown as encompassing indicia circuit elements 732D and 732H. The integrity circuit element 740 provides a discreet electrical signature for the ticket identification indicia, such as the bar code 730, and thus can be used to determine the authenticity and integrity of the ticket identification indicia. For example, if an attempt is made to replace the bar code 730 by cutting the ticket 700, the resistive element 746 would also be cut and thus detectable by the electronic verification machine 500.

The ticket 700 can include additional data circuits, generally denoted as 750, which can be used to provide additional ticket authenticity and integrity information. The data circuits 750 include first capacitive pick-up areas 752 and second capacitive pick-up areas 754 that are positioned and shaped to capacitively couple with one of the sensor plates 574 and with the excitation plate 576, respectively, of the sensor array 502. The data circuits 750 also include data tracks 756 that spans between the capacitive pick-up areas 752 and 754. The data tracks 756 are used to electrically store data in a binary form. For example, when the data tracks 756 include a conductive material the data tracks can encode a bit-on or "1" signal. Alternatively, when the data tracks 756 do not include a conductive material the data tracks 756 can encode a bit-off or "0" signal. As shown in FIG. 50, the ticket 700 preferably includes at least two data circuits, 750A and 750B, both of which are printed within the ticket identification portion 708. By including two data circuits 750A and 750B, the ticket can store four separate binary codes, e.g., 11, 10, 01, and 00. As shown in FIG. 50, the data track 756A of the data circuit 750A does not include a conductive material and so encodes a bit-off or "0" signal while the data track 756B of the data circuit 750B includes conductive material and so encodes a bit-on or "1" signal. The binary code produced by the data circuits 750A and 7508, when used in conjunction with additional information stored elsewhere on the ticket 700, for example, in the validation number 726, can provide at least partial ticket authenticity and integrity information. The ink used to print the integrity circuit element 740 and the data circuit elements 750A–B should be fairly conductive. Table 11, in Section XII.B. (below) describes the presently preferred formulation for the ink used to print the integrity circuit elements 740. The ink described in Table 11 has a sheet resistivity of less than 5 K$\Omega$/□. Table 1 presents an alternative ink formulation for printing the integrity circuit elements. The ink described in Table 1 has sheet resistivity of about 3 M$\Omega$/□.

Figure 51:
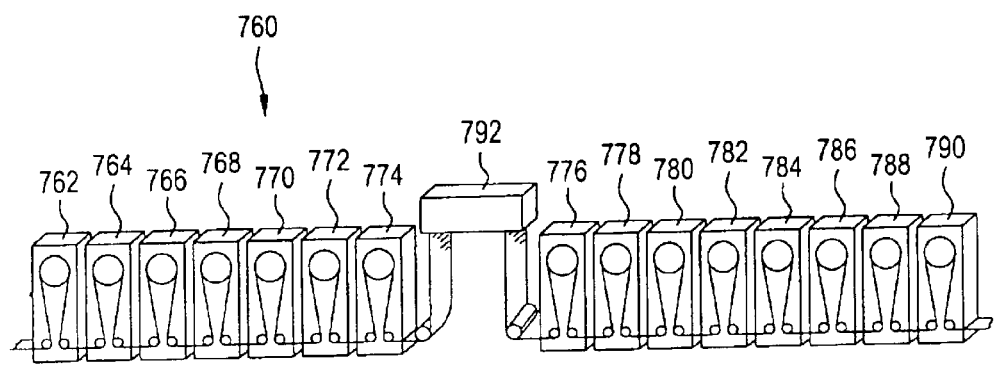
FIG. 51 is a schematic representation of a gravure printing press used to print the ticket in FIG. 49.

It should be noted that the two general types of circuit elements, the indicia circuit elements 732A–H and the integrity circuit element 740, are actually printed on the ticket 700 as separate layers. In addition, the ticket 700 includes several other layers that are used to generate the finished form of the ticket 700 shown in FIG. 49. FIGS. 51–72 illustrate the sequence and configurations of the layers which form parts of the ticket 700. The ticket 700 is preferably printed by an intaglio method. A gravure printing method is especially preferred as it allows for the widest range of ink and coating formulations, although other intaglio printing methods can be used. The ticket 700 can also be printed by screen printing, relief printing, planographic printing, letterpress, and flexographic printing. However, as noted a gravure printing process is preferred for printing the ticket 700. FIG. 51 presents a schematic diagram of a gravure printing press 760 which is suitable for printing the ticket 700. The press 760 has fifteen printing stations 762–790, each of which prints one layer on the ticket 700, and one ink jet printer 792 that prints the play indicia 720A–H, the validation number 726, the inventory control number 728, and the bar code 730. The first print station 762 prints a first layer 794 on the ticket 700. The first layer 794 is an opaque blocking layer that helps to protect the play indica 720A–H and the circuit elements 732A–H, 740, 750A, and 7508, from surreptitious detection by candling.

In order that the circuit elements such as 732A–H, 740, 750A or 750B can be detected, the first opaque blocking layer 794, as well as any other layer on the ticket, should be relatively non-conductive as compared to the conductivity of the circuit elements 732A–H, 740, 750A or 750B. Otherwise, the layer 794 would tend to interfere with the detection of the electrical signatures of the circuit elements 732A–H, 740, 750A or 750B. This is especially the case with the capacitive pick-up areas such as 734A–H and 736A–H and in particular with respect to the capacitive pick-up areas 734A–H that serve in this embodiment as sensor capacitive pick-up areas. It has been found that a relatively conductive layer under the capacitive pick-up area 734 can result in a noise spike, making it difficult for the electronic verification machine 500 to accurately the presence or signature of the resistive element 738. Although it is possible to detect the presence of the resistive elements 738A–H and 746 using an electronic verification machine of the type shown at 500 where the conductivity of the circuit elements such as 732A–H, 740, 750A and 7508 is only twice the conductivity of an adjacent layer such as the lower blocking layer 794, it is desirable that the difference in conductivity be at least one order of magnitude or 10 dB and more preferably, two to three orders of magnitude or 20 to 30 dB. Therefore, it is considered preferable that, in order to reduce the signal to noise ratio in scanning the circuit elements such as 732A–H, 740, 750A and 750B, that the layer 794 appear to be substantially nonconductive in comparison to the circuit elements 732A–H, 740, 750A and 750B. By increasing the difference in conductivity between the circuit elements such as 732A–H, 740, 750A and 750B and the layer 794 it is possible to reduce the manufacturing tolerances of both the electronic verification machine 500 and the ticket 700. This consideration is significant when documents and verification machines are being produce in large volumes. In particular where the lottery tickets 700 are printed in the millions and are subject to various types of abuse such as bending and crumpling, the difference in conductivity between the circuit elements 732A–H, 740, 750A and 750B and the layer 794 is preferably three orders of magnitude or 30 dB. Thus, in the preferred embodiments of the electronic verification machine 500 and the ticket 700, where the blocking layer 794 is a continuous layer underlying all of the circuit elements 732A–H, 740, 750A and 750B, the desired relationship between the sheet resistivity ($\rho S_{(LBL)}$) of the lower blocking layer 794 and the sheet resistivity ($\rho s_{(CE)}$) of the circuit elements 732A–H, 740, 750A, and 750B is at least two orders of magnitude as illustrated by the equation:

$$\rho S_{(LBL)} \geq 1000 \rho S_{(CE)}$$

Figure 52:
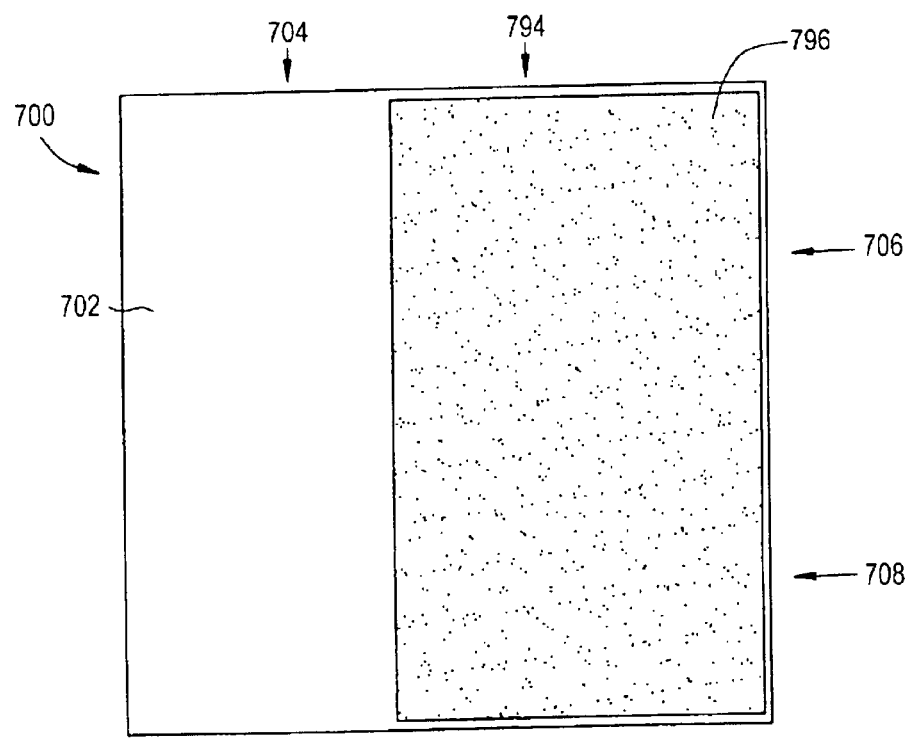
FIG. 52 is a plan drawing of a first blocking layer that is part of the ticket in FIG. 49.
Figure 53:
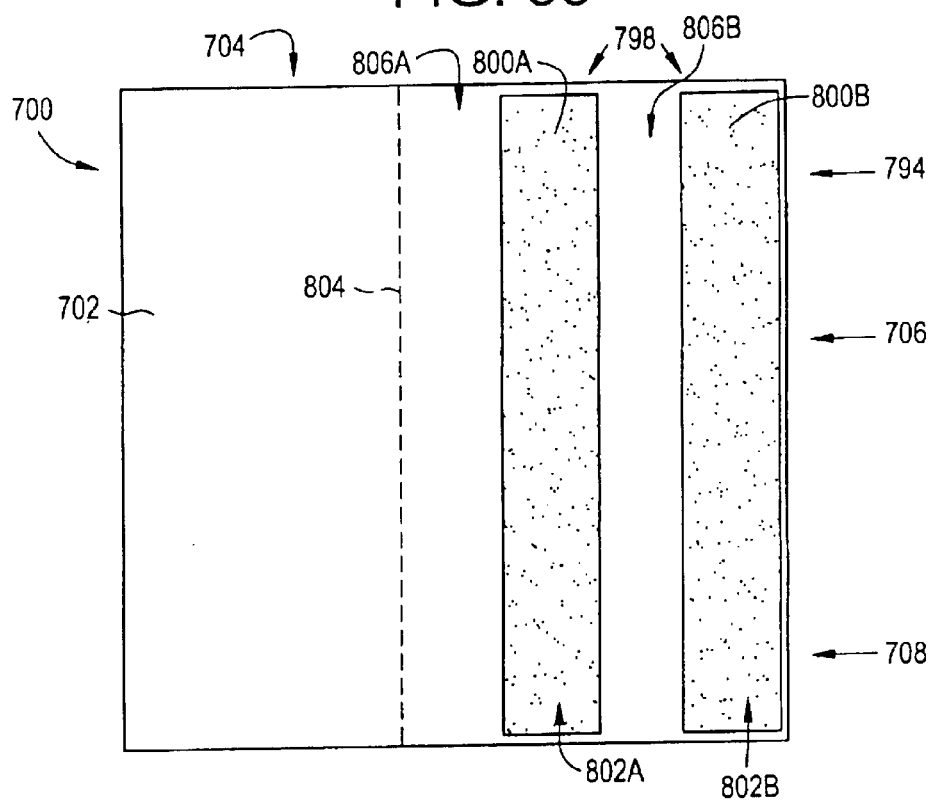
FIG. 53 is a plan drawing of an alternative embodiment of the first blocking layer shown in FIG. 53.
Figure 54:
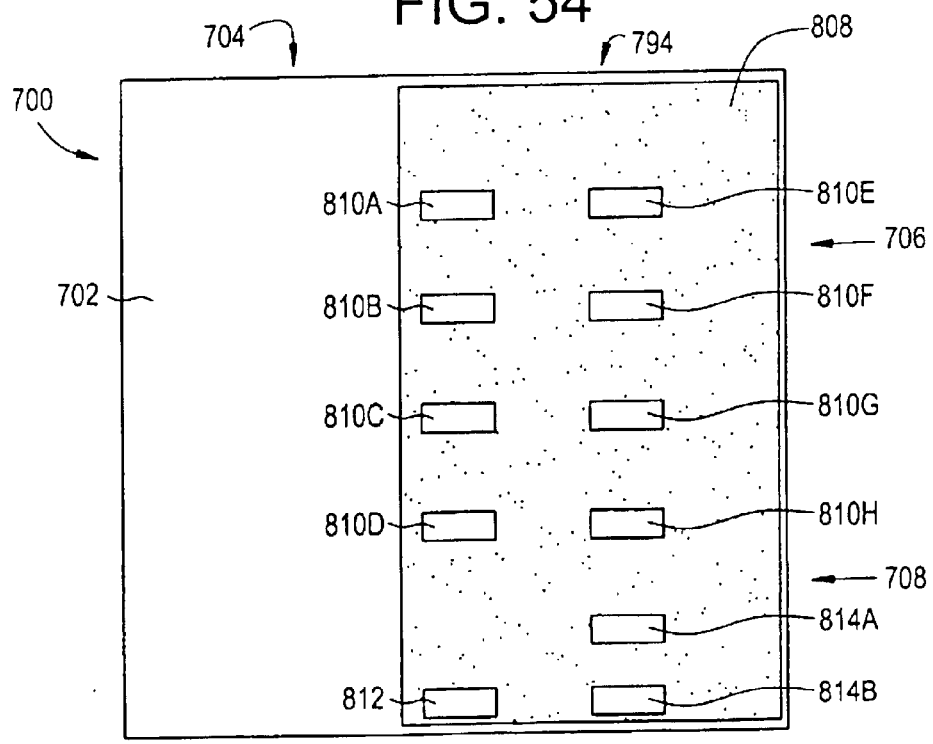
FIG. 54 is a plan drawing of a second alternative embodiment of the first blocking layer shown in FIG. 53.

FIG. 52 illustrates the preferred embodiment of the lower blocking layer 794 when the lower blocking layer 794 has a sheet resistivity that is at least one thousand times greater than the sheet resistivities of the circuit elements 732A–H, 740, 750A, and 750B. In this embodiment, the lower blocking layer 794 is printed as a continuous, substantially opaque layer 796 that completely overlies the play field portion 706 and the ticket identification portion 708 of the ticket 700. The lower blocking layer 794 can, however, be printed with materials that have a lesser difference in conductivity relative to the circuit elements 732A–H, 740, 750A, and 750B as long as the configuration of the lower blocking layer 794 electrically isolates at least portions of the circuit elements 732A–H, 740, 750A, and 750B from the lower blocking layer 794. For example, FIG. 53 illustrates an alternative configuration of the lower blocking layer 794 which is printed as a barred layer 798 that includes laterally spaced-apart strips 800A and 800B which are printed with a material which is minimally conductive relative to the material used to print the circuit elements 732A–H, 740, 750A, and 750B. The spaced-apart strips 800A and 800B are substantially opaque and longitudinally span the play field portion 706 and the ticket identification portion 708 of the ticket 700. The spaced-apart strips 800A and 800B define channels 802A and 802B for the resistive elements 738A–H of the indicia circuit elements 732A–H. The space between the strip 800A and the interface 804 between the play field portion 706 and the display portion 704 and the space between the strips 800A and 800B define channels 806A and 806B for the capacitive pick-up areas 734A–H and 736A–H of the indicia circuit elements 732A–H, for the capacitive pick-up areas 742 and 744 of the integrity circuit element 740, and for the capacitive pick-up areas 752A–B and 754A–B of the data circuits 750A–B. The configuration of the lower blocking layer 794 thus electrically isolates the capacitive pick-up areas 734A–H, 736A–H, 742, 744, 752A–B, and 754A–B of the various circuit elements 732A–H, 740, 750A, and 750B from the minimally conductive strips 800A and 800B. FIG. 54 illustrates another embodiment of the lower blocking layer 794 which includes a patterned layer 808 that is printed with a material that is minimally conductive relative to the circuit elements 732A–H, 740, 750A, and 750B. The patterned layer 808, which is substantially opaque, spans both the play field and ticket integrity portions 706 and 708 of the ticket 700 and defines several apertures 810A–H, 812, 814A, and 814B which electrically isolate portions of the circuit elements 732A–H, 740, 750A, and 750B. Specifically, the apertures 810A–H are positioned and shaped to electrically isolate the first capacitive pick-up areas 734A–H of the indicia circuit elements 732A–H, the aperture 812 is positioned and shaped to electrically isolate the first capacitive pick-up 742 of the ticket integrity circuit 740, and the apertures 814A and 814B are positioned and shaped to electrically isolate the first capacitive pick-up areas 752A and 752B of the data circuits 670A–B. As previously noted, the first capacitive pick-up areas 734A–H, 742, and 752A–B serve a sensor capacitive pick-up areas when the ticket 700 is read by the electronic verification machine 500. Table 10, in Section XI.B. (below) describes the presently preferred formulation for an ink used to print the lower blocking layer 794. The ink described in Table 10 has a sheet resistivity which is greater than about 20 MΩ/□. An alternative formulation for the ink used to print the lower blocking layer 794 is given in Table 6. The formulation in Table 6 is particularly useful for printing the lower blocking layer 794 either as the barred layer 798 or as the patterned layer 808.

TABLE 6

Ink Formulation For The Lower Blocking Layer 794

| Material | wt % |
| --- | --- |
| Predesol Carbon Black 1649V (KVK USA, Inc.) | 25 |
| VCMA | 10 |
| methyl-ethyl ketone | 65 |

It should be noted that since one of the functions of the lower blocking layer 794 is to obscure the play indicia 720A–H and the circuit elements 732A–H, 740, and 750A–B, it is desirable that the blocking layer 794 be a opaque as possible. One way to achieving a sufficiently opaque layer is to use inks that contain black pigments or other dark pigments in order to mask the circuit elements circuit elements 732A–H, 740, and 750A–B. Thus, it is convenient to use carbon or carbon black in the ink used for the layer 794. Using carbon black normally will result in an ink with a sheet resistivity less than would be the case with a basically non-conductive material such as the paper substrate 702. However, the ink formulation presented in Table 6 above does provide a relatively high sheet resistivity which, in this case, is greater than 20 MΩ/□. Thus, as noted above, this ink formulation is suitable for printing the lower blocking layer 794 provided at least portions of the circuit elements 732A–H, 740, 750A, and 7508 are electrically isolated from the layer 794, for example, by printing the lower blocking layer 794 as the barred layer 798 having spaced-apart strips 800A–B or by printing the lower blocking layer 794 as the patterned layer 808 having the apertures 810A–H, 812, 814A, and 814B.

The second printing press station 764 prints the second layer 826 which consists of the ticket integrity circuit 740 and the data circuits 750A–B. The appearance of the ticket 700 at this point depends on the form of the lower blocking layer 794. FIG. 55 shows the ticket 700 when the lower blocking layer 794 is printed as the continuous, substantially non-conductive layer 796. Both of the data circuits 750A and 750B are printed over the first layer 796 within the ticket identification portion 708 of the ticket 700. The first capacitive pick-up area 742 and the second capacitive pick-up area 744 of the integrity circuit element 740 are also printed within the ticket identification portion 708 over the layer 796. The resistive element 746, which is connected to and extends between the capacitive pick-up areas 742 and 744 of the integrity circuit element 740, is printed on the layer 796 so that the portion 748 of the resistive element 746 is located within the play field portion 706 of the ticket 700. FIG. 56 shows the ticket 700 when the lower blocking layer 794 is printed as the barred layer 798. The first capacitive pick-up area 742 of the integrity circuit element 740 is printed in the ticket identification portion 708 and is located within the channel 806A. The first capacitive pick-up area 742 thus is not printed over either of the strips 802A or 802B and is actually printed on the substrate 702 of the ticket 700. Similarly, the capacitive pick-up areas 752A and 754A of the data circuit element 750A and the capacitive pick-up areas 752B and 754B of the data circuit element 750B are printed in the ticket identification portion 708 and are located within the channel 806B. The capacitive pick-up areas 752A, 754A, 752B, and 754B of the data circuit elements 750A and 750B are thus printed on the substrate 702 of the ticket 700. Consequently, because the capacitive pick-up areas 742, 752A, 754A, 752B, and 754B are printed on the substrate 702, the capacitive pick-up areas 742, 752A, 754A, 752B, and 754B are electrically isolated from the layer 798. The second capacitive pick-up area 744 is printed within the ticket identification portion 708 over the strip 800B and thus is located in the channel 802B. The resistive element 746, which is connected to and extends between the capacitive pick-up areas 742 and 744 of the integrity circuit element 740, is printed on the ticket 700 so that the portion 748 of the resistive element 746 is located within the play field portion 706 of the ticket 700. FIG. 57 shows the ticket 700 when the lower blocking layer 794 is printed as the patterned layer 808. The first capacitive pick-up area 742 of the integrity circuit element 740 is printed in the ticket identification portion 708 and is located within the aperture 812. The first capacitive pick-up area 742 thus is not printed over the patterned layer 808 and is actually printed on the substrate 702 of the ticket 700. Similarly, the capacitive pick-up area 752A of the data circuit element 750A and the capacitive pick-up area 752B of the data circuit element 750B are printed in the ticket identification portion 708 and are located within the apertures 814A and 814B, respectively. The capacitive pick-up areas 752A and 752B of the data circuit elements 750A and 750B are thus printed on the substrate 702 of the ticket 700. Consequently, because the capacitive pick-up areas 742, 752A, and 752B are printed on the substrate 702, the capacitive pick-up areas 742, 752A, and 752B are electrically isolated from the layer 808. The second capacitive pick-up area 744 of the integrity circuit element 740 and the second capacitive pick-up areas 754A and 754B of the data circuits 750A and 750B are printed directly over the patterned layer 808, within the ticket identification portion 708 of the ticket 700. The resistive element 746, which is connected to and extends between the capacitive pick-up areas 742 and 744 of the integrity circuit element 740, is printed on the ticket 700 so that the portion 748 of the resistive element 746 is located within the play field portion 706 of the ticket 700.

Figure 61:
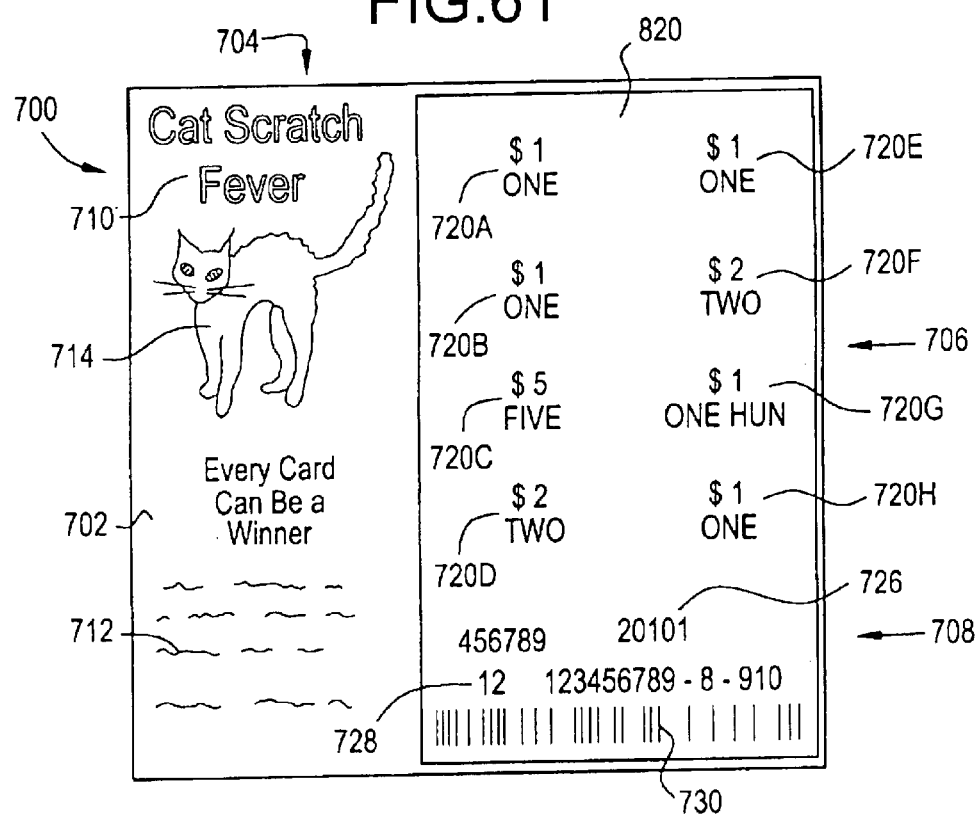
FIG. 61 is a plan drawing of play indicia which are part of the ticket shown in FIG. 49.

The third printing press station 766 prints the third layer 818 (shown in FIG. 58) which is a masking layer that masks the lower blocking layer 794 and prevents visual interference from the lower blocking layer 794 when a user inspects the play indicia 720A–H (shown in FIG. 61). As shown in FIG. 58 the masking layer 818 is printed as a continuous layer that covers both the play field portion 706 and the ticket identification portion 708 of the ticket 700. In order not to interfere with the electrical signatures of the circuit elements 732A–H, 740, 750A, and 750B, the electrical conductivity of the masking layer 818 should be significantly less than the electrical conductivity of the circuit elements 732A–H, 740, 750A, and 750B. In the preferred embodiment, the sheet resistivity of the masking layer 818 is greater than $10^8$ Ω/□. A suitable formulation for the masking layer 818 is given in Table 7.

TABLE 7

Ink Formulation For The Masking Layer 818

| material | wt % |
| --- | --- |
| Predasol rutile white 1300-PA | 33.33 |
| versamide 940 resin | 22.22 |
| ethanol | 22.225 |
| heptane | 22.225 |

Figure 59:
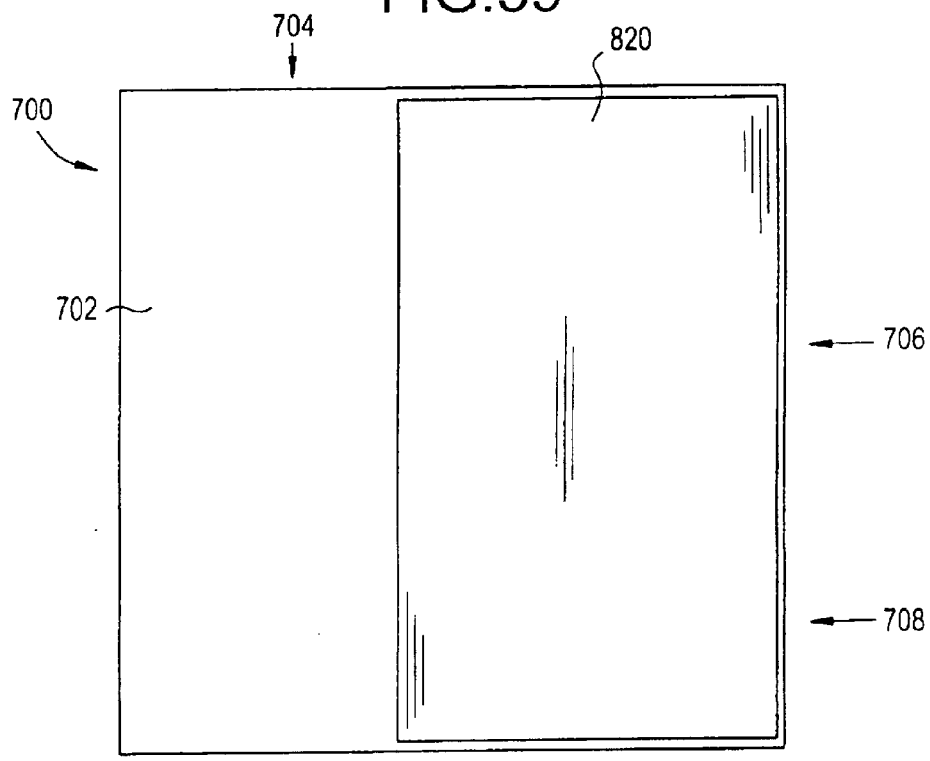
FIG. 59 is a plan drawing of a primer layer that is apart of the ticket shown in FIG. 49.
Figure 60:
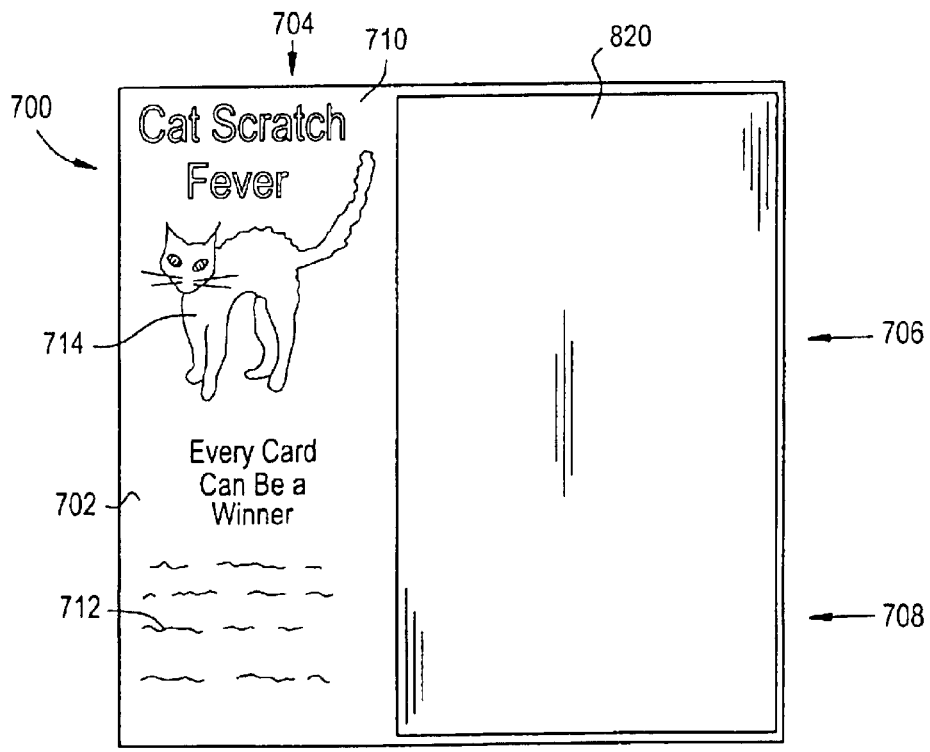
FIG. 60 is a plan drawing of the display portion graphics that are part of the ticket shown in FIG. 49.
Figure 62:
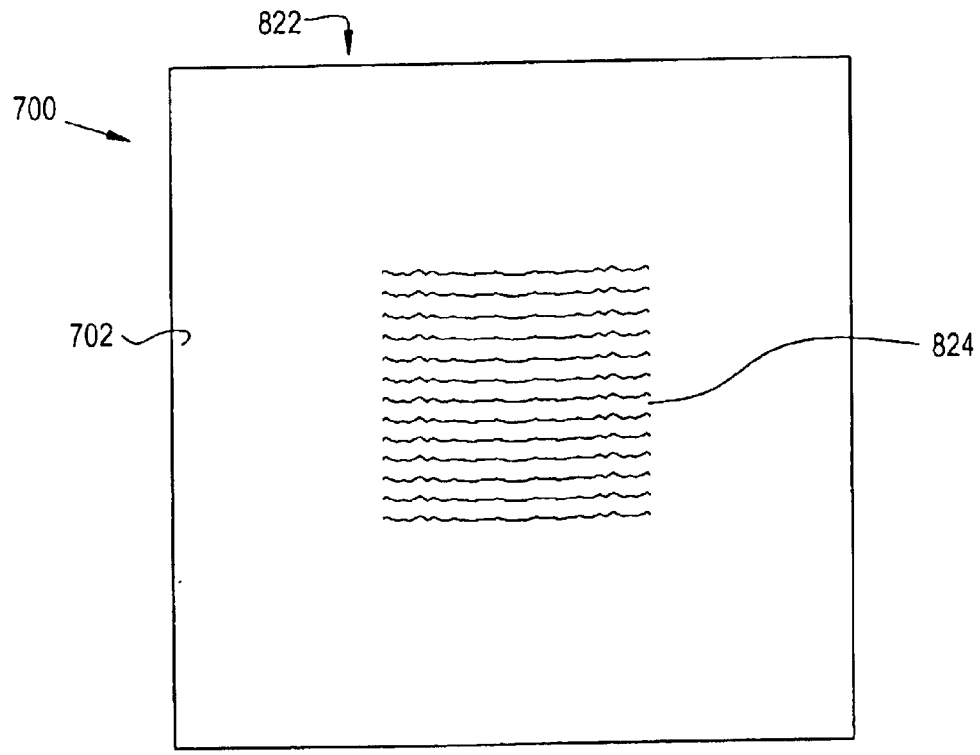
FIG. 62 is a plan drawing of the back of the ticket shown in FIG. 49.

The fourth printing station 768 prints the fourth layer 820 which is a primer layer that provides a suitable surface for printing the play indicia 720A–H (shown in FIG. 61). As shown in FIG. 59, the primer layer 820 is printed as a continuous layer that covers both the play field portion 706 and the ticket integrity portion 798 of the ticket 700. In order not to interfere with the electrical signatures of the circuit elements 732A–H, 740, 750A, and 750B, the electrical conductivity of the primer layer 820 should be significantly less than the electrical conductivity of the circuit elements 732A–H, 740, 750A, and 750B. In the preferred embodiment, the sheet resistivity of the primer layer 820 is greater than $10^8$ Ω/□. Printing stations 770–774 provide the features printed in the display portion 704 of the ticket 700 which, as shown in FIG. 60, include the name of the game 710, the rules for playing the game 712, and the customized art work 714. The ink jet station 792 prints the play indicia 720A–H, the validation number 726, the inventory control number 728 and the bar code 730. As shown in FIG. 61 the play indicia 720A–H are printed directly on the primer layer 820 within the play field portion 706 of the ticket 700. The validation number 726, the inventory control number 728 and the bar code 730 are also printed directly on the primer layer 820 but are located within the ticket identification portion 708 of the ticket. Station 776 prints the back 822 of the ticket 700 which, as shown in FIG. 62, can include additional information 824 concerning the game.

Figure 63:
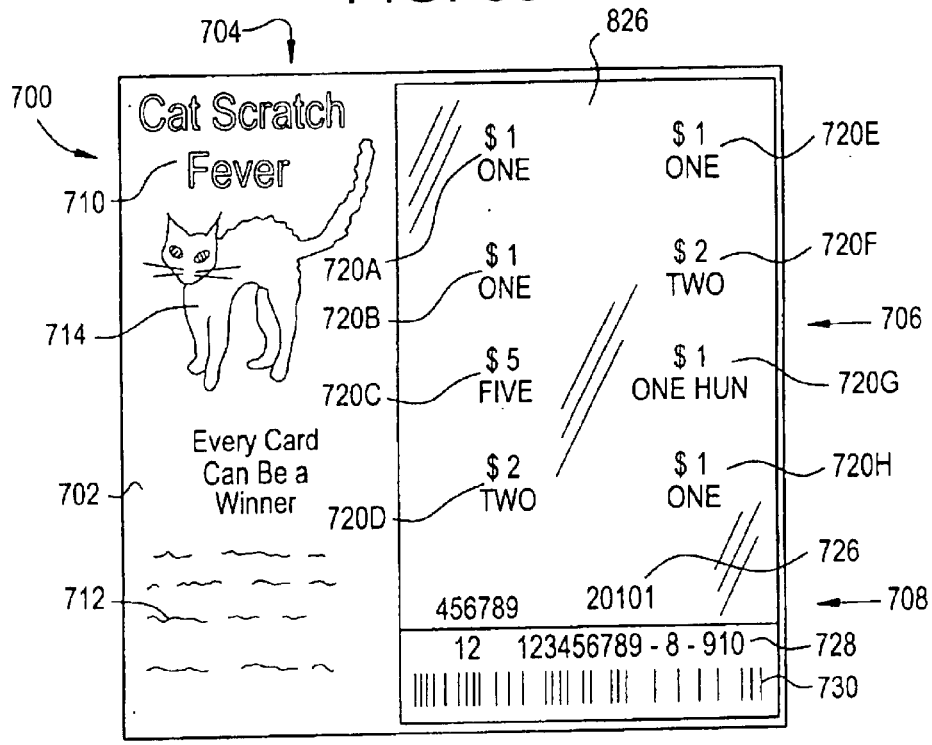
FIG. 63 is a plan drawing of a seal coat which is part of the ticket shown in FIG. 49.

Station 778 prints the fifth layer 826 which is a seal coat layer that protects the play indicia 720A–H and the validation number 726 against abrasion. FIG. 63 illustrates the seal coat layer 826 which is printed on the ticket 700 so that the layer 826 covers all of the primer layer 820 within the play field portion 706 and so that the seal coat layer 826 covers the validation number 726 within the ticket identification portion 708 of the ticket. In order not to interfere with the electrical signatures of the circuit elements 732A–H, 740, 750A, and 750B, the electrical conductivity of the seal coat layer 826 should be significantly less that the electrical conductivity of the circuit elements 732A–H, 740, 750A, and 750B. In the preferred embodiment, the sheet resistivity of the seal coat layer 826 is greater than $10^8$ Ω/□. A suitable formulation for the seal coat layer 826 is given in Walton, U.S. Pat. No. 4,726,608.

Figure 64:
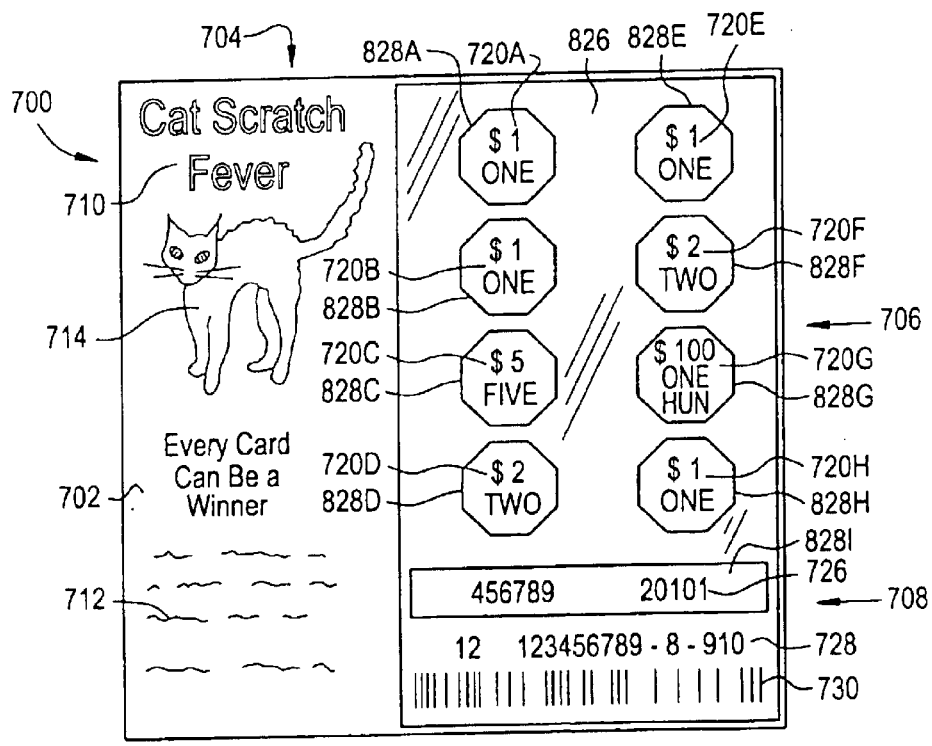
FIG. 64 is a plan drawing of a release coat which is part of the ticket shown in FIG. 49.

The next layer is a release coat layer, generally denoted as 828, that is printed by the station 780. The release coat layer 828 is not continuous but instead in this embodiment consists of discreet layer portions 828A–828H that are associated with the play indicia 720A and a discrete layer portion 828I that is associated with the validation number 726. Thus, as shown in FIG. 64, the release coat layer 828 is printed on the seal coat layer 826 so that the release coat layer portion 828A covers the play indicia 720A. Similarly, the release coat layer portion 828C covers the play indicia 720C and the release coat layer portion 828F covers the play indicia 720F. In addition, the release coat layer portion 828I covers the validation number 726. The release coat 828 serves two general functions. First, the release coat 828 assures that layers which overlie the play indicia 720A–H and the validation number 726 can be removed to reveal the play indicia 720A–H and the validation number 726. In addition, as explained with reference to FIG. 75, the discrete release coat portions 828A–H help to ensure that the electrical signatures of the indicia circuit elements 732A–H change when the layers overlying the play indicia 720A–H are removed to reveal the play indicia 720A–H. In order not to interfere with the electrical signatures of the circuit elements 732A–H, 740, 750A, and 750B, the electrical characteristics of the release coat layer 828 should be significantly less than the electrical conductivity of the circuit elements 732A–H, 740, 750A, and 750B. In the preferred embodiment, the sheet resistivity of the release coat layer 828 is greater than $10^8$ Ω/□. However, since the release coat layer 828 does not contact any of the capacitive pick-up areas 734A–H, 736A–H, 742A–H, 744A–H, 752A–B, and 754A–B, a lesser sheet resistivity, for example about $10^7$ Ω/□, would be acceptable. A suitable formulation for the release coat layer 828 is given in Walton, U.S. Pat. No. 4,726,608.

Station 782 prints the next layer which is an opaque upper blocking layer 830 that helps to protect the play indicia 720A–H, the validations number 726 and portions of the circuit elements 732A–H, 740, 750A, and 750B against surreptitious detection by candling. The preferred embodiment of the upper blocking layer 830 has a sheet resistivity that is at least about 1000 times greater than the sheet resistivity of the circuit elements 732A–H, 740, 750A, and 750B. Consequently, in the preferred embodiment the upper blocking layer 830 does not interfere with the electrical signatures of the circuit elements 732A–H, 740, 750A, and 750B and there is no need to electrically isolate the circuit elements 732A–H, 740, 750A, and 750B from the upper blocking layer 830. Thus, shown in FIG. 65, in the preferred embodiment the upper blocking layer 830 is printed as a continuous layer 832 that overlies the play field portion 706 of the ticket 700 and overlies the validation number 726 within the ticket integrity portion of the ticket 700. The play indicia 720A and the associated release coat portion 828A are shown in phantom for reference. A presently preferred formulation for the ink used to print the upper blocking layer 830 is given in Table 8. The ink formulation described in Table 8 has a sheet resistivity greater than 1 G$\Omega$/□.

TABLE 8

Ink Formulation For The Upper Blocking Layer 830

| Material | wt % |
| --- | --- |
| non-conductive carbon black dispersion (35% carbon) | 23.71 |
| Normal propyl acetate | 21.85 |
| Heptane | 25.94 |
| Rubber block copolymer | 6.25 |
| Calcium carbonate | 8.00 |
| Maleic rosin ester resin | 1.50 |
| Titanium dioxide | 7.00 |
| Silicone paste | 1.50 |
| Diacetone alcohol | 0.50 |
| Terpene phenolic resin | 0.75 |
| PE/PTFE wax blend | 3.00 |

The upper blocking layer 830 can also be printed with materials that have a lesser difference in conductivity relative to the circuit elements 732A–H, 740, 750A, and 750B as long as the configuration of the layer 830 electrically isolates at least portions of the indicia circuit elements 732A–H. Another suitable ink for the upper blocking layer 830 is given in Table 9.

TABLE 9

Ink Formulation For The Upper Blocking Layer 830

| material | wt % |
| --- | --- |
| Heptane | 34.1 |
| Normal Propyl Acetate | 30 |
| Rosin Ester Resin 3330 | 10.2 |
| Silicone Dispersant BYK 163 | 0.7 |
| Carbon Black 350 | 13 |
| Rubber Copolymer D 1107 | 9.2 |
| Calcium Carbonate | 1.7 |
| Polyethylene/PTFE wax blend | 1 |

Similar to the lower blocking layer 794, one of the functions of the upper blocking layer 830 is to obscure the play indicia 720A–H and the circuit elements 732A–H. Consequently, the upper blocking layer 830 should be as opaque as possible, a goal which is conveniently obtained by using carbon black or other dark pigments in the ink used to print the upper blocking layer 830. However, the presence of carbon black in the ink used to print the upper blocking layer 830 can result in an ink formulation that is somewhat conductive. However, the ink formulation in Table 9 does provide a relatively high sheet resistivity which, in this case, is greater than about 20 M$\Omega$/□. In addition, the ink formulation in Table 9 has a reduced graphic adhesiveness compared the to the ink presented in Table 6 which is suitable for printing the lower blocking layer 794. The ink presented in Table 9 therefore can be readily removed from the ticket 700 when the play spot areas 716A–H are removed to reveal the underlying play indicia 720A–H.

FIG. 66 illustrates an alternative configuration of the upper blocking layer 830 which is a barred layer 834 that is printed with a material which is minimally conductive relative to the material used to print the circuit elements 732A–H, 740, 750A, and 750B. The barred layer 834 includes laterally spaced-apart strips 836A and 836B which are substantially opaque and longitudinally span the play field portion 706. The strips 836A–B also cover the validation number 726 within the ticket identification portion 708 of the ticket 700. The spaced-apart strips 836A and 836B define channels 838A and 838B for the resistive elements 738A–H of the indicia circuit elements 732A–H. The channels 838A and 838B contain the material used to print the upper blocking layer 830. The space between the strip 836A and the interface 804 between the play field portion 706 and the display portion 704 and the space between the strips 836A and 836B define channels 840A and 840B for the capacitive pick-up areas 734A–H and 736A–H of the indicia circuit elements 732A–H. The layer that is exposed by the channels 840A and 840B is the seal coat layer 826 which, as previously stated, has a sheet resistivity greater than $10^8$ $\Omega$/□. The configuration of the barred layer 834 thus electrically isolates the capacitive pick-up areas 734A–H and 736A–H of the indicia circuit elements 732A–H from the minimally conductive strips 836A and 836B. The barred layer 834 is the preferred form of the upper blocking layer 830 when the lower blocking layer 794 is printed as the barred layer 798 shown in FIG. 53. The upper blocking layer 830 is printed in registry with the lower blocking layer 794 so that the spaced-apart strips 836A and 836B of the upper barred layer 834 are aligned with the spaced-apart strips 800A and 800B of the lower barred layer 798. Consequently, the channels 838A and 838B and the channels 840A and 840B which are defined by the upper barred layer 834 coincide with the channels 802A and 802B and the channels 806A and 806B, respectively, which are defined by the lower barred layer 798. In FIG. 66, the play indicia 720A and the associated release coat portion 828A are shown in phantom for reference. The play indicia 720A and the associated release coat portion 828A are printed on the ticket 700 so that the play indicia 720A and the associated release coat portion 828A are aligned with both the strip 836A of the upper blocking layer 830 and the strip 800A of the lower blocking layer 794. The play indicia 720A and the associated release coat portion 828A are thus within both the channel 838A defined by the upper blocking layer 830 and the channel 802A defined by the lower blocking layer 794.

Figure 67:
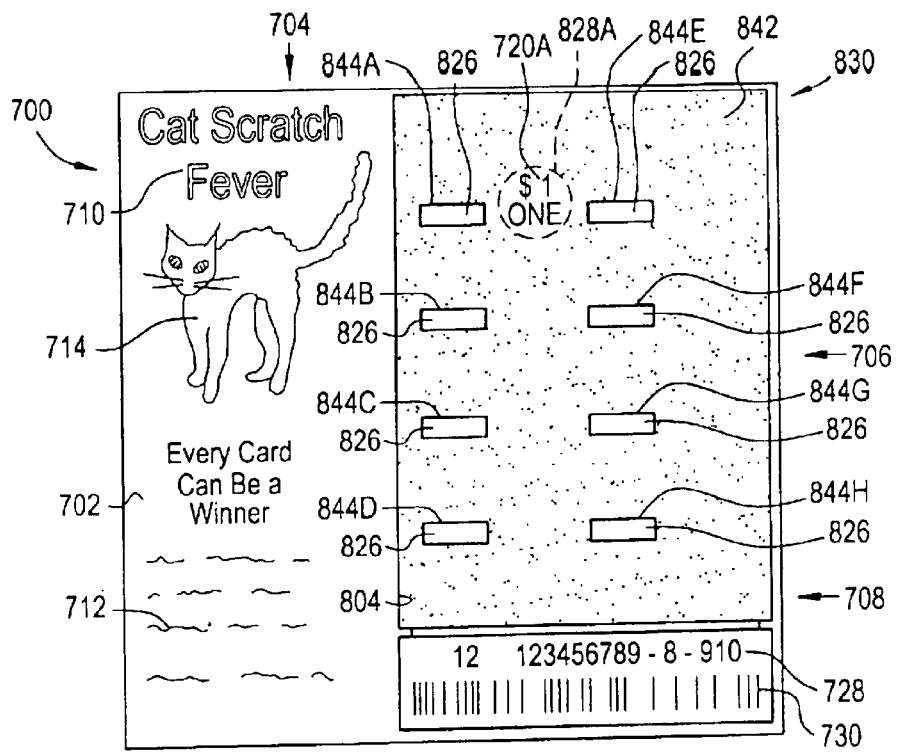
FIG. 67 is a plan drawing a second alternative embodiment of the upper blocking layer in FIG. 65.

FIG. 67 illustrates another embodiment of the upper blocking layer 830 which includes a patterned layer 842 that is printed with a material that is minimally conductive relative to the circuit elements 732A–H, 740, 750A, and 750B. The patterned layer 842, which is substantially opaque, overlies the entire play field portion 706 of the ticket 700 and also covers the validation number 726 within the ticket identification portion 708 of the ticket 700. The patterned layer 842 defines several apertures 844-H which electrically isolate portions of the indicia circuit elements 732A–H. Specifically, the apertures 844-H are positioned and shaped to coincide with the first capacitive pick-up areas 734A–H of the indicia circuit elements 732A–H. The exposed layer within the apertures 844A–H is the seal coat layer 826 which has a sheet resistivity greater than $10^8$ $\Omega$/□. The patterned layer 842 is the preferred form of the upper blocking layer 830 when the lower blocking layer 794 is printed in the patterned layer 808 shown in FIG. 54. The upper blocking layer 830 is printed in registry with the lower blocking layer 794 so that the apertures 844A–H defined by the patterned layer 842 are aligned with the apertures 810A–H defined by the lower patterned layer 808. Thus, for example, the aperture 844A of the upper blocking layer 830 coincides with the aperture 810A of the lower blocking layer 794. In FIG. 67, the play indicia 720A and the associated release coat portion 828A are shown in phantom for reference. The play indicia 720A and the associated release coat layer portion 828A are printed on the ticket adjacent the aperture 844A in the upper blocking layer 830. Because the upper blocking layer 830 is printed in registry with the lower blocking layer 794, the play indicia 720A and the associate release coat layer portion 828A are also printed adjacent the aperture 810A in the lower blocking layer 794. A suitable ink for printing the upper blocking layer 830 either as the barred layer 834 or as the patterned layer 842 was given previously in Table 9.

Figure 68:
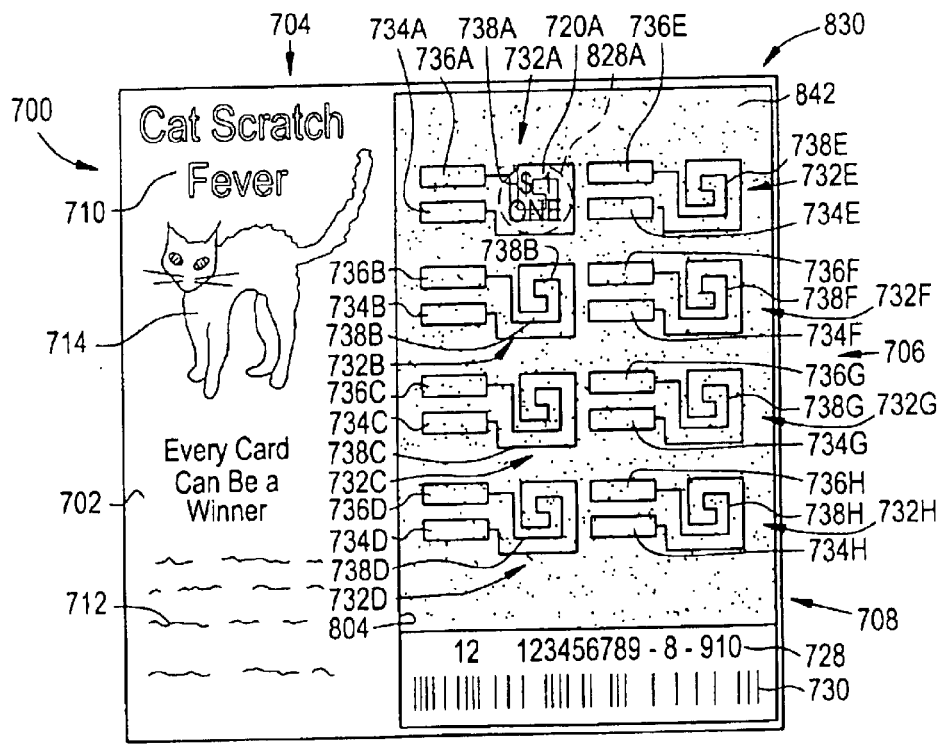
FIG. 68 is a plan drawing of some of the circuit elements shown in FIG. 50 as printed on the blocking layer shown in FIG. 65.

The station 784 prints the next layer which consists of the indicia circuit elements 732A–H. The appearance of the ticket 700 at this point varies according to the configuration of the upper blocking layer 830. FIG. 68 illustrates the ticket 700 when the upper blocking layer 830 is printed as the continuous layer 832. Since in the preferred embodiment the continuous layer 832 is printed with a material that does not interfere with the electrical signatures of the circuit elements 732A–H, 740, 750A, and 750B there is no need to isolate any portions of the indicia circuit elements 732A–H from the upper blocking layer 830. Consequently, the indicia circuit elements 732A–H are printed directly on the continuous layer 832. The indicia circuit elements 732A–H are positioned to align with the play indicia 720 so that the resistive elements 738 overlie the play indicia 720. Thus, for example, the indicia circuit element 732A is printed on the layer 832 to align with the play indicia 720A and the associated release coat layer portion 828A (shown in phantom) so that the resistive element 738A overlies the play indicia 720A and the associated release coat layer portion 828A.

Figure 69:
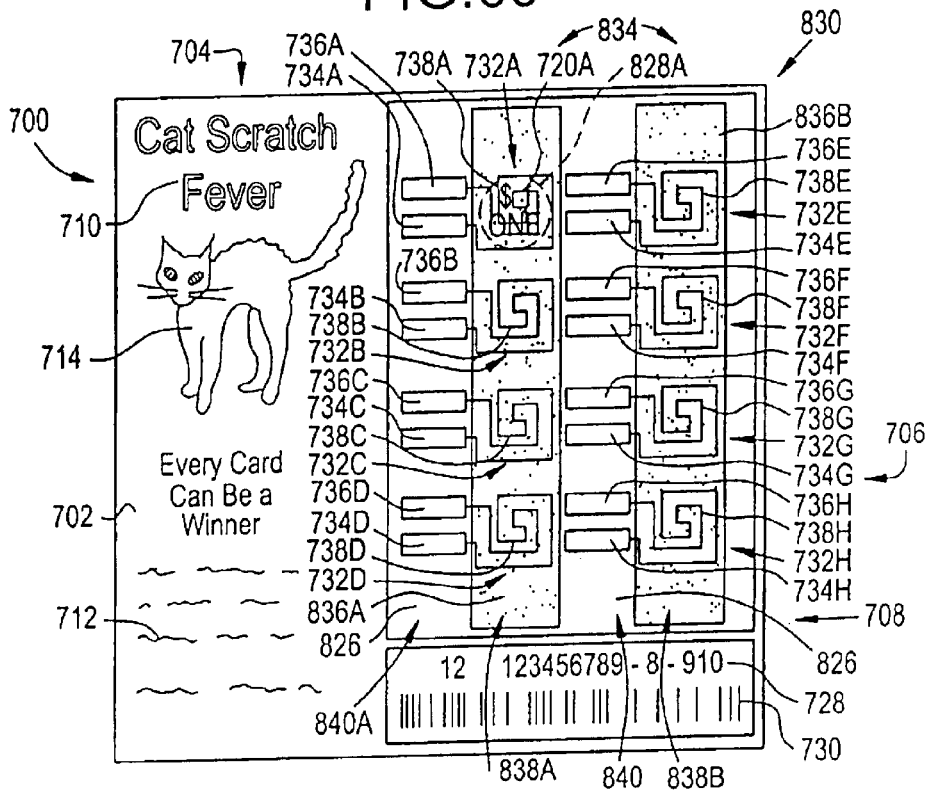
FIG. 69 is a plan drawing of some of the circuit elements shown in FIG. 50 as printed on the blocking layer shown in FIG. 66.

FIG. 69 illustrates the form of the ticket 700 when the upper blocking layer 830 is printed as the barred layer 834. In FIG. 69 the play indicia 720A and the associated release coat layer portion 828A are shown in phantom for reference. However it should be kept in mind that neither the play indicia 720A and nor the associated release coat layer portion 828 would be visible because of the upper blocking layer 830. The indicia circuit elements 732A–H are printed on the ticket 700 so that the first capacitive pick-up areas 734A–H and the second capacitive pick-up areas 736A–H are printed in registry with the channels 840A and 840B defined by the barred layer 834. For example, the indicia circuit element 732A is printed on the ticket 700 so that the first and second capacitive pick-up areas 734A and 734B are positioned within the channel 840A. Similarly, the indicia circuit element 732F is printed on the ticket 700 so that the first and second capacitive pick-up areas 734F and 736F are positioned within the channel 840B. As noted earlier, the layer exposed in the channels 840A and 840B is the seal coat layer 826 which has a sheet resistivity greater than about $10^8$ $\Omega/\square$. The channels 840A and 840B defined by the barred layer 834 thus electrically isolate the first capacitive pick-up areas 734A–H and the second capacitive pick-up areas 736A–H of the indicia circuit elements 732A–H from the minimally conductive strips 838A and 838B. Moreover, the upper blocking layer 830 is printed in registry with the lower blocking layer 794 so that the upper channels 840A and 840B are aligned with the lower channels 802A and 802B. The first capacitive pick-up areas 734A–H and the second capacitive pick-up areas 736A–B of the indicia circuit elements 732A–H therefore are electrically isolated from the minimally conductive strips 800A and 800B in the lower blocking layer 794.

The indicia circuit elements 732A–H are also printed on the ticket 700 so that the resistive elements 738A–H are aligned with the strips 836A–B and overlie the play indicia 720A–H. For example, the indicia circuit element 732A is printed on the ticket 700 so that the resistive element 738A is printed on the strip 836A, within the channel 838A, and overlies the play indicia 720A and the associated release coat layer portion 828A (shown in phantom). Similarly, the indicia circuit element 732G is printed on the ticket 700 so that the resistive element 738G is printed on the strip 836B, within the channel 838B, and overlies the play indicia 720G (not shown) and the associated release coat layer portion 828G (not shown). In addition, the strips 826A and 836B of the upper barred blocking layer 834 are printed in registry with the strips 800A and 800B of the lower barred blocking layer 798. Consequently, the play indicia 720A–H are intermediate the strips 836A–B and 800A–B of the upper and lower barred blocking layers, 834 and 798 respectively, and so are protected against surreptitious detection by candling.

Figure 70:
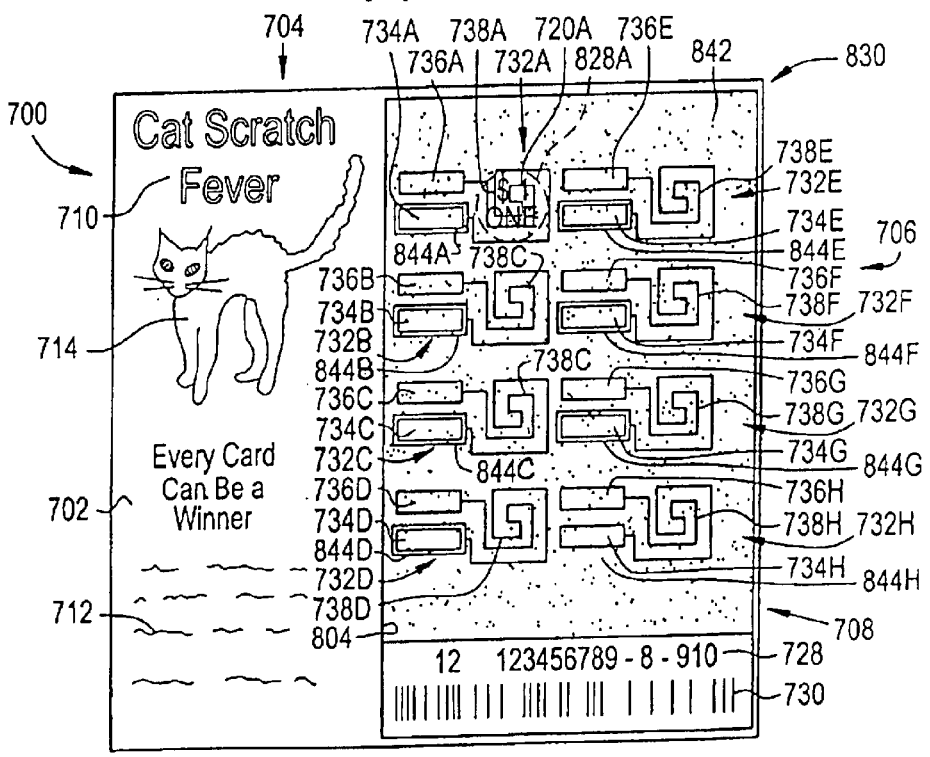
FIG. 70 is a plan drawing of some of the circuit elements shown in FIG. 50 as printed on the blocking layer shown in FIG. 67.

FIG. 70 illustrates the form of the ticket 700 when the upper blocking layer 830 is printed as the patterned layer 842. The play indicia 720A and the associated release coat layer portion 828A are shown in phantom for reference. However it should be kept in mind that neither the play indicia 720A and nor the associated release coat layer portion 828 would be visible because of the upper blocking layer 830. The indicia circuit elements 732A–H are printed on the ticket 700 so that the first capacitive pick-up areas 734A–H are in registry with and positioned within the apertures 844A–H defined by the upper patterned blocking layer 842. For example, the first capacitive pick-up area 734A of the indicia circuit element 732A is in registry with and positioned within the aperture 844A. Similarly, the first capacitive pick-up area 734F of the indicia circuit element 732A is in registry with and positioned within the aperture 844F. As noted earlier, the layer exposed in the apertures 844A–H is the seal coat layer 826 which has a sheet resistivity that is greater than about $10^8$ $\Omega/\square$. The apertures 844A–D defined by the upper patterned blocking layer 842 thus electrically isolate the first capacitive pick-up areas 734A of the indicia circuit elements 732A–H from the minimally conductive layer 842. Moreover, the upper patterned blocking layer 842 is printed in registry with the lower patterned blocking layer 808 so that the upper apertures 844A–H are aligned with the lower apertures 810A–H. The first capacitive pick-up areas 734A–H of the indicia circuit elements 732A–H therefore are electrically isolated from the minimally conductive layer 808 as well. The indicia circuit elements 732A–H are also printed on the ticket 700 so that the resistive elements 738A–H overlie the play indicia 720A–H. For example, the resistive element 738A of the indicia circuit element 732A overlies the play indicia 720A. Similarly, the resistive element 738F is printed on the ticket 700 to overlie the play indicia 720F (not shown). Moreover, because the upper patterned blocking layer 842 is printed in registry with the lower patterned blocking layer 808, the play indicia 720A–H are protected against candling.

Figure 71:
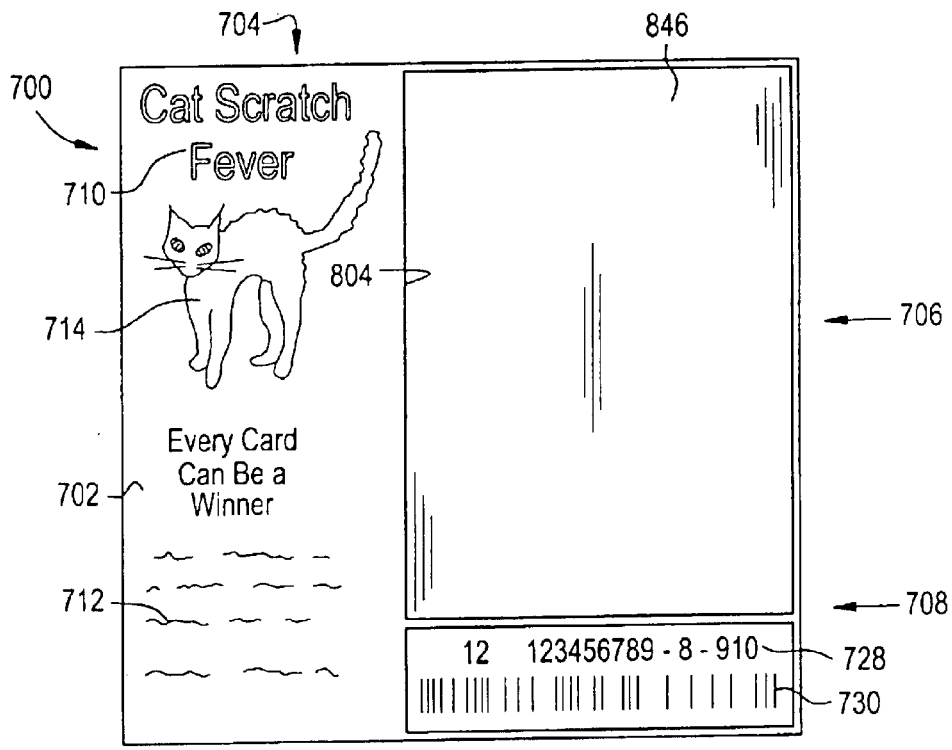
FIG. 71 is a plan drawing is a plan drawing of a scratch-off layer that is part of the ticket shown in FIG. 49.

Printing press station 786 prints the next layer on the ticket which is a removable scratch-off coating 846. As shown in FIG. 71, the scratch-off coating 846 is printed as a continuous layer that covers the play field portion 706 of the ticket 700 and the validation number 726 within the ticket identification portion 708 of the ticket. In order not to interfere with the electrical signatures of the circuit elements 732A–H, 740, 750A, and 750B, the electrical conductivity of the scratch-off coating 846 should be significantly less that the electrical conductivity of the circuit elements 732A–H, 740, 750A, and 750B. In the preferred embodiment, the sheet resistivity of the scratch-off coating

846 is greater than $10^8$ $\Omega/\square$. A suitable formulation for the scratch-off coating 846 is given in Walton, U.S. Pat. No. 4,726,608. The remaining two printing press stations 788 and 790 apply overprint graphics such as the play spot areas 716A–H, the play spot graphics 718, the void-if-removed area 722, and the overprint graphics 724 and thus provide the finished appearance of the ticket 700 as shown in FIG. 49.

Figure 72:
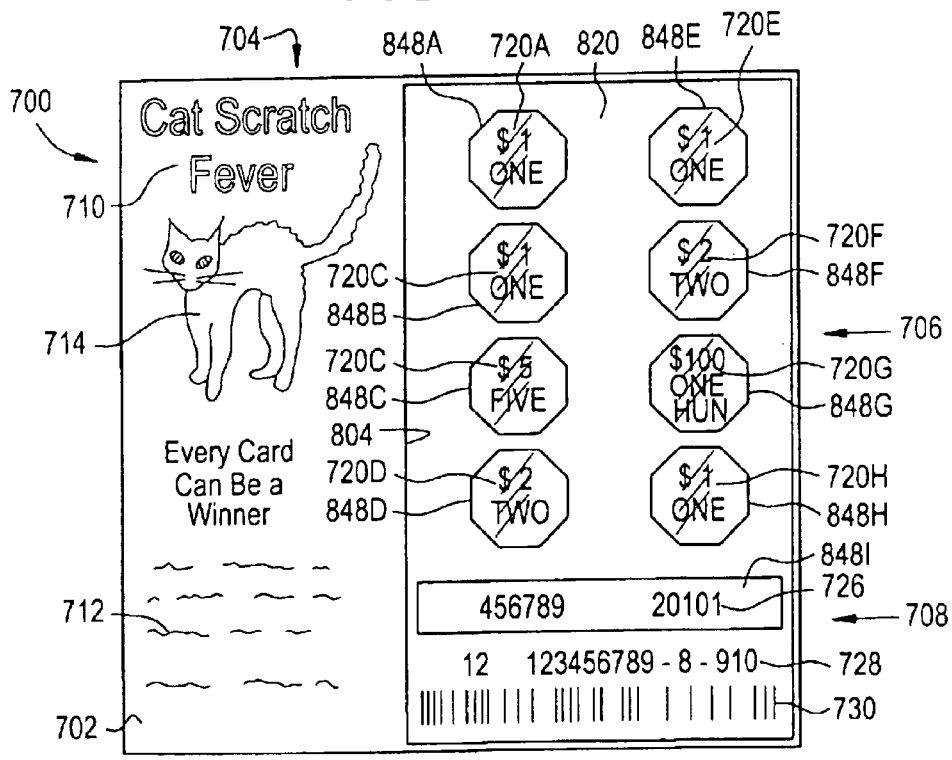
FIG. 72 is a plan drawing of a combined seal-release coat that can be used on the ticket instead of the seal coat and the release coat that are shown in FIGS. 63 and 64, respectively.

The structure of the ticket 700 can be simplified by replacing the separate seal coat layer 826, shown in FIG. 63, and the discontinuous release coat layer 828, shown in FIG. 64, with a combined seal-release coat layer, generally denoted as 848. Like the release coat 828, the combined seal-release coat layer 848 is not continuous but instead consists of discreet layer portions 848A–H that are associated with the play indicia 720A–H and a discrete layer portion 848I that is associated with the validation number 736. For example, as shown in FIG. 72 the combined seal-release coat layer 848 is printed on the primer 820 so that the seal-release coat layer portion 848A covers the play indicia 720A. Similarly, the combined seal-release coat portion 848G covers the play indicia 720G. In addition, the seal-release coat portion 848I covers the validation number 726. The combined seal-release coat 848 protects the play indicia 720A–H and the validation number 726 against abrasion. The combined seal-release coat 848 also ensures that the layers which overlie the play indicia 720A–H and the validation number 726 can be removed to reveal the play indicia 720A–H and the validation number 726. In addition, as explained in reference to FIG. 75, the discrete seal-release coat portions 848A–H help to ensure that the electrical signatures of the indicia circuit elements 732A–H change when the layers overlying the play indicia 720A–H are removed. In order not to interfere with the electrical signatures of the circuit elements 732A–H, 740, 750A, and 750B, the electrical conductivity of the seal-release coat layer 848 should be significantly less than the electrical conductivity of the circuit elements 732A–H, 740, 750A, and 750B. In the preferred embodiment, the sheet resistivity of the seal-release coat 848 is greater than about $10^8$ $\Omega/\square$. However, since the seal-release coat layer 848 does not contact any of the capacitive pick-up areas 734A–H, 736A–H, 742A–H, 744A–H, 752A–B, and 754A–B, a lesser sheet resistivity, for example about $10^7$ $\Omega/\square$, would be acceptable.

Figure 73:
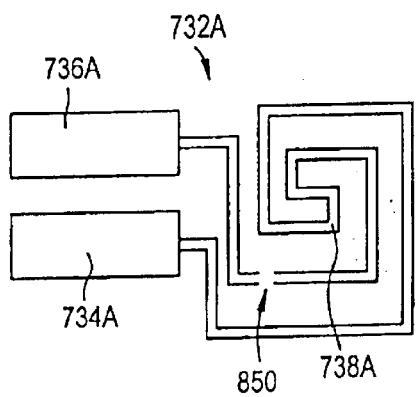
FIG. 73 is an enlarged plan drawing of one of the circuit elements shown in FIG. 50 and illustrates a first printing defect.
Figure 74:
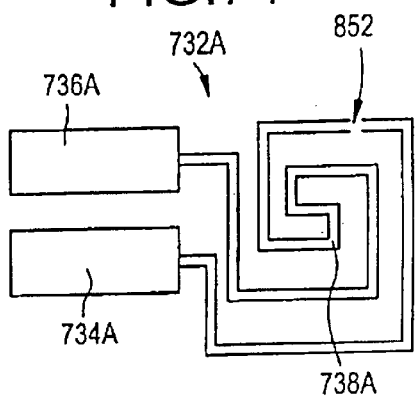
FIG. 74 is a plan drawing of the circuit element in FIG. 72 and illustrates a second printing defect.

The printing sequence for the ticket changes slightly when the seal-release coat 848 is used instead of the separate seal coat layer 826 and the separate release coat layer 828. Instead of printing the seal coat 826 on the primer layer 820, station 778 prints the seal-release coat 848 on the primer layer. Station 780 then prints the upper blocking layer 830 as previously described with reference to FIGS. 65–67 and station 782 prints the indicia circuit elements 732A–H as previously described with reference to FIGS. 68–70. It should be noted that when the combined seal-release coat 848 is used the primer layer 820, instead of the seal coat layer 826, is exposed in the channels 840A and 840B defined by the upper barred blocking layer 834 and in the apertures 844A–D defined by the upper patterned blocking layer 842. However, like the seal coat layer 826 the primer layer 820 has a sheet resistivity that is greater than $10^8$ $\Omega/\square$. The ticket 700 therefore functions in the same manner as described with reference to FIGS. 65–70 when the seal-release coat layer 848 is used instead of the separate seal coat 826 and the separate release coat 828. This printing sequence also makes it possible to apply the indicia circuit elements 732A–H twice, at stations 782 and 784. As explained below with reference to FIGS. 75–76, portions of the indicia circuit elements 732A–H are removed when portions of the scratch-off layer 846 within the play spot areas 716A–H are removed to reveal the play indicia 720A–H. Consequently, the ink used to print the indicia circuit elements 732A–H has a reduced graphic adhesiveness relative to the ink used to print the integrity circuit elements 740 and the data circuit elements 750A–B. The reduced graphic adhesiveness of the ink used to print the indicia circuit elements 732A–H, coupled with the high speed of the gravure printing press 760 can result in small holes, known as picking, in the indicia circuit elements 732A–H. FIGS. 73 and 74 present an enlarged representation of one of the indicia circuit elements 732A–H, for example, the element 732A. In FIG. 73 a small portion 850 of the indicia circuit element 732A has been picked-off during the printing of the element 732A. Similarly, in FIG. 74 a different small portion 852 of the indicia circuit element 732A has been picked-off during the printing of the element 732A. The resulting discontinuity in the indicia circuit element 732A in FIGS, 73 and 74 can lead to errors in detecting the electrical signature of the indicia circuit element 732A. However, if the two illustrations of the indicia circuit element 732A in FIGS. 73 and 74 are superimposed, for example, by laying the indicia circuit element 732A in FIG. 74 over the indicia circuit element 732A in FIG. 73 in registry therewith, the combined image does not suffer from any discontinuities. Therefore, by printing the indicia circuit elements 732A–H at two of the stations, for example at the stations 782 and 784, such that the two layers of the indicia circuit elements 732A–H are in registry with each other, discontinuities in the printed indicia circuit elements 732A–H can be reduced or eliminated.

Figure 75:
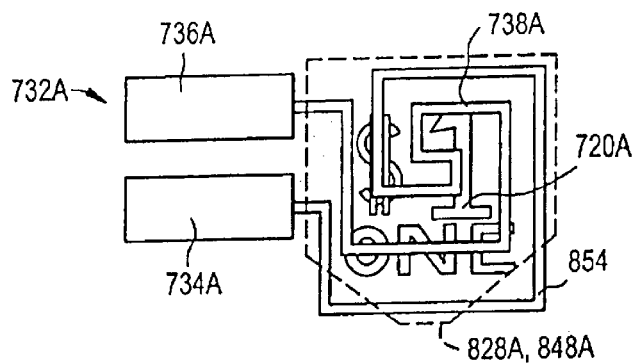
FIG. 75 is an enlarged plan drawing of one of the circuit elements in FIG. 50 and shows the configuration of the circuit element relative to a play indicia and a release coat portion or a seal-release coat portio.

FIG. 75 presents an enlarged view of one of the indicia circuit elements, for example circuit element 720A, and the underlying associated play indicia 720A. FIG. 75 also shows the position and configuration of the associated release coat layer portion 828A or the associated seal-release coat layer portion 848A. As previously explained, the release coat 828 or the seal-release coat 848 is interposed between the play indicia 732A–H and the indicia circuit elements 732A–H. Although not shown, it is to be understood that the upper blocking layer 830 is also interposed between the release coat 828 or the seal-release coat 848 and the indicia circuit elements 732A–H. As shown in FIG. 75, in the preferred embodiment the resistive element 738A is printed over either the release coat layer portion 828A or the seal-release coat layer portion 848A so that a portion 854 extends beyond the release coat layer portion 828A or the seal-release coat layer portion 848A thereby ensuring that the electrical signature of the circuit element 732 changes when the layers overlying the play indicia 720 are lifted or removed.

Figure 76:
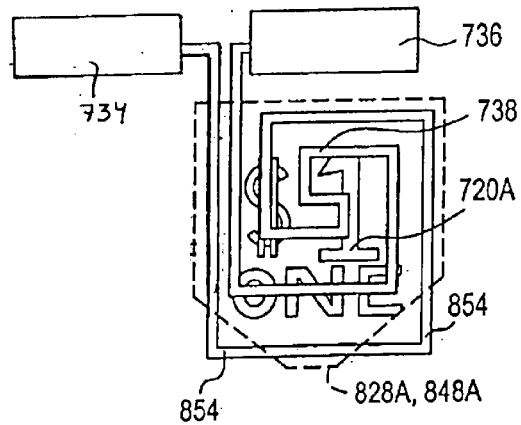
FIG. 76 is a plan drawing of an alternative embodiment of the circuit element shown in FIG. 75.

FIG. 76 shows an alternative embodiment of an indicia circuit element 856 according to the invention. Like the indicia circuit elements 732A–H, the indicia circuit element 856 includes the first capacitive pick-up area 734, the second capacitive pick-up area 736, and the resistive element 738. The main difference between the indicia circuit element 856 and the indicia circuit elements 732A–H is that the second capacitive pick-up area 736 is no longer aligned with the first capacitive pick-up area 734 but instead is aligned with the resistive element 738. This change is of primary importance when the upper blocking layer 830 is printed as the barred layer 834 in which case the second capacitive pick-up area 736 of the indicia circuit element 856 is printed on the ticket 700 so that the second capacitive pick-up area 736 either is printed on the strip 836A, within the channel 838A, and or is printed on the strip 836B, within the channel 838B. In all other respects, the indicia circuit element 856 operates in the same manner as the indicia circuit elements 732A–H.

The complete structure of the ticket 700 offers several security advantages. The lower and upper blocking layers 794 and 830 help to protect against surreptitious detection of the play indicia 720A–H and the circuit elements 732A–H, 740, 750A, and 750B by candling or fluorescence. The integrity circuit 740 provides a way of determining if an attempt has been made to alter the bar code 730, for example, by cutting and replacing the bar code 730. The data circuits 750A and 750B offer at least partial ticket authenticity and integrity information in binary form. The indicia circuit elements 732A–H both protect the play indicia 720A–H against fraudulent manipulation and provide a way to verify the gaming value of the ticket 700. As noted previously with reference to FIGS. 75 and 76, in the preferred embodiment the indicia circuit elements 732A–H are printed over either the release coat portions 828A–H or the seal-release coat portions 848A–H so that portions 854A–H of the resistive elements 738A–H extend beyond the release coat layer portions 828A–H or the seal-release coat layer portions 848A–H. When one of the play spot areas 716A–H, for example the play spot area 716A, is lifted to reveal the underlying play indicia 720A, the resistive element 738A will be fractured because the portion 854A of the resistive element 738A remains affixed to the ticket 700. Consequently, if an attempt is made thereafter to replace the play spot area 716A and the fractured resistive element 738A, the resulting change in the electrical signature of the indicia circuit element 732A is detected by the sensor array 502 of the electronic verification machine 500. In addition, when a play spot area such as the play spot area 716A is legitimately removed to reveal the play indicia 720A, the electrical continuity between the capacitive pick-up area 734A and 736A of the indicia circuit element 732A is broken when the resistive element 738A is removed with the play spot area 716A. The resulting change in the electrical signature of the indicia circuit element 732A can then be detected by the sensor array 502 of the electronic verification machine 500, thereby providing a way to determine the gaming value of the ticket 700.

IX. A Marker Ticket in Accordance With the Invention.

Figure 77:
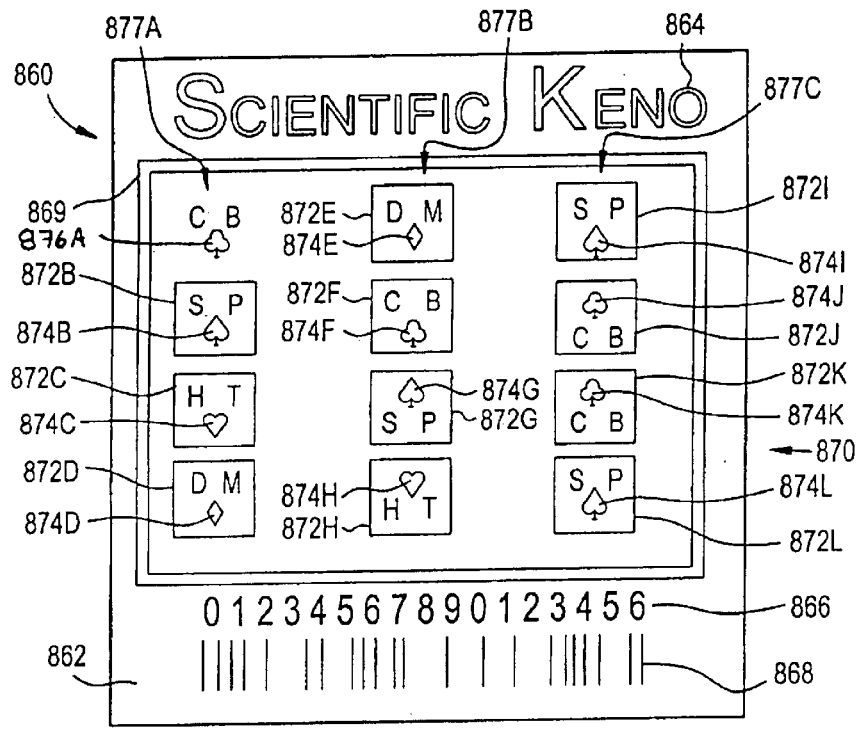
FIG. 77 is a plan drawing of a marker card according to the invention.

FIGS. 77–83 show a marker ticket 860 which can be used with the electronic verification machine 500 (shown in FIGS. 38–40). The marker card 860 is the type used to record a user's choices relative to pre-set options. For example, marker cards, such as the marker card 860, can be used in playing games such as Bingo or Keno. Marker cards like the card 860 are also used to record a user's choice of numbers or other indicia in on-line lottery games. The marker card 860, like the probability game ticket 700, can be used in conjunction with the electronic verification machine 500 of the type shown in FIGS. 38–40. FIG. 77 presents the finished appearance of the card 860 which is printed on a substrate, such as paper or card stock, and includes various printed information such as the identity or title 864 of the card 860, inventory data 866, and a machine-readable bar code 868. A boarder 869 delineates the play area of the card 860 and is printed as overprint graphics. The card 860 also includes an indicia-array area 870 that has a group of indicia spot areas 872A–L, each of which includes an overlay indicia 874A–L. The indicia spot areas 872A–L and the overlay indicia 874A–L are printed as overprint graphics. Each of the indicia spot areas 872A–L covers a play indicia 876A–L (shown in FIGS. 79–81) that is identical to the corresponding overlay indicia 874A–L. For example, the overlay indicia 874E in indicia spot area 872E is a diamond and the play indicia 876E (shown in FIGS. 79–81), which is located beneath the indicia spot area 872E is also a diamond.

The indicia spot area 872A has been removed to reveal the underlying associated play indicia 876A. The overlay indicia 874A–L and the play indicia 857A–L define longitudinal data channels 877A–C. For example, the overlay indicia 874A–D and the associated play indicia 876A–D are in the data channel 877A and the overlay indicia 874I-L and the associated play indicia 876I-L are in data channel 877C. The overlay indicia 874A–L and the play indicia 876A–L are used to represent the pre-set options among which a user can choose.

Figure 78:
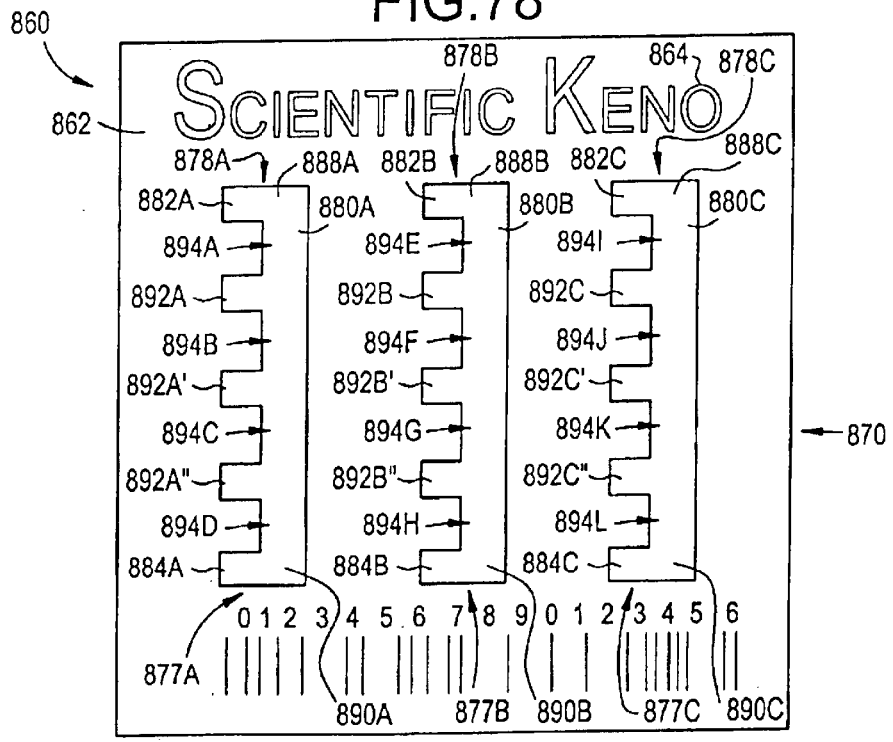
FIG. 78 is a plan drawing of the circuit elements which are part of the marker card shown in FIG. 77.

The card 860 also includes circuit elements, generally denoted as 878, which when coupled to the sensor array 502 of the electronic verification machine 500 serve to verify or record the user's chosen options. As shown in FIG. 78 the card 860 has three circuit elements 878A–C, each of which includes a resistive element, generally denoted as 880, and an upper and a lower terminal capacitive pick-up area, generally denoted as 882 and 884, which are connected to and extend from the opposites ends 888 and 890 of the resistive element 880. For example, the circuit element 878A includes the resistive element 880A and the two terminal capacitive pick-up areas 882A and 884A which are aligned with each other and are connected to and laterally extend from the first end 888A and the second end 890A, respectively, of the resistive element 880A. Each of the circuit element 878 also includes intermediate capacitive pick-up areas, generally denoted as 892, that are aligned with the terminal capacitive pick-up areas 888 and 890 and are connected to the resistive elements 880 intermediate the terminal capacitive pick-up areas 888 and 890. For example, the circuit element 878A has three intermediate capacitive pick-up areas 892A, 892A', and 892A", that are aligned with the terminal capacitive pick-up areas 888A and 890A and are connected to the resistive element 880A intermediate the terminal capacitive pick-up areas 888A and 890A. Similarly, the circuit element 878B has three intermediate capacitive pick-up areas 892B, 892B', and 892B", that are aligned with the terminal capacitive pick-up areas 888B and 890B and are connected to the resistive element 880B intermediate the terminal capacitive pick-up areas 888B and 890B. The circuit elements 878A–C are positioned on the card 860 so that the resistive elements 880A–C are aligned with and positioned in the data tracks 877A–C defined by the overlay indicia 874A–L and the play indicia 876A–L and so that portions 894A–L of the resistive elements 880A–L are aligned with the overlay indicia 874A–L and with the play indicia 876A–L. For example, the portion 894A–D of the resistive element 880A are aligned with the overlay indicia 874A–D and with the associated play indicia 876A–D. Similarly, the portions 894I-L of the resistive element 880C are aligned with the overlay indicia 874I-L and with the associated play indicia 876I-L.

Several layers are needed to provide the finished card 860 shown in FIG. 77. As shown in FIG. 79, the first layer 896 is printed directly on the substrate 862 and includes the play indicia 876A–L. The first layer 896 can also include the title 864, the inventory data 866, and the bar code 868. The play indicia 876A–L are printed on the card substrate 862 with the indicia-array portion 870 and are positioned to define the data channels 877A–C. For example, the play indicia 876E–H define the data channel 877B. In the preferred embodiment, the play indicia 876A–L are printed in a different color than the overlay indicia 874A–L in order to make it easier for a user of the card 860 to determine which if the overlay indicia 874A–L have been removed. The W next layer is a seal coat layer 898 that protects the play indicia 876A–L against abrasion. As shown in FIG. 80, in the preferred embodiment the seal coat layer 898 is printed within the indicia-array portion 870 of the card 860 as a continuous layer that overlies the play indicia 876A–L. In order not to interfere with the electrical signatures of the circuit elements 878A–C the electrical conductivity of the seal coat layer 898 should be significantly less that the electrical conductivity of the circuit elements 878A–C. In the preferred embodiment, the sheet resistivity of the seal coat layer 898 is greater than $10^8$ $\Omega/\square$. A suitable formulation for the seal coat layer 898 is given in Walton, U.S. Pat. No. 4,726,608.

Next, a release coat 900 is printed on the card 860 so that the release coat 900 overlies the play indicia 876A–L but preferably is not located below any of the capacitive pick-up areas 882, 884, and 892 of the circuit elements 878A–C. For example, as shown in FIG. 81 the release coat 900 can be printed as a barred layer 902 that includes longitudinally spaced-apart strips 904A–D which are printed within and laterally span the indicia-array portion 870 of the card 860. Each of the strips 904A–D covers a row of play indicia 876A–L. For example, the strip 904A laterally spans the indicia-array portion 870 of the card 860 and covers the play indicia 876A, 876E, and 876I. Similarly, the strip 904B covers the play indicia 876B, 876F, and 876J, the strip 904C covers the play indicia 976C, 876G, and 876K, and the strip 904D covers the play indicia 876D, 876H, and 876L. The material exposed between two adjacent strips 904A–D, for example the strip 904A and the strip 904B, is the seal coat layer 898 and the material exposed adjacent the strips 904A–D but outside of the indicia-array portion 870 of the card 860 is the substrate 862. Alternatively, as shown in FIG. 82, the release coat layer 900 can be printed as a discontinuous layer 906 that includes discreet release coat spots 908A–L each of which covers an associated play indicia 876A–L. For example, the release coat spot 908A covers the play indicia 876A and the release coat spot 908G covers the play indicia 876G. Within the indicia-array portion 870 of the card 860 the material exposed between adjacent release coat spots 908A–L, for example the release coat spot 908B and the release coat spot 908F, is the seal coat layer 898. Outside of the indicia-array portion 870 of the card 860 the material exposed adjacent the release coat spots 908A–L is the substrate 862. In order not to interfere with the electrical signatures of the circuit elements 878A–C the electrical conductivity of the release coat layer 900 should be significantly less that the electrical conductivity of the circuit elements 878A–C. In the preferred embodiment, the sheet resistivity of the release coat layer 900 is greater than $10^8$ $\Omega/58$. However, since the release coat layer 900 does not underlie any of the capacitive pick-up areas 882, 884, and 892, a lesser sheet resistivity, for example about $10^7$ $\Omega/\square$, would be acceptable. A suitable formulation for the release coat layer 900 is given in Walton, U.S. Pat. No. 4,726,608.

Figure 83:
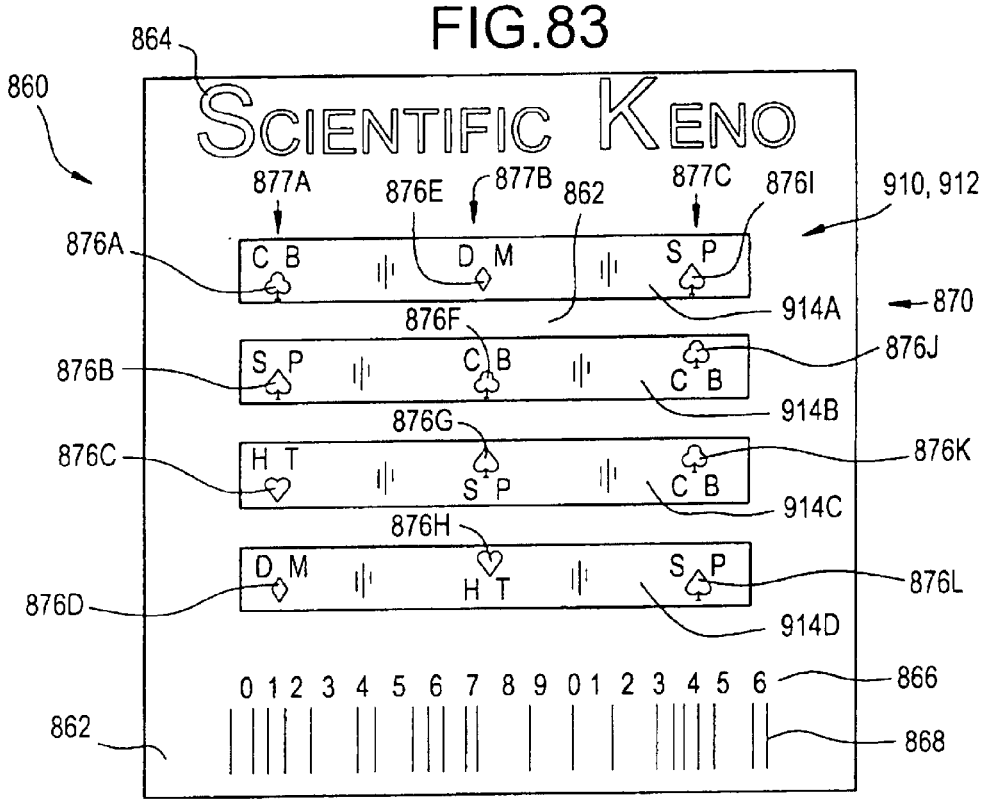
FIG. 83 is a plan drawing seal-release coat that can be used instead of the seal coat and the release coat that are shown in FIGS. 80 and 81, respectively.
Figure 84:
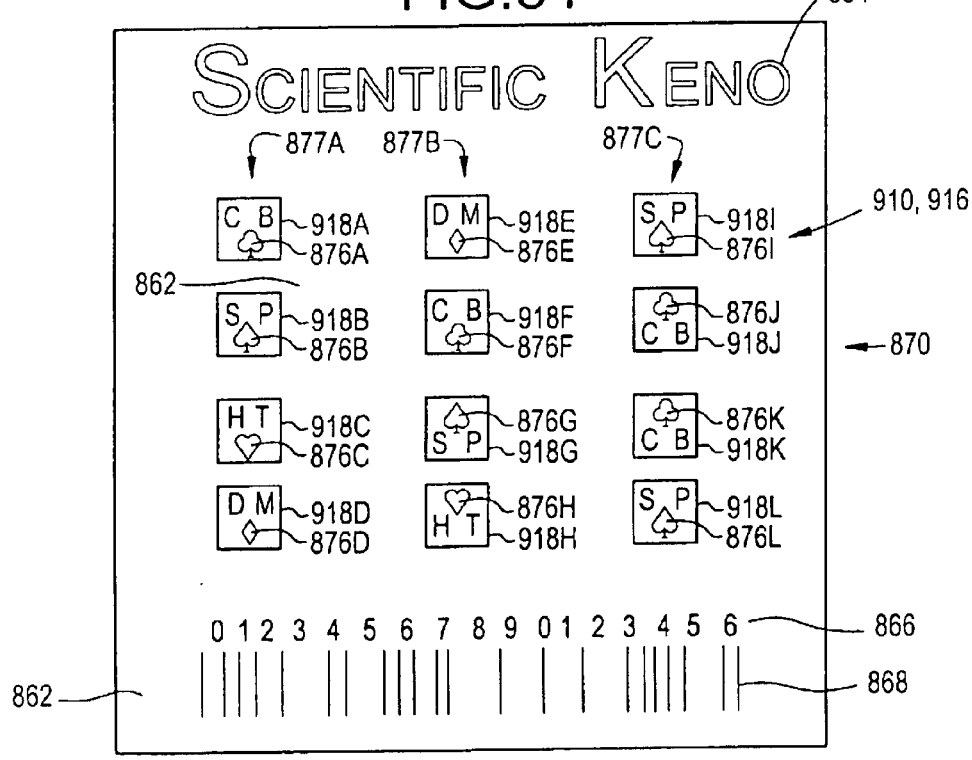
FIG. 84 is a plan drawing of an alternative embodiment of the seal-release coat in FIG. 83.

Alternatively, a combined seal-release coat 910 can be used instead of the separate seal coat and release coat layers 898 and 900 shown in FIGS. 80–82, in which case, the combined seal-release coat 910 is printed on the card 860 so that the seal-release coat 910 overlies the play indicia 876A–L but is not located below any of the capacitive pick-up areas 882, 884, and 892 of the circuit elements 878A–C. For example, as shown in FIG. 83 the seal-release coat 910 can be printed as a barred layer 912 that includes longitudinally spaced-apart strips 914A–D which are printed within and laterally span the indicia-array portion 870 of the card 860. Each of the strips 914A–D covers a row of play indicia 876A–L. For example, the strip 914A laterally spans the indicia-array portion 870 of the card 860 and covers the play indicia 876A, 876E, and 876I. Similarly, the strip 914B covers the play indicia 876B, 876F, and 876J, the strip 914C covers the play indicia 976C, 876G, and 876K, and the strip 914D covers the play indicia 876D, 876H, and 876L. The exposed material around any of the strips 914A–D is the substrate 862. Alternatively, as shown in FIG. 84, the seal-release coat layer 910 can be printed as a discontinuous layer 916 that includes discreet seal-release coat spots 918A–L each of which covers an associated play indicia 876A–L. For example, the seal-release coat spot 918A covers the play indicia 876A and the seal-release coat spot 918G covers the play indicia 876G. The exposed material around any of the seal-release coat spots 918A–L is the substrate 862. In order not to interfere with the electrical signatures of the circuit elements 878A–C the electrical conductivity of the seal-release coat layer 910 should be significantly less that the electrical conductivity of the circuit elements 878A–C. In the preferred embodiment, the sheet resistivity of the seal-release coat layer 910 is greater than $10^8$ $\Omega/\square$. However, since the seal-release coat layer 910 does not underlie any of the capacitive pick-up areas 882, 884, and 892, a lesser sheet resistivity, for example about $10^{-7}$ $\Omega/\square$, would be acceptable.

The circuit elements 878A–C are printed on the card 860 immediately after either the release coat 900 or the seal-release coat 910. Since the portions 894A–L of the resistive elements 880A–C are removed when the indicia spot areas 872A–L and associated portions of the scratch-off layer 920 are removed to revel the play indicia 876A–L, the ink used to print the circuit elements 878A–C should have a relatively reduced adhesiveness. In addition, the ink used to print the circuit elements should have a relatively high conductivity. In the preferred embodiment, the ink used to print the circuit elements 878A–C has a sheet resistivity of about 1 $K\Omega/\square$. A suitable formulation for the ink used to print the circuit elements 878A–L was given previously in Table 5.

Figure 85:
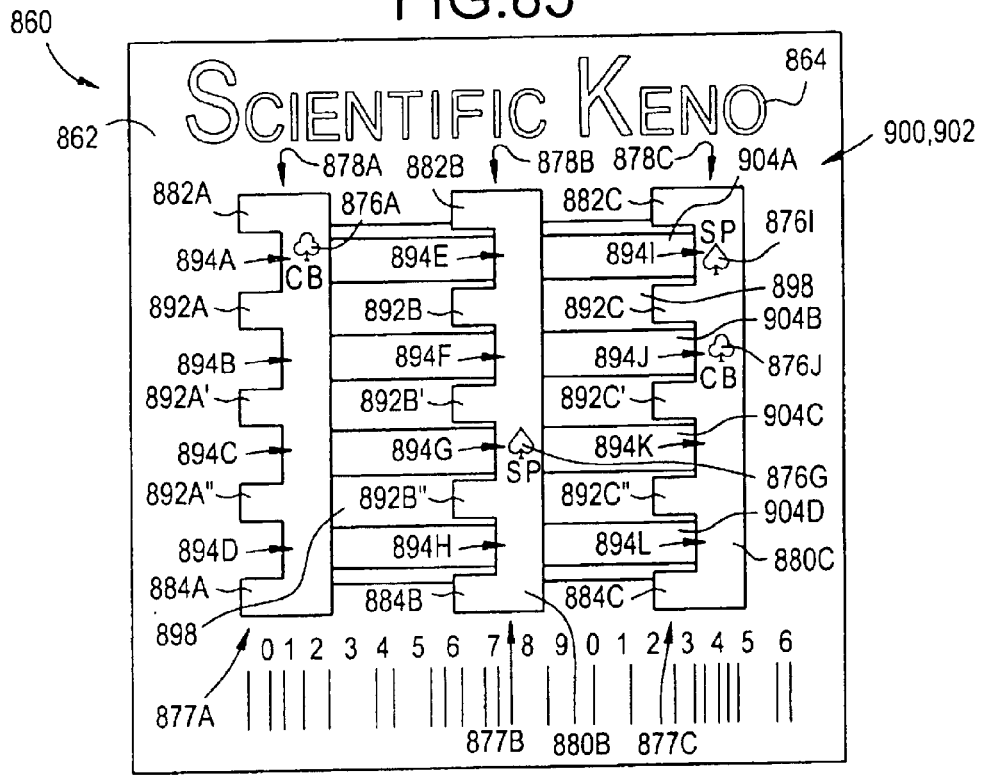
FIG. 85 is a plan drawing of the circuit elements in FIG. 78 as printed on the release coat shown in FIG. 81.
Figure 86:
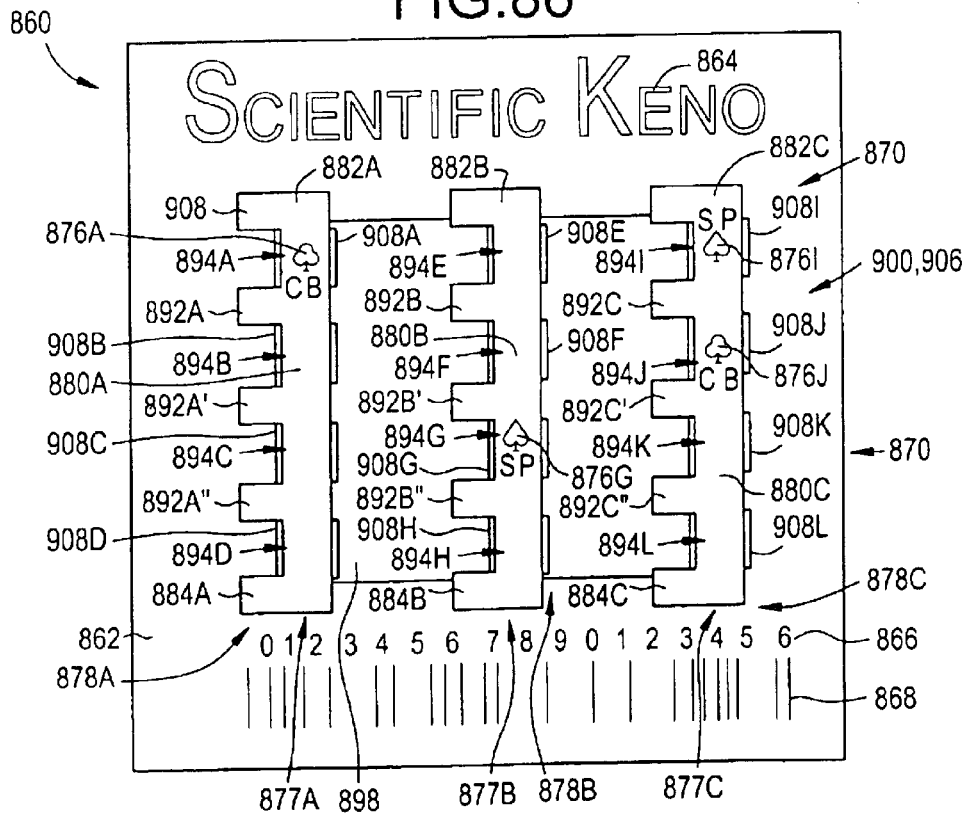
FIG. 86 is a plan drawing of the circuit elements in FIG. 78 as printed on the release coat shown in FIG. 82.

FIG. 85 illustrates the configuration of the card 860 when the circuit elements 878A–C are printed over the barred release coat layer 902. As noted earlier with reference to FIG. 78, the circuit elements 878A–C are positioned on the card 860 so that the resistive elements 880A–C are aligned with and positioned in the data tracks 877A–C. Each resistive element 880A therefore overlies a column of the play indicia 876A–L and the portions 894A–L of each resistive element 880A–D directly overlie one of the play indicia 876A–L. For example, the circuit element 878A overlies the play indicia 876A–D and the portions 894A–D of the resistive element 880A directly overlie the play indicia 876A–D. Similarly, the circuit element 878B overlies the play indicia 876E–H and the portions 894E–H of the resistive element 880B directly overlie the play indicia 876E–H. In addition, the circuit element 878C overlies the play indicia 876I-L and the portions 894I-L of the resistive element 880C directly overlie the play indicia 876I-L. Thus, although the play indicia 876A and 876G are shown for reference, it should be kept in mind that the play indicia 876A and 876G would not actually be visible because of the overlying portions 894A and 894G of the resistive elements 880A and 880B, respectively. Similarly, the play indicia 876I and 876J, although shown for reference, would not actually be visible because of the overlying portions 894I and 894J of the resistive element 880C. As previously noted with reference to FIG. 81, each of the longitudinally spaced-apart strips 904A–D of the barred release coat 902 covers a row of play indicia 876A–L so that within the play indicia array portion 870 the exposed material between adjacent strips 904A–D is the seal coat layer 898. Moreover, outside of the indicia array portion 870 the exposed material adjacent the strips 904A–D is the substrate 862. Consequently, the terminal capacitive pick-up areas 882A–C and 884A–C are printed directly on the substrate 862, as are the intermediate capacitive pick-up areas 89A, 892A', and 892A" of the circuit element 878A. The intermediate capacitive pick-up areas 892B, 892B', and 892B" of the circuit element 878B and the intermediate capacitive pick-up areas 892C, 892C', and 892C" of the circuit element 878C are printed on the seal coat layer 898. FIG. 86 illustrates the configuration of the card 860 when the circuit elements 878A–C are printed over the discontinuous release coat layer 906. The circuit elements 878A–C are positioned on the card 860 so that the resistive elements 880A–C are aligned with and positioned in the data tracks 877A–C. Each resistive element 880A therefore overlies a column of the play indicia 876A–L and the portions 894A–L of each resistive element 880A–D directly overlie one of the play indicia 876A–L. Consequently, although shown for reference the play indicia 876A, 876G, 876I, and 876J would not be visible because of the overlying portions 894A, 894G, 894I, and 894J of the resistive elements 880A–C. As noted previously with reference to FIG. 82, within the indicia-array portion 870 of the card 860 the material exposed between adjacent release coat spots 908A–L, for example the release coat spot 908B and the release coat spot 908F, is the seal coat layer 898. In addition, outside of the indicia-array portion 870 of the card 860 the material exposed adjacent the release coat spots 908A–L is the substrate 862. Consequently, the terminal capacitive pick-up areas 882A–C and 884A–C are printed directly on the substrate 862, as are the intermediate capacitive pick-up areas 89A, 892A', and 892A" of the circuit element 878A. The intermediate capacitive pick-up areas 892B, 892B', and 892B" of the circuit element 878B and the intermediate capacitive pick-up areas 892C, 892C', and 892C" of the circuit element 878C are printed on the seal coat layer 898.

Figure 87:
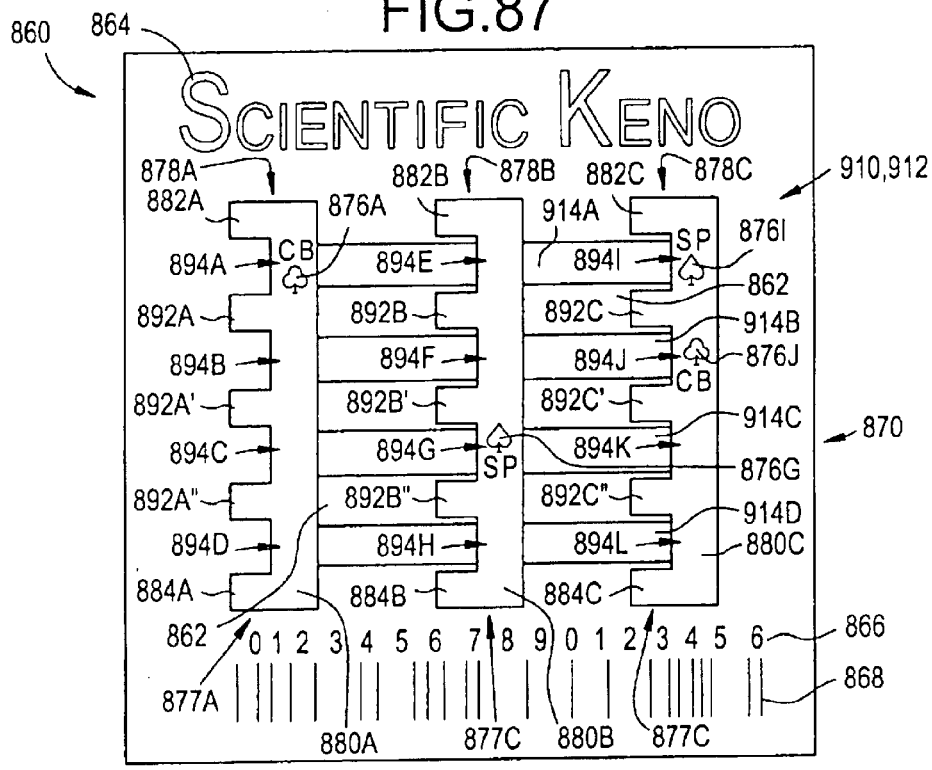
FIG. 87 is a plan drawing of the circuit elements in FIG. 78 as printed on the seal-release coat shown in FIG. 83.

FIG. 87 illustrates the configuration of the card 860 when the circuit element 878A–C are printed on the barred seal-release coat 912. The circuit elements 878A–C are positioned on the card 860 so that the resistive elements 880A–C are aligned with and positioned in the data tracks 877A–C. Each resistive element 880A therefore overlies a column of the play indicia 876A–L and the portions 894A–L of each resistive element 880A–D directly overlie one of the play indicia 876A–L. Consequently, although shown for reference the play indicia 876A, 876G, 876I, and 876J would not be visible because of the overlying portions 894A, 894G, 894I, and 894J of the resistive elements 880A–C. As noted earlier with reference to FIG. 83, the exposed material around any of the strips 914A–D is the substrate 862. Consequently, all of the terminal capacitive pick-up areas 882A–C and 884A–C and all of the intermediate capacitive pick-up areas 892A, 892A', 892A", 892B, 892B', 892B", 892C, 892C', and 892C" are printed directly on the substrate 862.

Figure 88:
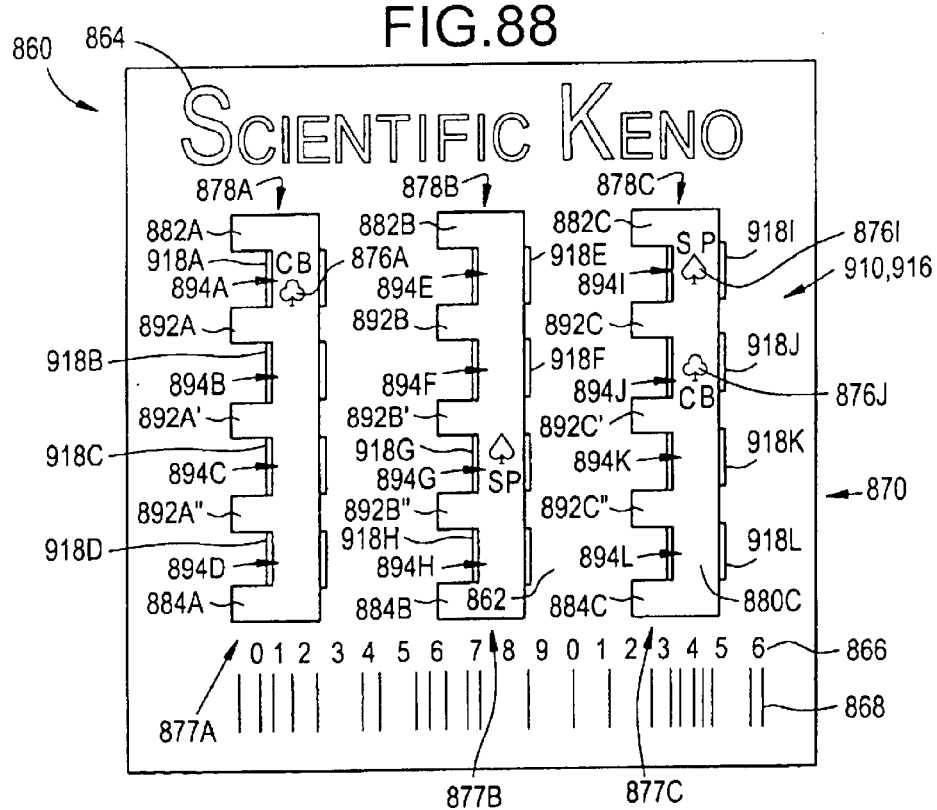
FIG. 88 is a plan drawing of the circuit elements in FIG. 78 as printed on the seal-release coat shown in FIG. 84.

FIG. 88 illustrates the configuration of the card 860 when the circuit elements 878A–C are printed over the discontinuous seal-release coat layer 916. The circuit elements 878A–C are positioned on the card 860 so that the resistive elements 880A–C are aligned with and positioned in the data tracks 877A–C. Each resistive element 880A therefore overlies a column of the play indicia 876A–L and the portions 894A–L of each resistive element 880A–D directly overlie one of the play indicia 876A–L. Consequently, although shown for reference the play indicia 876A, 876G, 876I, and 876J would not be visible because of the overlying portions 894A, 894G, 894I, and 894J of the resistive elements 880A–C. As previously noted with reference to FIG. 84, the exposed material around any of the seal-release coat spots 918A–L is the substrate 862. Consequently, all of the terminal capacitive pick-up areas 882A–C and 884A–C and all of the intermediate capacitive pick-up areas 892A, 892A', 892A", 892B, 892B', 892B", 892C, 892C', and 892C" are printed directly on the substrate 862.

A scratch-off coating 920 is then printed on the card 860 so that the scratch-off coating 920 span the entire indicia array portion 870 of the card 860 and covers all of the circuit elements 878A–C, as shown in FIG. 89. In order not to interfere with the electrical signatures of the circuit elements 878A–C the electrical conductivity of the scratch-off coating 920 should be significantly less that the electrical conductivity of the circuit elements 878A–C. In the preferred embodiment, the sheet resistivity of the scratch-off coating 920 is greater than $10^8$ $\Omega/58$. A suitable formulation for the scratch-off coating 920 is given in Walton, U.S. Pat. No. 4,726,608. The boarder 869, the indicia spots areas 872A–L and the overlay indicia 874A–L are then printed as overprint graphics to give the card 860 the finished appearance shown in FIG. 77.

The operation of the circuit elements 878A–C is best explained 14 with reference to FIGS. 77, 79, and 85–88. Each of the capacitive pick-up areas 882A–C, 884A–C, 892A, 892A', 892A", 892B, 892B', 892B", 892C, 892C', and 892C" is sized, shaped, and positioned on the card 860 so that each of the capacitive pick-up areas 882A–C, 884A–C, 892A, 892A', 892A", 892B, 892B', 892B", 892C, 892C', and 892C" can capacitively couple with either the excitation plate 576 or one of the sensor plates 574 of the sensor array 502 in the electronic verification machine 500. Consequently, all of the intermediate capacitive pick-up areas 892A, 892A', 892A", 892B, 892B', 892B", 892C, 892C', and 892C" function as both excitation and sensor capacitive pick-up areas when the card 860 is coupled to the electronic verification machine 500. The terminal capacitive pick-up areas 882A–C and 884A–C, however, function only as either an excitation capacitive pick-up area or a sensor capacitive pick-up area depending on the direction in which the card 860 moves through the electronic verification machine 500. For example, if the card moves through the electronic verification machine 500 so that the terminal capacitive pick-up areas 882A–C first couple with the sensor array 502, then the terminal capacitive pick-up areas 882A–C function only as excitation capacitive pick-up areas and the terminal capacitive pick-up areas 884A–C function only as sensor capacitive pick-up areas. Alternatively, if the card moves through the electronic verification machine 500 so that the terminal capacitive pick-up areas 884A–C first couple with the sensor array 502, then the terminal capacitive pick-up areas 884A–C function only as excitation capacitive pick-up areas and the terminal capacitive pick-up areas 882A–C function only as sensor capacitive pick-up areas. For ease of explanation, in the following discussion it is to be understood that the card 860 moves through the electronic verification machine 500 so that the terminal capacitive pick-up areas 882A–C first couple with the sensor array 502 and so function only as excitation capacitive pick-up areas. Referring now to FIGS. 85–88, when the card 860 first couples with the sensor array 502, the terminal capacitive pick-up area 882C serves as an excitation capacitive pick-up area and the intermediate capacitive pick-up area 892C serves as a sensor capacitive pick-up area. In addition, the terminal capacitive pick-up area 892C is joined to the intermediate capacitive pick-up area 892C by the portion 894I of the resistive element 880C. The capacitive pick-up areas 882C and 892C and the associated portion 894I of the resistive element 880C therefore form a U-shaped circuit element. As the card 860 continues to move through the electronic verification machine 500, the intermediate capacitive pick-up area 892C and the intermediate capacitive pick-up area 892C' function as excitation and sensor capacitive pick-up areas, respectively, that are joined by the portion 894J of the circuit element 880C. Similarly, the intermediate capacitive pick-up area 892C' and the intermediate capacitive pick-up area 892C', together with the portion 894K of the resistive element 880C form a U-shaped circuit element, and the intermediate capacitive pick-up area 892C' and the terminal capacitive pick-up area 884C, together with the portion 894L of the resistive element 880C form a U-shaped circuit element. Each of the circuit elements 878 therefore serves as a linear array of U-shaped circuit elements that are defined by two adjacent capacitive pick-up areas, 882A–C and 892A–C, 892A–C and 892A'–C', 892A'–C' and 892A''–C'', 892A''–C'', and 884A–C, and the associated portions 894A–L of the resistive elements 880A–C. Thus, when a given indicia spot area 872A–L is removed to mark the card 860 and reveal the underlying play indicia 876A–L, only the U-shaped circuit element which is partially defined by the associated portion 894A–L of the resistive element 880A–C is affected. For example, when the indicia spot area 872A is removed to reveal the underlying play indicia 876A as shown in FIG. 77, the only affected U-shaped circuit element is the one that is defined by the terminal capacitive pick-up area 882A, the intermediate capacitive pick-up area 892A and the associated portion 894A of the resistive element 880A.

It should be kept in mind that a similar result can be achieved if the card is printed with a plurality of separate U-shaped circuit elements, such as the data circuit elements 750A–B of the ticket 700. However, the method of printing the circuit elements 878 has advantages over printing individual U-shaped elements such as 750A–B in that much fewer capacitive pick-up areas are required for each data bit. Also, for those applications where the play indicia 876A–L are not required, the seal coat 898 can be omitted from the marker card 860.

X. A Data Card According to the Invention.

FIG. 90 shows a data card 922 which can be used with the electronic verification machine 500, shown in FIGS. 38–40. The data card 922 includes circuit elements, generally denoted as 924, that are printed directly on a substrate 926. Each of the circuit elements 924 includes two terminal capacitive pick-up areas, generally denoted as 928 and 930, and a data track, generally denoted as 932, that spans between the two terminal capacitive pick-up areas 928 and 930. In addition, each of the circuit elements 924 can include intermediate capacitive pick-up areas, generally denoted as 934, 936, and 938, that are positioned on the card 922 intermediate the terminal capacitive pick-up areas 928 and 930 and are aligned with the terminal capacitive pick-up areas 928 and 930. As with the marker card 860, each pair of adjacent capacitive pick-up areas, for example, the capacitive pick-up area 928B and the capacitive pick-up area 934B, or the capacitive pick-up area 934B and the capacitive pick-up area 936B, define partial U-Shaped circuit elements the remainder of which are defined by an associated portion 940A–L of the data tracks 932. The U-shaped circuit elements can in turn encode either a bit-off or "0" signal or a bit-on or "1" signal, depending on whether or not the associated portions 940A–L of the data tracks 932 contain conductive material. For example, the U-shaped circuit element that is defined by the capacitive pick-up areas 928A and 934A and the associated portion 940A of the data track 932A encode a bit-off or "0" signal and the U-shaped circuit element that is defined by the capacitive pick-up areas 928B and 934B and the associated portion 940E of the data track 932B encodes a bit-on or "1" signal. Thus, reading from left to right, the first row of U-Shaped circuit elements encodes "011", the second row of U-Shaped circuit elements encodes "110", the third row of U-Shaped circuit elements encodes "100" and the fourth row of U-shaped circuit elements encodes "111". A suitable ink for printing the circuit elements 924A–C for the data card 922 can be printed with the ink that was previously described in Table 1.

Figure 91:
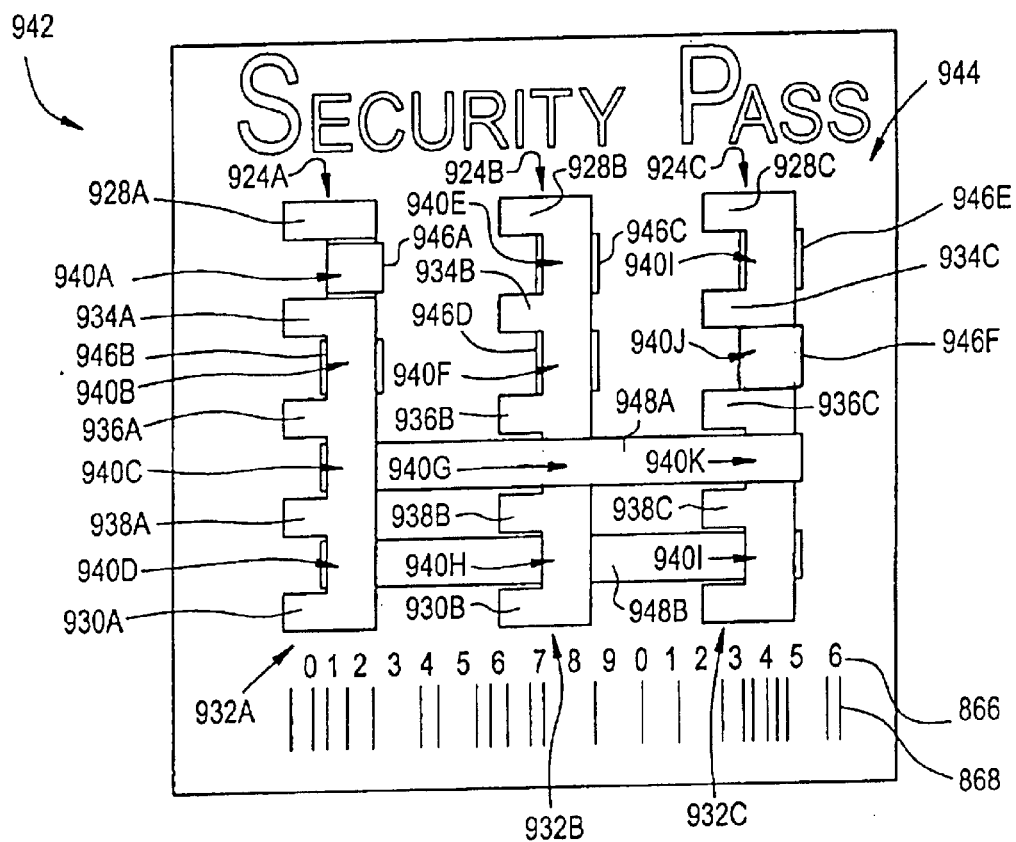
FIG. 91 is a plan drawing of an alternative embodiment of the data card in FIG. 91.

FIG. 91 illustrates an alternative embodiment of a data card 942 according to the invention. Like the data card 922, the data card 942 includes circuit elements 924A–C. The main difference between the data card 922 and the data card 942 is that the data card 942 includes a release coat 944 that is printed on the substrate 926 so that the release coat underlies the portions 940A–L of the data tracks 932A–C but does not underlie any of the capacitive pick-up areas 928A–C, 930A–C, 934A–C, 936A–C, and 938A–C. As with the marker card 860, the release coat 944 can be printed on the substrate 926 either as discreet release coat layer portions 946A–F or as spaced-apart strips 948A–B. The circuit elements 924A–C are therefore printed on the data card 942 so that initially each of the data tracks 932A–C contains conductive material in all of the portions 940A–L of the data tracks 932A–C. After the data card 942 is printed, specific portions 940A–L of the data tracks 932A–C are scratched-off to encode the desired binary data. For example the portion 940A of the resistive track 932A, the portion 940G of the data track 932B, and the portions 940J and 940K of the data track 932C have been removed subsequent to printing the data card 942. Thus, reading from left to right, the first row of U-Shaped circuit elements encodes "011", the second row of U-Shaped circuit elements encodes "110", the third row of U-Shaped circuit elements encodes "1100" and the fourth row of U-Shaped circuit elements encodes "111". A suitable ink for printing the circuit elements 924A–C for the data card 942 was previously given in Table 1.

XI. A Laminated Document According to the Invention.

Figure 92:
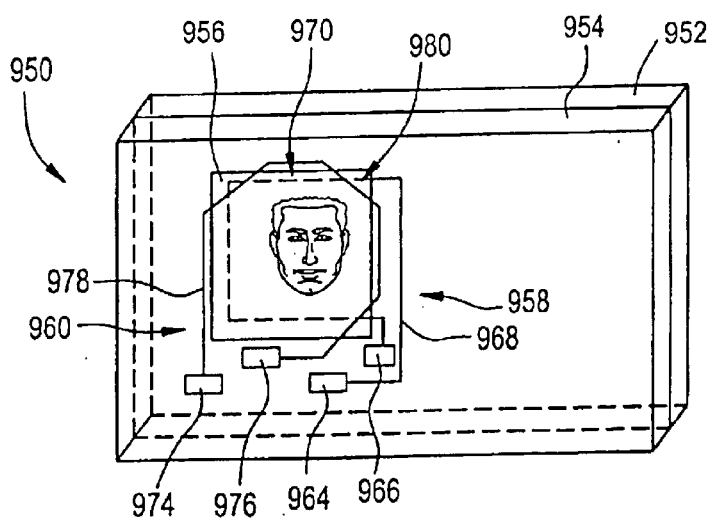
FIG. 92 is a plan drawing a laminated document according to the invention.
Figure 93:
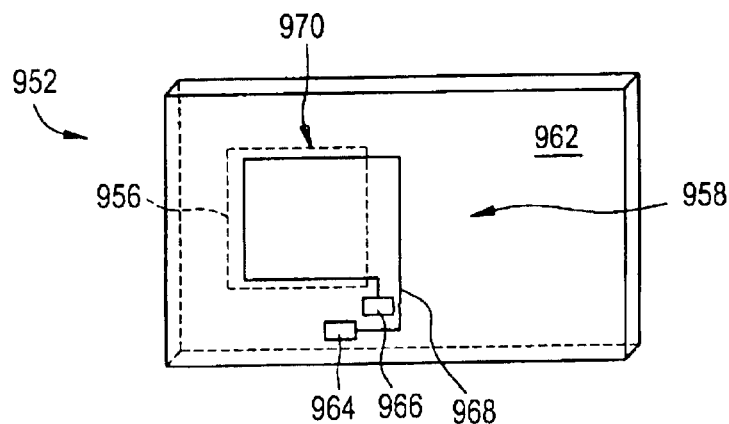
FIG. 93 is a plan drawing of a lower laminate and a lower circuit element that is part of the laminated document in FIG. 92.

FIG. 92. shows a laminated document 950 that can be used with the electronic verification machine (shown in FIGS. 38–40). Laminated documents, such as the document 950, have a variety of uses including protecting an information document against excessive wear. One example of a laminated document, such as the document 950, is an identification card such as a driver's license where the information document is a photograph. Laminated documents, such as identification cards, can be altered, for example, by splitting the laminated document to remove the original identification document and then substituting a fraudulent identification document. The laminated document 905 helps to prevent such fraudulent misuse. As shown in FIG. 92, the document 950 includes a first laminate 952, a second laminate 954, and an information document 956, such as a photograph. The laminated document 950 also includes two circuit elements 958 and 960, each of which is secured to or printed on one of the laminates 952 and 954. FIG. 93 illustrates the first laminate 952 which includes an upper surface 962 on which the circuit element 958 is printed. The laminate 952 preferably is made from a durable non-conductive material, such as plastic, that can be opaque and that has a sheet resistivity greater than $10^8$ $\Omega/\square$. The outline of the information document 956 is shown in phantom for reference. The circuit element 958 includes two capacitive pick-up areas 964 and 966. The capacitive pick-up area 966 is shaped and positioned on the upper surface 962 of the laminate 952 so that the capacitive pick-up area 966 capacitively couples with the excitation plate 576 of the sensor array 502 in the electronic verification machine 500. The capacitive pick-up area 964 is shaped and positioned on the upper surface 962 of the laminate 952 so that the capacitive pick-up area 964 capacitively couples with one of the sensor plates 574 of the sensor array 502. The circuit element 952 further includes a resistive element 968 that is connected to and extends between the capacitive pick-up areas 964 and 966 so that at least a portion 970 of the resistive element 968 underlies the information document 956 in the laminated document 950.

Figure 94:
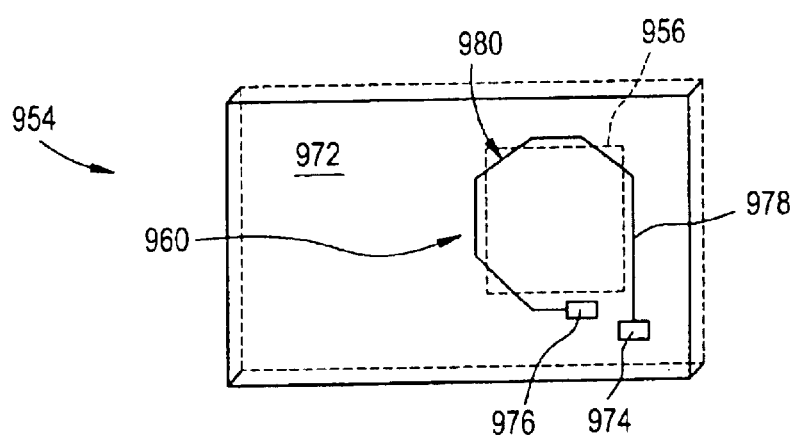
FIG. 94 is a plan drawing of an upper laminate and an upper circuit element that is part of the laminated document in FIG. 92.

FIG. 94 illustrates the second laminate 954 which includes a lower surface 972 on which the circuit element 960 is printed. The laminate 954 preferably is made from a transparent material, such as plastic, that has a sheet resistivity greater than $10^8$ $\Omega/\square$. The outline of the information document 956 is shown in phantom for reference. The circuit element 960 includes two capacitive pick-up areas 974 and 976. The capacitive pick-up area 976 is shaped and positioned on the lower surface 972 of the laminate 954 so that the capacitive pick-up area 976 capacitively couples with the excitation plate 576 of the sensor array 502 in the electronic verification machine 500. The capacitive pick-up area 974 is shaped and positioned on the lower surface 972 of the laminate 954 so that the capacitive pick-up area 974 capacitively couples with one of the sensor plates 574 of the sensor array 502. The circuit element 954 further includes a resistive element 978 that is connected to and extends between the capacitive pick-up areas 974 and 976 so that at least a portion 980 of the resistive element 978 overlays the information document 956 in the laminated document 950. A suitable ink for printing the circuit elements 968 and 069 was presently previously in Table 1.

Figure 95:
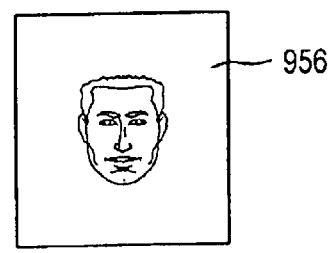
FIG. 95 is a plan drawing of an information document that is part of the laminated document shown in FIG. 92.

In making the finished laminated document 950 shown in FIG. 92, the information document 956, shown in FIG. 95, is positioned on the first laminate 952 so that the portion 970 of the resistive element 960 underlies the information document 950. The second laminate 954 is then inverted, relative to its configuration in FIG. 94, so that the lower surface 972 of the second laminate 954 is adjacent the upper surface 962 of the first laminate 952. The second laminate 954 is also aligned with the information document 956 so that the portion 980 of the circuit element 960 overlies the information document 956. The two laminates 952 and 954 are then bonded together to form the laminated document 950. Thereafter, if an attempt is made to split the laminated document 950 and remove the information document 956, one or both of the resistive elements 968 and 978 will be damaged or broken. The resulting change in the electrical signature of the affected circuit element 958 or 960 can then be detected by the sensor array 502 of the electronic verification machine 500.

XII. A Third Electronic Verification Machine

A. Components

Figure 96:
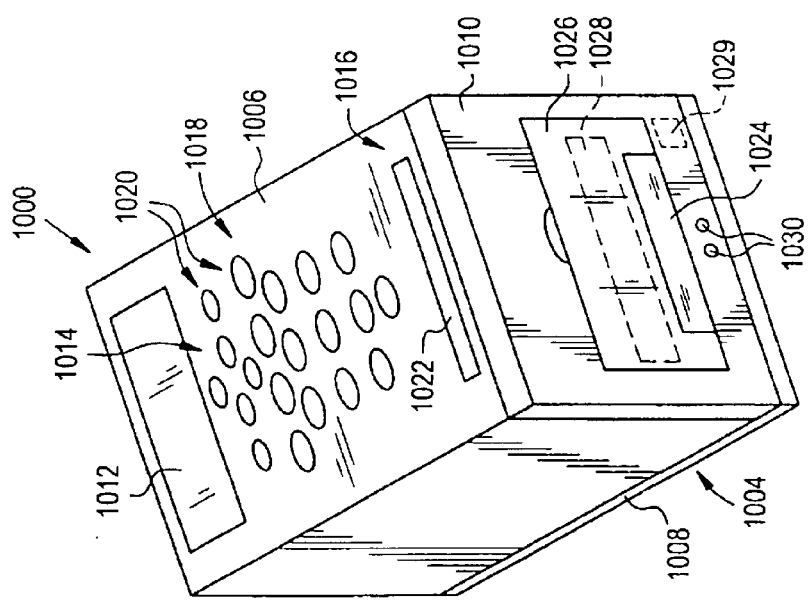
FIG. 96 is a perspective view of a third electronic verification machine according to the invention.

A third and preferred embodiment of an electronic verification machine 1000 according to the invention is shown in FIG. 96. The electronic verification machine 1000 includes a frame structure 1002 (shown in FIG. 97) which is enclosed within a housing 1004 that includes a cover section 1006, a bottom section 1008, and a front section 1010. Although the exact configuration of the exterior of the electronic verification machine 1000 can vary, the exterior of the electronic verification machine 1000 preferably includes a display panel 1012, a user interface 1014, and a document interface 1016, all of which are positioned along the cover section 1006. The display panel 1012 can display instructions, such as "Insert Ticket" and can also display the results of document validation and verification testing. The display panel 1012 preferably consists of a commercially available display unit, such as a liquid crystal display, a gas discharge display, or a light emitting diode (LED) display. The user interface 1014 includes a numeric keypad, shown generally as 1018, and function keys, shown generally as 1020. The operator can use the user interface 1014 to manually enter data from the document into the electronic verification machine 1000. The document interface 1016 includes a slot 1022 into which the document to be tested is inserted. In the preferred embodiment, the document interface 1016 also includes an exit slot 1024 from which the document being tested exits the electronic verification machine 1000. In addition, the electronic verification machine 1000 preferably includes a door 1026 located on the front section 1010 of the housing 1004. The door 1026 provides access to the document pathway and can be used to clear the pathway should the document become jammed within the electronic verification machine 1000. The door 1026 also provides access to a mirror 1028 (shown in phantom) that is positioned along the inner surface of the door 1026. As explained below, the mirror 1028 can be used to read certain kinds of data printed on the document. The door 1026 and associated front section 1010 also include a door position sensor 1029. Indicator lights 1030 located on the front section 1010 can be used to indicate that the door 1026 is open or jammed, that a document is jammed within the document channel 1038, or that the electronic verification machine 1000 is unable to scan a document.

Figure 97:
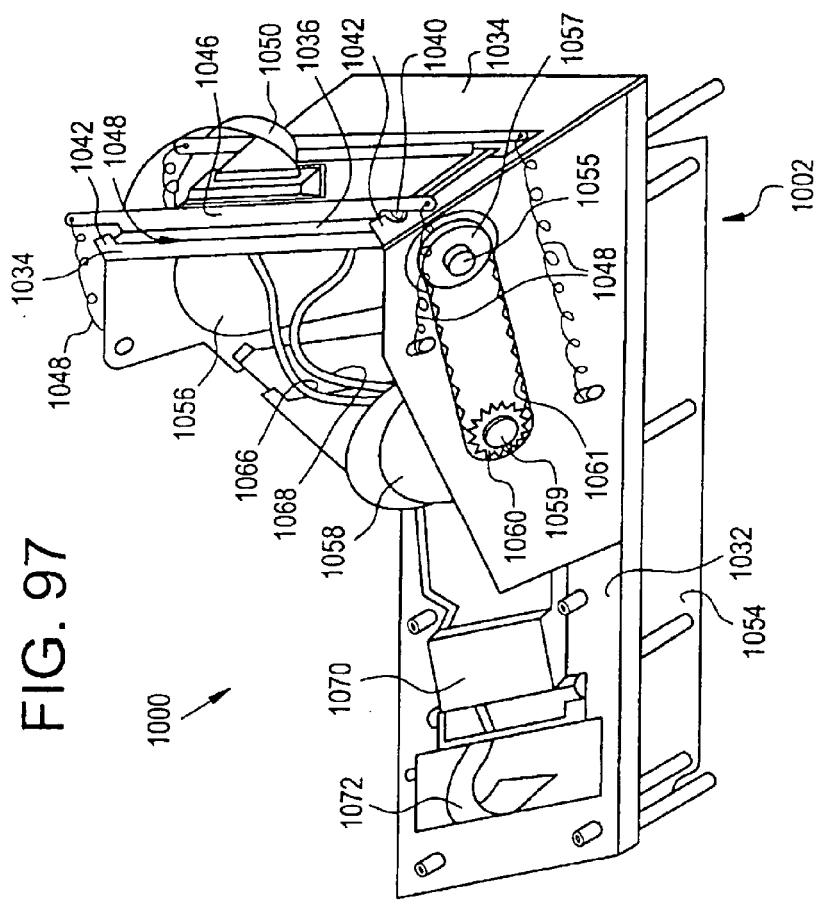
FIG. 97 is a side perspective view of the electronic verification machine in FIG. 96 with the cover removed.

FIG. 97 shows the electronic verification machine 1000 with the housing 1004 removed. The frame structure 1002 includes a base portion 1032 and a front portion 1034 that is generally aligned with the front section 1010 of the housing 1004 (as shown in FIG. 96). A sensor head 1036 is secured to the frame structure 1002 to form a channel 1038 intermediate the front portion 1034 of the frame structure 1002 and the sensor head 1036. The channel 1038 defines the document pathway through the electronic verification machine 1000. In the preferred embodiment of the invention, the sensor head 1036 is tensionably secured to the frame structure 1002 so that the document being tested is in intimate physical contact with a sensor array 1044 (shown in FIGS. 99 and 100) positioned on the sensor head 1036. The sensor head 1036 therefore includes hinge pins 1040 that are rotatably mounted in hinge arms 1042 formed on the front portion 1034 of the frame structure 1002. A tensioning guide 1046 is located along the sensor head 1036, opposite the front portion 1034 of the frame structure 1002 and is secured to the frame structure 1002 by tensioning fasteners 1048. The tensioning guide 1046 is preferably formed from a rigid material, such as metal, and the tensioning fasteners 1048 can be formed from any appropriate stretchable devices, such as springs. The tensioning guide 1046 helps to ensure that the document being tested maintains intimate physical contact with the sensor array 1044 while the hinge pins 1040 permit the sensor head 1036 to pivot slightly so that the electronic verification machine 1000 can accept documents of varying thickness. A ribbon connector 1050 extends through an aperture 1052 (shown in FIG. 98) formed in the tensioning guide 1046 and operatively connects the sensor head 1036 to a master control processing board 1054 which is affixed to the frame structure 1002.

The electronic verification machine 1000 also includes a pressure roller 1056 which moves the document being tested through the document channel 1038 and through the exit slot 1024 (shown in FIG. 96). The pressure roller 1056 is supported in the frame structure 1002 via a shaft 1055 which also supports a pulley 1057. A stepper motor 1058 is also supported on the frame structure 1002 via a shaft 1059, on which is also mounted a pulley 1060. A toothed belt 1061 looped around the pressure roller pulley 1057 and the stepper motor pulley 1060 connects the pressure roller 1056 to the stepper motor 1058. As explained in more detail below, the stepper motor 1058 is operatively connected to the master control processing board 1054 and controls the rate at which the document being tested is moved through the document channel 1038. In addition, edge detectors 1062 and 1064 (shown in FIG. 98), which are operatively connected to the master control processing board 1054 by sets of lines 1066 and 1068 and by ribbon connector 1050, provide information about the position of the document being tested within the document channel 1038. The electronic verification machine 1000 further includes a bar code reader 1070 which is secured to the frame structure 1002 and is operatively connected to the master control processing board 1054 via connector lines 1072.

Figure 98:
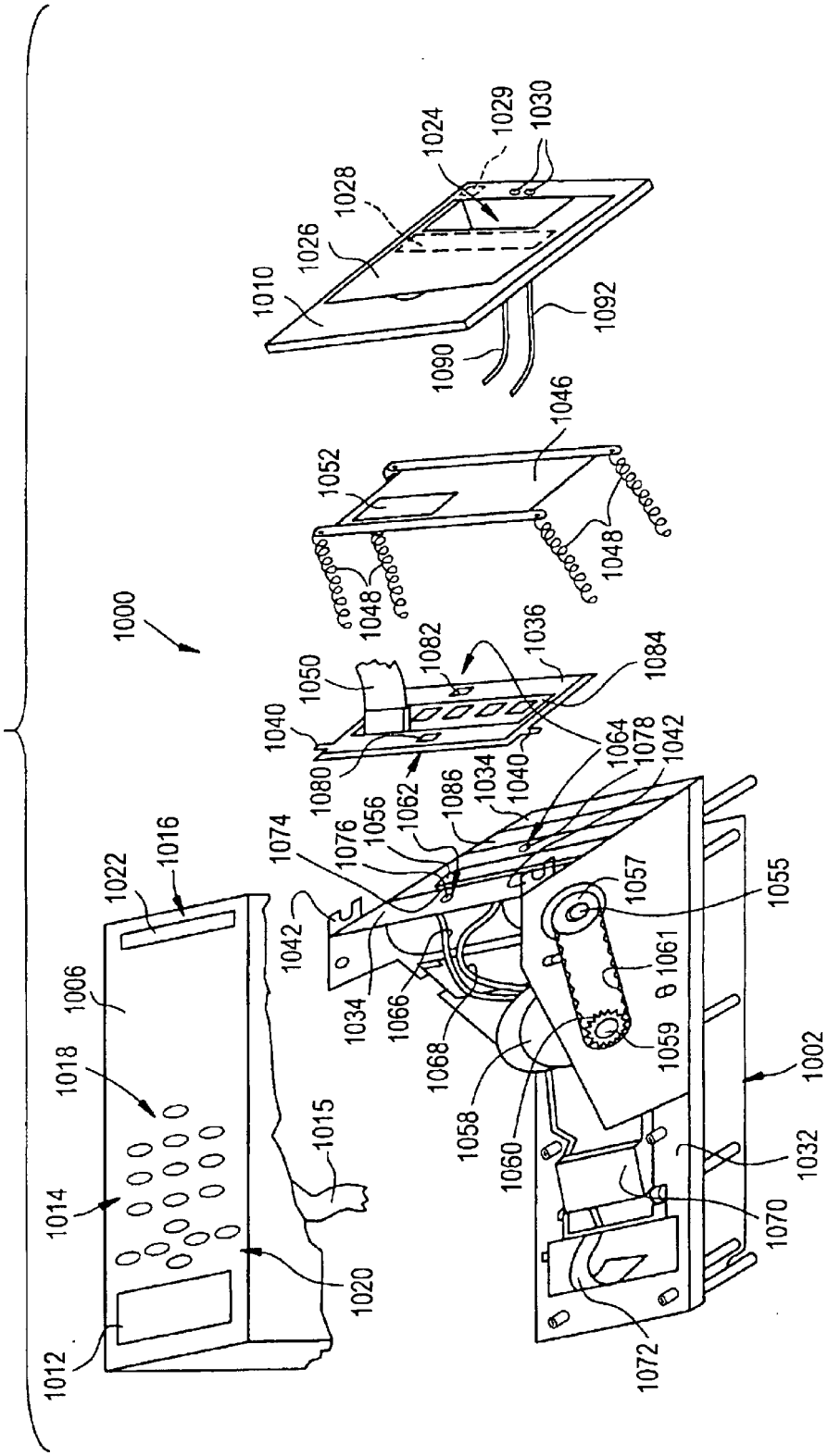
FIG. 98 is a partially cut-away exploded side perspective view of the electronic verification machine in FIG. 96.

FIG. 98, which is a partially cut-away exploded side perspective view of the electronic verification machine 1000, shows the relationship among the cover section 1006 of the housing 1004, the front portion 1034 of the frame structure 1002, the sensor head 1036, the tensioning guide 1046, and the front section 1010 of the housing 1004 in more detail. The user display panel 1012 and the user interface 1014, located along the cover portion 1006, are operatively connected to the master control processing board 1054 via a ribbon connector 1015. When the electronic verification machine 1000 is fully assembled, the ticket slot 1022 formed in the cover portion 1006 is aligned with the document channel 1038 (shown in FIG. 97) which is formed between the front portion 1034 of the frame structure 1002 and the sensor head 1036. The pressure roller 1056 extends through an aperture 1074 formed in the front portion 1034 of the frame structure 1002. Consequently, the pressure roller 1056 contacts the document being tested and moves the document through the document channel 1038 (shown in FIG. 97). In the preferred embodiment, the edge detectors 1062 and 1064 consists of two light emitting diodes 1076 and 1078 and two phototransistors 1080 and 1082. The light emitting diodes 1076 and 1078 are positioned along the front portion 1034 of the frame structure 1002 on opposite sides of the pressure roller 1056. The phototransistors 1080 and 1082 are positioned along the sensor head 1036 on opposite sides of a sensor array circuit board 1084 which is secured to the sensor head 1036. The phototransistors 1080 and 1082 on the sensor head 1036 are aligned with the light emitting diodes 1076 and 1078 on the frame structure 1002 to form the edge detectors 1062 and 1064. The first edge detector 1062 is used to indicate that a document has been inserted into the electronic verification machine 1000. The second edge detector 1064 is used to obtain precise document position information. The first edge detector 1062 and the second edge detector 1064 are spaced-apart by a pre-determined distance which, in the preferred embodiment, is about 1.48 inches. In addition, the second edge detector 1064 is located at a pre-determined distance, preferably 0.73 inches, below the tangent point of the pressure roller 1056.

The electronic verification machine 1000 also includes a window 1086 formed along the front portion 1034 of the frame structure 1002. The window 1086 is aligned with both the bar code reader 1070 and the mirror 1028 located along the front section 1010 of the housing 1004. Together, the mirror 1028 and the window 1086 can be used with the bar code reader 1070 to read bar codes that are printed on the front of the document being tested. Alternatively, bar codes that are printed on the back of the document being tested can be read by the bar code reader 1070 and the window 1086 alone. As noted earlier, the electronic verification machine 1000 can also include indicator lights 1030 located on the front section 1010 of the housing 1004. The indicator lights 1030 are operatively connected to the door position sensor 1029 (shown in phantom) which also is located on the front section 1010 and which, in the preferred embodiment, includes a light emitting diode and a phototransistor. The door position sensor 1029 and the indicator lights 1030 are operatively connected to the master control processing board 1054 by lines 1090 and 1092, respectively.

Figure 99:
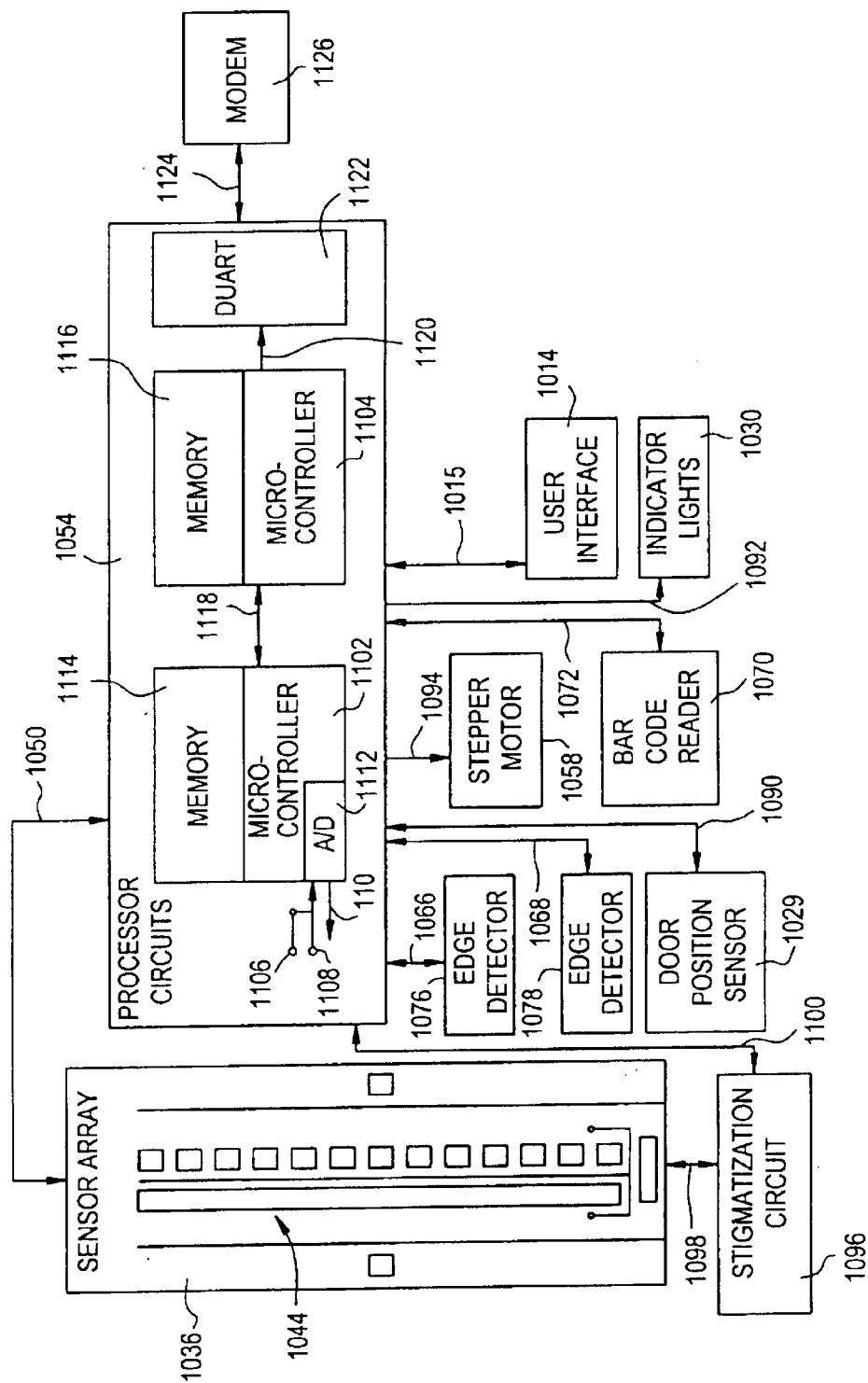
FIG. 99 is a block diagram of the relationship among the major components of the electronic verification machine in FIG. 96.

FIG. 99 is a block diagram of the relationship among the major components of the electronic verification machine 1000. The sensor head 1036 is connected to the master control processing board 1054 by the ribbon connector 1050. The light emitting diodes 1076 and 1078 which form parts of the edge detectors 1062 and 1064, respectively, are connected to the master control processing board 1054 by the lines 1066 and 1068, respectively. The door position sensor 1029 is connected to the master control processing board 1054 by the line 1090, while the indicator lights 1030 are operatively connected to the master control processing board 1054 by the line 1092. A line 1094 operatively connects the stepper motor 1058 to the master control processing board 1054. The lines 1072 operatively connect the bar code reader 1070 to the master control processing board 1054. The user interface 1014 is operatively connected to the master control processing board 1054 by the ribbon connector 1015. The electronic verification machine also includes a stigmatization circuit 1096 which is used in conjunction with the sensor array 1044 and the master control processing board 1054 to stigmatize a document being tested once its electrical signature has been measured. The stigmatization circuit 1096 is operatively connected to the sensor array 1044 by lines 1098 and to the master control processing board 1054 by lines 1100.

In the preferred embodiment of the invention, master control processing board 1054 includes two microcontrollers, a support microcontroller 1102 and a primary microcontroller 1104. The support microcontroller 1102 is used in controlling all low-level device interfaces, such as the sensor array 1044, the stigmatization circuit 1096, the edge detectors 1062 and 1064, the door position sensor 1029, the indicator lights 1030, the user interface 1014, the bar code reader 1070 and the stepper motor 1058. A set of lines 1106–1110 provides signal inputs and outputs to the support microcontroller 1102. In the preferred embodiment of the invention, the support microcontroller 1102 is a Motorola MC68HC16 processor which incorporates a 16 bit central processing unit, a single chip integration module, a multi-channel communications interface, a general purpose timer and a time processing unit. The support microcontroller also includes an 8 to 10 bit analog-to-digital (A/D) converter 1112 and memory 1114. The memory 1114 of the support microcontroller 1102 preferably includes 48 Kbytes of Programmable Read Only Memory (PROM) and 65 Kbytes of Static Random Access Memory (SRAM). The bar code reader 1070 is connected to the support microcontroller 1102 by a standard bidirectional UART port operating at 9600 Baud. The internal timers of the support microcontroller 1102 are used to control the stepper motor 1058. The edge detectors 1062 and 1064 are interfaced to the support microcontroller as standard Transistor-Transistor Logic (TTL) signals.

The primary microcontroller 1104 is used to process the electrical signature of the document being tested in order to verify that the document is authentic. In the preferred embodiment of the invention, the primary microcontroller 1104 preferably is a 32 bit Elan SC410A which operates at an internal clock speed of 66 MHz. The primary microcontroller 1104 also includes memory 1116 which, in the preferred embodiment consists of 4–8 Mbytes of Dynamic Random Access Memory (DRAM), 2–4 Mbytes of flash memory, and 512 Kbytes to 1 Mbyte of SRAM supported by a back up battery. In the preferred embodiment of the invention, the primary microcontroller 1104 includes a glueless burst-mode interface that allows the flash memory to be partitioned in to various sectors, e.g., operating system, operational software version A, operational software version B, etc. The primary microcontroller 1104 is connected to the support microcontroller 1102 by a high speed parallel interface 1118. A parallel interface 1120 connects the primary microcontroller 104 to a Dual Universal Asynchronous Receiver-Transmitter (DUART) 1122 which is also connected by a serial digital line at Transistor Transistor Logic (TTL) levels to a modem 1126. In the preferred embodiment of the invention, the modem 1126 is a 14.4 kbps Rockwell modem. The modem 1126 is used to provide communications between the electronic verification machine 1000 and a central site computer, such as the computer 223 (shown in FIG. 17).

As mentioned earlier, the support microcontroller 1102 is used for all low level device interfaces. Consequently, the primary microcontroller 1104 is used only for high level functionality such as comparing the measured electrical signature to a predetermined game signature map such as shown in FIG. 44. In addition, the primary microcontroller 1104 communicates with the central site computer 223 to obtain game specific information such as the game signature map 632, and to determine the redemption value of high level probability game lottery tickets, such as the ticket 700. To maximize communications flexibility with the central site computer, the electronic verification machine can also be equipped with an optional Motorola MC68302 communications processor (not shown). This communications processor would then be used to handle all low-level communications protocols, thereby allowing the primary microcontroller 1104 to focus exclusively on high-level ticket/user functionality.

Figure 100:
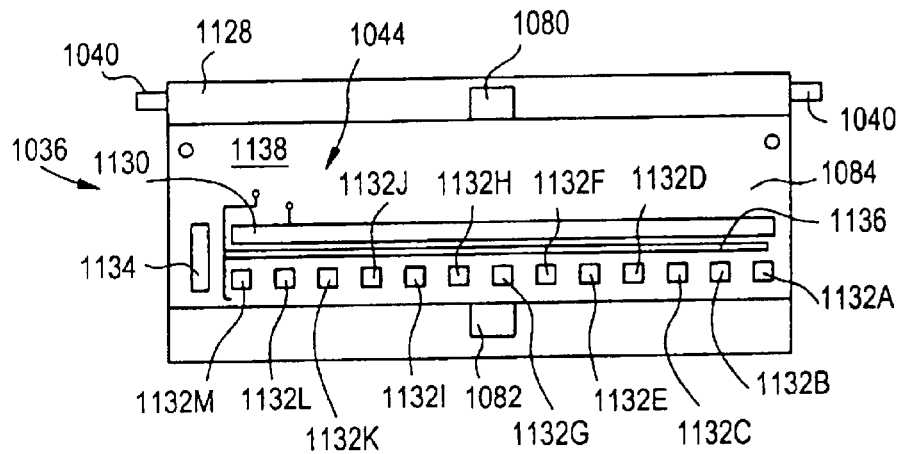
FIG. 100 is a top plan view of a sensor head which forms a part of the electronic verification machine in FIG. 96.

FIG. 100 is a top plan view of the sensor head 1036 and shows the sensor array 1044 in more detail. The sensor head 1036 includes the phototransistors 1080 and 1082 that form parts of the edge detectors 1062 and 1064 (shown in FIG. 98) and the sensor array circuit board 1084 of which the sensor array 1044 forms a part. In the preferred embodiment, the sensor array circuit board 1084 is secured to a sensor head housing 1128 which also carries the phototransistors 1080 and 1082. Due to the intimate physical contact between the document being tested and the sensor head 1036, if not protected the phototransistors 1080 and 1082 can become dirty over time due to contact with the document being tested. Consequently, in the preferred embodiment of the invention, the phototransistors 1080 and 1082 are embedded within and protected by the sensor head housing 1128 which is formed from a plastic that is transparent in the infrared region. In the preferred embodiment, a clear Acrylic with a 94-VO flame rating is used to form the sensor head housing 1128.

The sensor array 1044 includes an elongated excitation plate 1130, thirteen sensor plates 1132A–1132M, and a fuse excitation pad 1134. It should be noted that, in an embodiment of the invention that does not include stigmatization, the fuse excitation pad 1134 can be replaced with a sensor plate to provide fourteen document sensor channels. The vertical dimension of each of the sensor plates 1132A–1132M preferably is 0.1 inches and the horizontal dimension of each of the sensor plates 1132A–1132M preferably is 0.1 inches. The vertical dimension of the excitation plate 1130, which preferably is located about 0.05 inches from the sensor plates 1132A–1132M, preferably is 0.1 inches. The horizontal dimension of the fuse excitation pad 1134 preferably is about 0.1 inches and the vertical dimension preferably is about 0.26 inches. The sensor array 1044 can also include a thin ground strap 1136 positioned intermediate the excitation plate 1130 and the sensor plates 1132A–1132M. Because of the close proximity of the excitation plate 1130 and the sensor plates 1132A–1132M, the excitation signal can jump between the excitation plate 1130 and the sensor plates 1132A–1132M, resulting in an inaccurate electrical signature. The ground strap 1136 behaves as an "electrical fence" and prevents signal jumping from the excitation plate 1130 to the sensor plates 1132A–1132M. The inter-sensor plate spacing should be about twice the horizontal dimension of the sensor plates 1132A–1132M. In the preferred embodiment of the invention, the spacing between any two adjacent sensor plates 1132A–1132M, such as the sensor plates 1132B and 1132C, is about 0.18 inches. The horizontal dimension of the excitation plate 1130 is chosen so that the excitation plate 1130 spans the distance of the thirteen sensor plates 1132A–1132M. In the preferred embodiment of the invention, the horizontal dimension of the excitation plate 1130 therefore is about 3.46 inches.

The excitation plate 1130, the sensor plates 1132A–1132M, the fuse excitation pad 1134, and the ground strap 1136 preferably are made from a highly conductive material, such as copper. However, it has been found that over time the sensor array 1044 can become worn due to the close physical contact of the document being tested. Consequently, in the preferred embodiment of the invention, the excitation plate 1130, the sensor plates 1132A–1132M, the fuse excitation pad 1134, and the ground strap 1136 are initially formed as a three-part layer consisting of copper, covered by nickel, covered by a thin layer of gold. The nickel protects the copper surface and protects the sensor array 1044 from undue wear and tear. The thin gold layer allows other parts of the sensor array circuit to be soldered onto the sensor array circuit board 1084. Over time, the gold layer covering the sensor array elements 1130, 1132A–1132M, 1134, and 1136 wears away leaving only the nickel-coated copper layer. The thin gold layer over the sensor array elements 1130, 1132A–1132M, 1134, and 1136 thus serves as a sacrificial mask while the thin gold layer on other portions of the sensor array circuit board 1084 permits soldering of other sensor head components.

It has also been found that, because of the close physical contact between the sensor array 1044 and the document being tested, irregularities along the top surface 1138 of the sensor array circuit board 1084 can cause the document to become jammed in the document channel 1038 (shown in FIG. 97). Consequently, care must be taken in fabricating the sensor array circuit board 1084 to ensure that the sensor array elements 1130, 1132A–1132M, 1134, and 1136 are essentially flush with the top surface 1138 of the sensor array circuit board 1084. Preferably, the sensor array elements 1130, 1132A–1132M, 1134, and 1136 project less than 0.00006 inches from the top surface 1138. If necessary, a non-conductive epoxy film can be applied to the top surface 1138 to achieve this goal.

The general operation of the electronic verification 1000 to measure the electrical signature and other verification data of a document will now be explained with reference to the ticket 700, shown in FIG. 49. Referring now to FIGS. 96–100, the document to be tested, such as the ticket 700, is placed in the document ticket slot 1022 so that the back 822 of the ticket 700 faces the front portion 1034 of the frame structure 1002. The ticket 700 drops into the document channel 1038 until it reaches the top of the pressure roller 1056. At this point, the first edge detector 1062 signals the support microcontroller 1102 that the ticket 700 is present in the document channel 1038. Consequently, the support microcontroller 1102 provides a first pulse rate to the stepper motor 1058 which rotates the pressure roller 1056 at a first rate to move the ticket 700 down the ticket channel 1038 past the sensor head 1036. In the preferred embodiment of the invention, the stepper motor 1058 advances the ticket 700 in discrete steps of about 0.02 inches per step. The first pulse rate supplied by the support microcontroller 1102 preferably is 300 steps per second. Thus, the pressure roller 1056 initially moves the ticket 700 in the document channel 1038 at a rate of about six inches per second. As soon as the stepper motor 1058 has been activated, the support microcontroller 1102 activates the sensor array circuit board 1084 so that the sensor array 1044 measures the electrical signature of the ticket 700. The electronic verification machine 1000 measures the electrical signature of the document being tested, such as the ticket 700, by capacitively coupling an excitation signal from the triangular waveform generator 510 (shown in FIGS. 40, 41, and 101) to the document via the excitation plate 1130. Since there are thirteen sensor plates 1132A–1132M, the sensor array 1044 provides thirteen sensed electrical signature values for each step of the stepper motor 1058. The thirteen sensed electrical values are forwarded to associated amplifiers. The processed signal is then sampled by the 8-bit A/D converter 1112. The 8-bit values of the sampled signals are then passed to the primary microcontroller 1104 for analysis.

As the stepper motor 1058 moves the ticket 700 through the document channel 1038 at the first pulse rate, the leading edge of the ticket 700 eventually passes the second edge detector 1064 and thereby activates the second edge detector 1064. The stepper motor 1058 then continues to move the ticket 700 through the document channel 1038 via the pressure roller 1056 until the support microcontroller 1102 determines that the bar code 730, which is printed on the ticket identification portion 708 (shown in FIG. 49) of the ticket 700, is in position for reading by the bar code reader 1070. The bar code 730 is printed on the ticket 700 at a predetermined position, relative to the leading and following edges of the ticket 700. Since the ticket 700 moves through the document channel 1038 at a pre-determined rate, in this case a rate of 0.02 inches per step, the location of the leading edge of the ticket 700 involves simply counting the number of stepper motor steps which have occurred since the second edge detector 1064 was activated. Once the ticket 700 is in position for the bar code reader 1070 to read the bar code 730, the support microcontroller 1102 provides a second pulse rate to the stepper motor 1058 so that the ticket 700 moves at a second pre-determined rate while the bar code 730 is being read. The bar code reader 1070 operates at a pre-determined rate which, in the preferred embodiment of the invention is thirty Hertz. Consequently, the rate at which the ticket 700 moves past the bar code reader 1070 must be slower than the initial rate at which the ticket 700 moves through the document channel 1038 to ensure an accurate reading of the bar code 730. Therefore, in the preferred embodiment of the invention, the second pulse rate provided by the support microcontroller 1102 is 15 steps per second so that the bar code 730 on the ticket 700 moves past the fixed bar code reader 1070 at a rate of 0.3 inches per second. If the bar code reader 1070 is not able to read the bar code 730, the stepper motor 1058 continues to move the ticket 700 at the second rate until the support microcontroller 1102 determines that the bar code 730 has moved completely past the bar code reader 1070. Since the bar code 730 has a pre-determined height, determining that the bar code 730 has moved past the bar code reader 1070 involves counting the stepper motor steps which have occurred since the support microcontroller 1102 initiated the second pulse rate. If the bar code reader 1070 still has not been able to read the bar code 730, the support microcontroller 1102 stops the stepper motor 1058 and sends a reverse pulse rate to the stepper motor 1058 so that the ticket 700 is moved back out through the document slot 1022, thereby alerting the operator that the bar code 730 has not been read.

Once the bar code 730 is read by the bar code reader 1070, the support microcontroller 1102 again sends the first pulse rate to the stepper motor 1070 to move the ticket 700 through the document channel 1038 at the first rate until the following edge of the ticket 700 passes the first edge detector 1062 and thereby inactivates the first edge detector 1062. The support microcontroller 1102 then calculates the number of additional stepper motor steps needed to move the ticket 700 past the sensor head, based on the pre-determined distance between the first edge detector 1062 and the second edge detector 1054. The stepper motor 1070 then continues to move the ticket 700 at the first pre-determined rate for the calculated number of stepper motor steps needed for the ticket 700 to clear the sensor head 1102. At this point, the support microcontroller 1102 deactivates both the stepper motor 1058 and the sensor head 1036. The measured electrical signature value of the document being tested is then transmitted the primary microcontroller 1104 for verification analysis.

In addition to providing document position information to the support microcontroller 1102 while the ticket 700 is being read by the electronic verification machine 1000, the edge detectors 1062 and 1064 also provide information which controls how the support microcontroller 1102 responds if the ticket 700 becomes jammed in the electronic verification machine 1000. For example, the operator may inadvertently place an improperly sized document into the electronic verification machine 1000. If the document is too short, the first edge detector 1062 can become deactivated before the leading edge of the document passes the second edge detector 1064 and the document can become jammed in the document channel 1038. The support microcontroller 1102 uses the pre-determined distance between the first edge detector 1062 and the second edge detector 1064 to determine if a short ticket has been inserted into the electronic verification machine 1000. The number of stepper motor pulses needed to move the leading edge of a document from the first edge detector 1062 to the second edge detector 1064 is pre-determined by the distance between the first edge detector 1062 and the second edge detector 1064 and by the size of each stepper motor step. If the first edge detector 1062 is deactivated before the second edge detector 1064 is activated, the document must be less than 1.478 inches long. Once the leading edge of the document activates the second edge detector 1064, 0.73 inches of the ticket must have moved from the tangent point of the pressure roller 1056 to the second edge detector 1064, leaving at most 0.75 inches of the ticket to be moved through the document channel 1038 past the second edge detector. As previously stated, the first pre-determined pulse rate moves the document at 0.02 inches per stepper motor step. Consequently, the support microcontroller 1102 continues to provide the first pulse rate to the stepper motor for an 38 additional stepper motor steps, at which time the document should be past the second edge detector 1064 and free of the document channel 1038.

The edge detectors 1062 and 1064 can also be used to provide data that helps to verify the authenticity of the document being tested. For example, when the document being tested is a probability game lottery ticket, such as the ticket 700, the size of the ticket 700 can be used to help determine if the ticket is authentic. Once the ticket has passed completely though the document channel 108, the size of the ticket can be determined by counting the number of stepper motor steps which have occurred between the activation and deactivation of the second edge detector 1064. The measured value for the size of the ticket 700 can then be compared to a pre-determined value for the size of the ticket 700 to provide an additional parameter by which the authenticity of the ticket 700 can be tested.

B. Determining the Electrical Signature

Figure 101:
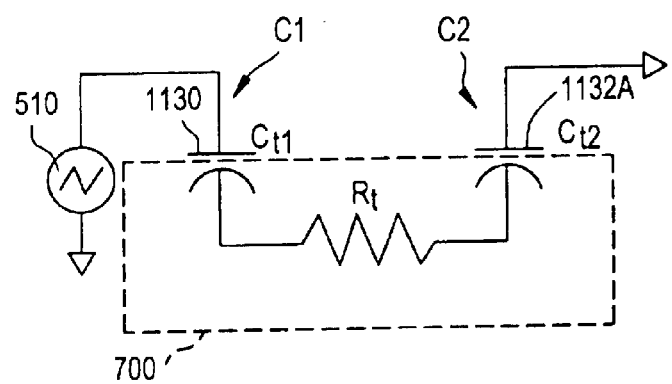
FIG. 101 is a simplified partial circuit diagram of the capacitive coupling between the sensor head in FIG. 100 and a document being tested.

One of the objects of the electronic verification machine 1000 is to determine the electrical signature of the document being tested. When the document being tested consists of a probability game ticket, such as the ticket 700 (shown in FIG. 49), the electrical signature consists of a two-dimensional array or grid which represents the location and amount of conductive material found on the document. The sensor array 1044 of the electronic verification machine 1000 is used to scan the playing field portion 706 and the ticket identification portion 708 of the ticket 700 to determine the amount and location of conductive materials and to generate a scanned data map or scratch map, such as that shown in FIG. 45. The primary electrical signature value that the sensor array 1044 detects is the total capacitance of the excitation plate 1130 and a given one of the sensor plates 1132A–1132M. In general, capacitance is defined by Maxwell's equation:

$$C = K\epsilon_0 (A/T)$$

where K is the dielectric constant of the insulating material separating the conductive planes of the capacitor, A is the intersecting area of the conductive planes, T is the thickness of the insulating material and $\epsilon_0$ is the permittivity of free space. When the sensor array 1044 is capacitively coupled to the document being tested, such as the ticket 700, the excitation plate 1130 and a given one of the sensor plates 1132A–1132M, such as the sensor plate 1132A, function as two capacitors C1 and C2 whose capacitance depends on the nature and amount of conductive material on the portions of the ticket 700 which underlie the excitation plate 1130 and the sensor plate 1132A. A simplified partial circuit diagram of the capacitive coupling between the sensor array 1044 and the document being tested, such as the ticket 700, is shown in FIG. 101. $C_{t1}$ represents the capacitance between the excitation plate 1130 and the document being tested and $C_{t2}$ represents the capacitance between the document and one of the sensor plates 1132A–1132M, such as the sensor plate 1132A. The portion of the ticket 700 which is intermediate the excitation plate 1130 and the sensor plate 1132A functions as a resistor having a resistance represented by $R_t$ and effectively connects in series the capacitors C1 and C2 formed at the excitation plate 1130 and the sensor plate 1132A, respectively. Consequently, the total coupling capacitance $C_{total}$ is the combined capacitances of $C_{t1}$ and $C_{t2}$. The magnitudes of $C_{t1}$ and $C_{t2}$ depend on the nature and amount of conductive material on the portions of the ticket 700 which underlie the excitation plate 1130 and the sensor plate 1132A. Referring back to FIGS. 49–71, it will be recalled that the ticket 700 is printed in several different layers. One of the conductive layers printed on the ticket 700, such the integrity circuit element 740 layer, the indicia circuit elements 732A–732H layer, or the upper blocking layer 830, serves as the conducting plane in the ticket 700 which operates with the excitation plate 1130 and the sensor plate 1132A to form the two capacitors C1 and C2. The printed layers which lie between the excitation plate 1130 and the conductive layer and which lie between the sensor plate 1132A and the conductive layer serve as the insulating medium whose thickness and dielectric constant affect the magnitudes of $C_{t1}$ and $C_{t2}$. The particular conductive layer which forms the conducting plane in the ticket 700 varies depending on the portion of the ticket 700 which is capacitively coupled to the sensor array 1044, as do the particular layers which form the insulating medium.

It will be recalled that the final form of the ticket 700 includes several different printed layers. The characteristics of the inks used to print the various layers affects the electrical signature measured by the electronic verification machine 1000. When the electronic verification machine 1000 is used to determine the electrical signature of a probability game ticket, such as the ticket 700, the preferred first layer 794 (shown in FIG. 52 is an opaque blocking layer that helps to protect the play indica 720A–H and the circuit elements 732A–H, 740, 750A, and 750B, from surreptitious detection by candling. In the presently preferred embodiment of the invention, the first layer 794 ideally is non-conductive relative to conductive layers, such as the layer of integrity circuit elements 740 and the layer of play indicia circuit elements 732A–732H. The presently preferred formulation for the ink used to print the first layer 794 is given in Table 10.

TABLE 10

Ink Formulation for the First Layer 794
(Opaque Blocking Layer 794)

| material | wt % |
| --- | --- |
| methyl Ethyl Ketone | 56.13 |
| VYHH vinyl resin | 5.58 |
| VMCA vinyl resin | 17.00 |
| Acrylic resin | 3.28 |
| Carbon Black | 9.30 |
| Diacetone alcohol | 5.00 |
| Sucrose acetate isobutyrate solution | 2.50 |
| polymeric surfactant | 1.21 |

The sheet resistivity of the ink described in Table 10 is greater than 20 MΩ/□.

The next layer printed on the ticket 700 contains the integrity circuit elements 740 as well as the data circuit elements 750A and 750B. It will be recalled that the integrity circuit elements 740 are used to determine the authenticity and integrity of the ticket identification indicia, such as the bar code 730, while the data circuit elements 750A and 750B are used to provide additional ticket authenticity and integrity information. The ink used to print the data circuit elements 740 and the data circuit elements 750A and 750B should be fairly conductive. The presently preferred formulation for the ink used to print the second layer 816 containing the integrity circuit elements 740 and the data circuit elements 750A and 750B is given in Table 11.

TABLE 11

Ink Formulation for the Second Layer 816
(the Integrity Circuit Elements 740 and
the Data Circuit Elements 750A and 750B)

| material | wt % |
| --- | --- |
| Water | 38.75 |
| Styrenated acrylic Varnish (J678) | 7.00 |
| Dimethylethanol amine | 0.25 |
| Acetylenic surfactant | 1.00 |
| Defoamer (RS576) | 0.25 |
| Carbon Black | 15.00 |
| Stryrenated acrylic emulsion (7830) | 21.75 |
| Ethyl Alcohol | 3.00 |
| Styrenated acrylic emulsion (J89) | 8.00 |
| Polyethylene wax dispersion (J28) | 5.00 |

The ink formulation given in Table 11 has a sheet resistivity less than 5 K$\Omega$/□.

Both of the inks used to print the first layer 794 and the second layer containing the integrity circuit elements 740 and the data circuit elements 750A and 750B contain carbon black. Consequently, these two layers on the ticket 700 present a dark image. The third layer 818 (shown in FIG. 58) is a masking layer which prevents visual interference from these two layers by masking the lower blocking layer 794, the integrity circuit elements 740, and the data circuit elements 750A and 750B. The third layer 818 ideally is non-conductive relative to conductive layers, such as the layer of integrity circuit elements 740 and the layer of play indicia circuit elements 732A–732H. A suitable formulation for the third layer 818 was given previously in Table 7 and has a sheet resistivity greater than $10^8$ $\Omega$/□. The fourth layer printed on the ticket 700 is a primer layer 820 that provides a suitable surface for printing the play indicia 720A–H (shown in FIG. 61). The ink used to print the fourth layer 820 should be non-conductive relative to conductive layers, such as the layer of integrity circuit elements 740 and the layer of play indicia circuit elements 732A–732H and preferably has a sheet resistivity greater than $10^8$ $\Omega$/□.

The fifth layer printed on the ticket 700 contains the play indicia 720A–720H (shown in FIG. 61). As will be recalled, a standard ink jet printing station is used to print this layer on the ticket 700. Consequently, this layer is printed with commercially available laser jet inks. The sixth layer 826 (shown in FIG. 63) is a UV seal coat layer that protects the play indicia 720A–720H and the validation number 726 against abrasion. The sixth layer 826 should also be non-conductive relative to conductive layers, such as the layer of integrity circuit elements 740 and the layer of play indicia circuit elements 732A–732H and preferably has a sheet resistivity on the order of $10^8$ $\Omega$/□. The seventh layer printed on the ticket 700 is the release coat layer 828 which, as shown in FIG. 64, is printed as discreet layer portions 828A–828H that are associated with the play indicia 720A and the discrete layer portion 828I that is associated with the validation number 726. In order not to interfere with the electrical signatures of the circuit elements 732A–H, 740, 750A, and 750B, the electrical conductivity of the release coat layer 828 should be significantly less than the electrical conductivity of the circuit elements 732A–H, 740, 750A, and 750B and preferably has a sheet resistivity of $10^8$ $\Omega$/□.

The eighth layer printed on the ticket 700 is the opaque upper blocking layer 830 (shown in FIG. 65) that helps to protect the play indicia 720A–H, the validations number 726 and portions of the circuit elements 732A–H, 740, 750A, and 750B against surreptitious detection by candling. The eighth layer 830 preferably is non-conductive relative to the conductive layers on the ticket 700, such as the layer of integrity circuit elements 740 and data circuit elements 750A and 750B and the layer of play indicia circuit elements 732A–732H. An appropriate formulation for the ink used to print the eighth layer (upper blocking layer 830) is given in Table 12. This ink formulation has a sheet resistivity of greater than or equal to 20 M$\Omega$/□. This formulation is preferred when the play indicia circuit elements 732A–732H are printed with the ink described in Table 13, below.

TABLE 12

Ink Formulation for the Eighth Layer 830
(Upper Blocking Layer 830)

| material | wt % |
| --- | --- |
| Conductive carbon black dispersion (AGC 2708 Mod III, Merit) | 30.00 |
| Heptane | 16.00 |
| Normal propyl acetate | 13.60 |
| Kraton varnish (AGC 2640) (a 25% solution of rubber copolymer) | 25.00 |
| Calcium Carbonate | 10.00 |
| PE/PTFE wax blend (PF 150) | 3.00 |
| Silicone Emulsion (DC 29) | 0.50 |
| Silicone Emulsion (DC 18) | 0.90 |
| Maleic rosin ester resin (3330 Varnish, Merit) | 1.00 |

The play indicia circuit elements 732A–732H (shown in FIG. 68) are printed on the ticket 700 as the ninth layer. The play indicia circuit elements 732A–732H are used to determine the authenticity and integrity of the play indicia 720A–720H. Consequently, the ink used to print the play indicia circuit elements 732A–732H should be fairly conductive. An appropriate formulation for the ink used to print the play indicia circuit elements 732A–732H 732H is given in Table 13. This formulation has a sheet resistivity of less than or equal to 2500 $\Omega$/□ and is particulary useful when the document, such as the ticket 700, includes a stimatization element, such as an electronic fuse junction 1146 (shown in FIG. 105 and described in more detail below.)

TABLE 13

Ink Formulation for the Ninth Layer
(Play Indicia Circuit Elements 732A–732H)

| material | wt % |
| --- | --- |
| 06-M conductive black base (Merit) | 64.00 |
| Colloid acrylic resin (Carboset 1594) | 11.00 |
| PE/PTFE wax blend (Polyfluo) | 2.00 |
| Ethanol | 3.00 |
| Acrylic microspheres (Ropaque OP 96) | 5.00 |
| Silicone emulsion (DC 29) | 1.50 |
| Surfactant (BYK 348) | 0.50 |
| Styrenated acrylic emulsion (Lucidene 604) | 10.00 |
| Water | 3.00 |

The tenth layer printed on the ticket 700 is the removable scratch off coating 846, shown in FIG. 71. The scratch-off coating 846 is printed as a continuous layer that covers the play field portion 706 of the ticket 700 and the validation number 726 within the ticket identification portion 708 of the ticket. To avoid interference with the electrical signatures of the circuit elements 732A–H, 740, 750A, and 750B, the electrical conductivity of the scratch-off coating 846 should be significantly less that the electrical conductivity of the circuit elements 732A–H, 740, 750A, and 750B and preferably has a sheet resistivity greater than $10^8$ $\Omega/\square$. Suitable scratch-off coatings are well known in the art.

The eleventh and twelfth layers printed on the ticket 700 are overprint graphic layers, such as the play spot areas 716A–H, the play spot graphics 718, the void-if-removed area 722, and the overprint graphics 724. These layers help to provide the finished appearance of the ticket 700 as shown in FIG. 49. To avoid interference with the measured electric signatures of the conductive layers on the ticket 700, such as the second layer, which contains the integrity circuit elements 740 as well as the data circuit elements 750A and 750B, and the ninth layer, which contains the play indicia circuit elements 732A–732H, these layers should be relatively non-conductive and preferably have sheet resistivities on the order of $10^8$ $\Omega/\square$. Suitable overprint graphic inks are well known in the art.

It can thus be seen that the electrical characteristics of the various layers vary from one layer to another, with some layers, such as second layer 816 containing the integrity circuit elements 740 and the data circuit elements 750A and 750B or the ninth layer containing the play indicia circuit elements 732A–732H, being relatively conductive while other layers, such as the masking layer 818 or the UV seal coat layer 826 are relatively non-conductive. The electrical characteristics of the layers printed on the ticket 700 in turn can affect the electrical signature measured by the electronic verification machine 1000. Table 14 summarizes the identity and electrical characteristics of the various layers printed on the ticket 700.

TABLE 14

Identity and Electrical Characteristics of Ticket 700 Printed Layers

| Layer Number | Identity | Sheet Resistivity |
|---|---|---|
| Layer 12 | Overprint Graphics | $\sim 10^8 \Omega/\square$ |
| Layer 11 | Overprint Graphics | $\sim 10^8 \Omega/\square$ |
| Layer 10 | Removable Scratch Off Coating 846 | $\sim 10^8 \Omega/\square$ |
| Layer 9 | Play Indicia Circuit Elements 732A–732H | $\leq 2500\ \Omega/\square$ |
| Layer 8 | Opaque Upper Blocking Layer 830 | $\geq 20\ M\Omega/\square$ |
| Layer 7 | Release Coat Layer 828 | $\sim 10^8 \Omega/\square$ |
| Layer 6 | Seal Coat Layer 826 | $\sim 10^8 \Omega/\square$ |
| Layer 5 | Play Indicia 720A–720H | $\sim 10^8 \Omega/\square$ |
| Layer 4 | Primer Layer 820 | $\sim 10^8 \Omega/\square$ |
| Layer 3 | Masking Layer 818 | $\sim 10^8 \Omega/\square$ |
| Layer 2 | Integrity Circuit Elements 740 | $<5000\ \Omega/\square$ |
| Layer 1 | Opaque Blocking Layer 794 | $>20\ M\Omega/\square$ |

[Left Tab]Although the final form of the preferred embodiment ticket 700 includes all of the layers 1 through 12, specific portions of the ticket 700 may contain only a few of the layers because some of the layers are printed as discontinuous patterns or as discreet layer portions. For example, the ninth layer is composed of the individual play indicia circuit elements 732A–732H and therefore is not a continuous layer. Similarly, the release coat layer 828 is printed as discreet layer portions 828A–828H that are associated with the play indicia 720A and the discrete layer portion 828I that is associated with the validation number 726. Consequently, there are several different printed layer patterns on the ticket 700, each of which can have different electrical signatures. Variations in the structure of the ticket 700 as described above might be desirable based on the configuration, use, or method of manufacture of such probability-type lottery tickets or similar documents utilizing conductive elements.

Figure 102A:
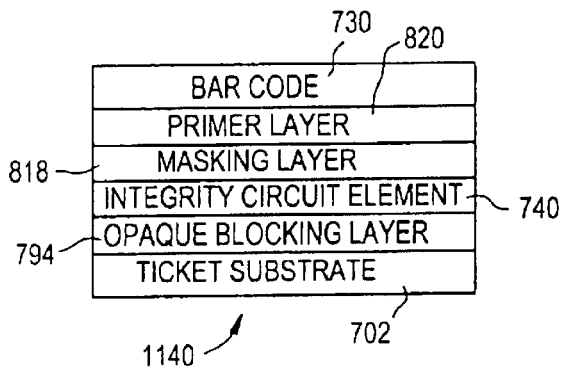
FIG. 102A is a plan view of a first printed layer pattern that can be used with the electronic verification machine in FIG. 96.
Figure 102B:
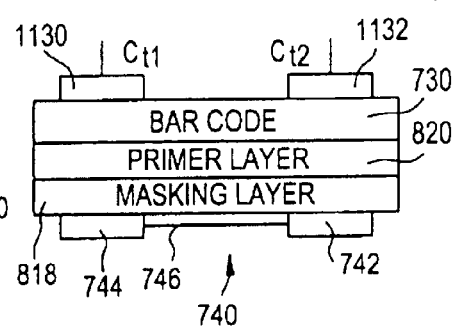
FIG. 102B is a conceptual representation of two capacitors which are formed when the sensor array of the electronic verification machine in FIG. 96 is capacitively coupled to a document which contains the first printed layer pattern shown in FIG. 102A.

The printing sequence described with reference to FIGS. 49–77 results in at least three general types of printed layer patterns on the ticket substrate 702, as shown in FIGS. 102A–104B. Referring to FIG. 102A, a first printed layer pattern 1140 consists of the first opaque blocking layer 794, the layer containing the integrity circuit element 740, the masking layer 818, the primer layer 820, and the layer containing the bar code 730. The first printed layer pattern 1140 is formed on the ticket identity portion 708 (shown in FIG. 49) of the ticket 700. FIG. 102B is a conceptual representation of the two capacitors which are formed when the excitation plate 1130 and the sensor plate 1132A are capacitively coupled to a portion of the ticket 700 which contains the first printed layer pattern 1140. The capacitive pick-up area 744 of the integrity circuit element 740 forms the conducting plane in the ticket 700 that couples with the excitation plate 1130 to form the first capacitor. The capacitive pick-up area 742 of the integrity circuit element 740 forms the conducting plane in the ticket 700 that couples with the sensor plate 1132A to form the second capacitor. The resistive element 746 of the integrity circuit element 740 functions as the resistor that connects the two capacitors in series. The masking layer 818, the primer layer 820, and the layer containing the bar code 730 serve as the insulating medium which is interposed between the excitation plate 1130 and the capacitive pick-up area 744 and which is interposed between the sensor plate 1132A and the capacitive pick-up area 742. The thickness of the masking layer 818, the primer layer 820, and the layer containing the bar code 730 and the dielectric constant of the masking layer 818, the primer layer 820, and the layer containing the bar code 730 affect the magnitude of the capacitances $C_{r1}$ and $C_{r2}$ formed at the excitation plate 1130 and the sensor plate 1132A.

Figure 103A:
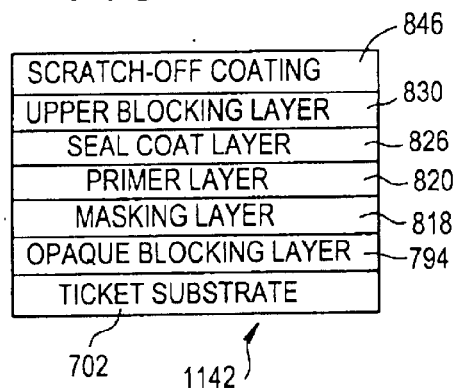
FIG. 103A is a plan view of a second printed layer pattern that can be used with the electronic verification machine in FIG. 96.
Figure 103B:
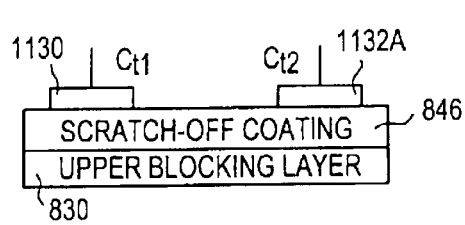
FIG. 103B is a conceptual representation of two capacitors which are formed when the sensor array of the electronic verification machine in FIG. 96 is capacitively coupled to a document which contains the second printed layer pattern shown in FIG. 103A.

A second printed layer pattern 1142, shown in FIG. 103A, consists of the first opaque blocking layer 794, the masking layer 818, the primer layer 820, the seal coat layer 826, the upper blocking layer 830, and the scratch-off coating 846. The second printed layer pattern 1142 is formed on the playing field portion 706 of the ticket 700 in locations where there are no play indicia, such as the portion of the ticket 700 between the play spot area 716B and the play spot area 716C (shown in FIG. 49). FIG. 103B is a conceptual representation of the two capacitors which are formed when the excitation plate 1130 and the sensor plate 1132A are capacitively coupled to a portion of the ticket 700 which contains the second printed layer pattern 1142. The upper blocking layer 830 serves as both the conductive plane in the ticket 700 and the resistor which connects the two capacitors in series. The scratch-off coating 846 and any overprint graphics serve as the insulating medium interposed between the excitation plate 1130 and the upper blocking layer 830 and which is interposed between the sensor plate 1132A and the upper blocking layer 830. Consequently, the thickness of the scratch-off coating 830 and any overprint graphics and the dielectric constant of the scratch-off layer 830 and any overprint graphics affect the magnitude of the capacitances $C_{r1}$ and $C_{r2}$ formed at the excitation plate 1130 and the sensor plate 1132A.

Figure 104A:
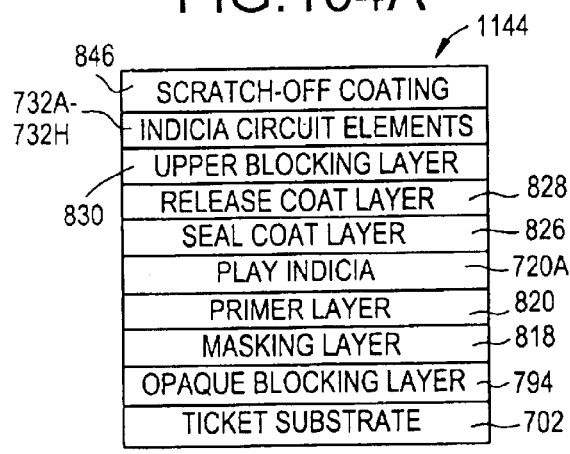
FIG. 104A is a plan view of a third printed layer pattern that can be used with the electronic verification machine in FIG. 96.
Figure 104B:
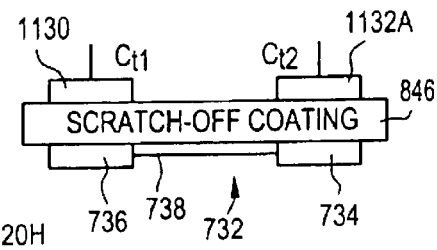
FIG. 104B is a conceptual representation of two capacitors which are formed when the sensor array of the electronic verification machine in FIG. 96 is capacitively coupled to a document which contains the third printed layer pattern shown in FIG. 104A.

A third printed layer pattern 1144, shown in FIG. 104A, consists of the blocking layer 794, the masking layer 818, the primer layer 820, the layer containing the play indicia 720A–720H, the seal coat layer 826, the release coat layer 828, the upper blocking layer 830, the layer containing the indicia circuit elements 732A–732H, and the scratch-off coating 846. The third printed layer pattern 1144 is formed on the playing field 706 portion of the ticket 700 at each of the play spot areas 716A–716H. FIG. 104B is a conceptual representation of the two capacitors which are formed when the excitation plate 1130 and the sensor plate 1132A are capacitively coupled to a portion of the ticket 700 which contains the third printed layer pattern 1144. The capacitive pick-up area 736 of any given indicia circuit element 732A–732H forms the conducting plane in the ticket 700 that couples with the excitation plate 1130 to form the first capacitor. The capacitive pick-up area 734 of the given one of the indicia circuit elements 732A–732H forms the conducting plane in the ticket 700 that couples with the sensor plate 1132A to form the second capacitor. The resistive element 738 of the given one of the indicia circuit elements 732A–732H serves as the resistor that connects the two capacitors in series. The scratch-off coating 846 and any overprint graphics serve as the insulating medium interposed between the excitation plate 1130 and the capacitive pick-up area 736 and which is interposed between the sensor plate 1132A and the capacitive pick-up area 734. Consequently, the thickness of the scratch-off coating 830 and any overprint graphics and the dielectric constant of the scratch-off layer 830 and any overprint graphics affect the magnitude of the capacitances $C_{t1}$ and $C_{t2}$ formed at the excitation plate 1130 and the sensor plate 1132A.

As stated earlier, there are thirteen sensed electrical values for each step of the stepper motor 1058. The stepper motor 1058 advances the document being tested, such as the ticket 700, in discreet steps of 0.02 inches each. The number of scan rows for a given document, such as the ticket 700, can be determined by the following equation:

Scan Rows=H/0.02 inches where H is the height of the document in inches. The thirteen electrical values for each step of the stepper motor 1058 correspond to the $C_{total}$ across each one of the thirteen sensor plates 1132A–1132M and the excitation plate 1130. $C_{total}$ between any given one of the sensor plates 1132A–1132M, such as the sensor plate 1132A, and the excitation plate 1130 in turn depends upon the nature of the printed layer patern, such as the printed layer patterns 1140, 1142, and 1144, that underlie the sensor plate 1132A and the excitation plate 1130. Each step of the stepper motor 1058 yields thirteen more electrical values, each of which can be different due to differences in the printed layer patterns which underlie each of the thirteen sensor plates 1132A–1132M. The resulting electrical signature is a two-dimensional array or grid, where the x-axis represents the 13 electrical values for each step of the stepper motor 1058 and the y-axis represents the position of the sensor array 1044 in stepper motor steps. The two dimensional array constitutes a scanned data map, such as the scanned data map 634 shown in FIG. 45, which represents the location and amount of conductive material on the tested document.

When the document being tested is a probability game lottery ticket, such as the ticket 700, the scanned data map, such as the map 634 (FIG. 45), is compared to a game signature map, such as the map 632 shown in FIG. 44, to determine the authenticity of the document. The electronic verification machine 1000 downloads the game signature map from the central site computer via the modem 1126 and stores the game signature map in the memory 1116 of the primary microcontroller 1104. Each game signature map contains a series of vectors that define information about the sensed electrical values in a given area of the ticket 700. The area of the vectors is defined as a channel number (x-axis) by stepper motor steps (y-axis). The sensed electrical values are provided by the 8-bit A/D converter 1112 in the support microcontroller 1102. In the preferred embodiment of the invention, there are three general types of vectors: a Latex Vector, which corresponds to the electrical integrity of the printed layer patterns, such as the patterns 1140, 1142, and 1144, on the ticket 700; a Paper Vector, which is used to determine the thickness of the paper stock of the ticket 700 and to sense an object pushing the Latex Sensor off the paper substrate; and a Ghost Vector, which is used to provide protection against photocopies of the ticket 700.

The software program that compares the scanned data map, such as the map 634 (FIG. 45) with its associated game signature map, such as the map 632 (FIG. 44) is called Electronic Latex Validation Software or ELVIS. ELVIS is stored in the flash memory portion of the memory 1116 in the primary microcontroller 1104. After the ticket 700 has been successfully scanned by the electronic verification machine 1000, ELVIS is called to analyze the scanned data map of the ticket 700. ELVIS begins by extracting the first three digits of the bar code to determine the game number of the ticket 700. ELVIS uses the extracted game number to find the associated game signature map in the SRAM portion of the memory 1116 of the primary microcontroller 1104. If there is no game signature map for the extracted game number, ELVIS aborts processing the ticket 700 and transmits a No Signature Map error message to the display panel 1012. The operator is then prompted to manually enter the three-digit security number of the ticket 700 via the numeric keypad 1018.

Once ELVIS has retrieved a game signature map that corresponds to the document being tested, such as the ticket 700, ELVIS then counts the total number of scan rows to determined the size of the ticket 700. If the ticket is found to be too big or too small, ELVIS aborts processing the ticket and transmits a Ticket Too Big/Small error message. However, if the size of the ticket 700 is acceptable, ELVIS then analyzes the three vector types for the ticket 700. The testing criteria used by ELVIS depends on the vector type. For Latex Vectors, Elvis first adds all latex vectors together to determine the total "Play area." After the total "Play Area" is determined, ELVIS applies a minimum and maximum pixel count criteria to determine if the total "play area" is in compliance. Alternatively, in some circumstances a maximum pixel count alone can suffice. For Paper and Ghost Vectors, ELVIS will reject the ticket 700 if the testing criteria for either of these vectors is not met. ELVIS first analyses the Paper Vectors areas of the ticket 700 to determine if the signals are acceptable. Assuming that there are no Paper Vector errors, ELVIS will sum all of the Latex Vectors to determine the status of the printed layer patterns, such as the patterns 1140, 1142, and 1144, within the play field portion 706 of the ticket 700. If the Latex Vectors are found to be acceptable ELVIS examines the Ghost Vectors of the ticket 700 to determine if some of the removable scratch-off coating 846 remains in any played portion of the ticket 700. If all of the above vector tests are passed, ELVIS concludes that the ticket 700 is authentic and has been validly played.

C. Stigmatization

In addition to measuring the electronic signature of the document being tested, the electronic verification machine 1000 also can stigmatize the document. As explained earlier in Section VI., stigmatization refers to a process by which a document, such as the ticket 700, which has already been tested by the electronic verification machine 1000 is "marked." In the case of game tickets, such as the ticket 700, stigmatization prevents winning tickets from being presented multiple times to be paid. A successful stigmatization scheme has several attributes. The stigmatization should be automatic: if human intervention is required to stigmatize the document errors can occur when the stigmatization is not done correctly. The stigmatization should also be difficult to circumvent. Preferably, the stigmatization equipment should require minimum maintenance. In addition, the stigmatization preferably permits monitoring of tested documents so that attempts at fraudulent redemption can be detected. Consequently, it is desirable that the stigmatization be difficult to detect.

Currently accepted practices for stigmatizing a game ticket, such as the ticket 700, include visually marking the ticket, for example by stamping the ticket with the words "PAID VOID". Alternatively, it is common for winning tickets to be destroyed once they have been redeemed. However, since both of these stigmatization schemes require human intervention, the possibility exists that a winning ticket will not be stigmatized correctly and can then be presented multiple times for payoff. In addition, these stigmatization schemes do not permit monitoring of paid tickets so that attempts at fraudulent redemption can be detected. Another accepted practice is to maintain a paid ticket file in a central computer. Although such a scheme does not necessarily require human intervention and cannot be easily detected, such a stigmatization scheme requires that the ticket redemption terminal maintains a constant link with the central computer and such on-line linkages can be quite costly. As mentioned previously in Section IV., another method for stigmatizing a ticket involves automatically colorizing at least a portion of the ticket once it has been presented for redemption. For example, a portion of the document could be printed with an invisible ink that is thermally sensitive. Once the ticket is presented for redemption, power applied by the ticket terminal could be used to generate sufficient heat to change the color of the invisibly printed portion, thereby automatically stigmatizing the ticket. This scheme, however, has several disadvantages. The stigmatization is not difficult to detect, consequently this stigmatization scheme does not permit monitoring of paid tickets so that attempts at fraudulent redemption can be detected. Moreover, since heat is used as the method for activating the invisible ink and stigmatizing the ticket, heat sources other than the lottery terminal can inadvertently result in ticket stigmatization, for example, when the ticket is left in a closed car on a hot day.

Figure 105:
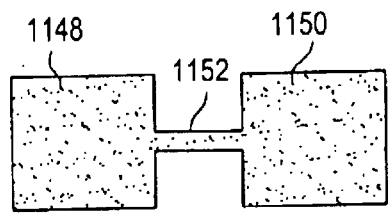
FIG. 105 is an example of a printed circuit element that can be electronically altered by the electronic verification machine in FIG. 96, to stigmatize a document being tested.

Referring back to FIG. 100, the fuse excitation pad 1134, together with the sensor pad 1132M of the sensor array 1044 in the electronic verification machine 1000 can be used to electronically stigmatize a document, such as the ticket 700. The fuse excitation pad 1134 provides a high voltage excitation signal which is used to alter the state of a printed circuit element on the document. An example of a printed circuit element that can be electronically altered by the electronic verification machine 1000 is shown in FIG. 105, where the printed circuit element is an electronic fuse junction or fuse 1146. The electronic fuse junction 1146 includes an excitation pick-up area 1148 and a sensor pick-up area 1150 connected by a fuse link 152. As explained in more detail below, the electronic verification machine 1000 provides sufficient energy to the electronic fuse junction 1146 via the fuse excitation pad 1134 (shown in FIG. 100) to open the fuse link 1152 between the excitation pick-up area 1148 and the sensor pick-up area 1150. As described in detail below, direct measurement circuitry in the electronic verification machine 1000 has the capability of checking the state of the electronic fuse junction 1146. An open electronic fuse junction 1146, where the fuse link 1152 is not present, normally indicates that the document has already been tested by the electronic verification machine 1000. On the other hand, a closed electronic fuse junction 1146 indicates that the document has not been previously tested by the electronic verification machine 1000.

An important feature of the electronic fuse junction 1146 is that it changes its binary status, from closed to open, when the electronic verification machine 1000 applies an energy pulse via the fuse excitation pad 1134. Therefore the composition and configuration of the electronic fuse junction 1146 is selected such that the electronic fuse junction 1146 changes its binary status upon receipt of the energy pulse rather than simply absorbing the energy pulse through, for example, heat transfer to the substrate or other materials on the document. It is desirable to make the time duration of the energy pulse provided by the electronic verification machine 1000 as short as possible, for example, on the order of 0.1 seconds. By the same token, to minimize heat transfer to the ambient surroundings the fuse link 1152 should be as small as possible. In addition, the electronic fuse junction 1146, including the fuse link 1152, preferably is formed from a material that has a reasonably high resistance so that the current flow through the fuse link 1152 will generate enough heat to break the conductive path.

When the electronic fuse junction 1146 is printed on probability game tickets, such as the ticket 700, there are additional attributes that the electronic fuse junction 1146 should have. For example, the electronic fuse junction 1146 should be formed from a material that is not hazardous to the environment or to humans. The electronic fuse junction 1146 also should be formed from a material that can be printed with a Gravure, Offset, or Lithograph printing press. It is also desirable that the electronic fuse junction 1146 should be formed from a material which is already being used on the ticket 700, to avoid having to add an additional printing station.

In one example, the electronic fuse junction 1146 is printed on the document using an ink that has a sheet resistivity in a range of from about 800 $\Omega/\square$ to about 2.4 K$\Omega/\square$. Preferably, the ink used to print the electronic fuse junction 1146 has a sheet resistivity on the order of 2.4 K$\Omega/\square$. Along with the above discussed criteria, the dimensions of the fuse link 1152 are determined by a number of additional factors, including by the printing press resolution, the characteristics of the ink used to print the electronic fuse junction 1146, the dimensions of the sensor plates 1132A–1132M in the sensor array 1044, and the characteristics of the substrate on which the electronic fuse junction 1146 is printed. In the example of the electronic fuse junction 1146 printed on a probability game ticket, such as the ticket 700, the vertical dimension of the excitation pick-up area 1148 preferably is about 0.24 inches, as is the vertical dimension of the sensor pick-up area 1150. The horizontal dimension of the excitation pick-up area 1148 preferably is about 0.10 inches, as is the horizontal dimension of the sensor pick-up area 1150. The vertical dimension of the fuse link 1152 preferably is about 0.02 inches and the horizontal dimension of the fuse link 1152 preferably is about 0.05 inches. In addition, when the electronic fuse junction 1146 is printed on a probability game ticket, such as the ticket 700, the electronic fuse junction 1146 can be printed on the ticket 700 with the same ink used to print the play indicia circuit elements 732A–732H (shown in FIG. 50). Therefore, an additional printing station is not needed to print the electronic fuse junction 1146 on the ticket 700. When the electronic fuse junction 1146 is printed with an ink that has a sheet resistivity of 2.4 K$\Omega/\square$, for example, the ink formulation desribed in Table 13, and has the aforementioned preferred dimension the fuse link 1152 has a resistance between 6 KΩ and 16 KΩ that opens reliably with the application of 0.1 joules of energy expended in 0.1 second or less. It should also be pointed out that the electronic fuse junction 1146 can be printed with the same ink used to print the circuit elements on the probability game ticket 700 or with the upper conductive black ink on a conventional lottery ticket.

Figure 106:
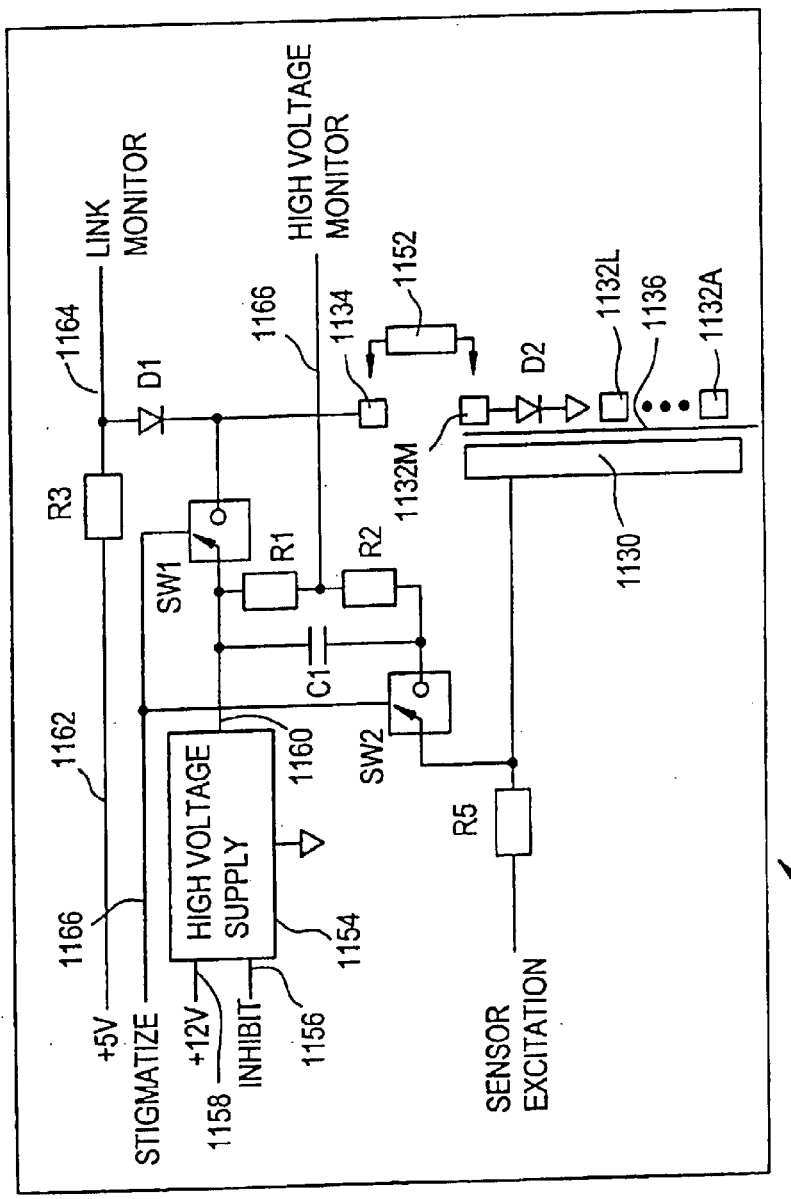
FIG. 106 is a functional block diagram of a stigmatization circuit that can be used to stigmatize a document having the printed circuit element of the type shown FIG. 105.

The functional block diagram of FIG. 106 illustrates the stigmatization circuit 1096 that can be used to stigmatize a document such as the probability ticket 700 having the electronic fuse junction 1146 of the type shown in FIG. 105. As indicated above, it has been found that the application of 0.1 joules of energy to the electronic fuse junction 1146 in approximately 0.01 seconds is enough to reliably open the fuse link 1152. To expend 0.1 joules in 0.01 seconds requires 10 watts of average power. Power in a resistor is equal to the product of the resistance and the square of the current through it. For a 16,000 Ω resistor such as the fuse link 1152, the required current is:

$$(10/16000)^{1/2}=25 \text{ mA}$$

The voltage across a resistor is equal to the product of the resistance and the current through it. In this example, the required voltage is then:

$$16000\times0.025=400 \text{ volts}$$

Thus it is possible to open a 16 KΩ fuse junction by applying 400 volts DC to the junction. Most 10-watt, 400-volt supplies, however, are large and expensive. However, storing the energy in a capacitor, such as a capacitor C1 as shown in FIG. 106, over a relatively long time period, at a relatively low charging rate, and discharging the capacitor into the electronic fuse junction 1146 quickly can substantially reduce the size and cost of the supply. The energy stored in a capacitor is equal to:

$$\text{Energy stored in cap.}=1/2 CE^2 \text{ joules}$$

Solving for C, $$C=(2E)/V^2$$

With E=0.1 joules and V=400 volts, $C_{min}$=1.25 μF. Since 1 μF capacitors are more available than 1.25 μF capacitors, the above formula suggests the use of a voltage V of at least 470 volts. With a voltage V of 500 volts the total capacitor energy will be 0.125 joules. In this case, it will take approximately 13 ms to apply 0.1 joules of energy into the fuse link 1152 which is significantly below the desired 100 ms indicated above.

It is possible to provide a 500 voltage supply that runs continuously or a voltage supply that turns on when the leading edge of a ticket passes the first edge detector. The advantage to having the voltage supply constantly operating is that the electronic fuse junction 1146 could be located anywhere on the ticket 700, including the leading edge. On the other hand, if the voltage supply is off until needed, the electronic fuse junction 1146 should be located near the end of the ticket to allow the storage capacitor time to be charged. Assuming the tickets 700 are fed into the machine 1000 one after the other, the supply should be able to recover in the time required to process a 2-inch long ticket. Given that the stepper motor moves the ticket 700 at 0.02-inch per step at approximately 300 steps per second, 0.5 seconds is available to charge the capacitor C1. Where the capacitor C1 is charged with a constant current and the actual values are V equal to 500 volts and C1 equal to 1 μF, total capacitor energy will be 0.125 joules. Approximately 13 ms are required to dump 0.1 joules into the 16,000 Ω resistor 1152. This time is well below 100 ms. Also since:

$$I=C(dv/dt)$$

$$I=(0.5)(1.0\times10^{-8})/0.5=1 mA$$

The maximum output power from the supply is thus:

$$P=IV$$

$$P=500\times0.001=0.5 \text{ watts}$$

which is 20 times smaller than the 10-watt power supply mentioned above.

It should be understood that voltage converter topology presents a variety of choices. It is possible to use a push-pull converter, boost converter, or flyback converter. In this case, there is no particular advantage to transformer isolation and the output power is low enough to make push-pull unnecessary. In order to reduce the cost of the voltage supply, a simple boost power supply using a Texas Instruments (TI) TL497 controller 1154, an off-the-shelf inductor, and 1 μF storage capacitor C1 are used in the preferred embodiment of the invention shown in FIG. 106. The supply 1154 normally will require 0.3 seconds to produce 500 volts on the capacitor C1.

Operation of the stigmatization circuit 1096 shown in FIG. 106 will now be described in connection with the operation of the electronic verification machine 1000. The supply 1154 is activated by a signal (from the support microcontroller 1102) on an inhibit line 1156 which converts a 12 volt DC voltage on a line 1158 from the system power supply (not shown) to a 500 volt voltage on an input line 1160 to the capacitor C1. The electronic fuse junction 1146 is moved by the stepper motor 1058 into position between the fuse excitation plate 1134 and the sensor pad 1132M. A voltage divider including a resistor R3 and the fuse link 1152 along with a diode D1 respond to a 5 volt signal on a line 1162, from the system power supply (not shown), to apply a voltage on a link monitor line 1164 which in turn is input to an analog to digital converter (not shown) on the support microcontroller 1102. In the event that the fuse link 1152 is open, indicating that the ticket 700 might have already been stigmatized, a voltage of 5 volts will appear on the link monitor line 1164. On the other hand, if the fuse link 1152 is still present and ignoring the resistance in the fuse link 1152 and the resistor R3, a small voltage, for example 0.6 volts will appear on the link monitor line 1164 due to the resistance in the diode D1 and a diode D2. However, if the resistor R3 has a value equal to the value of the fuse link 1152 resistance, for example 16,000K Ω, then the voltage on the link monitor line 1164 will be about 2.8 volts. One advantage of the invention is that by printing the fuse link 1152 with a known value, it is possible to significantly reduce the possibility of counterfeits by in effect measuring the resistance value of the fuse link 1152.

In one embodiment of the invention, once the value of the resistance of the fuse link 1152 is determined, the voltage of the output of the power supply 1154 can be measured using a voltage divider including a pair of resistors R1 and R2. The output of this voltage divider is applied over a high voltage monitor line 1166 to the analog to digital converter (not shown) on the support microcontroller 1102. In this manner it is possible for the support microcontroller 1102 to determine if there is sufficient charge on the capacitor C1 to blow the fuse link 1152. When the voltage on the capacitor C1 has reached a predetermined value, such as 470 volts, this voltage is applied to the fuse link 1152 via a switch SW1 and over the fuse excitation plate 1134 and the sensor pad 1132M. The switch SW1 can be a field effect transistor under control of the support microcontroller 1102 via a line 1166. It should be noted that the diode D1 serves to protect the link monitor line 1164 from the high voltage on the capacitor C1. Also, in this circuit 1096, the diode D2 prevents the current in the fuse link 1152 from pulling the pad 1132M to more than 0.7 volts above ground.

One of the advantages of the circuit 1096 shown in FIG. 106 is that the plate 1132M can be used as both a sensor plate for sensing the various criteria in the ticket 700 as described above and as ground plate for stigmatizing the ticket 700. Here a switch SW2, which also can be a field effect transistor, is switched on at the same time the switch SW1 is closed in response to the stigmatization signal on the line 1166. This prevents the current in the fuse link 1152 from returning to the sensor excitation circuit.

In the preferred embodiment, after the stigmatization voltage has been applied from capacitor C1 to the electronic fuse junction 1146, the switches SW1 and SW2 are opened and the support microprocessor 1102 measures the voltage on the link monitor line 1164. If the voltage on this line is 5 volts, indicating that the fuse link 1152 might have been blown, the ticket 700 is advanced by the stepper motor 1058 one step or 0.02 inches. The support microcontroller 1102 again measures the voltage on the link monitor line 1164 and if the voltage is significantly below 5 volts, the stigmatization process is initiated again. After five such steps without a significant drop in the voltage on the link monitor line 1164, it is assumed that the fuse link 1152 has been successfully blown. At this point, the stigmatization process has been completed and the high voltage power supply 1154 is inhibited by a signal on line 1156. One advantage of using an electronic fuse junction having dimensions larger than the excitation plate 1134 and the sensor plate 1132M, is that it is possible to test the fuse link 1152 over a number of steps to ensure that it has been opened.

The following is the preferred criteria for using the circuit such as the circuit 1096 in the electronic validation machine 1000 to stigmatize lottery tickets. Losing tickets can be stigmatized although there is no apparent advantage to doing so. Conversely, it is not apparent that there is any particular disadvantage to stigmatizing a losing ticket. Therefore, losing tickets will be stigmatized. Winning tickets should be stigmatized. In the event of a barcode misread, the ticket preferably should not be stigmatized. The electronic validation machine 1000 should back the ticket out and request a rescan. The ticket may have been inserted backward or upside down.

With respect to improperly played tickets, the general conclusion is to stigmatize all of them. Regarding counterfeit tickets and tickets that have been tampered with, as detected by measuring the electrical properties of the fuse link 1152 as described above, the ticket should not be stigmatized. Rather the ticket should be retained by the lottery agent and submitted for analysis.

D. Document Thickness Measurement

Figure 107:
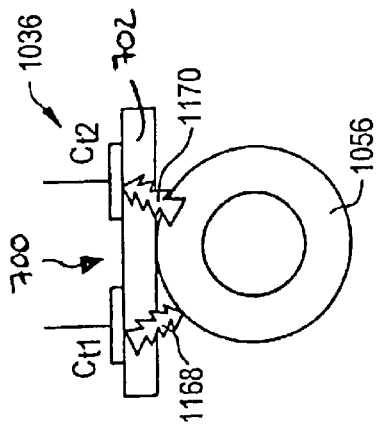
FIG. 107 is a conceptual diagram which illustrates the use of the electronic verification machine in FIG. 96 to measure the thickness of a document being tested.

FIG. 107 illustrates another significant feature of the electronic validation machine 1000 which is the capability of measuring the thickness t of the substrate of a lottery ticket and similar type documents. This feature will be described in connection with the lottery ticket 700.

As discussed above, the primary electrical signature value that the electronic validation machine 1000 utilizes is capacitance. Factors influencing capacitance listed below:

$$C = K\epsilon_0 (A/t)$$

where:
C=Capacitance (in Farads)
K=Dielectric Constant
A=Area of Electrodes (inches$^2$)
t=Electrode Spacing—dielectric thickness (inches)
$\epsilon_0$=Constant—0.225 Farad/inch When there are no conductive or semiconductive ink films located beneath the sensor head 1036 shown in FIG. 100, the electrical waves produced by the excitation bus bar 576 will penetrate through the substrate of the document such as ticket 700 and appear to reflect off of the pressure roller 1056 as indicated by a pair of arrows 1168 and 1170. Also, it should be noted that it is desirable that the pressure roller be insulated from ground to achieve this reflection effect. The reflected signal is absorbed by the channel sense capacitors 1132A–1132M and can be processed as an electrical signature for the ticket's paper stock by electronic validation machine 1000 as described above. Thus, electronic validation machine 1000 can evaluate the thickness (t) of a ticket's paper substrate as well as the composition (K) of the substrate. For the frequency range of the electrical illuminating signal used in electronic validation machine 1000 as indicated above, the dielectric constant of typical paper stock ($K_p$) will range between:

$$K_p: 3.29 \leq K_p \leq 4.8$$

As a practical matter this relative small dielectric range (1.51) for ticket paper substrates in itself has minimal impact on ticket security determination in this particular example. However, evaluation of the thickness t of the substrate can be very important to lottery ticket security. The electronic validation machine 1000 will normally read a lottery ticket's barcode to determine if the ticket 700 has winning indicia printed under its scratch-off latex. On a traditional scratch-off lottery ticket, the barcode is almost always printed on the back of the ticket. Therefore, it is possible to defraud the lottery by securing an unplayed ticket behind a properly played ticket and feeding both ticket through the electronic validation machine 1000 assuming that the electronic validation machine 1000 will scan the latex of the front ticket and the barcode on the back of the ticket.

However, by measuring the thickness t of the substrate 702 of the lottery ticket 700 at the trailing edge of the ticket where no conductive materials are located, it is possible to determine if additional material such as another ticket has been added to the ticket undergoing validation. As illustrated in FIG. 107, when scanning non-latex areas of a scratch-off the ticket 700, the paper substrate 702 functions as a large part of the coupling capacitor's dielectric. Because both the thickness (t) and dielectric constant (K) of a capacitor's dielectric affect the coupling capacitance and because the dielectric constant for a ticket's paper substrate ($K_p$) does not vary over a significant range and because the capacitance C is divided by the thickness (t) of the dielectric of the coupling capacitor increasing the influence of the dielectric's thickness (t) on the sensed coupling capacitance, the electronic validation machine 1000 can easily detect an additional ticket between the front ticket 700 and the pressure roller 1056. For example, the coupling capacitance sensed by the electronic validation machine 1000 for a single 10 point (0.01 inch) ticket substrate would be approximately:

$C = K\epsilon_0(A/t)$ $C = 4\epsilon_0(0.1/0.01)$ $C = 40\epsilon_0$

As a result, the coupling capacitance sensed by the electronic validation machine 1000 for a ticket having a substrate double the thickness of the substrate 702 of the lottery ticket 700 would be one-half of the value measured for a single ticket:

$C = 4\epsilon_0(0.01/(2 \times 0.01))$ $C = 20\epsilon_0$

Thus, the change in the sensed capacitance C and therefore a difference in the thickness (t) is readily detectable by the electronic validation machine 1000.

The composition of the pressure roller 1056 is important in making it electrically reflective. For example, if the pressure roller 1056 is made out of a typical rubber compound with carbon particles embedded in the rubber, the direct current (dc) resistivity of the pressure roller ($\rho_{roller}$) has a very high value:

$\rho_{roller} > 2 M\Omega/cm$

This is not surprising because this roller is primarily made of a rubber binder surrounding numerous carbon particles. Rubber is a commonly used insulator and has a very high dc resistivity:

$\rho_{rubber}: 8 \times 10^{12} \leq \rho_{rubber} \leq 2 \times 10^{15} \Omega/cm$ Carbon, on the other hand has a relatively low resistivity ($\rho_{carbon}$):

$\rho_{carbon} 35 K\Omega/cm$

This composite roller has a very high dc resistivity because its numerous carbon particles are encapsulated in the high resistivity rubber binder. Therefore, there is no low resistance dc path from one carbon particle to another.

However, this arrangement of carbon particles encapsulated by very thin films of rubber (micron level) causes the composite roller to exhibit a very high dielectric constant, $K_{roller} >> 300$. Apparently due to the close proximity of conductive carbon particles insulated by thin films of rubber which create a 3-dimensional network comprised of a large number of capacitors. Thus, the network consists of numerous microscopic capacitors in a complex arrangement of series and parallel Resistance Capacitance (RC) circuits.

For the excitation frequency range used in the electronic validation machine 1000, the dielectric constant of rubber compounds, excluding polysulfide rubber (K=2260), ranges from a low of 2.38 (Butyl rubber) to a high of 6.60 (Neoprene rubber). Assuming a rubber dielectric of K=6.60 (for neoprene,) the capacitance between the carbon particles would not be large unless the thickness of the dielectric is very small. Preferably, the best way to obtain small dielectric spacing is with high carbon loading, that is the percentage of carbon particles relative to rubber binder contained in the composite roller material. By increasing the percentage of carbon particles relative to rubber binder the spacing between the individual carbon particles will be reduced. Thus, it is believed that the very small spacing between the conductive carbon particles causes the pressure roller to effectively exhibit an extremely high dielectric constant. As a result, the preferred composition of the pressure roller 1056 is a nonconductive elastomeric material, such as rubber, encapsulating a large number of conductive particles, such as carbon.

XIII. Other Applications of the Invention

The present invention is not limited to validating or determining the authenticity and integrity of probability game, pull-tab or other types of lottery tickets, but is applicable in many circumstances in which bar code readers and magnetic stripes are used. For example a document such as a stock certificate could be printed with electronic circuits similar to the resistors 82–96 printed on the lottery ticket 50 where the electrical signatures of the circuits represent verification data such as a serial number. Human readable document data such as the serial number would also be printed on the stock certificate. The electronic verification machine 108 or 500 would then electrically couple with the circuit elements as described above to generate a verification signal representing the electrical signatures and hence the verification data. Authentication of the certificate is then accomplished by the processor board 220 or terminal 532 which relates or compares the verification signal to a data signal representing the document data. The data signal can be generated by an optical character reader or a user interface such as the keyboard 178. In this manner the electronic document machine can verify that the serial number printed on the certificate is the correct one for the certificate and thus authenticate the document.

It will then be appreciated that the present invention will have utility in a variety of areas including coupon redemption, inventory security, airport tracking systems, magnetic stripes, currency security, compact disk security, drivers license and passport security. Coupon fraud is a serious problem for the retail industry. Current estimates of money lost to coupon fraud range in the hundreds of millions of dollars. Moreover, with the advent and growth of desk-top publishing and color-photocopiers, the opportunities for coupon fraud as well as other types of document fraud will increase. The present invention can be used to stem the growth of coupon fraud. Providing coupons with an electrical signature by printing at least a portion of an electric circuit on the coupons, according to the invention, would provide the ability to verify the authenticity of the coupons submitted for payment. Further, by utilizing the stigmatizing technique described above it will be possible to prevent coupons from being redeemed more than once. As to inventory security, the circuits according to the present invention can be printed directly on an inventory ticket, price tag or manufacturer's tag thus supplanting the use of metal strips and coils. Airline ticket fraud, which may also cost hundreds of millions of dollars annually, present another application for the present invention. Circuits according to the present invention could be used to ensure the authenticity and integrity of airline tickets. In addition, the present invention could be used to track the luggage associated with airline travel. The present invention can also be used as an effective alternative to magnetic stripes. Magnetic stripes contain identification numbers, for example, credit card numbers, that are programmed at manufacture. The stripes are prone to failure and are subject to fraud because they are easily copied or modified. To overcome these shortcomings, circuits according to the present invention could be printed on a substrate and encoded with specific customer information. Thus the present invention can be used to improve the security of credit cards, automatic teller machine ("ATM") cards, and any other tracking card which uses magnetic stripes as a security measure. The present invention can also be used to mitigate the losses resulting from currency fraud which includes, for example, counterfeit currency, and check forgery. Counterfeiting of these documents could be reduced if the documents were provided with an electrical signature or conductive fibers as described above. The invention could be used in the same manner to improve the security of drivers licenses and passports. The invention could also be used to provide inventory control of compact disks which, because of their small size, are subject to theft. Circuits according to the present invention, which included RF devices, could be used to track the compact disks and to prevent their clandestine removal.

Although the present invention has been described with reference to preferred embodiments, it will be understood that various changes and modifications will be suggested to one skilled in the art and it is intended that the invention encompass such changes and modifications as fall within the scope of the appended claims.

We claim:

1. A system for electronically validating a probability lottery ticket having a plurality of player removable play spots covering play indicia wherein the lottery ticket has more than one potential redemption value and wherein the ticket redemption value depends upon which of the play indicia are covered by play spots that have been removed, comprising:

ticket data, relating which of the play indica are located under which of the play spots, printed on the lottery ticket; and an electronic validation machine, including a detector for determining which of the play spots have been removed from the lottery ticket, a data reader for reading said ticket data and a microprocessor operatively connected to said detector and said data reader wherein said microprocessor computes from said play spots that have been removed from the lottery ticket in combination with said ticket data the ticket redemption value based the indicia under said play spots which have been removed.

2. The system of claim 1 wherein different combinations of said player indicia represent different winning ticket redemption values.

3. The system of claim 1 wherein said electronic validation machine invalidates the lottery ticket if more than a predetermined number of the play spots have been removed.

4. The system of claim 1 wherein the probability lottery ticket includes a player removable material including the player removable play spots and said electronic validation machine includes:

a memory containing a data bit map representing at least a portion of the player removable material that has been removed, said memory further containing data representing validation data; and wherein said microprocessor is operatively connected to said memory for comparing said data bit map to said data representing validation data according to a predetermined criteria to validate the lottery ticket.

5. The system of claim 4 wherein said predetermined criteria includes a location of the portion of the player removable material that has been removed.

6. The system of claim 4 wherein said predetermined criteria includes a shape of the portion of the player removable material that has been removed.

7. The system of claim 4 wherein said predetermined criteria includes an expected percentage of removal of the player removable material.

8. The system of claim 7 wherein said percentage represents a minimum percentage of the player removable material for a played lottery ticket.

9. The system of claim 8 wherein said minimum percentage is 30 percent.

10. The system of claim 4 wherein said data representing validation data is contained in said memory as a game bit map and said processor compares said data in said game bit map to said data in said data bit map.

11. The system of claim 4 further including means to stigmatize the lottery ticket.

12. The system of claim 1 wherein said detector includes:
   a source of electromagnetic energy; and
   a detector circuit including an array of photo-detectors responsive to said electromagnetic energy, said detector circuit generating a verification signal indicating which of the player removable spots have been removed from the lottery ticket.

13. The system of claim 12 wherein said validation circuit includes a display for displaying said ticket redemption value.

14. The system of claim 12 further including a transport mechanism for moving the play spots past said array of photo-detectors.

15. The system of claim 12 wherein computes said ticket redemption value from said verification signal and said ticket data.

16. The system of claim 12 further including means for stigmatizing the lottery ticket.

17. The system of claim 1 wherein said detector includes a source of electromagnetic energy.

18. The system of claim 17 wherein said lottery ticket includes at least one combination of said play spots representing a winning play redemption value.

19. The system of claim 17 wherein said lottery ticket includes a plurality of circuit elements and wherein at least one of said circuit elements is associated with each of said play spots on said lottery ticket.

20. The system of claim 17 wherein said detector includes a set of sensors adapted to detect and classify a frequency of electromagnetic radiation emitted by said lottery ticket in response to said electromagnetic energy.

21. The system of claim 20 wherein the frequency of electromagnetic radiation sensed by said sensors is in the optical range of the electromagnetic spectrum.

22. The system of claim 20 wherein the frequency of electromagnetic radiation sensed by said sensors is in the infrared range of the electromagnetic spectrum.

23. The system of claim 20 wherein the frequency of electromagnetic radiation sensed by said sensors is between 50 KHz and 150 KHz.

24. The system of claim 20 wherein said validation means includes means to stigmatize said lottery ticket.

25. The system of claim 1 wherein said ticket data includes redemption information;

wherein said detector includes electromagnetic sensors adapted to generate a removed spot signal identifying which of said play spots have been removed from said lottery ticket; and wherein said electronic validation machine includes a validation means that includes said microprocessor for determining the ticket redemption value wherein said ticket redemption value is determined from said redemption information and said removed spot signal.

26. The system of claim 25 wherein said detector includes at least one electrical circuit element located on said lottery ticket.

27. The system of claim 25 wherein said redemption information includes play indicia value data.

28. The system of claim 27 wherein said ticket data includes a plurality of play indicia value data corresponding to different combinations of said play spots on said lottery ticket and wherein said validation means determines said ticket redemption value from said plurality of play indicia value data.

29. The system of claim 28 wherein said validation means additionally includes a display for displaying said ticket redemption value.

30. The system of claim 28 wherein said validation means additionally includes a printer for printing said ticket redemption value.

31. The system of claim 25 wherein at least one combination of said player removable play spots represents a winning ticket redemption value.

32. The system of claim 27 wherein said redemption information includes an identity number relating to said play indicia value data.

33. The system of claim 32 wherein said identity number includes a game number and a pack number.

34. The system of claim 33 wherein said identity number additionally includes a ticket number.

35. The system of claim 32 wherein said identity number includes a ticket number.

36. The system of claim 32 wherein said identity number includes a game unique validation number.

37. The system of claim 32 wherein said identity number includes a pool unique validation number.

38. The system of claim 32 wherein said identity number includes a pack unique validation number.

39. The system of claim 32 wherein said identity number includes ticket integrity data.

40. The system of claim 32 wherein said identity number includes ticket reconstruction information.

41. The system of claim 32 wherein said detector includes at least one electronic circuit on said lottery ticket associated with said player removable play spots, wherein said validation means includes a validation file containing redemption data corresponding to a plurality of said identification numbers, and wherein said validation means utilizes said validation file and said removed spot signal to generate a value representing said ticket redemption value.

42. The system of claim 41 wherein said validation file and said computer are located remote from said reader.

43. The system of claim 41 wherein said validation means includes a display for displaying said ticket redemption value.

44. The system of claim 25 wherein at least a portion of said ticket data is optically readable indicia.

45. The system of claim 44 wherein at least a portion of said ticket data includes data related to an integrity status of said lottery ticket.

46. The system of claim 44 wherein said optically readable indicia is a bar code and said reader includes a bar code reader.

47. The system of claim 44, wherein said reader includes an optical character reader.

48. The system of claim 44 wherein said optically readable indicia includes alpha-numeric characters and wherein said system further includes a keyboard for entering said optically readable indicia into said validation means.

49. The system of claim 44 wherein said ticket data is encoded in a magnetic material on the lottery ticket and wherein said system further includes a magnetic code reader.

50. The system of claim 25 including a plurality of said lottery tickets wherein said redemption information on each of said lottery tickets includes an identity number, wherein said validation means includes a central computer having a validation file containing for each of said identity numbers redemption data relating to each of said lottery tickets and wherein said central computer determines said ticket redemption value from said removed spot signal, said identity number, and said redemption data in said validation file.

51. The system of claim 50 wherein said central computer and said validation file are remote from said detector and said reader, and wherein said validation means includes transmission means for transmitting said identity number and said removed spot signal to said central computer.

52. The system of claim 51 wherein said validation means additionally includes a display for displaying said ticket redemption value.

53. The system of claim 52 wherein said display is located with said reader and said transmission means additionally transmits said ticket redemption value to said display from said central computer.

54. The system of claim 25 wherein said ticket data includes a play spot code containing information related to a location on said lottery ticket of at least a portion of said play spots.

55. The system of claim 54 wherein said play spot code is represented by a number that relates to a redemption value for each of said play indicia under said portion of said play spots.

56. The system of claim 55 wherein said number is a base 10 number.

57. The system of claim 55 wherein said number is a binary number.

58. The system of claim 55 wherein includes computational means for converting said number into a plurality of play spot location codes, each of said play spot location codes corresponding to one of said play indicia under said portion of said play spots and representing a location on said lottery ticket of said one play indicia.

59. The system of claim 58 wherein said play spot location codes are two-bit binary numbers.

60. The system of claim 59 additionally including a central computer remote from said validation means and wherein at least one of said play spot location codes causes said validation means to transmit information containing said play spot location codes to said central computer to determine said ticket redemption value.

61. The system of claim 25 wherein said ticket data includes a play spot code containing information related to a play spot value for at least a portion of said play spots.

62. The system of claim 61 wherein said detector includes a circuit element under at least one of said play spots on said lottery ticket and wherein said system includes means for generating a signal representing an electrical signature of said circuit element.

63. The system of claim 61 wherein said play spot code is represented by a number relating to a redemption value for each of said play indicia under said portion of said play spots.

64. The system of claim 63 wherein said number is a base 10 number.

65. The system of claim 63 wherein said number is a binary number.

66. The system of claim 63 wherein said validation means includes computational means for converting said number into a plurality of play indicia redemption codes wherein each of said play indicia redemption codes corresponds to one of said play indicia under said portion of said play spots and represents said redemption value of said one play indicia.

67. The system of claim 66 wherein each of said play indicia redemption codes is a two bit binary number.

68. The system of claim 66 additionally including a central computer remote from said validation means and wherein at least one of said plurality of play indicia redemption codes causes said validation means to transmit information containing said play indicia redemption codes to said central computer to determine said ticket redemption value.

69. The system of claim 66 wherein said validation means utilizes said microprocessor for computing said ticket redemption value from said plurality of play indicia redemption codes and said removed spot signal.

70. The system of claim 69 further including a first range of ticket redemption values and a second range of ticket redemption values, said first range being less than said second range, wherein said validation means utilizes said microprocessor to compute said ticket redemption value from said plurality of play indicia redemption codes when said ticket redemption value is in said first range, and wherein said system includes a second computer remote from said validation means, said second computer being adapted to compute said ticket redemption value when said ticket redemption value is in said second range.

71. The system of claim 70 including a plurality of said lottery tickets, wherein said redemption information is different on at least a portion of different ones of said plurality of lottery tickets.

72. The system of claim 63 including a plurality of said lottery tickets, wherein said redemption information is different on at least a portion of different ones of said plurality of lottery tickets.

73. The system of claim 72 wherein said redemption information on each lottery ticket in said portion of said plurality of lottery tickets includes play indicia value data and wherein said ticket data on each of said lottery tickets in said portion of said plurality of lottery tickets additionally includes an identity number relating to said play indicia value data.

74. The system of claim 73 wherein said validation means utilizes said microprocessor to convert said play spot code on each lottery ticket in said portion of said plurality of lottery tickets into a first set of play indicia redemption codes and wherein said validation means includes a second computer adapted to convert said identity number for each lottery ticket in said portion of said plurality of lottery tickets, in combination with information from said detector, into said ticket redemption value for each lottery ticket in said portion of said plurality of lottery tickets.

75. The system of claim 74 wherein said second computer is remote from said microprocessor and includes a validation file containing for each of said identity numbers a second set of related play indicia redemption codes, wherein said validation means includes transmission means for transmitting said identity number for each lottery ticket in said portion of said plurality of lottery tickets to said second computer.

76. The system of claim 75 said play spot code of at least one lottery ticket in said portion of said plurality of lottery tickets includes a play redemption code in said first set having a predetermined value and said play redemption code in said first set having said predetermined value causes said transmission means to transmit said identity number for said at least one lottery ticket to said second computer to determine said ticket redemption value of said at least one lottery ticket from said identity number of said at least one lottery.

77. The system of claim 75 wherein said play spot code of at least one lottery ticket in said portion of said plurality of lottery tickets includes a play redemption code having a predetermined value and said information in said play spot code of said at least one lottery ticket causes said transmission means to transmit said identity number of said at least one lottery ticket to said central computer to determine said ticket redemption value of said at least one lottery ticket from said identity number of said at least one lottery ticket.

78. The system of claim 76 wherein said predetermined value is greater than a predetermined number.

79. The system of claim 78 wherein said detector includes at least one electrical circuit located on said at least one lottery ticket.

80. The system of claim 79 wherein said validation means additionally includes a display for displaying said ticket redemption value of said at least one lottery ticket.

81. The system of claim 77 wherein said microprocessor is located remote from said reader and wherein said validation means includes communication means for transmitting said number representing said play spot code of said at least one lottery ticket from said reader to said microprocessor.

82. The system of claim 81 wherein said validation means additionally includes a display for displaying said ticket redemption value of said at least one lottery ticket.

83. The system of claim 81 wherein said validation means additionally includes a printer for printing said ticket redemption value of said at least one lottery ticket.

84. The system of claim 61 wherein said play spot code is encrypted and said validation means includes decryption means for decrypting said play spot code to generate a decrypted play spot code.

85. The system of claim 84 wherein said validation means includes computational means for converting said decrypted play spot code into said ticket redemption value.

86. The system of claim 84 wherein said play spot code contains information related to a plurality of play spot values, each of said play spot values in said plurality of play spot values corresponding to a different combination of said play spots on said lottery ticket, wherein said validation means includes computational means for converting said decrypted play spot code into said plurality of play spot values, and wherein said validation means determines said ticket redemption value from said plurality of play spot values.

87. The system of claim 86 further including a first range of ticket redemption values and a second range of ticket redemption values, wherein said validation means includes a first computer adapted to said ticket redemption value when said ticket redemption value is in said first range and said system additionally includes a central computer remote from said validation means and configured to determine said ticket redemption value when said ticket redemption value is in said second range.

88. The system of claim 87 wherein said validation means additionally includes a display configured to display said ticket redemption value from both said first and second ranges.

89. The system of claim 1 wherein:

the probability lottery has a set of predetermined play rules, and validation data printed on said ticket;

an electromagnetic responsive material printed in registry with said play spots on said lottery ticket;

said electronic validation machine having;
i. a controller including said microprocessor,
ii. said data reader adapted for reading said validation data, said data reader being operatively connected to said controller,
iii. an electromagnetic sensor as part of said detector operatively connected to said controller and configured to detect said electromagnetic material,
iv. a ticket interface and transport mechanism operatively connected to said controller and adapted to receive said lottery ticket and to position the validation data and play spots with respect to said data reader and said electromagnetic sensor respectively, wherein said controller is effective to generate from said data reader a data signal representing the validation data and said controller is effective to generate from said electromagnetic sensor a validation signal indicating which of said play spots have been removed from said lottery ticket; and a processor operatively connected to said controller for relating said data signal to said validation signal to verity said lottery ticket has been played according to said predetermined play rules.

90. The system of claim 89 wherein said electromagnetic material is printed in the form of a circuit element.

91. The system of claim 90 wherein said validation signal represents an electrical signature of said circuit element.

92. The system of claim 89 wherein said electromagnetic sensor is an optical detector.

93. The system of claim 92 wherein said validation signal represents an optical signature of said lottery ticket.

94. The system of claim 92 wherein said optical detector is a photo detector and is configured to detect and classify a frequency of light emitted by said lottery ticket.

95. The system of claim 89 wherein said data reader includes an optical reader.

96. The system of claim 95 wherein said validation data is printed as a bar code.

97. The system of claim 95 wherein said validation data is printed in a two dimensional bar code and said optical reader is a two dimensional bar code reader.

98. The system of claim 96 wherein said validation data includes data representing the number of said play spots to be removed by a player according to said predetermined play rules.

99. The system of claim 89 wherein said validation data includes rule data representing the number of said play spots specified in said predetermined play rules to be removed by a player.

100. The system of claim 89 wherein said processor is included in said electronic validation machine.

101. The system of claim 100 wherein said validation data includes rule data representing the number of said play spots to be removed by a player according said predetermined play rules and wherein said processor includes a memory storing said validation data.

102. The system of claim 101 wherein said memory stores said validation data in a form representing an electromagnetic signature of said electromagnetic material.

103. The system of claim 89 wherein said processor includes a central computer and a memory storing rule data representing the number of said play spots specified in said predetermined play rules to be removed by a player.

104. The system of claim 103 wherein both said processor and said memory are located remote from said electronic validation machine and wherein said electronic validation machine includes means for transmitting said data signal and said validation signal to said processor.

105. The system of claim 104 wherein said rule data stored in said memory represents an electrical signature of said electromagnetic material.

106. The system of claim 89 wherein said electronic validation machine additionally includes a display operatively connected to said processor and configured to display an indication that said lottery ticket has not been played according to said predetermined play rules.

107. The system of claim 89 wherein said electronic validation machine additionally includes a stigmatization circuit operatively connected to said processor and configured to stigmatize said lottery ticket after said processor has determined that said lottery ticket has been played according to said predetermined play rules.

108. The system of claim 89 wherein said validation data includes a ticket identifier, wherein a portion of said data signal corresponds to said ticket identifier, and wherein said processor includes computation means for converting said portion of said data signal into a value related to a redemption value for said lottery ticket.

109. The system of claim 108 wherein a portion of said play spots have been removed by a player and wherein said redemption value is related to said portion of said play spots.

110. The system of claim 109 wherein said validation signal represents an electrical signature of said electromagnetic material and said processor includes means for computing from said validation signal a value corresponding to said redemption value.

111. The system of claim 108 wherein said processor is included in said electronic validation machine.

112. The system of claim 111 wherein said electronic validation machine additionally includes a display configured to display said redemption value.

113. The system of claim 111 wherein said electronic validation machine additionally includes a printer configured to print said redemption value.

114. The system of claim 108 including a plurality of said lottery tickets, wherein said processor includes a central computer including a memory storing a plurality of said redemption values each corresponding to said ticket identifiers on individual ones of said plurality of said lottery tickets and wherein said central computer is remote from said electronic validation machine.

115. The system of claim 114 wherein said electronic validation machine includes a keyboard for manual inputting into said processor of said validation data for a given lottery ticket in said plurality of lottery tickets.

116. The system of claim 114 wherein for each lottery ticket in said plurality of lottery tickets said redemption values are represented by an electrical signature of said electromagnetic material.

117. The system of claim 114 wherein said validation data includes value data and wherein for each lottery ticket in said plurality of said lottery tickets said processor converts said validation signal into said value related to said redemption value.

118. The system of claim 114 wherein for each lottery ticket in said plurality of said lottery tickets said ticket identifier is related to said redemption value.

119. The system of claim 118 wherein said central computer additionally includes means for converting at least a portion of said validation signal into said redemption value for each lottery ticket in said plurality of lottery tickets.

120. The system of claim 119 wherein said processor includes logic means in said electronic validation machine for converting a first range of validation signals into a corresponding first range of said redemption values and for transmitting at least a portion of said validation signals to said central computer for conversion of a second range of said validation signals into a corresponding second range of said redemption values.

121. The system of claim 120 wherein said logic means does not convert said second range of validation signals into said second range of redemption values.

122. The system of claim 120 wherein said first range of redemption values is less than said second range of said redemption values.

123. The system of claim 122 wherein for each lottery ticket in said plurality of lottery tickets said validation data is printed in a bar code and represents said redemption value of said lottery ticket.

124. The system of claim 122 wherein said processor includes a central computer remote from electronic validation machine and having a file containing redemption information and wherein for each lottery ticket in said plurality of lottery tickets said validation data is printed in a bar code and represents a key to said file, and wherein said central computer determines said redemption value of each of said lottery tickets in said plurality of lottery tickets from said redemption information and said validation signal.

125. The system of claim 122 said processor includes a central computer remote from electronic validation machine and including a ticket reconstruction program, wherein for each lottery ticket in said plurality of lottery tickets said validation data is printed in a bar code and represents sufficient information to initiate said ticket reconstruction program for said lottery tickets, and wherein said central computer determines said redemption value of each of said lottery tickets in said plurality of lottery tickets from said ticket reconstruction program and said validation signal.

126. The system of claim 122 said processor includes a computer having a ticket reconstruction program, wherein for each lottery ticket in said plurality of lottery tickets said validation data is printed in a bar code and represents a seed to said ticket reconstruction program, and wherein said computer determines said redemption value of each of said lottery tickets in said plurality of lottery tickets from said ticket reconstruction program and said validation signal.

127. The system of claim 122 further including a first computer having a first ticket reconstruction program and a remote second computer having a second ticket reconstruction program, wherein for each lottery ticket in said plurality of lottery tickets said validation data is printed in a bar code and represents information relating to said first and second ticket reconstruction programs, and wherein said first computer and said second remote computer determine said redemption value of each of said lottery tickets in said plurality of lottery tickets from said first and second ticket reconstruction programs and said validation signal.

128. The system of claim 122 wherein said data reader includes a photo-detector.

129. The system of claim 128 wherein said electronic validation machine additionally includes a display configured to display a result of said verification.

130. The system of claim 128 wherein said electronic validation machine additionally includes a printer configured to print a result of said verification.

131. The system of claim 128 wherein data reader is an optical reader.

132. The system of claim 122 wherein for each lottery ticket in said plurality of lottery tickets said validation data is printed in a two-dimensional bar code and wherein said optical reader is a two-dimensional bar code reader.

133. The system of claim 122 wherein for each lottery ticket in said plurality of lottery tickets said validation data is printed in a magnetic material and said data reader includes a magnetic reader.

134. The system of claim 89 wherein said validation data is printed on said lottery ticket in human readable form and wherein said electronic validation machine includes a keyboard for manual inputting of said validation data into said processor.

135. The system of claim 134 wherein said electronic validation machine additionally includes a display configured to display a result of said verification.

136. The system of claim 134 wherein said electronic validation machine additionally includes a printer configured to print a result of said verification.

137. The system of claim 89 wherein said validation data is printed on said lottery ticket in both bar code and human readable forms and wherein said electronic validation machine includes a keyboard for manual inputting of said validation data into said controller and said data reader includes an optical reader for inputting said validation data into said controller.

138. The system of claim 137 wherein said electronic validation machine additionally includes a display configured to display a result of said verification.

139. The system of claim 137 wherein said electronic validation machine additionally includes a printer configured to print a result of said verification.

140. The system of claim 89 additionally including stigmatization means operatively connected to said processor for stigmatizing said lottery ticket after said lottery ticket has been verified.

141. The system of claim 140 wherein said stigmatization means includes a source of electromagnetic energy for applying sufficient electromagnetic energy to a surface of said lottery ticket to alter a color of said lottery ticket.

142. The system of claim 140 wherein said lottery ticket additionally includes a fuse element and said stigmatization means includes power means for applying sufficient power to said ticket to break said fuse element.

143. The system of claim 140 wherein said lottery ticket includes a temperature sensitive material and said stigmatization means includes energy means for applying sufficient electromagnetic energy to said temperature sensitive material to cause said temperature sensitive material to change color.

144. The system of claim 89 wherein said lottery ticket includes a plurality of circuit elements printed on a surface of said lottery ticket and said electronic validation machine includes a power source effective to apply sufficient power to at least a portion of said circuit elements to alter said portion of said electronic circuit elements thereby storing information in said portion of said circuit elements.

145. The system of claim 89 wherein said validation data includes ticket identification data.

146. The system of claim 145 said portion of said validation data includes a check sum of at least a portion of said validation data.

147. The system of claim 1 wherein said electronic validation machine includes:
a controller including said microprocessor,
a document channel;
a sensor array as part of said detector operatively connected to said controller;
a transport mechanism operatively connected to said controller effective to transport the lottery ticket through said document channel such that at least a portion of the player removable material is aligned with said sensor array;

a memory; and a scanning circuit as part of said detector operatively connected to said controller and to said sensor array for generating in said memory a scanned bit map of at least a portion of the player removable material.

148. The system of claim 147 additionally including validation data in said memory and a processor operatively connected to said controller for comparing said scanned bit map to said validation data according to a predetermined criteria to verify the lottery ticket.

149. The system of claim 148 wherein said predetermined criteria includes a location of the player removable material.

150. The system of claim 148 wherein said predetermined criteria includes a shape of the player removable material.

151. The system of claim 148 wherein said predetermined criteria includes an expected percentage of removal of the player removable material.

152. The system of claim 151 wherein said percentage represents a minimum percentage of the player removable material for a played lottery ticket.

153. The system of claim 151 wherein said minimum percentage is 30 percent.

154. The system of claim 148 wherein said validation data is contained in said memory as a bit map.

155. The system of claim 148 wherein said predetermined criteria includes a percentage of the player removable material.

156. The system of claim 155 wherein said percentage is related to an expected amount of removal of the player removable material for a played ticket.

157. The system of claim 155 wherein said percentage is 30 percent.

158. The system of claim 1 wherein the probability lottery ticket includes a set of predetermined play rules and validation data printed on said probability lottery ticket;

and wherein said electronic validation machine includes:

a housing;

a controller located in said housing;

a document channel configured in said housing;

a transport mechanism operatively connected to said controller and located in said housing effective to transport said probability lottery ticket through said document channel;

a memory operatively connected to said controller containing data representing said probability lottery ticket including at least a portion of said validation data and removed play spot data; and a processor including said microprocessor operatively connected to said controller for relating said removed play spot data to said portion of said validation data contained in said memory to verify said probability lottery ticket has been played according to said predetermined play rules and to cause said transport mechanism to exit said probability lottery ticket from said document channel.

159. The system of claim 158 wherein said validation data is printed as a bar code on said probability lottery ticket.

160. The system of claim 159 wherein said validation data includes data representing the number of play spots to be removed by a player according to said predetermined play rules.

161. The system of claim 160 wherein said portion of said validation data contained in said memory includes data representing the number of play spots specified by said predetermined play rules to be removed by a player.

162. The system of claim 158 wherein said processor is included in said housing.

163. The system of claim 158 additionally including a central computer, said central computer including a central memory storing data representing the number of play spots specified in said predetermined play rules to be removed by a player.

164. The system of claim 163 wherein said central computer is located remote from said housing and wherein said controller includes a communications interface for transmitting said validation data from said memory to said central computer.

165. The system of claim 158 wherein said housing additionally includes a display operatively connected to said processor and configured to display an indication that said probability lottery ticket has not been played according to said predetermined play rules.

166. The system of claim 158 wherein said housing additionally includes a stigmatization circuit operatively connected to said processor for stigmatizing said probability lottery ticket after said processor has determined that said probability lottery ticket has been played according to said predetermined play rules.

167. The system of claim 158 wherein said portion of said validation data contained in said memory includes a ticket identifier and wherein said processor converts said ticket identifier into a value corresponding to a ticket redemption value for said ticket.

168. The system of claim 167 wherein a portion of said play spots has been removed by a player and wherein said ticket redemption value is related to said portion of said play spots.

169. The system of claim 168 wherein said processor is included in said housing.

170. The system of claim 167 wherein said housing additionally includes a display operatively connected to said controller and configured to display said ticket redemption value.

171. The system of claim 167 further including a plurality of said probability lottery tickets, wherein said processor includes a central computer having a central memory storing a plurality of said ticket redemption values each corresponding to said ticket identifiers on said plurality of said tickets and wherein said central computer is remote from said housing.

172. The system of claim 171 wherein said each of said plurality of ticket redemption values corresponds to at least one combination of said play spots on individual ones of said plurality of probability lottery tickets.

173. The system of claim 158 wherein said portion of said validation data contained in said memory includes redemption value data and said processor converts said removed play spot data and said redemption value data into a ticket redemption value.

174. The system of claim 158 wherein said portion of said validation data contained in said memory includes a ticket identifier representing a ticket redemption value.

175. The system of claim 174 wherein said processor additionally converts at least a portion of said ticket identifier into said ticket redemption value.

176. The system of claim 175 wherein said housing additionally includes a display operatively connected to said controller and configured to display said ticket redemption value.

177. The system of claim 175 additionally including a plurality of said probability lottery tickets and a central computer, operatively connected to said processor, having a central memory storing a plurality of said ticket redemption values each corresponding to said validation data on individual ones of said plurality of said probability lottery tickets, wherein said central computer is remote from said housing and wherein said processor is located in said housing and is adapted to convert a first range of said removed play spot data into a corresponding first range of said ticket redemption values and is adapted to transmit at least a portion of said removed play spot data to said central computer for conversion of a second range of said removed play spot data into a corresponding second range of said ticket redemption values.

178. The system of claim 177 wherein said first range of ticket redemption values is less than said second range of ticket redemption values.

179. The system of claim 177 wherein said processor does not convert said second range of removed play spot data into said second range of said ticket redemption values.

180. The system of claim 158 additionally including a stigmatization mechanism having a source of electromagnetic energy operatively connected to said processor, said stigmatizing mechanism being adapted to stigmatizing said probability lottery ticket after said processor has verified said probability lottery ticket.

181. The system of claim 180 wherein said probability lottery ticket is printed with a temperature sensitive ink and wherein said stigmatization mechanism applies a sufficient amount of electromagnetic energy to said probability lottery ticket to change a color of at least a portion of said probability lottery ticket.

182. The system of claim 158 wherein said portion of said validation data contained in said memory includes an identity number related to at least one ticket redemption value.

183. The system of claim 182 wherein said identity number includes ticket integrity data.

184. The system of claim 182 wherein said identity number includes ticket reconstruction information.

185. The system of claim 182 wherein said identity number includes a game number and a pack number.

186. The system of claim 185 wherein said identity number additionally includes a ticket number.

187. The system of claim 182 wherein said identity number includes a ticket number.

188. The system of claim 182 wherein said identity number includes a game unique validation number.

189. The system of claim 182 wherein said identity number includes a pool unique validation number.

190. The system of claim 182 wherein said identity number includes a pack unique validation number.

191. The system of claim 182 further including a plurality of said probability lottery tickets, wherein said memory includes a validation file containing for each said identity number on said plurality of lottery tickets at least one of said related ticket redemption values for at least one combination of said player removable play spots and wherein for individual tickets in said plurality of said probability lottery tickets said processor determines a played ticket redemption value from said removed play spot data, said identity number, and said related ticket redemption values in said validation file.

192. The system of claim 182 further including a plurality of said probability lottery tickets and a central computer operatively connected to said processor, said central computer having a validation file containing for each said identity number on said plurality of said probability lottery tickets at least one of said related ticket redemption values for at least one combination of said player removable play spots and wherein for individual tickets in said plurality of said probability lottery tickets said central computer determines a played ticket redemption value from said removed spot data, said identity number, and said related ticket redemption values in said validation file.

193. The system of claim 192 wherein said central computer and said validation file are remote from said housing and wherein said system further includes transmission means for transmitting said identity number and said removed spot data for individual tickets in said plurality of said probability lottery tickets to said central computer.

194. The system of claim 193 wherein said housing additionally includes a display operatively connected to said processor and configured to display said played ticket redemption value for individual tickets in said plurality of said probability lottery tickets.

195. The system of claim 194 wherein said display is located in said housing and said transmission means additionally transmits said played ticket redemption value for individual tickets in said plurality of lottery tickets to said display from said central computer.

196. The system of claim 182 further including a plurality of said probability lottery tickets, wherein said memory includes a validation file containing play indicia value data corresponding to said identification number for each lottery ticket in said plurality of lottery tickets and wherein for individual tickets in said plurality of said probability lottery tickets said processor determines a played ticket redemption value from said removed play spot data, said identity number, and said corresponding play indicia value data in said validation file.

197. The system of claim 182 further including a plurality of said probability lottery tickets and a central computer operatively connected to said processor, said central computer having a validation file containing play indicia value data corresponding to said identification number for each lottery ticket in said plurality of lottery tickets and wherein for individual tickets in said plurality of said probability lottery tickets said central computer determines a played ticket redemption value from said removed spot data, said identity number, and said corresponding play indicia value data in said validation file.

198. The system of claim 197 wherein said central computer and said validation file are remote from said housing and wherein said system further includes transmission means for transmitting said identity number and said removed spot data for individual tickets in said plurality of said probability lottery tickets to said central computer.

199. The system of claim 198 wherein said housing additionally includes a display operatively connected to said processor and configured to display said played ticket redemption value for individual tickets in said plurality of said probability lottery tickets.

200. The system of claim 199 wherein said display is located in said housing and said transmission means additionally transmits said played ticket redemption value for individual tickets in said plurality of lottery tickets to said display from said central computer.

201. The system of claim 158 wherein said portion of said valuation data contained in said memory includes a play spot code containing play indicia value data for at least a portion of said play spots and said processor is adapted to compute a ticket redemption value from said play spot code.

202. The system of claim 201 wherein said play spot code is encrypted and said processor includes decryption logic for decrypting said play spot code.

203. The system of claim 201 wherein said play spot code is represented by a number.

204. The system of claim 203 wherein said number is a base 10 number.

205. The system of claim 203 wherein said number is a binary number.

206. The system of claim 203 wherein said processor is adapted to convert said number into a plurality of play indicia redemption codes wherein each of said play indicia redemption codes corresponds to a combination of removed play spots as represented by said removed play spot data.

207. The system of claim 206 wherein said play indicia redemption codes are two bit binary numbers.

208. The system of claim 158 additionally including a central computer remote from said housing and operatively connected to said processor, wherein said removed play spot data causes said processor to transmit information representing said validation data and said removed play spot data to said central computer to determine a ticket redemption value.

209. The system of claim 158 wherein said portion of said validation data contained in said memory contains a plurality of play indicia redemption codes corresponding to various combinations of said play spots and said processor is adapted to compute a played ticket redemption value from said removed play spot data in said memory and said plurality of play indicia redemption codes.

210. The system of claim 209 further including a first range of ticket redemption values and a second range of ticket redemption values, said first range being less than said second range, wherein said processor computes said played ticket redemption value when said played ticket redemption value is in said first range and wherein said system additionally includes a central computer remote from said housing and operatively connected to said processor, said processor being adapted to transmit data from said memory to said central computer, said central computer being adapted to compute said played ticket redemption value when said played ticket redemption value is in said second range.

211. The system of claim 210 wherein at least one of said play indicia redemption codes representing a predetermined value causes said processor to transmit said to said central computer said removed play spot data and said portion of said validation data contained in said memory.

212. The system of claim 210 wherein at least one of said play indicia redemption codes represents a predetermined value and wherein said portion of said validation data contained in said memory includes an indicator that will cause said processor to transmit said removed play spot data and said portion of said validation data in said memory to said central computer.

213. The system of claim 212 wherein said predetermined value represents at least one of said redemption values greater than a predetermined value.

214. The system of claim 158 wherein said portion of validation data contained in said memory data includes information representing a plurality of play indicia redemption codes corresponding to different combinations of said play spots on said probability lottery ticket and wherein said processor determines a ticket redemption value from said removed play spot data and said portion of said validation data contained in said memory.

215. The system of claim 214 wherein said housing additionally includes a display operatively connected to said controller and configured to display said ticket redemption value.

216. The system of claim 1 wherein:
the probability lottery ticket includes a set of predetermined play rules and validation data printed on said ticket and wherein said plurality of player removable play spots covering play indicia are located in predetermined locations on said ticket;
and wherein said electronic validation machine includes:
a housing;
a controller including said microprocessor located in said housing,
a document channel configured in said housing;
a transport mechanism operatively connected to said controller and located in said housing effective to transport said probability lottery ticket through said document channel;
a memory operatively connected to said controller containing data representing said probability lottery ticket including removed play spot data and at least a portion of said validation data; and
a processor operatively connected to said controller for relating said portion of said validation data to said removed play spot data to generate said ticket redemption value and to cause said transport mechanism to exit said probability lottery ticket from said document channel.

217. The system of claim 216 wherein said housing additionally includes a stigmatization circuit operatively connected to said processor for stigmatizing said probability lottery ticket prior to said transport mechanism exiting said ticket from said document channel.

218. The system of claim 216 wherein said stigmatization circuit applies sufficient electromagnetic power to said probability lottery ticket to change a color of at least a portion of said probability ticket.

219. The system of claim 216 wherein said probability lottery ticket is printed with a temperature sensitive ink and said stigmatization circuit applies sufficient electromagnetic energy to said probability lottery ticket to change a color of at least a portion of said probability lottery ticket printed with said temperature sensitive ink.

220. The system of claim 216 wherein said housing additionally includes a display operatively connected to said processor and configured to said played ticket redemption value.

221. The system of claim 216 wherein said portion of said validation data includes a ticket identifier and wherein said processor converts said ticket identifier into a value corresponding to said played ticket redemption value for said ticket.

222. The system of claim 221 wherein a portion of said play spots has been removed by a player and wherein said played ticket redemption value is related to said portion of said play spots.

223. The system of claim 222 wherein said processor is included in said housing.

224. The system of claim 221 wherein said housing additionally includes a display operatively connected to said controller and configured to display said played ticket redemption value.

225. The system of claim 221 further including a plurality of said probability lottery tickets, wherein said processor includes a central computer having a central memory storing a plurality of ticket redemption values each corresponding to said ticket identifiers on said plurality of said probability lottery tickets and wherein said central computer is remote from said housing.

226. The system of claim 225 wherein said each of said plurality of ticket redemption values corresponds to at least one combination of said play spots on individual ones of said plurality of probability lottery tickets.

227. The system of claim 216 wherein said portion of said validation data contained in said memory includes redemption value data and said processor converts said removed play spot data and said redemption value data into said played ticket redemption value.

228. The system of claim 216 wherein said portion of said validation data represented in said memory includes a ticket identifier related to said played ticket redemption value.

229. The system of claim 228 wherein said processor additionally converts at least a portion of said ticket identifier into said played ticket redemption value.

230. The system of claim 229 wherein said housing additionally includes a display operatively connected to said controller and configured to display said played ticket redemption value.

231. The system of claim 229 additionally including a plurality of said probability lottery tickets and a central computer operatively connected to said processor and having a central memory storing a plurality of ticket redemption values each corresponding to said validation data on individual ones of said plurality of said probability lottery tickets, wherein said central computer is remote from said housing and wherein said processor is located in said housing and is adapted to convert a first range of said removed play spot data into a corresponding first range of said ticket redemption values and is adapted to transmit at least a portion of said removed play spot data to said central computer for conversion of a second range of said removed play spot data into a corresponding second range of said ticket redemption values.

232. The system of claim 231 wherein said first range of ticket redemption values is less than said second range of ticket redemption values.

233. The system of claim 232 wherein said processor does not convert said second range of removed play spot data into said second range of said ticket redemption values.

234. The system of claim 216 additionally including a stigmatization mechanism having a source of electromagnetic energy operatively connected to said processor, said stigmatizing mechanism being adapted to stigmatizing said probability lottery ticket after said processor has generated said played ticket redemption value.

235. The system of claim 234 wherein said probability lottery ticket is printed with a temperature sensitive ink and wherein said stigmatization mechanism applies a sufficient amount of electromagnetic energy to said probability lottery ticket to change a color of at least a portion of said probability lottery ticket.

236. The system of claim 216 wherein said portion of said validation data represented in said memory includes an identity number related to at least one ticket redemption value.

237. The system of claim 236 wherein said identity number includes ticket integrity data.

238. The system of claim 236 wherein said identity number includes ticket reconstruction data.

239. The system of claim 236 wherein said identity number includes a game number and a pack number.

240. The system of claim 239 wherein said identity number additionally includes a ticket number.

241. The system of claim 236 wherein said identity number includes a ticket number.

242. The system of claim 236 wherein said identity number includes a game unique validation number.

243. The system of claim 236 wherein said identity number includes a pool unique validation number.

244. The system of claim 236 wherein said identity number includes a pack unique validation number.

245. The system of claim 236 further including a plurality of said probability lottery tickets, wherein said memory includes a validation file containing for each said identity number on said plurality of probability lottery tickets at least one of said related ticket redemption values for at least one combination of said player removable play spots and wherein for individual tickets in said plurality of said probability lottery tickets said processor determines said played ticket redemption value from said removed play spot data, said identity number, and said related ticket redemption values in said validation file.

246. The system of claim 236 further including a plurality of said probability lottery tickets and a central computer operatively connected to said processor, said central computer having a validation file containing for each said identity number on said plurality of said probability lottery tickets at least one of said related ticket redemption values for at least one combination of said player removable play spots and wherein for individual tickets in said plurality of said probability lottery tickets said central computer determines said played ticket redemption value from said removed spot data, said identity number, and said related ticket redemption values in said validation file.

247. The system of claim 246 wherein said central computer and said validation file are remote from said housing and wherein said system further includes transmission means for transmitting said identity number and said removed spot data for individual tickets in said plurality of said probability lottery tickets to said central computer.

248. The system of claim 247 wherein said housing additionally includes a display operatively connected to said processor and configured to display said played ticket redemption value for individual tickets in said plurality of said probability lottery tickets.

249. The system of claim 248 wherein said display is located in said housing and said transmission means additionally transmits said played ticket redemption value for individual tickets in said plurality of lottery tickets to said display from said central computer.

250. The system of claim 236 further including a plurality of said probability lottery tickets, wherein said memory includes a validation file containing play indicia value data corresponding to said identification number for each probability lottery ticket in said plurality of probability lottery tickets and wherein for individual tickets in said plurality of said probability lottery tickets said processor determines said played ticket redemption value from said removed play spot data, said identity number, and said corresponding play indicia value data in said validation file.

251. The system of claim 236 further including a plurality of said probability lottery tickets and a central computer operatively connected to said processor, said central computer having a validation file containing play indicia value data corresponding to said identification number for each probability lottery ticket in said plurality of probability lottery tickets and wherein for individual probability tickets in said plurality of said probability lottery tickets said central computer determines said played ticket redemption value from said removed spot data, said identity number, and said corresponding play indicia value data in said validation file.

252. The system of claim 251 wherein said central computer and said validation file are remote from said housing and wherein said system further includes transmission means for transmitting said identity number and said removed spot data for individual probability tickets in said plurality of said probability lottery tickets to said central computer.

253. The system of claim 252 wherein said housing additionally includes a display operatively connected to said processor and configured to display said played ticket redemption value for individual probability tickets in said plurality of said probability lottery tickets.

254. The system of claim 253 wherein said display is located in said housing and said transmission means additionally transmits said played ticket redemption value for individual probability tickets in said plurality of probability lottery tickets to said display from said central computer.

255. The system of claim 216 wherein said portion of said valuation data represented in said memory includes a play spot code containing play indicia value data for at least a portion of said play spots and said processor is adapted to compute said played ticket redemption value from said play spot code.

256. The system of claim 255 wherein said play spot code is encrypted and said processor includes decryption logic for decrypting said play spot code.

257. The system of claim 255 wherein said play spot code is represented by a number.

258. The system of claim 257 wherein said number is a base 10 number.

259. The system of claim 257 wherein said number is a binary number.

260. The system of claim 257 wherein said processor is adapted to convert said number into a plurality of play indicia redemption codes wherein each of said play indicia redemption codes corresponds to a combination of removed play spots as represented by said removed play spot data.

261. The system of claim 260 wherein said play indicia redemption codes are two-bit binary numbers.

262. The system of claim 216 additionally including a central computer remote from said housing and operatively connected to said processor, wherein said removed play spot data causes said processor to transmit information representing said validation data and said removed play spot data to said central computer to determine played ticket redemption value.

263. The system of claim 216 wherein said portion of said validation data represented in said memory contains a plurality of play indicia redemption codes corresponding to various combinations of said play spots and said processor is adapted to compute said played ticket redemption value from said removed play spot data in said memory and said plurality of play indicia redemption codes.

264. The system of claim 263 further including a first range of ticket redemption values and a second range of ticket redemption values, said first range being less than said second range, wherein said processor computes said played ticket redemption value when said played ticket redemption value is in said first range and wherein said system additionally includes a central computer remote from said housing and operatively connected to said processor, said processor being adapted to transmit data from said memory to said central computer, said central computer being adapted to compute said played ticket redemption value when said played ticket redemption value is in said second range.

265. The system of claim 264 wherein at least one of said play indicia redemption codes having a predetermined value causes said processor to transmit to said central computer said removed play spot data and said portion of said validation data represented in said memory.

266. The system of claim 264 wherein at least one of said play indicia redemption codes has a predetermined value and wherein said portion of said validation data represented in said memory includes an indicator causing said processor to transmit said removed play spot data and said portion of said validation data in said memory to said central computer.

267. The system of claim 265 wherein said predetermined value represents at least one of said redemption values greater than a predetermined value.

268. The system of claim 216 wherein said portion of validation data represented in said memory data includes information representing a plurality of play indicia redemption codes corresponding to different combinations of said play spots on said probability lottery ticket and wherein said processor determines said ticket redemption value from said removed play spot data and said portion of said validation data represented in said memory.

269. The system of claim 268 wherein said housing additionally includes a display operatively connected to said controller and configured to display said played ticket redemption value.

270. The system of claim 216 wherein said portion of said validation data in said memory includes a ticket identifier and said processor converts said portion of said validation data corresponding to said ticket identifier into a value corresponding to said played redemption value.

271. The system of claim 270 wherein a portion of said play spots has been removed by a player and wherein said redemption value is related to said portion of said play spots.

272. The system of claim 216 wherein said processor is included in said housing.

273. The system of claim 272 wherein said housing additionally includes a display operatively connected to said controller and configured to display said played ticket redemption value.

274. The system of claim 270 additionally including a plurality of said probability lottery tickets and a central computer having a memory storing a plurality of potential ticket redemption values each corresponding to said ticket identifiers on each lottery ticket in said plurality of said probability lottery tickets and wherein said central computer is remote from said housing.

275. The system of claim 274 wherein said potential ticket redemption values are represented by at least one combination of said play spots.

276. The system of claim 216 wherein said validation data in said memory includes redemption value data and said processing means converts said removed play spot data and said redemption value data into said played ticket redemption value.

277. The system of claim 216 wherein validation data represented in said memory includes a ticket identifier relating to a potential ticket redemption value.

278. The system of claim 277 wherein said processor additionally converts at least a portion of said ticket identifier into said played ticket redemption value.

279. The system of claim 278 additionally including a plurality of said probability lottery tickets and a central computer operatively connected to said processor and having a central memory storing a plurality of said potential ticket redemption values each corresponding to said validation data on individual ones of said plurality of said probability lottery tickets, wherein said central computer is remote from said housing and wherein said processor is located in housing and is adapted to convert a first range of said removed play spot data into a corresponding first range of said potential ticket redemption values and for transmitting at least a portion of said removed play spot data to said central computer for conversion of a second range of said removed play spot data into a corresponding second range of said potential ticket redemption values.

280. The system of claim 279 wherein of said first range of potential ticket redemption values is less than said second range of potential ticket redemption values.

281. The system of claim 216 wherein said validation data in said memory includes an identity number related to at least one potential ticket redemption value.

282. The system of claim 281 further including a plurality of said probability lottery tickets, wherein said memory includes a validation file containing for each said identity number on individual ones of said plurality of probability lottery tickets at least one of said related potential ticket redemption values for at least one combination of said player removable play spots and wherein for an individual ticket in said plurality of probability lottery tickets said processor determines said played ticket redemption value from said removed spot data, said identity number, and said related potential ticket redemption values in said validation file.

283. The system of claim 281 further including a plurality of said probability lottery ticket and a central computer operatively connected to said processor and having a validation file containing for each said identity number on individual ones of said plurality of probability lottery tickets at least one of said related potential ticket redemption values for at least one combination of said player removable play spots and wherein for an individual ticket in said plurality of probability lottery tickets said central computer determines said played ticket redemption value from said removed spot data, said identity number, and said related potential ticket redemption values in said validation file.

284. The system of claim 283 wherein said central computer and said validation file are remote from said housing and wherein said system further includes transmission means for transmitting said identity number and said removed play spot data for said individual ticket in said plurality of probability lottery tickets to said central computer.

285. The system of claim 284 wherein said housing additionally includes a display operatively connected to said processor and configured to display played ticket redemption value for said individual ticket in said plurality of probability lottery tickets.

286. The system of claim 1 wherein the probability lottery ticket includes a set of predetermined play rules and validation data printed on the ticket, comprising:

and wherein said electronic validation machine includes:

a controller including said microprocessor, a document channel;

a photo-detector array operatively as part of said detector connected to said controller;

a transport mechanism operatively connected to said controller effective to transport the probability lottery ticket through said document channel such that at least a portion of the play spots is substantially aligned with said photo-detector array;

a scanning circuit as part of said detector operatively connected to said photo-detector array for generating a validation signal indicating which of the play spots have been removed from the probability lottery ticket;

said data reader operatively connected to said controller for reading the validation data;

wherein said controller is effective to generate from said data reader a data signal representing the validation data; and a processor operatively connected to said controller for relating said data signal to said validation signal to verify the probability lottery ticket has been played.

287. The system of claim 286 wherein said processor additionally verifies that the probability lottery ticket has been played according to the predetermined play rules.

288. The system of claim 287 additionally including a stigmatization circuit for stigmatizing the probability lottery ticket after the probability lottery ticket has been verified.

289. The system of claim 288 wherein said stigmatization circuit applies sufficient electromagnetic power to the probability lottery ticket to change a color of at least a portion of the ticket.

290. The system of claim 288 wherein the probability lottery ticket is printed with a temperature sensitive ink and said stigmatization circuit generates sufficient heat on the probability lottery ticket to change a color of said portion of the probability lottery ticket printed with the temperature sensitive ink.

291. The system of claim 1 wherein the probability lottery ticket has a set of predetermined play rules and validation data printed on the probability ticket, and wherein said electronic validation machine includes:

a housing;

a controller including said microprocessor located in said housing, a document channel configured in said housing;

a sensor array as part of said detector located in said housing and operatively connected to said controller;

a transport mechanism located in said housing including at least one roller, a plurality of ticket sensors, and a motor operatively connected to said controller and said roller, said transport mechanism being effective to transport the probability lottery ticket through said document channel such that at least a portion of the play spots is substantially aligned with said sensor array;

a scanning circuit as part of said detector operatively connected to said sensor array for generating a validation signal indicating which of the play spots have been removed from the probability lottery ticket;

said data reader operatively connected to said controller and adapted to read the validation data;

wherein said controller is effective to generate from said data reader a data signal representing the validation data; and a processor operatively connected to said controller for relating said data signal to said validation signal to verify the probability lottery ticket has been played according to the predetermined play rules.

292. The system of claim 291 wherein said verification includes determining if the correct number of play spots have been removed according to the predetermined play rules.

293. The system of claim 292 wherein, after the probability lottery ticket has been verified, said processor determines said redemption value for the probability lottery ticket.

294. The system of claim 293 additionally including a display configured to display said redemption value.

295. The system of claim 291 additionally including a stigmatization circuit adapted to stigmatize the probability lottery ticket after the probability lottery ticket has been verified.

296. The system of claim 295 wherein said stigmatization circuit applies sufficient electromagnetic energy to the probability lottery ticket to change a color of at least a portion of the probability ticket.

297. The system of claim 296 wherein the probability lottery ticket is printed with a temperature sensitive ink and said stigmatization circuit generates sufficient heat on the probability lottery ticket to change a color of said portion of the probability lottery ticket printed with the temperature sensitive ink.

298. The system of claim 291 wherein a first of said ticket detectors indicates to said controller that the probability lottery ticket is in said channel.

299. The system of claim 298 wherein said controller responds to said first ticket detector to cause said motor to rotate said roller and move the probability lottery ticket past said sensor array.

300. The system of claim 299 wherein a second of said ticket detectors indicates when the probability lottery ticket has exited said channel.

301. The system of claim 1 wherein said probability lottery ticket includes a set of predetermined play rules and validation data printed on the ticket in the form of a bar code, comprising:

and wherein said electronic validation machine includes:

a housing;

a controller including said microprocessor located in said housing, a document channel configured in said housing;

a sensor as part of said detector including an optical detector located in said housing and operatively connected to said controller;

said data reader operatively connected to said controller and adapted to read the bar code;

a transport mechanism located in said housing and operatively connected to said controller, said transport mechanism including at least one roller, a plurality of ticket sensors, and a motor, said roller being effective to transport the probability lottery ticket through said document channel such that at least a portion of the play spots is substantially aligned with said sensor and such that the bar code is substantially aligned with said data reader;

a scanning circuit as part of said detector operatively connected to said sensor and to said controller for scanning at least a portion of the probability ticket for the player removable material covering the play spots and generating a validation signal indicating which, if any, of the player removable material covering the play spots has been removed from the probability lottery ticket;

a memory operatively connected to said controller and containing data representing the probability lottery ticket including at least a portion of the validation data obtained from said data reader and removed play spot data obtained from said validation signal;

a processor operatively connected to said controller and said memory for relating said portion of said validation data to said removed play spot data to verify the probability lottery ticket and to cause said transport mechanism to exit the probability lottery ticket from said document channel; and a stigmatization circuit operatively connected to said processor and adapted to change at least a portion of a color of the probability lottery ticket prior to said transport mechanism exiting the probability ticket from said document channel.

302. The system of claim 301 wherein said processor additionally relates said validation data to said removed play spot data to generate said redemption value for the probability lottery ticket.

* * * * *